(12) United States Patent
Takatori

(10) Patent No.: US 9,054,698 B2
(45) Date of Patent: Jun. 9, 2015

(54) METHOD FOR SETTING TRANSISTOR OPERATING POINT AND CIRCUIT THEREFOR, METHOD FOR CHANGING SIGNAL COMPONENT VALUE AND ACTIVE-MATRIX LIQUID CRYSTAL DISPLAY DEVICE

(71) Applicant: Gold Charm Limited, Apia (WS)

(72) Inventor: Ken-Ichi Takatori, Tokyo (JP)

(73) Assignee: Gold Charm Limited, Apia (WS)

( * ) Notice: Subject to any disclaimer, the term of this patent is extended or adjusted under 35 U.S.C. 154(b) by 3 days.

(21) Appl. No.: 14/093,505

(22) Filed: Dec. 1, 2013

(65) Prior Publication Data

US 2014/0084969 A1  Mar. 27, 2014

Related U.S. Application Data

(62) Division of application No. 10/479,426, filed on Dec. 3, 2003, now Pat. No. 8,625,038.

(30) Foreign Application Priority Data

Jun. 4, 2001 (JP) ................................. 2001-168362

(51) Int. Cl.
*G02F 1/1368* (2006.01)
*H03K 17/10* (2006.01)
*G09G 3/36* (2006.01)
*G02F 1/133* (2006.01)
*G02F 1/1362* (2006.01)
*H03K 17/693* (2006.01)

(52) U.S. Cl.
CPC ............ *H03K 17/102* (2013.01); *G09G 3/3648* (2013.01); *G02F 1/13306* (2013.01); *G02F 1/136209* (2013.01); *G02F 1/1368* (2013.01); *H03K 17/693* (2013.01); *G09G 2300/0833* (2013.01); *G09G 2300/0842* (2013.01); *G09G 2320/02* (2013.01); *G09G 2320/0219* (2013.01); *G09G 2320/0257* (2013.01); *G09G 2320/0261* (2013.01)

(58) Field of Classification Search
CPC ..................................................... G02F 1/1368
USPC .......................................................... 349/42
See application file for complete search history.

*Primary Examiner* — Timothy L Rude
(74) *Attorney, Agent, or Firm* — Novak Druce Connolly Bove + Quigg LLP

(57) ABSTRACT

A data signal voltage on a signal line is held in a voltage holding capacitor through an n-type MOS transistor switched on by a gate scan voltage, and supplied to an analog amplifier circuit. The analog amplifier circuit is formed of an MOS transistor having a double gate structure, and the operating point thereof is set at an operating range in which dependence of Ids on Vds is substantially nullified. Even when Vds is varied due to a response of liquid crystal, Ids is substantially fixed. Accordingly, the pixel voltage which is substantially proportional to the data signal voltage can be applied to the liquid crystal.

19 Claims, 77 Drawing Sheets

METHOD FOR SETTING TRANSISTOR OPERATING POINT AND CIRCUIT THEREFOR, METHOD FOR CHANGING SIGNAL COMPONENT VALUE AND ACTIVE-MATRIX LIQUID CRYSTAL DISPLAY DEVICE

CROSS REFERENCE TO THE RELATED APPLICATIONS

This application is a divisional of U.S. patent application Ser. No. 10/479,426, filed Dec. 3, 2003, which claims priority from Japanese Patent Application No. 2001-168362, filed Jun. 4, 2001, the contents of all of which is incorporated herein by reference in their entirety.

BACKGROUND

1. Technical Field

The present invention relates to a method for setting a transistor operating point and a circuit therefor, a method for changing a signal component value and an active-matrix liquid crystal display device for use in a projector, a notebook-sized PC, a monitor, a viewer, Personal Digital Assistance (PDA), a portable telephone, a game machine, electrical household appliances, etc.

2. Description of Related Art

Following developments of multi-media agent, various types liquid crystal display devices covering from compact-scale type display devices used in a projector device, a portable telephone, etc. to large-scale type display devices used in a notebook-sized PC, a monitor, a television set, etc. have been rapidly popular. Besides, middle-scale type liquid crystal display devices have been indispensable for electronic equipment such as a viewer, PDA, etc., and further for even playing machines such as a portable game machine, a pachinko machine, etc. On the other hand, liquid crystal display devices have been used over various fields containing electrical household appliances such as freezers, microwave ovens, etc. Particularly, an active-matrix liquid crystal display device operated by thin film transistors has been mainly used because it provides higher resolution and higher image quality as compared with a simple matrix type liquid crystal display device.

FIG. 72 shows a pixel circuit for one pixel of a conventional active-matrix liquid crystal display device. As shown in FIG. 72, the pixel of the active-matrix liquid crystal display device comprises an MOS transistor (Qn) (hereinafter referred to as "transistor (Qn)") in which a gate electrode is connected to a scan line 901, any one of a source electrode and a drain electrode is connected to a signal line 902 and the other of the source and drain electrodes is connected to a pixel electrode 903, a storage capacitor 906 formed between the pixel electrode 903 and a storage capacitor electrode 905, and liquid crystal 908 sandwiched between the pixel electrode 903 and an opposed electrode Vcom 907.

In notebook-sized PCs which have dominated a large application market for liquid crystal display devices, an amorphous silicon thin film transistor (hereinafter referred to as "a-SiTFT") or a polysilicon thin film transistor (hereinafter referred to as "p-SiTFT") is used as the transistor (Qn) 904, and twisted nematic liquid crystal (hereinafter referred to as "TN liquid") is used as liquid crystal material. FIG. 73 shows an equivalent circuit to TN liquid crystal. As shown in FIG. 73, the equivalent circuit of TN liquid crystal can be represented by a circuit comprising a capacitance component C3 of liquid crystal (electrostatic capacitance of Cpix) and both of a resistor R1 (resistance value Rr) and a capacitor C1 (electrostatic capacitance of Cr), the capacitance component C3 and both the resistor R1 and the capacitor C1 being connected in parallel. Here, the resistance value Rr and the electrostatic capacitance Cr are components for determining the response time constant of liquid crystal.

FIG. 74 is a timing chart showing the relationship of a gate scan voltage Vg, a data signal voltage Vd and a voltage Vpix of the pixel electrode 903 (hereinafter referred to as "pixel voltage") when TN liquid as described above is operated by the pixel circuit shown in FIG. 72. As shown in FIG. 74, during a horizontal scan period, the gate scan voltage Vg is set to high level Vgh to set an n-type MOS transistor (Qn) 904 to ON state, and the data signal voltage Vd inputted on a signal line 902 is transferred through the transistor (Qn) 904 to the pixel electrode 903. TN liquid normally operates in a so-called normally white mode in which light is transmitted through the TN liquid under no applied voltage.

In this case, a voltage at which light transmission through TN liquid is high is applied as the data signal voltage Vd over several fields. When the horizontal scan period is finished and the gate scan voltage Vg is set to low level, the transistor (Qn) 904 is set to OFF state, and the data signal voltage transferred to the pixel electrode 903 is held by the storage capacitor 906 and the capacitance Cpix of the liquid crystal. At this time, the pixel voltage Vpix undergoes a voltage shift called as a field through voltage via the capacitance between the gate and source of the transistor (Qn) 904 at the time when the transistor (Qn) 904 is set to OFF state. This voltage shift is represented by Vf1, Vf2, Vf3 in FIG. 74, and the amount of the voltage shift Vf1 to Vf3 can be reduced by setting the capacitance of the storage capacitor 906 to a large value.

The pixel voltage Vpix is held until the gate scan voltage Vg is set to high level to select the transistor (Qn) 904 again during the next field period. The TN liquid is switched in response to the pixel voltage Vpix thus held, and the display state based on transmission light from the liquid crystal transits from a dark state to a light state as indicated by variation in light transmittance T1. At this time, as shown in FIG. 74, the pixel voltage Vpix is varied by .DELTA.V1, .DELTA.V2, .DELTA.V3 during the holding period in each field. This is because the capacitance of the liquid crystal is varied in conformity with the response of the liquid crystal. Normally, for suppressing the fluctuation of the capacitance, the storage capacitor 906 is designed to have capacitance which is several times (two or three times) or more as large as the pixel capacitance Cpix. As described above, the TN liquid is driven by the pixel circuit shown in FIG. 72.

However, as is apparent from the variation of the light transmittance shown in FIG. 74, the response time of the TN liquid is normally large, that is, it ranges from 30 to 100 msec, and thus an after-image remains when an object moving at high speed is displayed, so that there is a disadvantage that no clear display can be achieved. Furthermore, there is a disadvantage that the angle of visual field is small. Therefore, there has been actively studied and developed liquid crystal material having polarization and liquid crystal display devices using the liquid crystal material with which high response is achieved and a broad angle of visual field is provided.

As shown in FIG. 75, the equivalent circuit of high-response liquid crystal having polarization can be represented by a circuit having a circuit comprising a resistor R2 (resistance value Rsp) and a capacitor C2 (electrostatic capacitance Csp) connected to each other in series, and a high-frequency pixel capacitor C3 (electrostatic capacitance Cpix) which is not varied even when polarization is rotated, the circuit concerned and the high-frequency pixel capacitor C3 being connected to each other in parallel. The construction of the equivalent circuit is similar to the equivalent circuit of the TN liquid crystal shown in FIG. 73, however, the resistor R2 and the capacitor C2 for determining the response time of liquid crystal is different from that of TN liquid crystal, and they are illustrated in another diagram to be discriminated as components contributing to the response of polarization.

As such liquid crystal material having polarization may be used ferroelectric liquid crystal, antiferroelectric liquid crystal, thresholdless antiferroelectric liquid crystal, deformed helix ferroelectric liquid crystal, twisted ferroelectric liquid crystal, monostable ferroelectric liquid crystal or the like. Particularly, when thresholdless antiferroelectric liquid crystal, deformed helix ferroelectric liquid crystal, twisted ferroelectric liquid crystal or monostable ferroelectric liquid crystal is used for a liquid crystal display device, not only high response and a broad angle of visual field are achieved, but also gradation display can be performed by using an active-matrix liquid crystal display device as shown in FIG. 72, which is described by using thresholdless antiferroelectric liquid crystal as an example in "JAPAN JOURNAL OF APPLIED PHYSICS, Volume. 36, p 720 (Japan Journal of Applied Physics, Volume 36, p. 720 (hereinafter referred to as reference document 1)).

FIG. 76 is a timing chart showing a gate scan voltage Vg a data signal voltage Vd and a pixel voltage Vpix when thresholdless antiferroelectric liquid is driven by the conventional pixel circuit shown in FIG. 72. As shown in FIG. 75, the gate scan voltage Vg is set to high level VgH during the horizontal scan period to set the transistor (Qn) 904 to ON state, and the data signal voltage Vd input to the signal line 902 is transferred to the pixel electrode 903 through the transistor (Qn) 904. The thresholdless antiferroelectric liquid crystal normally operates in a so-called normally black mode in which light is not transmitted through the thresholdless antiferroelectric liquid crystal when a voltage is not applied.

When the horizontal scan period is finished and the gate scan voltage Vg is set to low level, the transistor (Qn) 904 is set to OFF state, and the data signal voltage Vd transferred to the pixel electrode 903 is held by the storage capacitor 906 and the high-frequency pixel capacitor C3 of the liquid crystal. At this time, the pixel voltage Vpix undergoes a voltage shift called as a field through voltage via the gate-source capacitance of the transistor (Qn) 904 at the time when the transistor (Qn) 904 is set to OFF state like the case where the TN liquid crystal described above is driven.

Furthermore, after the horizontal scan period is finished, the pixel voltage Vpix is varied by .DELTA.V1, .DELTA.V2, .DELTA.V3 in each field by re-distribution of the charges held in the high-frequency capacitor C3 and the polarization-based capacitor Csp as shown in FIG. 76. According to the driving method disclosed in the reference document 1, the gradation control is performed on the basis of the pixel voltage Vpix after the voltage variation described above.

At this time, in FIG. 75, the light transmittance is varied as indicated by T1, and the thresholdless antiferroelectric liquid crystal can be driven by the pixel circuit shown in FIG. 72.

Furthermore, a liquid crystal display device using liquid of OCB mode is described as high-response liquid crystal having no polarization in IDRC 97, P.L-66). OCB-mode liquid crystal uses bend orientation of TN liquid crystal, and it can be switched at a speed higher than the conventional TN liquid crystal by single figure. Furthermore, a display having a broad angle of visual field can be achieved by using a biaxial phase-contrast compensating film. In addition, time-divisional driving type color liquid crystal devices using high-response liquid crystal such as ferroelectric crystal, OCB-mode liquid crystal or the like have been recently actively studied and developed.

For example, JP-A-7-64051 discloses a time-divisional driving type of liquid crystal device using ferroelectric liquid. Furthermore, IDRC 97, p 37 reports a time-divisional driving type color liquid crystal display device using OCB-mode liquid crystal.

In the time-divisional driving type liquid crystal display device, color display is implemented by successively switching light incident to liquid crystal among red, green and blue during one-field period. Therefore, high-response liquid crystal responding within at least one-third of the one-field period is needed. When the time-divisional driving type liquid crystal display device is applied to a direct-view type liquid crystal display device such as a notebook-sized PC, a monitor or the like, no color filter is required, and thus the liquid crystal display device can be manufactured at low price. Furthermore, when it is applied to a projector device, a high aperture ratio having the same level as a three-plate type liquid light valve and color display can be implemented by a single-plate liquid crystal display device, thereby providing a compact, light, low-price and high-brightness liquid projector device.

When TN liquid, ferroelectrics liquid crystal or antiferroelectric liquid crystal having polarization, high-response TN liquid responding within one-field period is driven according to the conventional pixel circuit and driving method as described above, the following disadvantages occur.

As described above, when TN liquid is driven by the pixel circuit shown in FIG. 72, the pixel voltage Vpix undergoes the voltage variation of .DELTA.V1 to .DELTA.V3 due to the variation of the liquid crystal capacitance during the holding period as shown in FIG. 74. The voltage variation amount is also varied in accordance with the operation amount of liquid crystal molecules. Therefore, there occurs a disadvantage that even when the same data signal voltage is written, the voltage to be originally written to the liquid crystal cannot be applied at all times over the holding period because it is dependent on the data signal voltage written in the previous field. As a result, although the light transmittance of the liquid crystal should originally varies like a curved line indicated by T0 of FIG. 74, it actually varies like a curved line indicated by T1 described above. Therefore, accurate gradation display cannot be performed. In order to reduce the voltage variation .DELTA.V1 to .DELTA.V3, a solving method of setting the accumulative capacitance to a large value has been hitherto utilized. In this case, however, the aperture ratio can be reduced.

When ferroelectric liquid crystal or antiferroelectric liquid crystal having polarization is driven, the pixel voltage Vpix undergoes voltage variation of .DELTA.V1 to .DELTA.V3 by polarization switching during the holding period as shown in FIG. 76. AS described above, this voltage variation is caused by the redistribution of the charge held in the high-frequency capacitor C3 shown in FIG. 75 and the charge held in the capacitor C2 due to the polarization Here, Csp has a large value which is five to one hundred times as large as Cpix.

Therefore, the voltage variation .DELTA.V1 to .DELTA.V3 becomes a large value exceeding 1 to 2 voltages, and thus it is required to magnify the amplitude of the data signal voltage. As a result, the power consumption of the liquid crystal display device is increased, and the signal processing circuit, the peripheral driving circuit and the pixel transistor are required to be designed to have large withstand voltages, and it results in rise-up of the price of the liquid crystal display device. Furthermore, the amount of the voltage variation .DELTA.V1 to .DELTA.V3 is varied by the data signal voltage written in the previous field, so that the light transmittance of liquid crystal should originally vary like the curved line indicated T0 shown in FIG. 76, however, it actually vary like the curved line indicated by T1 as described. Therefore, it is impossible to perform the accurate gradation control every filed. Accordingly, when the liquid crystal having polarization described above is applied to the time-divisional driving system of liquid crystal device, color display having excellent color reproducibility cannot be performed.

The same disadvantage as the liquid crystal display device using the liquid crystal material having polarization as described above occurs in the liquid crystal display device using OCB-mode liquid crystal.

In order to solve these disadvantages, JP-A-7-64051 discloses a liquid crystal display device using a monocrystal silicon transistor. The construction of the liquid crystal display device shown in FIG. 18 in JP-A-7-64051 has a disadvantage that a transistor Q2 operating as a source follower type analog amplifier circuit is not reset. Therefore, the transistor Q2 is kept under OFF state when a data signal voltage lower than a data signal voltage written previously is input, and the voltage corresponding to the data signal voltage cannot be output. Furthermore, in the construction shown in FIG. 18 of JP-A-7-64051, the transistor Q2 is set to OFF state after it outputs a data signal voltage to a picture electrode 10. Therefore, when polarization current of ferroelectric liquid crystal flows afterwards, there occurs the same disadvantage as described above in which the voltage of the picture electrode is varied.

A liquid crystal display device disclosed in Japanese Patent No. 003042493 (hereinafter referred to as reference patent) (JP-A-11-326946) is provided as a liquid crystal display device for solving the above disadvantage. According to this liquid crystal display device, in an active-matrix liquid crystal display device in which pixel electrodes are driven by MOS transistor circuits disposed in the neighborhood of the respective cross points of plural scan lines and plural signal lines, each of the MOS transistor circuits comprises an MOS transistor having a gate electrode connected to one of the scan lines and source and drain electrodes any one of which is connected to one of the signal lines, an MOS type analog amplifier circuit having an input electrode connected to the other of the source and drain electrodes of the MOS transistor and an output electrode connected to the pixel electrode, and a voltage holding capacitor formed between the input electrode of the MOS type analog amplifier circuit and a voltage holding capacitance electrode.

According to the reference patent described above, the pixel voltage Vpix during the holding period can be kept to a fixed voltage. FIG. 77 (FIG. 52 attached to the reference patent) is a diagram showing an example of the pixel circuit having the analog amplifier circuit. As shown in FIG. 77, a scan line 101 is connected to the gate electrode of a switching MOS transistor (Qn) 1101, a signal line 102 is connected to the source electrode, the drain electrode of the MOS transistor 1101 is connected to the input electrode (the gate electrode of the n-type MOS transistor 1102) of an analog amplifier circuit (comprising an n-type MOS transistor 1102 and an n-type MOS transistor 1103), and the pixel electrode 107 of liquid crystal display element 109 is connected to the output electrode of the analog amplifier circuit, and a voltage is applied to liquid crystal between the pixel electrode 107 and an opposed electrode 108 to drive the liquid crystal.

When no analog amplifier circuit is used, the storage capacitor 906 is formed between the pixel electrode 903 and the accumulative capacitance electrode 905 as shown in FIG. 72 (corresponding to FIG. 59 attached to the reference patent).

As shown in FIG. 77, when the analog amplifier circuit is used, a voltage holding capacitor 106 is formed between the voltage holding capacitance electrode 105 and the contact point between the switching MOS transistor (Qn) 1101 and the analog amplifier circuit.

The power supply source lines of the analog amplifier circuit are respectively connected to amplifier positive power supply source electrode and amplifier negative power supply source electrode which are separately provided, or one of the lines is connected to the scan line while the other line is connected to an existing electrode such as the voltage holding capacitance electrode or the like, thereby simplifying the circuit construction.

FIG. 77 (FIG. 52 attached to the reference patent) shows a case where the amplifier positive power supply source electrode is provided, and the amplifier negative power supply source electrode is connected to the voltage holding capacitance electrode 105. According to this circuit construction, when the switching MOS transistor is set to OFF state, a predetermined voltage is continued to be applied to the liquid crystal element 109 from the analog amplifier circuit, so that the voltage variation can be suppressed.

However, when the conventional MOS analog amplifier circuit described above is constructed by Poly-Si TFT or the like, the following disadvantages occur. A first disadvantage resides in that the gain of the analog amplifier circuit is low. The gain of the amplifier is ideally equal to 1. In the case of a prototype produced by the inventor of this application, a gain of 0.78 was achieved by a resistance load type analog amplifier circuit, and a gain of 0.84 was achieved by an active load type analog amplifier circuit having a TFT current source as a load.

The reason why reduction in gain as described above occurs resides in that Ids (drain-source current) is greatly varied dependently on Vds (drain-source voltage) even under the condition that Vgs (gate-source voltage) is fixed. Particularly Ids is remarkably increased in an area where Vds is large. This phenomenon is estimated to be mainly caused by the kink effect. Furthermore, since it is observed that Ids is dependent on Vds in an area where Vgs is low, there may be other causes than the kin effect. When the dependence of Ids on Vds occurs as described above, Vds varies at the operating point of the analog amplifier circuit. The output voltage of the source follower amplifier circuit is represented by the following equation:

$$Vout = Vin - Vgs$$

In the above equation, Vin represents an input voltage to the source follower amplifier circuit, and Vout represents an output voltage from the source follower amplifier circuit. Accordingly, when Vgs is varied, the linearity between Vin and Vout is lost, and the gain of the analog amplifier circuit is reduced.

The present invention has been implemented in view of the above situation, and has an object to provide transistor operating point setting method and circuit that effectively use the characteristics of unipolar transistor having a multi-gate structure, a signal component value changing method and an active-matrix liquid crystal display device.

SUMMARY OF THE INVENTION

In order to attain the above object, according to a first aspect of the present invention, there is provided a transistor operating point setting method for setting the operating point of a unipolar transistor, which is characterized in that in a unipolar transistor having a multi-gate structure equivalently achieved by commonly connecting respective gates of plural unipolar transistors each having a single gate structure and connecting the plural unipolar transistors to one another in series, the operating point of each single unipolar transistor having the single gate structure is set at an operating point that the dependence of source-drain current on source-drain voltage is within a permissible range.

According to a second aspect of the present invention, a transistor operating point setting circuit for setting the operating point of a unipolar transistor, which is characterized in that in a unipolar transistor having a multi-gate structure equivalently achieved by commonly connecting respective gates of plural unipolar transistors each having a single gate structure and connecting the plural unipolar transistors to one another in series, the operating point of each single unipolar transistor having the single gate structure is set at an operating point that the dependence of source-drain current on source-drain voltage is within a permissible range.

According to a third aspect of the present invention, a signal component value changing method for changing a signal component value of an input signal by using a unipolar transistor, which is characterized in that in a unipolar transistor having a multi-gate structure equivalently achieved by commonly connecting respective gates of plural unipolar transistors each having a single gate structure and connecting the plural unipolar transistors to one another in series, the operating point of each single unipolar transistor having the single gate structure is set at an operating point that the dependence of source-drain current on source-drain voltage is within a permissible range, and the unipolar transistor having the multi-gate structure is operated at the operating point thus set to change the signal component value of the input signal.

According to a fourth aspect of the present invention, there is provided an active-matrix liquid crystal display device in which a pixel circuit including a gate circuit, an analog amplifier circuit connected to the output of the gate circuit and liquid crystal connected to the output of the analog amplifier circuit is equipped in the neighborhood of each of the cross points of scan lines and signal lines which are arranged in a matrix form, the gate circuit of each pixel circuit gates a data signal voltage on the signal line corresponding to the pixel circuit concerned to the analog amplifier circuit on the basis of a gate scan voltage on the scan line corresponding to the pixel circuit concerned, and when the analog amplifier circuit applies a pixel voltage to the liquid crystal, the liquid crystal displays the pixel corresponding to the pixel voltage thus applied, wherein the analog amplifier circuit is designed to contain a unipolar transistor having a multi-gate structure.

DETAILED DESCRIPTION

Embodiments according to the present invention will be described hereunder with reference to the drawings. In the figures described below, 10-1 to 10-37 represent liquid crystal display devices, 20-1 to 20-37 represent pixel circuits, 101, 101(N−1) to 101(N+1) represent scan lines, 102 represent signal lines, 103 represents an n-type MOS transistor (gate circuit), 104-1 to 104-37 represent analog amplifier circuits, 105 represents a voltage holding capacitance electrode, 106 represents a voltage holding capacitor, 107 represents a pixel electrode, 108 represents an opposed electrode, 109 represents liquid crystal, 301 represents an n-type MOS transistor (gate circuit), 302 represents a first p-type MOS transistor and a second p-type MOS transistor, 303 represents a second p-type MOS transistor and a third p-type MOS transistor, 304 represents a source electrode, 305 represents a bias power supply source, 306 represents a resistor, 307 represents a reset pulse power supply source, 308 represents a first p-type MOS transistor (gate circuit), 401 represents a glass substrate, 403 represents a p+-layer, 404 represents a p−-layer, 405 represents a first interlayer film, 406 represents metal, 407 represents a second interlayer film, 408 represents metal, 501 represents an i-layer, 601 represents an n+-layer, 602 represents an n+-layer, 701 represents a p-type MOS transistor (gate circuit), 702 represents a first n-type MOS transistor and a second n-type MOS transistor, 703 represents a second n-type MOS transistor and a third n-type MOS transistor, 704 represents a source power supply source, 705 represents a bias power supply source, and 708 represents a first n-type MOS transistor (gate circuit).

First Embodiment

Figure 1:
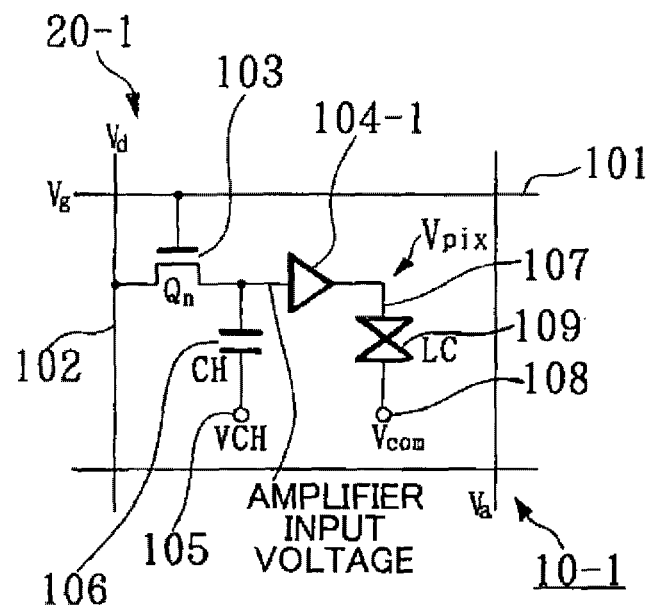
FIG. 1 is a diagram showing one pixel circuit constituting a liquid crystal display device according to a first embodiment of the present invention.
Figure 2:
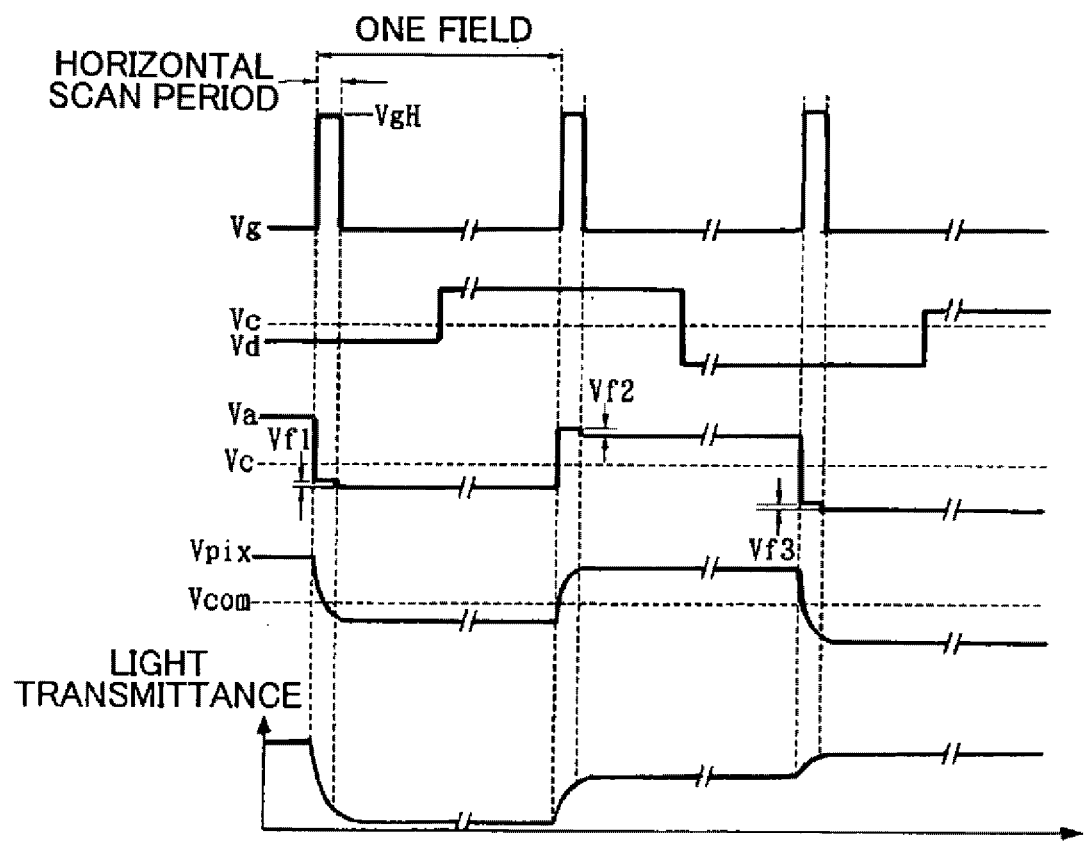
FIG. 2 is a timing chart for driving the liquid crystal display device of the first embodiment.
Figure 3:
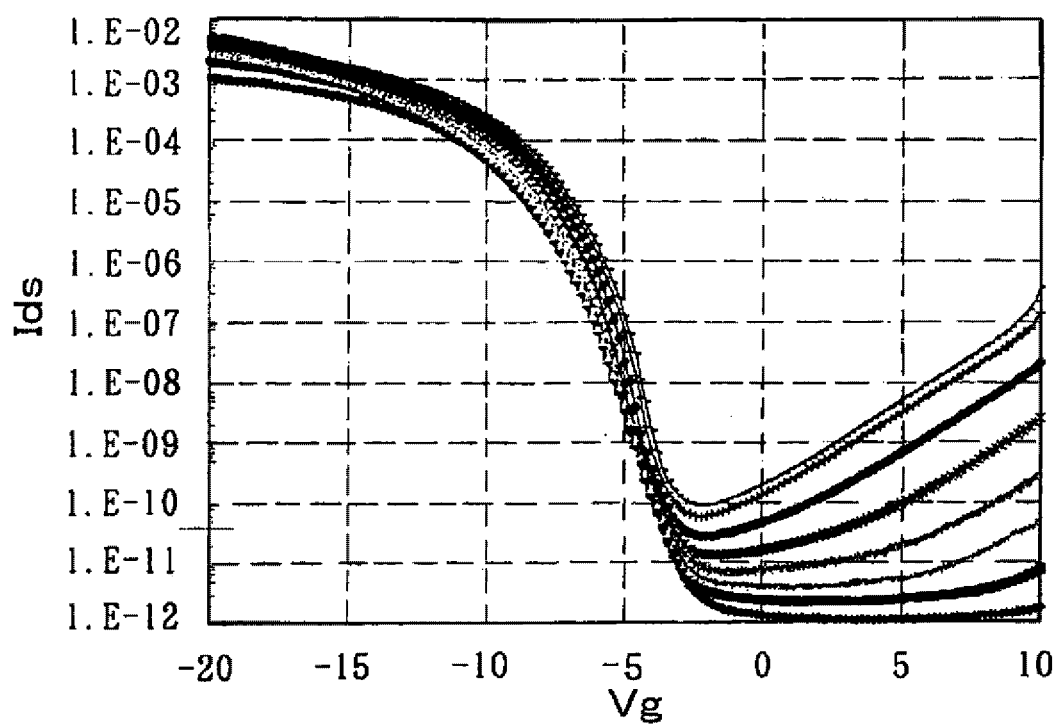
FIG. 3 is a diagram showing an Ids-Vgs characteristic curved line measured for an MOS transistor having a single gate structure to describe the liquid crystal display device of the first embodiment.
Figure 4:
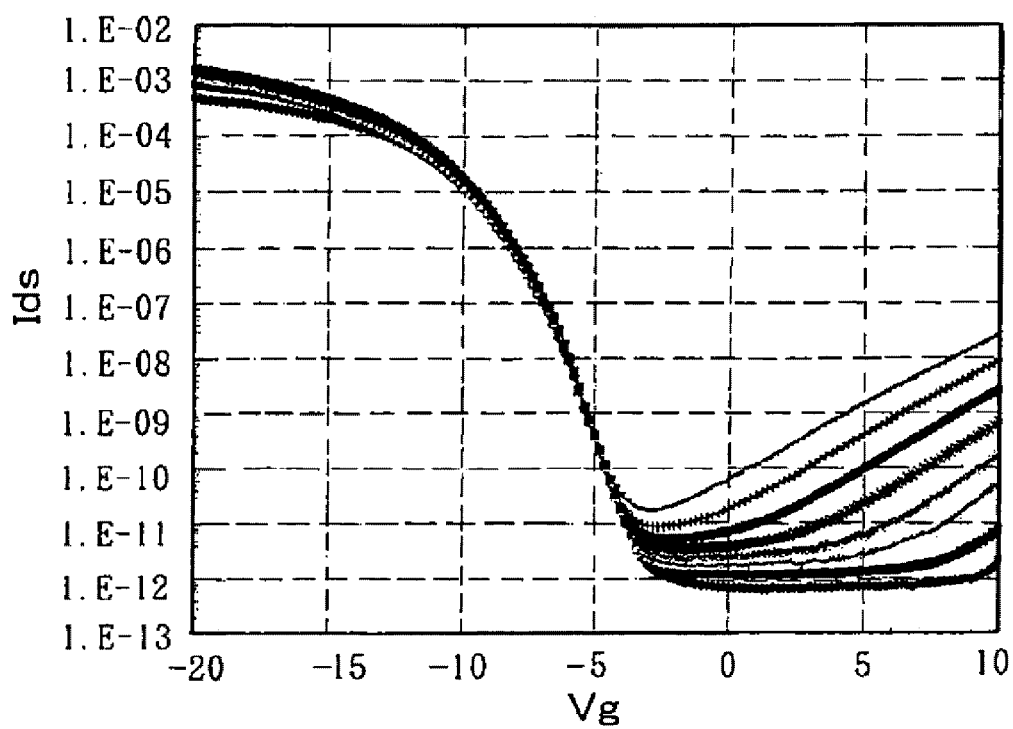
FIG. 4 is a diagram showing an Ids-Vgs characteristic curved line measured for an MOS transistor having a double gate structure used in the liquid crystal display device of the first embodiment.

FIG. 1 is a diagram showing a pixel circuit constituting a liquid crystal display device according to a first embodiment of the present invention, FIG. 2 is a timing chart showing a gate scan voltage Vg, a data signal voltage Vd, an amplifier input voltage Va and a pixel voltage Vpix and also shows variation of light transmittance of liquid crystal, FIG. 3 shows a measurement example of an Ids-Vgs characteristic representing the relationship between source-drain current Ids and gate-source voltage Vgs of an MOS thin film transistor having a single gate structure, and FIG. 4 shows a measurement example of an Ids-Vgs characteristic representing the relationship between source-drain current Igs and gate-source voltage Vgs of an MOS thin film transistor having a double gate structure.

The liquid crystal display device 10-1 of this embodiment relates to a device in which the analog amplifier circuit is designed by substantially excluding the dependence of the source-drain current Ids of the MOS transistor used in the analog amplifier circuit 104-1 on the source-drain voltage Vds, and the pixel voltage Vpix which is substantially proportional to the data signal voltage Vd is applied to the liquid crystal, whereby the liquid crystal is driven with more excellent gradation. The pixel circuit 20-1 of the device includes an n-type MOS transistor (Qn) 103 having a gate electrode connected to a scan line 101 and source and drain electrodes any one of which is connected to a signal line 102, an analog amplifier circuit 104-1 having an input electrode connected to the other of the source and drain electrodes of the n-type MOS transistor (Qn) 103, and an output electrode connected to the pixel electrode, a voltage holding capacitor 106 formed between the input electrode of the analog amplifier circuit 104-1 and the voltage holding capacitance electrode 105, and liquid crystal 109 switched between the pixel electrode 107 and an opposed electrode 108. A voltage holding capacitance voltage VCH is supplied to the voltage holding capacitance electrode 105.

The expression of "any one of" and "the other of" represents that the two channel terminal electrodes may be serve as any one of a source electrode and a drain electrode in accordance with a voltage application manner from the viewpoint of the feature that the analog amplifier circuit is constructed by the MOS transistor, and it is used to simplify the description.

The liquid crystal display device 10-1 is equipped with pixel circuits having the same construction as the pixel circuit 20-1, the number of the pixel circuits being equal to the number of pixels to be displayed on the display screen. Even if all the pixel circuits are not illustrated, it would not disturb the understanding of the liquid crystal display device, and thus only one pixel circuit 20-1 is shown in FIG. 1.

The n-type MOS transistor (Qn) 103 of the pixel circuit 20-1 comprises a p-SiTFT. The analog amplifier circuit 104-1 comprises a p-SiTFT (MOS transistor) (amplifier circuit portion) having a multi-gate structure and a load element. The gain of the analog amplifier circuit 104-1 is ideally set to 1.

Next, the operation of this embodiment will be described with reference to FIGS. 1 to 4.

FIG. 2 is a time chart of a gate scan voltage Vg, a data signal voltage Vd, an amplifier input voltage Va and a pixel voltage Vpix and also shows variation of light transmittance of liquid crystal 109 when the liquid crystal 109 is driven by the pixel circuit 20-1 in a normally black mode in which the liquid crystal 109 is kept dark under no voltage applied state. The liquid crystal 109 is formed of high-response liquid crystal such as ferroelectric or antiferroelectric having polarization, OCB mode liquid crystal responding within one field period, or the like.

As shown in FIG. 2, when the gate scan voltage Vg is set to high level VgH during the horizontal scan period, the n-type MOS transistor 103 is set to ON, and the data signal voltage Vd input to the signal line 102 is transferred through the n-type MOS transistor 103 to the input electrode of the analog amplifier circuit 104-1.

When the horizontal scan period is finished and the gate scan voltage Vg is set to low level, the n-type MOS transistor (Qn) 103 is set to OFF state, and the data signal voltage Vd transferred to the input electrode of the analog amplifier circuit 104-1 is held in the voltage holding capacitor 106. At this time, the amplifier input voltage Va undergoes a voltage shift called as a field through voltage via the gate-source capacitance of the n-type MOS transistor (Qn) 103 at the time when the n-type MOS transistor (Qn) 103 is set to OFF state. This voltage shift is represented by Vf1, Vf2, Vf3 in FIG. 2, and the amount of the voltage shift Vf1 to Vf3 can be reduced by setting the value of the voltage holding capacitor 106 to a large value.

The amplifier input voltage Va is held until the gate scan voltage Vg is set to high level and the n-type MOS transistor (Qn) 103 is selected during the next field period. The analog amplifier circuit 104-1 can output the analog gradation voltage corresponding to the amplifier input voltage Va thus held until the amplifier input voltage Va is varied in the next field.

The amplifier circuit portion of the analog amplifier circuit 104-1 is designed to contain an MOS transistor having a multi-gate structure, and the reason why the MOS transistor having the multi-gate structure is used will be described with reference to FIGS. 3 and 4.

FIGS. 3 and 4 show measurement examples for p-SiTFT of p-ch (p-Si thin film transistor) under the condition: channel length of 4 microns and channel width of 4 microns. FIGS. 3 and 4 show the Ids-Vgs characteristic indicating the relationship between the source-drain current Igs and the gate-source voltage Vgs, and the ordinate axis represents Ids while the abscissa axis represents Vgs (represented by Vg in the figures). The measurements were carried out while the drain-source voltage Vds is varied from −2 V to −16 V by 2 V.

In FIGS. 3 and 4, eight curved lines are achieved as a result of the variation from −2 V to −16 V by 2 V, and the curved line group is drawn so that the curved line for the drain-source voltage Vds having the smallest absolute value thereof is located at the lowermost side of the curved line group, and the curved line for the drain-source voltage Vds having the largest absolute value thereof is located at the uppermost side of the curved line group.

FIG. 3 shows the measurement result for an MOS thin film transistor (TFT) having a single gate structure. As is apparent form FIG. 3, Ids is greatly dependent on Vds. Paying attention to an area satisfying the condition that Vgs=−6 V, which indicates that Ids is equal to 10-7 (IE-07(=10-7) in FIG. 3), Ids is varied by the amount corresponding to nearly double figures when the drain-source voltage Vds is varied from 2V to 16V.

Even when the operating point of TFT having the single gate structure is set to an operating area where the variation of Ids is little, that is, the operating area where the dependence of Ids on Vds is little, there is still some dependence of Ids on Vds. Therefore, variation occurs in the gate-source voltage Vgs. Accordingly, when the MOS transistor having the single gate structure is used in the analog amplifier circuit, an output voltage which is not varied at a fixed rate, but at a different rate in accordance with the value of the amplifier input voltage appears at the output terminal of the analog amplifier circuit.

On the other hand, when the MOS transistor having the double gate structure is used as the MOS transistor constituting the analog amplifier circuit, the disadvantage appearing when the MOS transistor having the single gate structure is used can be substantially overcome.

That is, by representing the MOS thin film transistor (TFT) having the double gate structure with an equivalent circuit, it is estimated to be equivalent to a circuit structure that plural sub TFTs are connected to one another in series while the gates thereof are commonly connected to one another. Therefore, the source-drain voltage Vds of a single TFT constituting TFT having the multi-gate structure is apparently divided to the plural sub TFTs.

As a result, only a voltage equal to one-kth (1/k) of Vds which is actually applied to the MOS thin film transistor is applied between the source and the drain of each sub TFT (here, k represents the number of multi-gates, and the case of k=2 corresponds to the double gate structure).

Accordingly, each single TFT can be avoided from being used in the high-voltage area where the dependence of Ids on Vds is remarkable. As a result, as shown in FIG. 4, Ids varies hardly even when the drain-source voltage Vds is varied from 2V to 16V, and the dependence of Ids on Vds is reduced.

The same as described above is applied to the kink effect. That is, the voltage at both the ends of the sub TFT is not increased to the kink occurrence voltage due to the voltage division, and thus the kink effect is also suppressed. The kink effect is a drain-current variation phenomenon appearing in p-SiTFT or SOI (Silicon on Insulator), particularly in an n-channel device, and in this phenomenon the drain current is sharply increased and some crooked site occurs in the characteristic.

In this phenomenon, as the drain current is increased, collision ionization occurs in an area close to the drain region. Generated electrons are collected to the drain electrode, and generated holes are accumulated in an island of the device until the source and the island are set to ON. As a result, the drain current is abnormally increased to induce the above phenomenon.

By these actions, the constancy of the gain of the analog amplifier circuit 104-1 is enhanced, in other words, the linearity between the amplifier input voltage Va and the pixel voltage Vpix is enhanced even when the electrostatic capacitance of the liquid crystal 109 is varied in responsibility of liquid crystal 109 for even a fixed amplifier input voltage (gate input voltage) Va, or even when the amplifier input voltage is varied every field or at the time when the period of several fields has elapsed. Furthermore, as a result of voltage division, an effect of increasing the withstanding voltage can be achieved without using any MOS thin film transistor having high withstanding voltage. Accordingly, an MOS type thin film transistor which is normally unusable because of its low withstanding voltage can be used.

Still furthermore, the increase in the withstanding voltage can enhance reliability for a long term.

As described above, by using the MOS transistor having the double gate structure, the dependence of Ids on Vds is remarkably reduced, and occurrence of the kink effect can be prevented.

As in the case of FIG. 3, by referring to FIG. 4 while attention is paid to voltages corresponding to the neighborhood of Ids=10-7, it is clearly apparent from FIG. 4 that Ids is hardly varied around Vgs=−7 V.

As is apparent from the foregoing description, the analog gradation voltage (which is also called as the pixel voltage Vpix) substantially proportional to the amplifier input voltage Va held in the voltage holding capacitor 106 is continued to be output from the analog amplifier circuit 104-1 until the amplifier input voltage Va is varied in the next field.

After the horizontal scan period is finished, the pixel electrode 107 is driven by the pixel voltage Vpix output from the analog amplifier circuit 104-1 during the field period concerned.

As described above, according to the construction of this embodiment, since the MOS transistor having the double gate structure is used for the amplifier circuit portion of the analog amplifier circuit 104-1, the dependence of Ids on Vds is greatly reduced. Therefore, the gate-source voltage Vgs is hardly varied, and the withstanding voltage of the MOS thin film transistor can be enhanced. Accordingly, an MOS thin film transistor which cannot be normally used because the withstanding voltage thereof is low can be used in this embodiment.

Since the withstanding voltage can be increased, the long-term reliability can be enhanced.

Since the liquid crystal 109 is driven with the pixel voltage Vpix having such linearity as described above during the field period after the horizontal scan period. Therefore, in the image display operation, even when the electrostatic capacitance of the liquid crystal 109 is varied by applying the pixel voltage Vpix to the liquid crystal 109 or the data signal voltage Vd is changed every field period or at the time when the period of plural fields has elapsed to drive the liquid crystal 109, so that Vds is varied, ID is kept substantially constant. Therefore, the pixel voltage Vpix applied from the analog amplifier circuit 104-1 to the pixel electrode 107 is substantially proportional to the data signal voltage Vd, the variation of the pixel voltage Vpix is further less than the patent document described above, and the gain of the pixel electrode 107 is not reduced.

The variation of the pixel voltage Vpix can be more greatly reduced than the patent document described above.

By using the MOS transistor having the multi-gate structure, even when a relatively high voltage is applied to the MOS transistor concerned, the voltage applied to each of the single MOS transistors each having the single gate structure which are represented as being equivalent to the MOS transistor having the multi-gate structure is a divided value, that is, it is close to a value achieved by dividing the applied high voltage by the number of gates, so that the withstanding voltage performance can be enhanced.

As a result, as indicated by the waveform of the pixel voltage Vpix in FIG. 2, the pixel voltage having the linearity of the input-output voltage characteristic which is more greatly enhanced than the patent document described above can be applied to liquid crystal, and more excellent gradation can be achieved every field as also indicated with respect to the light transmittance of the liquid crystal.

An MOS transistor having a short channel can be used by using the MOS transistor having the double gate structure, so that the aperture ratio can be enhanced.

Furthermore, in liquid crystal display devices using TN liquid, ferroelectric or antiferroelectric liquid crystal having polarization, and other high-response liquid crystal responding within one field period, a compact-and-light liquid crystal display device which is designed in low price to have a high aperture ratio, high responsibility, a high visual field, high gradation and low power consumption is provided by eliminating the voltage variation ΔV1 to ΔV3.

Second Embodiment

Figure 5:
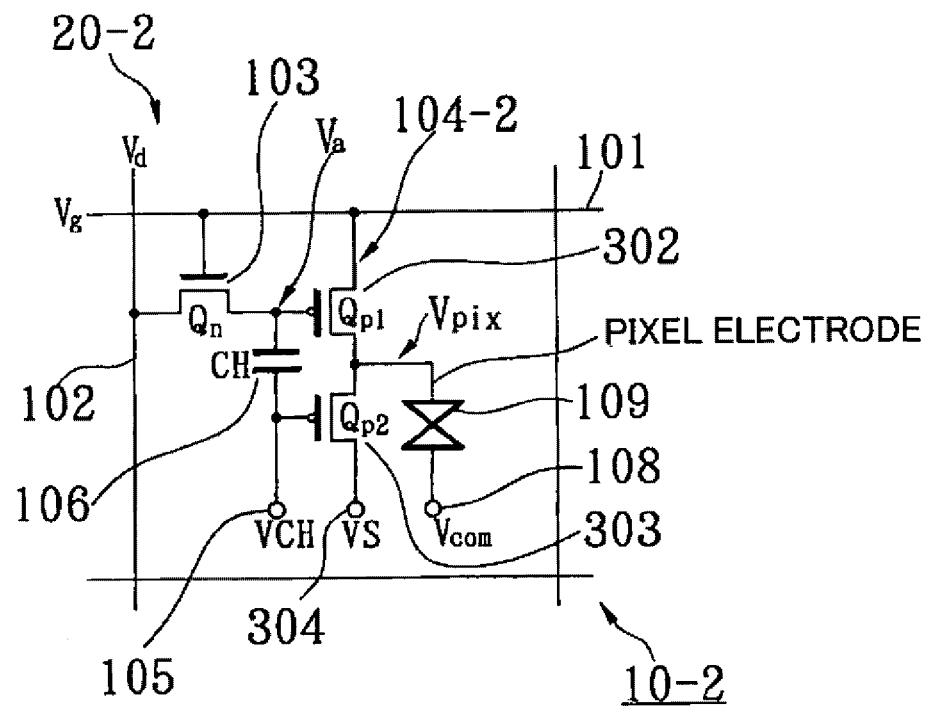
FIG. 5 is a diagram showing a pixel circuit constituting a liquid crystal display device according to a second embodiment.
Figure 6:
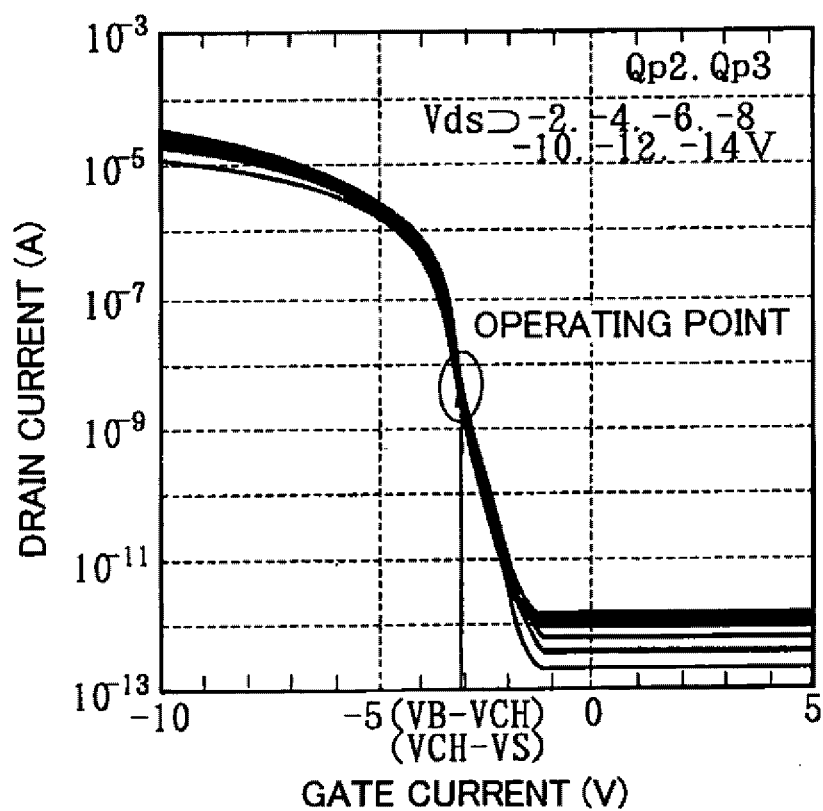
FIG. 6 is a diagram showing a drain current-gate input voltage characteristic curved line of an p-type MOS transistor having a double gate structure used in the liquid crystal display device of the second embodiment.
Figure 7:
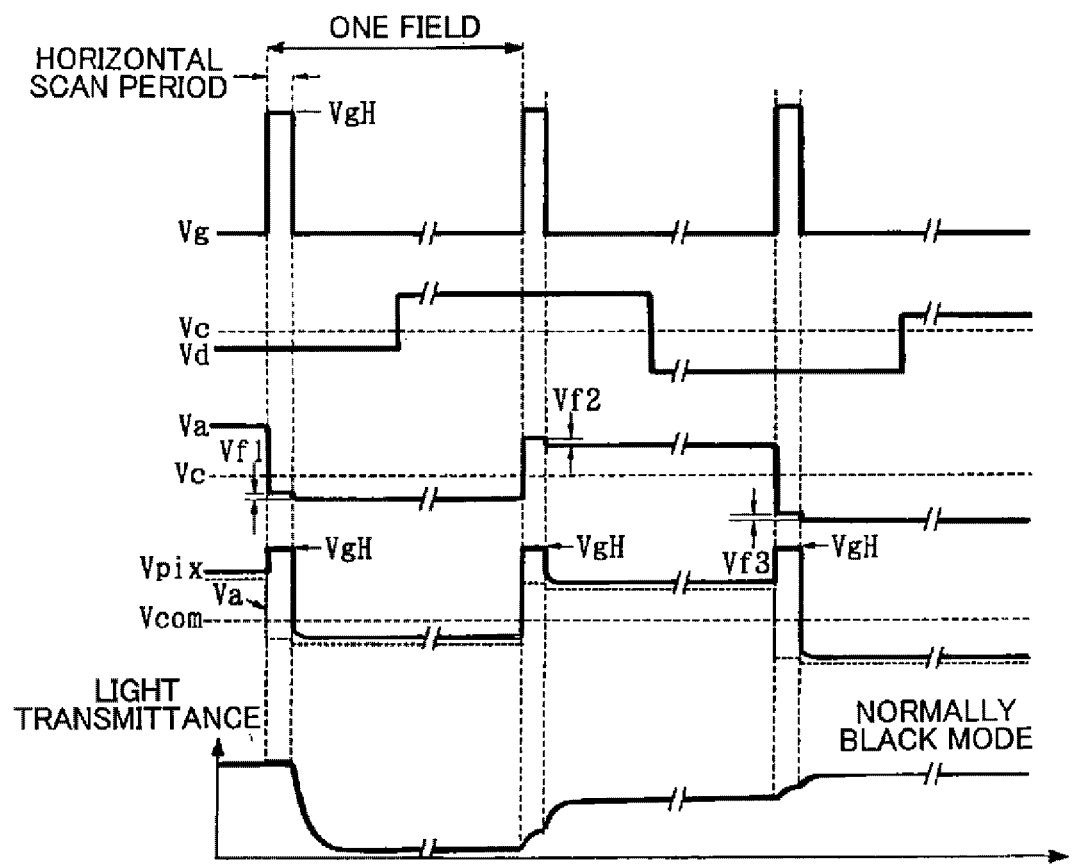
FIG. 7 is a timing chart when high-response liquid crystal is driven in the liquid crystal display device of the second embodiment.
Figure 8:
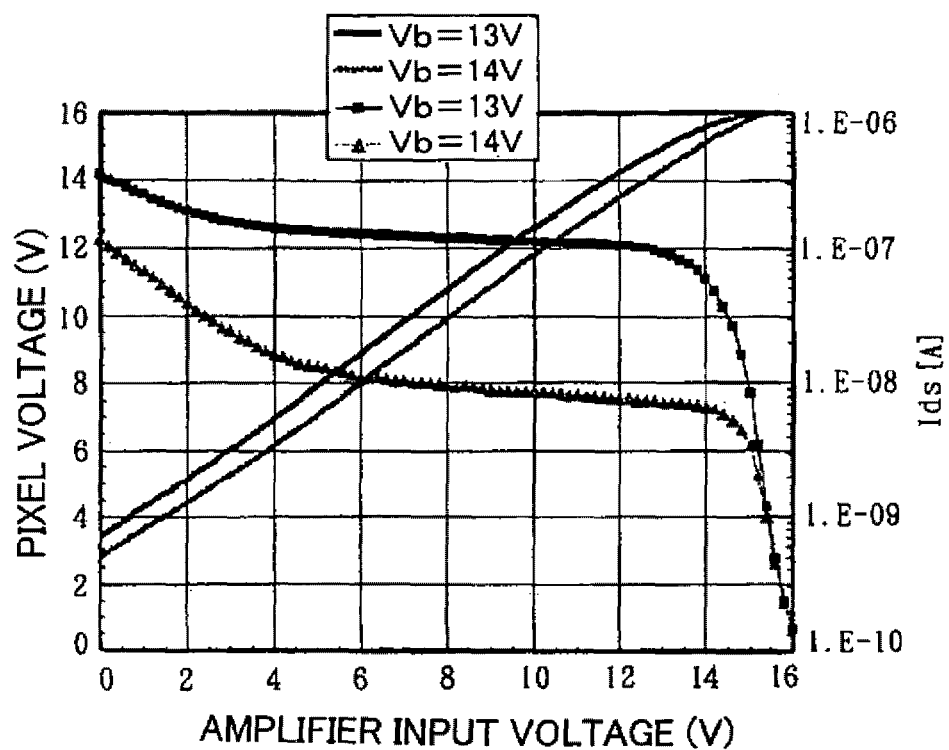
FIG. 8 is a diagram showing a gate input voltage-pixel voltage characteristic curved line of an active load type analog amplifier circuit constructed by an MOS transistor having a single gate structure to describe the liquid crystal display device of the second embodiment.
Figure 9:
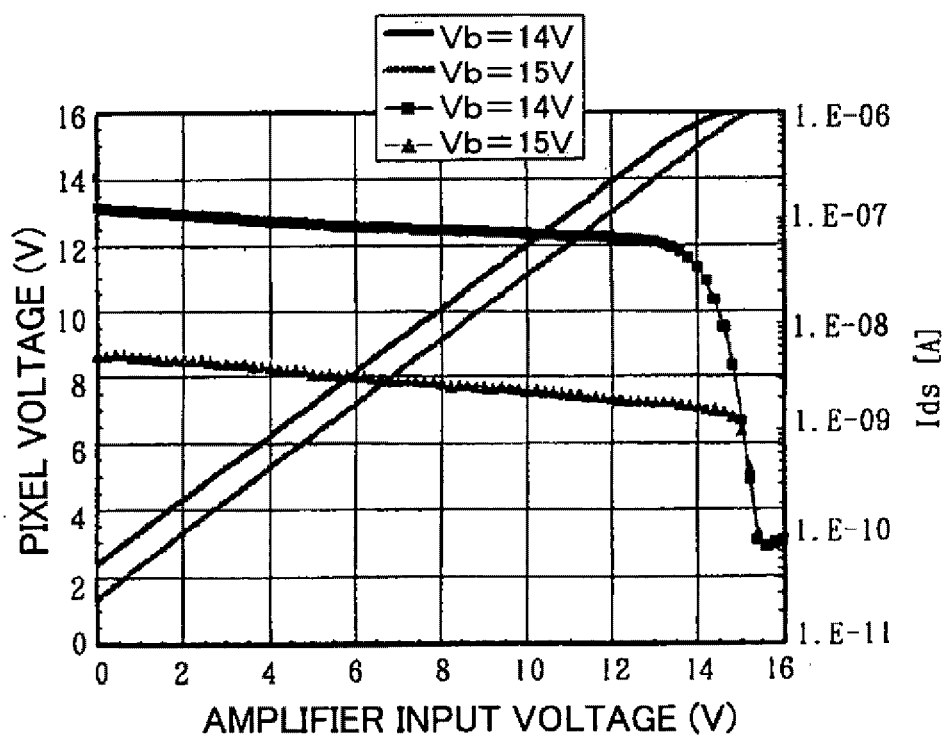
FIG. 9 is a diagram showing a gate input voltage-pixel voltage characteristic curved line of an active load type analog amplifier circuit constructed by an MOS transistor having a double gate structure in the liquid crystal display device of the second embodiment.
Figure 10:
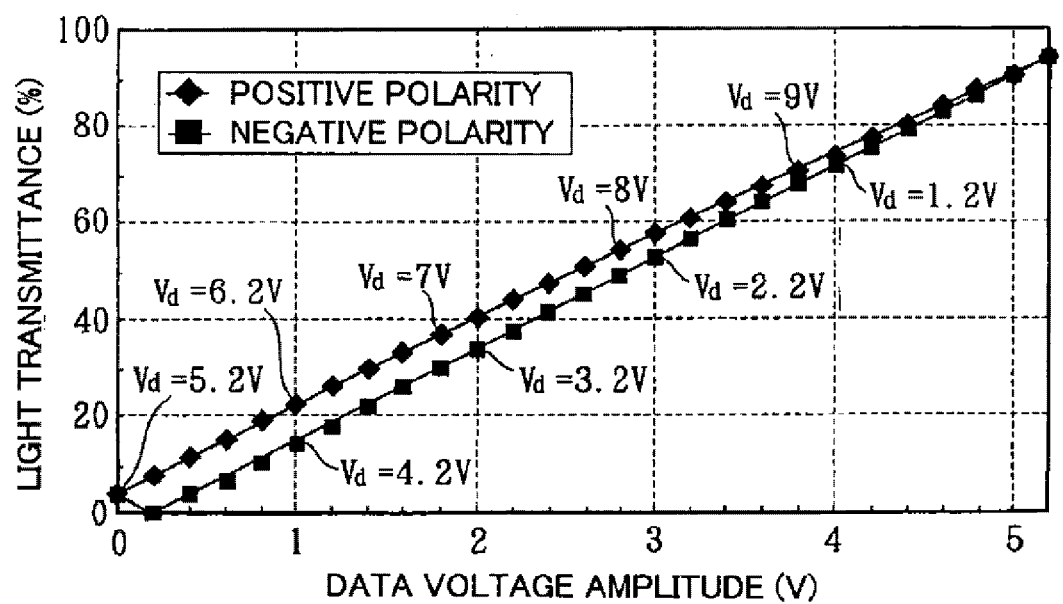
FIG. 10 is a diagram showing a gate input voltage-transmittance characteristic curved line of a pixel circuit constructed by an MOS transistor having a single gate structure to describe the liquid crystal display device of the second embodiment.
Figure 11:
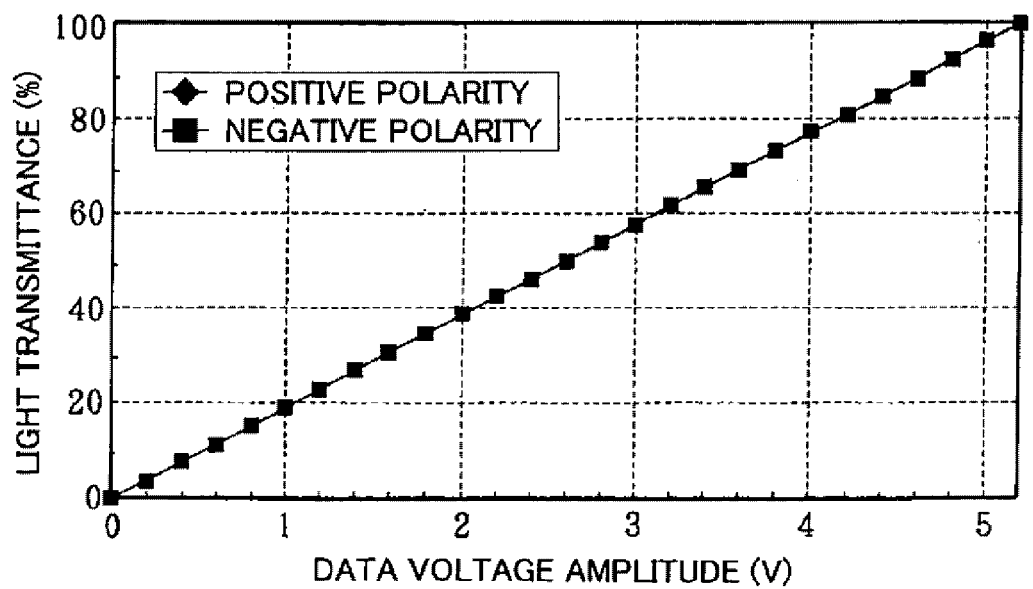
FIG. 11 is a diagram showing a gate input voltage-transmittance characteristic curved line of a pixel circuit constructed by an MOS transistor having a double gate structure in the liquid crystal display device of the second embodiment.
Figure 12:
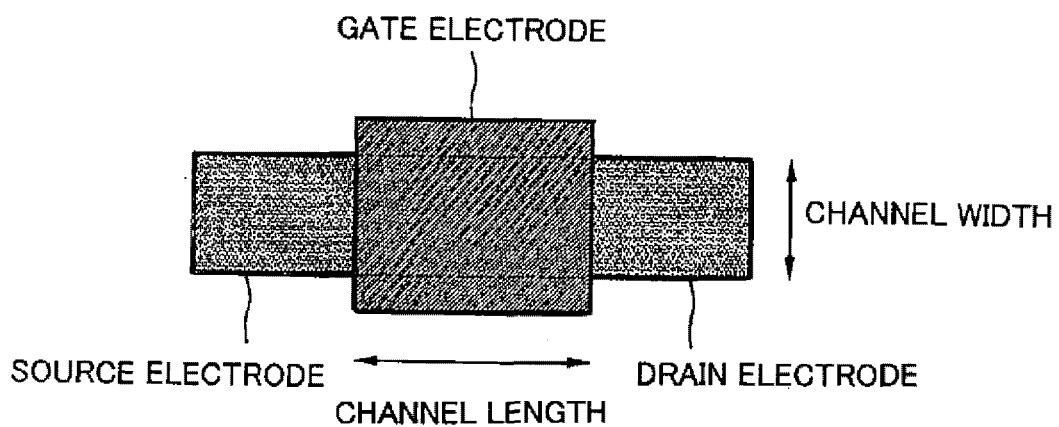
FIG. 12 is a plan view showing the structure of the MOS transistor when the pixel circuit is constructed by the MOS transistor having the single gate structure to describe the liquid crystal display device of the second embodiment.
Figure 13:
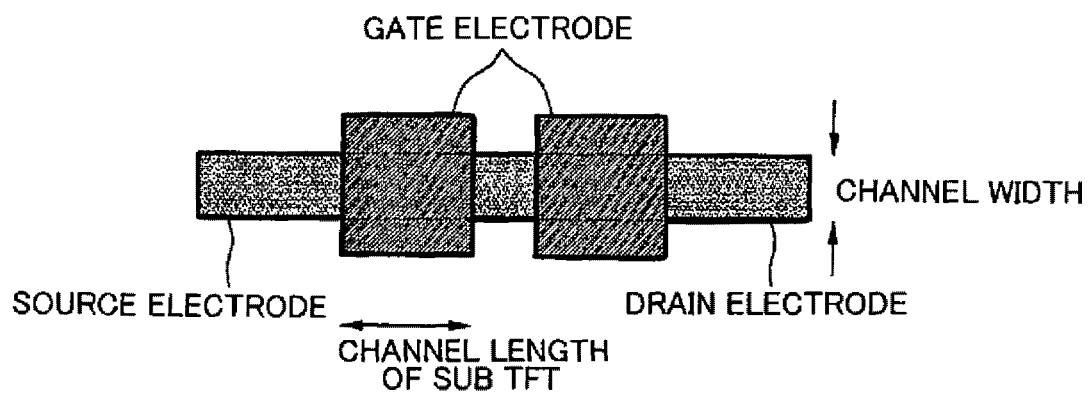
FIG. 13 is a plan view showing the structure of the MOS transistor when the pixel circuit is constructed by the MOS transistor having the double gate structure in the liquid crystal display device of the second embodiment.
Figure 14:
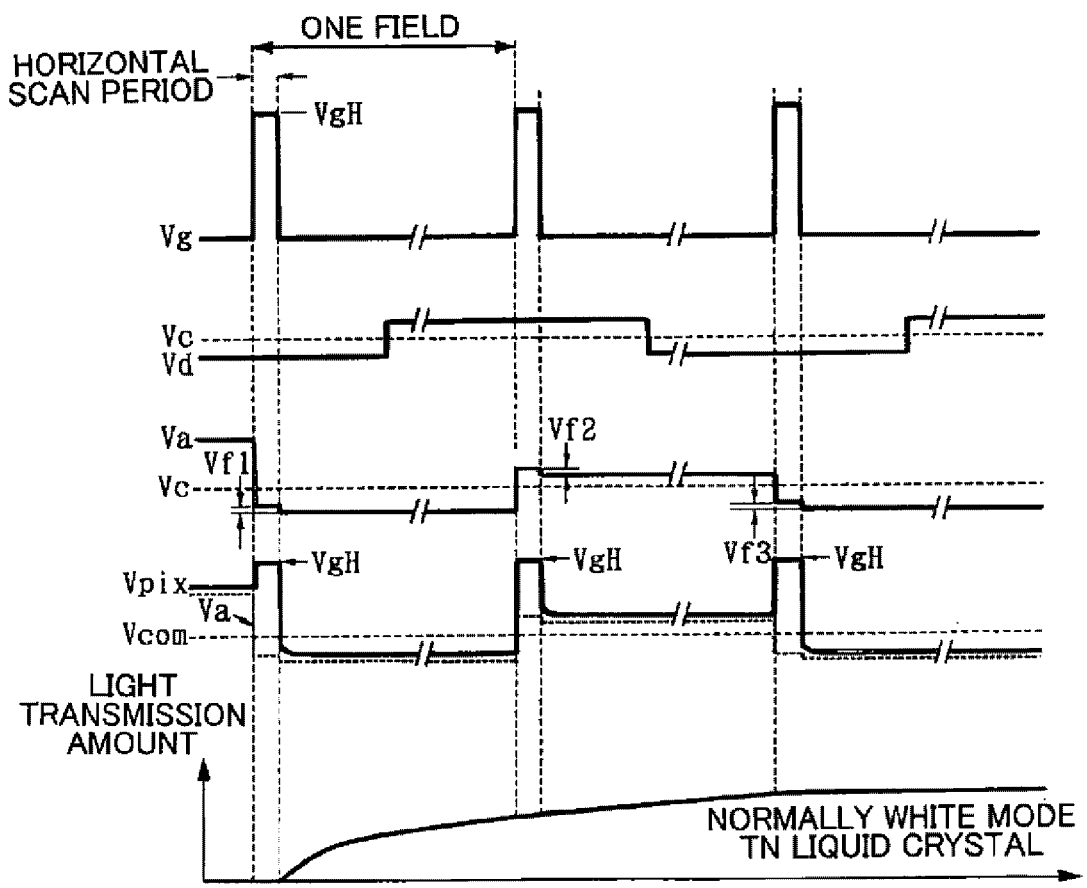
FIG. 14 is a timing chart when TN liquid is driven in the liquid crystal display device of the second embodiment.

FIG. 5 is a diagram showing a pixel circuit constituting a liquid crystal display device according to a second embodiment of the present invention, FIG. 6 is a diagram showing a drain current-gate input voltage (in FIG. 6, the gate input voltage represents the gate-source voltage) characteristic of a p-type MOS transistor of a pixel circuit constituting the liquid crystal display device of the second embodiment, FIG. 7 is a timing chart showing a gate scan voltage Vg, a data signal voltage Vd, a gate input voltage Va and a pixel voltage Vpix and shows variation of light transmittance of the liquid crystal when high-response liquid crystal is driven in the pixel circuit constituting the liquid crystal display device of the second embodiment, FIG. 8 is a diagram showing a gate input voltage-pixel voltage characteristic of an active load type analog amplifier circuit constructed by two p-type MOS transistors formed of p-Si having the single gate structure, FIG. 9 is a diagram showing a gate input voltage—pixel voltage characteristic of an active load type analog amplifier circuit constructed by two p-type MOS transistors of p-Si having the double gate structure, FIG. 10 is a diagram showing the relationship between the data signal voltage and the transmittance of the MOS transistor having the single gate structure, FIG. 11 is a diagram showing the relationship between the data signal voltage and the transmittance of the MOS transistor having the double gate structure, FIG. 12 is a plan view showing the structure of the p-type MOS transistor having the single gate structure, FIG. 13 is a plan view showing the structure of the p-type MOS transistor having the double structure, and FIG. 14 is a time chart showing a gate scan voltage Vg, a data signal voltage Vd, a gate input voltage Va and a pixel voltage Vpix and a diagram showing variation of light transmittance of liquid crystal when TN liquid crystal is driven in the pixel circuit constituting the liquid crystal display device of this embodiment.

The construction of this embodiment is greatly different from that of the first embodiment in that the load element in the analog amplifier circuit of each pixel circuit constituting the liquid crystal display device 10-2 is constructed by an active element, that is, the analog amplifier circuit is constructed by an active load type analog amplifier circuit.

The different point resides in that the p-type MOS transistor of the analog amplifier circuit 104-1 of the first embodiment is constructed by a first p-type MOS transistor (Qp1) 302, and the load element is constructed by a second p-type MOS transistor (Qp2) 303.

Accordingly, the analog amplifier circuit of this embodiment operates as a source follower type analog amplifier circuit. The analog amplifier circuit of this embodiment is represented by 104-2.

At least one of the first p-type MOS transistor (Qp1) 302 and the second p-type MOS transistor (Qp2) 303 is an MOS transistor having a multi-gate structure, and the n-type MOS transistor (Qn) 103, the first p-type MOS transistor (Qp1) 302 and the second p-type MOS transistor (Qp2) 303 are constructed by p-SiTFT.

That is, the gate electrode of the first p-type MOS transistor (Qp1) 302 is connected to the other of the source electrode and the drain electrode of the n-type MOS transistor (Qn) 103 while one of the source electrode and the drain electrode is connected to a scan line 101, the gate electrode of the second p-type MOS transistor (Qp2) 303 is connected to a voltage holding capacitance electrode 105, the source electrode thereof is connected to a source power supply source 304, and the drain electrode thereof is connected to a pixel electrode 107.

The power to be supplied from the source power supply source 304 to the source electrode of the second p-type MOS transistor (Qp2) 303 is set so that the resistance value Rdsp between the source and drain of the second p-type MOS transistor (Qp2) is not more than the value of a resistance component which determines the response time constant of the liquid crystal 109.

That is, the value Rr of the resistor R1 in the equivalent circuit to the liquid, crystal shown in FIG. 73, the value Rsp of the resistor R2 in the equivalent circuit to the liquid crystal shown in FIG. 75 and the value Rdsp of the resistance between the source and the drain (hereinafter referred to as source-drain resistance") satisfy the following relationship represented by the equation (1).

$$\text{Rdsp} \leq Rr, \text{Rdsp} \leq Rsp \qquad (1)$$

For example, when the value Rsp of the resistor R2 is equal to 5 GΩ, a voltage VS at which the value Rdsp of the source-drain resistance does not exceed 1 GΩ is supplied from the source power supply source 304. The operating point of the second p-type MOS transistor (Qp2) 303 is set to the operating point shown in FIG. 6. In FIG. 6, a curved line is ideally drawn. In FIG. 6, eight curved lines when Vds is varied from −2 V to −14 V are drawn, and the positional relationship of the respective curved lines in FIG. 6 is the same as those of FIGS. 3 and 4.

For example, in the case of FIG. 6, the gate-source voltage (VCH-VS) of the second p-type MOS transistor (Qp2) is set to about −3 V. For example, the voltage holding capacitance voltage VCH of the voltage holding capacitance electrode 105 is set to 17 V, and the voltage VS of the source power supply source 304 is set to 20 V. As a result, the drain current of the second p-type MOS transistor (Qp2) 303 is equal to about 1E-8(=$10^{-8}$)(A), and the value Rdsp of the source-drain resistance is equal to 1 GΩ when the source-drain voltage Vdsp is equal to −10 V, By setting the value Rr of the resistor R1, the value Rsp of the resistor R2 and the value Rdsp of the source-drain resistance so as to satisfy the equation (1), at least one of the first p-type MOS transistor (Qp1) 302 and the second p-type MOS transistor (Qp2) 303 each of which is constructed by the MOS transistor having the multi-gate structure is operated in such an operating area as described above with respect to the first embodiment, that is, each single TFT equivalent to the MOS transistor having the multi-gate structure is operated in a voltage area (weak inversion area) where the dependence of Ids on Vds is slight.

Accordingly, at least the second p-type MOS transistor (Qp2) thus constructed operates in the weak inversion area, and acts as a bias current source.

That is, in the second p-type MOS transistor (Qp2) 303, the drain current is substantially constant even when the source-drain voltage Vdsp is varied from −2 V to −14 V. The second p-type MOS transistor (Qp2) 303 operates as a bias current source when the first p-type MOS transistor (Qp1) 302 is operated as the analog amplifier circuit 104-2.

Furthermore, like the operation state of the second p-type MOS transistor (Qp2) 303, the operation state of the first p-type MOS transistor (Qp1) 302 may be set to the same operation state as the second p-type MOS transistor (Qp2) 303 under use.

Still furthermore, only the operation state of the first p-type MOS transistor (Qp1) 302 may be set to the same operation state as the second p-type MOS transistor (Qp2) 303 under use.

The constructions of the parts other than the above parts of this embodiment are the same as the first embodiment. Therefore, the parts concerned are represented by the same reference numerals as the first embodiment, and the description thereof omitted. Accordingly, the liquid crystal display device of this embodiment which has the above different point is represented by 10-2, and the pixel circuit is represented by 20-2.

Next, the operation of this embodiment will be described with reference to FIGS. 7 to 14.

A method of driving the liquid crystal display 10-2 according to this embodiment is as follows.

FIG. 7 is a timing chart showing the gate scan voltage Vg, the data signal voltage Vd, the gate input voltage Va of the first p-type MOS transistor (Qp1) 302 and the pixel voltage Vpix and also shows variation of light transmittance of the liquid crystal in a normally black mode in which the liquid crystal 109 is kept dark under no voltage applied state in pixel circuit 20-2. The liquid crystal 109 is formed of high-response liquid crystal such as ferroelectric or antiferroelectric liquid crystal having polarization, OCB mode liquid crystal responding with one field period, or the like.

As shown in FIG. 7, during the horizontal scan period, the gate scan voltage Vg is set to high level VgH, whereby the n-type MOS transistor (Qn) 103 is set to ON state, and the data signal voltage Vd input to the signal line 102 is transferred to the gate electrode of the first p-type MOS transistor (Qp1) 302 via the n-type MOS transistor (Qn) 103. On the other hand, during the horizontal scan period, the gate scan voltage VgH is transferred through the first p-type MOS transistor (Qp1), whereby the pixel electrode 107 is set to reset state.

That is, when the pixel voltage Vpix is set to VgH during the horizontal scan period, the reset of the first p-type MOS transistor (Qp1) 302, that is, the transition of the first p-type MOS transistor (Qp1) 302 to the normally black state is simultaneously carried out.

After the horizontal scan period is finished, the first p-type MOS transistor (Qp1) 302 operates as the amplifier circuit portion of the source follower type analog amplifier circuit 104-2. This operation will be described hereunder.

When the horizontal scan period is finished and the gate scan voltage Vg is set to low level, the n-type MOS transistor (Qn) 103 is set to OFF state, and the data signal voltage Vd transferred to the gate electrode of the first p-type MOS transistor (Qp1) 302 is held in the voltage holding capacitor 106. At this time, the gate input voltage Va of the first p-type MOS transistor (Qp1) 302 undergoes a voltage shift called as a field through voltage via the gate-source capacitance of the n-type MOS transistor (Qn) 103 at the time when the n-type MOS transistor 103 is set to OFF state. This shift voltage is represented by Vf1, Vf2, Vf3 in FIG. 7, and the amount of the voltage shift Vf1 to Vf3 can be reduced by setting the value of the voltage holding capacitor 106 to a large value.

The gate input voltage Va of the first p-type MOS transistor (Qp1) 302 is held in the voltage holding capacitor 106 until during the next field period the gate scan voltage Vg is set to high level and the n-type MOS transistor (Qn) 103 is selected. On the other hand, the first p-type MOS transistor (Qp1) 302 has completed its reset during the horizontal scan period, and operates as the amplifier circuit portion of the source follower type analog amplifier circuit 104-2 having the pixel electrode 107 as the source electrode.

As described above, in order to make the first p-type MOS transistor (Qp1) 302 operate as the amplifier circuit portion of the analog amplifier circuit 104-2, a voltage higher than at least (Vdmax-Vtp) is kept to be supplied to the voltage holding capacitance electrode 105. Here, Vdmax represents the maximum value of the data signal voltage Vd, and Vtp represents a threshold voltage of the first p-type MOS transistor (Qp1) 302. The first p-type MOS transistor (Qp1) 302 can output the analog gradation voltage (pixel voltage Vpix) corresponding to the gate input voltage Va thus held until the gate scan voltage is set to VgH in the next field to reset it.

The active load type analog amplifier circuit 104-2 for outputting the pixel voltage Vlx as described above will be described in detail with reference to FIGS. 8 and 9.

FIG. 8 shows a measurement result of the gate input voltage-pixel voltage characteristic of the active load type analog amplifier circuit 104-2 constructed by two p-type MOS transistors of p-Si having the single gate structure, and FIG. 9 shows a measurement result of the gate input voltage-pixel voltage characteristic of the active load type analog amplifier circuit 104-2 constructed by two p-type MOS transistors of p-Si having the double gate structure.

Current Ids flowing in TFT is shown at the same time. The abscissa axis represents the gate input voltage (Va), the left ordinate axis represents the pixel voltage (Vpix) and the right ordinate axis represents current (Ids). The voltage is represented by only solid lines, and the current is represented by solid lines having marks. Furthermore, the measurement was made for two bias voltage voltages Vb, that is, the bias voltage Vb=13 V and the bias voltage Vb=14 V The bias voltage Vb is the voltage VCH supplied to the voltage holding capacitance electrode 105.

FIG. 8 shows the characteristic of the analog amplifier circuit constructed by two TFTs having the single structure. Each of TFT is designed to have a channel length of 6 microns and a channel width of 3 μm. Under the condition of Vb=13 V, the gate input voltage Va ranges from 2.8 V to 10.6 V in the range in which the relationship between the gate input voltage and the pixel voltage keeps linearity. At this time, the pixel voltage Vpix ranges from 5.8 V to 13.2 V, and the gain is equal to about 0.949.

Under the condition of Vb=14 V, linearity is kept under the condition that the gate input voltage Va=5.0 V to 11.6 V and the pixel voltage Vpix=7.2 V to 13 V, and the gain is equal to about 0.879. As described above, the voltage range which can be output with keeping linearity is equal to 7.4 V under the bias voltage Vb=13 V and 5.8 V under the bias voltage Vb=14 V.

FIG. 9 shows the characteristic of the analog amplifier circuit 104-2 constructed by two TFTs having the double gate structure. The size of each TFT is set so that the channel width is equal to 1.5 micron and the channel length of the sub TFT of the equivalent circuit is equal to 3 microns. Under the condition of Vb=14 V, the gate input voltage Va at which the relationship between the gate input voltage and the pixel voltage keeps linearity ranges from 0 V to 13 V. At this time, the pixel voltage Vpix ranges from 2.4 V to 14.8 V, and the gain is equal to about 0.954. Under the condition of the gate input voltage Vb=15 V, linearity is kept under the condition that the gate input voltage Va=0 V to 14.8 V and the pixel voltage Vpix=1.3 V to 15.6 V, and the gain is equal to about 0.966. As described above, the voltage range which can be output with keeping linearity is equal to 12.4 V under the bias voltage Vb of 14 V and also to 14.3 V under the bias voltage Vb of 14 V As is apparent from the result, the gain is enhanced, and the voltage range which can be output with keeping linearity is broadened about twice.

Furthermore, the relationship between the data signal voltage Vd and the light transmittance which is difficult to read in FIG. 7 will be described with reference to FIGS. 10 and 11. Both FIGS. 10 and 11 show the light transmittance when a voltage ranging from 0 V to 10.4 V is applied as the data signal voltage Vd.

In FIGS. 10 and 11, the ordinate axis represents light transmittance (%), and the ordinate axis represents the absolute value of the difference between the data signal voltage Vd and the intermediate voltage (Vc) of the data signal voltage Vd, that is, the amplitude (|Vd−Vc|). The data signal voltage Vd is represented as having positive polarity when the data signal voltage Vd is larger than the intermediate voltage Vc and as having negative polarity when the data signal voltage Vd is smaller than the intermediate voltage Vc. The light transmittance is represented by using values which are achieved under the state that the light transmittance is stabilized in each field with time lapse of the light transmittance of FIG. 7.

FIG. 10 shows a case where an MOS transistor having a single gate structure is used, and FIG. 11 shows a case where an MOS transistor having a double gate structure is used.

In the case of the single gate structure, since the gain of the analog amplifier circuit is low, the maximum light transmittance is equal to be slightly smaller than 94%, and to make matters worse, the light transmittance is greatly different between positive polarity and negative polarity because the input/output characteristic of the analog amplifier circuit is bad. This difference reaches 9% at maximum.

In the case of the double gate structure, since the gain of the analog amplifier circuit 104-2 is high, the maximum light transmittance is equal to 100%. Furthermore, the input/output characteristic of the analog amplifier circuit 104-2 has high linearity, and there is little difference in light transmittance between positive polarity and negative polarity, and the difference does not reach even 0.1%.

In the foregoing description, only the double structure is used as an example to achieve the effect of the multi-gate structure, however, it is clear that an excellent characteristic is achieved by using a multi-gate structure having a larger number of gates. However, when the multi-gate structure is applied to a light transmission type, it is required to be designed so as to suppress reduction of the aperture ratio.

In the double gate structure of this embodiment, the aperture ratio can be increased as compared with the normal single gate structure.

The reason will be described with reference to FIGS. 12 and 13. FIGS. 12 and 13 show the structure of single TFTs used in FIGS. 8 and 9, respectively. With respect to the TFTs under this condition, in the case of the channel length of 6 microns, the withstanding voltage is equal to 16V or more. However, in the case of the channel length of 3 microns, some TFTs are broken under application of 16V.

Therefore, the channel length of 3 microns cannot be used in the single gate structure. However, by adopting the double gate structure, TFTs having a small channel length such as 3 microns or the like can be used because only about 8V is applied to sub TFT.

As a result, TFT achieving the same function as FIG. 12 can be constructed by sub TFT having a small channel length as shown in FIG. 13. As is apparent from FIGS. 12 and 13, the occupation area of TFT is smaller in the double gate structure of FIG. 13, and thus the aperture ratio is enhanced.

Next, a case where TN liquid s driven by the pixel circuit 20-2 constituting the liquid crystal display device 10-2 shown in FIG. 5 in the normally white mode in which the TN liquid is kept to be light under no voltage application will be described.

FIG. 14 is a timing chart showing the gate scan voltage Vg, the data signal voltage Vd, the gate input voltage Va of the first p-type MOS transistor (Qp1) 302 and the pixel voltage Vpix and also shows variation of light transmittance of liquid crystal in this embodiment.

Figure 74:
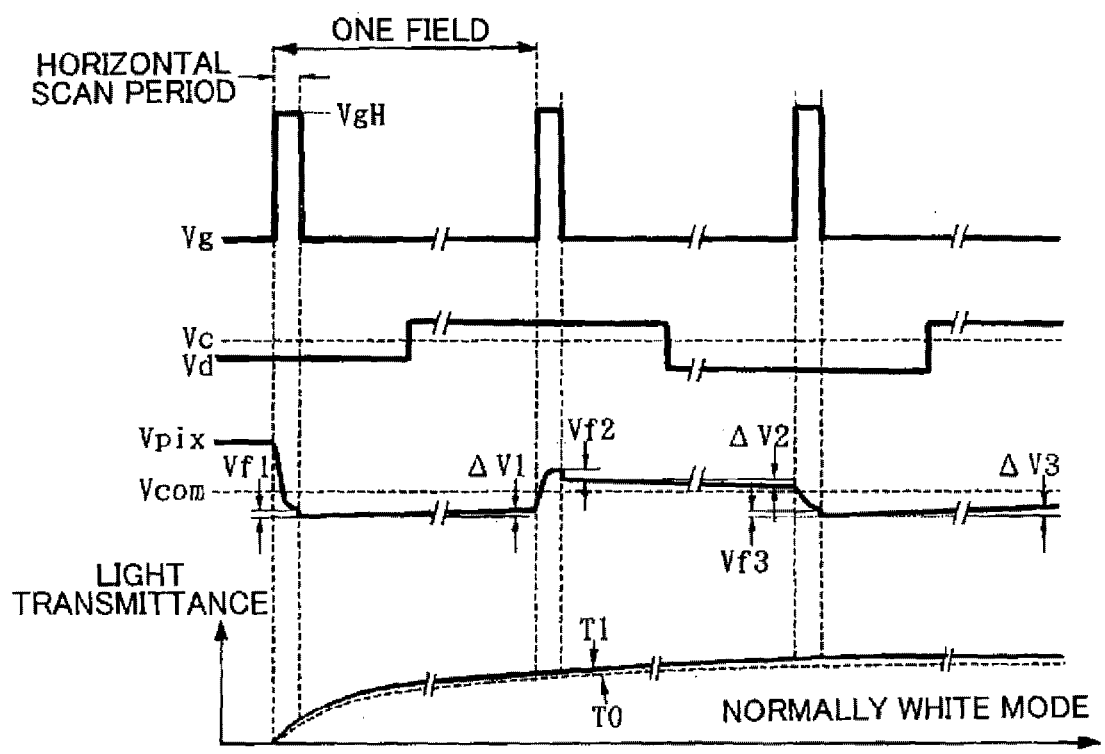
FIG. 74 is a timing chart when TN liquid crystal is driven in the conventional liquid crystal display device.

In this example, a signal voltage under which a light state is kept over several fields is applied as the data signal voltage Vd. The same driving method as shown in FIG. 7 is used. The display state of TN liquid transits to a light display state while taking the time corresponding to several fields as shown in FIG. 14 because its response time is equal to several tens sec to about 100 msec. During this period, molecules of the TN liquid are switched and the capacitance of the liquid crystal is varied. Therefore, in the conventional liquid crystal display device, the original light transmittance T0 of the liquid crystal cannot be achieved because the pixel voltage Vpix is varied as shown in FIG. 74.

On the other hand, in the liquid crystal display device 10-2 of this embodiment, the first p-type MOS transistor (Qp1) 302 operates as the amplifier circuit portion of the analog amplifier circuit 104-2, and thus it can continue to apply a fixed voltage to the liquid crystal 109 without being effected by the variation of the capacitance of the TN liquid crystal, so that the original light transmittance can be achieved and thus accurate gradation display can be performed.

That is, the pixel voltage Vpix and the light transmittance of the light crystal when TN liquid crystal is driven by the pixel circuit 20-2 are coincident with the pixel voltage Vpix and the light transmittance of the liquid crystal shown in FIG. 14.

Accordingly, in the case where TN liquid crystal is driven by the pixel circuit 20-2, substantially the same effect as the case where high-response liquid crystal is driven by the pixel circuit 20-2 is achieved.

As described above, according to the construction of this embodiment, the analog amplifier circuit 104-2 is constructed by the active load type analog amplifier circuit, and thus the dependence of Ids on Vds can be greatly reduced. Therefore, the variation of the gate-source voltage Vgs is slight.

Accordingly, linearity is achieved in the relationship between the gate input voltage and the pixel voltage of the analog amplifier circuit 104-2. Therefore, even when the data signal voltage Vd on the signal line 102 is varied every field, the pixel voltage Vpix applied from the analog amplifier circuit 104-2 to the pixel electrode 107 is substantially proportional to the data signal voltage Vd, and no reduction in gain of the pixel electrode 107 appears.

As described above, linearity is achieved in the relationship between the gate input voltage and the pixel voltage of the analog amplifier circuit 104-2, and the liquid crystal 109 is drive by the pixel voltage Vpix during the filed period after the horizontal scan period.

Accordingly, in the image display operation, even when the data signal voltage Vd is supplied and the pixel voltage Vpix substantially proportional to the data signal voltage Vd is applied to the crystal liquid 109, so that the electrostatic capacitance of the liquid crystal 109 is varied, or even when the data signal voltage Vd is changed every field or at the time when the period of plural fields has elapsed and the pixel voltage Vpix substantially proportional to the data signal voltage Vd is applied to the liquid crystal 109 to vary the electrostatic capacitance of the liquid crystal 109, so that Vds is varied, Ids is substantially fixed and thus the variation of the pixel voltage Vpix can be further reduced as comparison with the patent document described above.

As a result, the pixel voltage Vpix shown in FIG. 7, that is, the pixel voltage Vpix output from the analog amplifier circuit 104-2 is more enhanced in the linearity of the pixel voltage to the gate input voltage as compared with the patent document described above as shown in FIG. 9, and the pixel voltage Vpix can be applied to liquid crystal, so that more excellent gradation can be achieved every field as shown by the light transmittance of liquid crystal of FIG. 11.

Furthermore, by using the p-type MOS transistor having the double gate structure, a p-type MOS transistor having a short channel length can be used, so that the aperture ratio can be enhanced.

The liquid crystal display device of this embodiment is designed with keeping the above effect so that the scan voltage is used as the power supply source and reset power supply source of the first p-type MOS transistor (Qp1) 302 operating as the amplifier circuit portion of the analog amplifier 104-2, and the reset of the analog amplifier circuit 104-2 is carried out by the first p-type MOS transistor (Qp1) 302 itself. Therefore, wires and circuits such as power supply source wires, reset power supply source lines, reset switch, etc. are not needed, so that the analog amplifier circuit 104-2 can be constructed in a small area.

Third Embodiment

Figure 15:
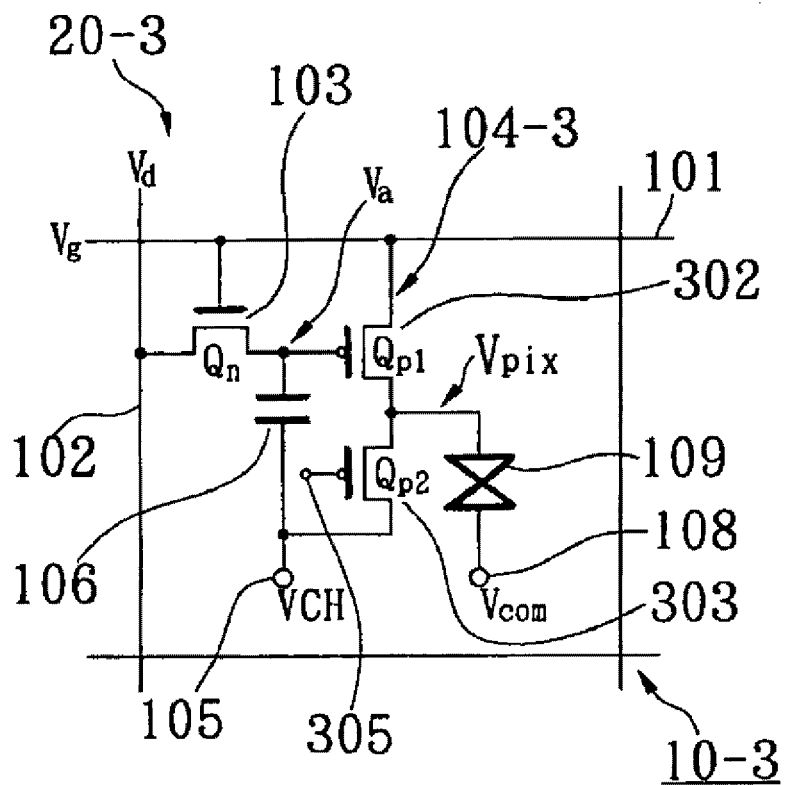
FIG. 15 is a diagram showing a pixel circuit constituting a liquid crystal display device according to a third embodiment of the present invention.

FIG. 15 is a diagram showing a pixel circuit constituting a liquid crystal display device according to a third embodiment of the present invention.

The construction of this embodiment is greatly different from that of the first embodiment in that a load element is constructed by an active element in the analog amplifier circuit of any pixel circuit constituting the liquid crystal display device, that is, the analog amplifier circuit is constructed as an active load type analog amplifier circuit.

The difference resides in that the p-type MOS transistor of the analog amplifier circuit 104-1 of the first embodiment is set as a first p-type MOS transistor (Qp1) 302, and a load element is set as a second p-type MOS type transistor (Qp2) 303.

That is, the gate electrode of the first p-type MOS transistor (Qp1) 302 is connected to any one of the source and drain electrodes of the n-type MOS transistor (Qn) 103, any one of the source and drain electrodes of the first p-type MOS transistor (Qp1) 302 is connected to the scan line 101, the gate electrode of the second p-type MOS transistor (Qp2) 303 is connected to the bias power supply source 305, the source electrode thereof is connected to the voltage holding capacitance electrode 05, and the drain electrode thereof is connected to the pixel electrode 107.

Furthermore, the bias voltage VB of the bias power supply source 305 to be supplied to the source electrode of the second p-type MOS transistor (Qp2) 303 is set to a voltage at which the value Rds of the source-drain resistance of the second p-type MOS transistor (Qp2) 303 is not more than the value of a resistance component which determines the response time constant of the liquid crystal 109.

Figure 73:
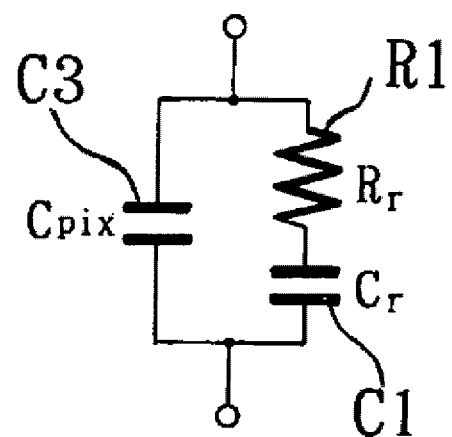
FIG. 73 is a diagram showing an equivalent circuit to TN liquid crystal.
Figure 75:
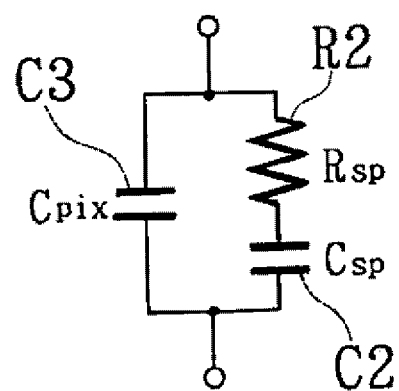
FIG. 75 is a diagram showing an equivalent circuit to high-response liquid crystal.
Figure 76:
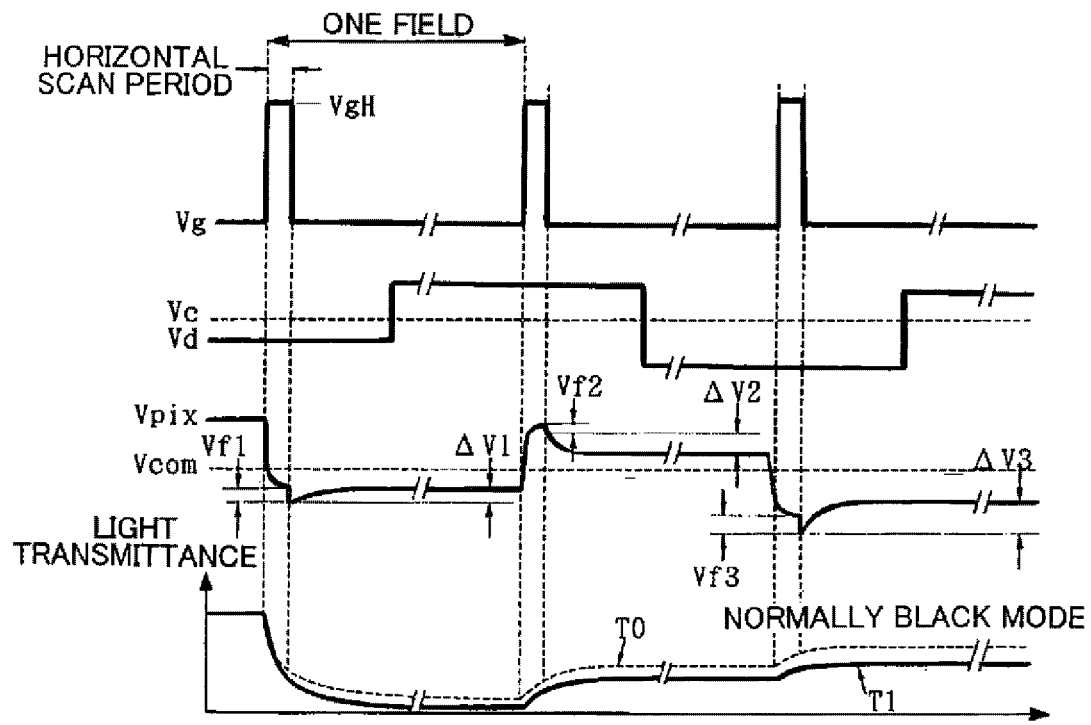
FIG. 76 is a timing chart when TN liquid crystal is driven in the conventional liquid crystal display device.
Figure 77:
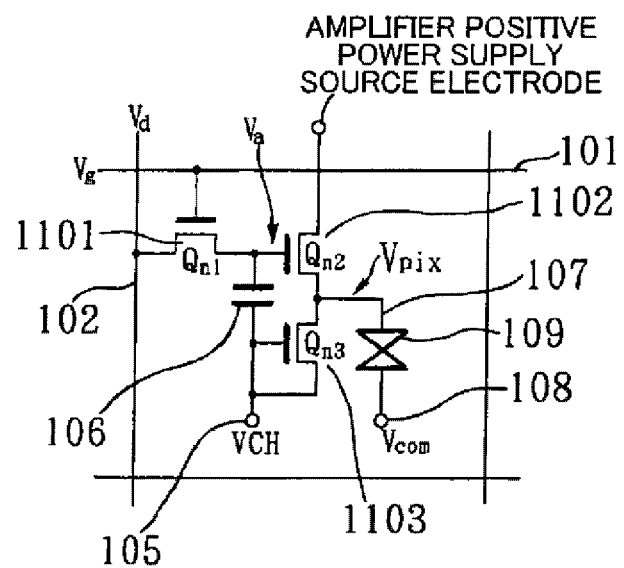
FIG. 77 is a diagram showing a second example of the pixel circuit constituting the conventional liquid crystal display device.

That is, the value Rr of the resistor R1 in the equivalent circuit of the liquid crystal shown in FIG. 73, the value Rsp of the resistor R2 in the equivalent circuit of the liquid crystal shown in FIG. 75 and the value Rdsp of the source-drain resistance are set to satisfy the equation (1).

For example, when the value Rsp of the resistor R2 is equal to 5 GΩ, a bias voltage VB at which the value Rdsp of the source-drain resistance does not exceed 1 GΩ is supplied from the bias power supply source 305. The drain current-gate input voltage characteristic and the operating point of the second p-type MOS transistor (Qp2) 303 are shown in FIG. 6. FIG. 6 represents an ideal characteristic.

As shown in FIG. 6, the gate-source voltage (VB-VCH) of the second p-type MOS transistor (Qp2) 303 is set to about −3 V. For example, the voltage holding capacitance voltage VCH is set to 20 V, and the bias voltage VB is set to 17 V. As a result, the drain current of the second p-type MOS transistor (Qp2) 303 is equal to about IE-8 (A), and the source-drain resistance Rdsp is equal to 1 GΩ when the source-drain voltage Vdsp is equal to −10 V.

As described above, the value Rr of the resistor R1, the value Rsp of the resistor R2 in the equivalent of liquid crystal and the value Rdsp of the source-drain resistor are set so as to satisfy the equation (1), whereby at least one of the first p-type MOS transistor (Qp1) 302 and the second p-type MOS transistor (Qp2) 303 each of which is constructed by the MOS transistor having the multi-gate structure is operated in the operation area described in the first embodiment, that is, each single TFT equivalent to the MOS transistor having the multi-gate structure is operated in the voltage area where the dependence of Ids on Vds is slight.

For example, the operation of the second p-type MOS transistor (Qp2) 303 is operated in the weak inversion area.

Accordingly, even when the source-drain voltage Vdsp is varied from −2 V to −14 V, the drain current is substantially constant. The second p-type MOS transistor (Qp2) 303 operates as a bias current source when the first p-type MOS transistor (Qp1) 302 is operated as the analog amplifier circuit 104-3. The analog amplifier circuit 104-3 operates in the weak inversion area or an area where the dispersion is small.

Furthermore, like the operation state of the second p-type MOS transistor (Qp2) 303, the operation state of the first p-type MOS transistor (Qp1) 302 may be set to the same operation state as the second p-type MOS transistor (Qp2) 303 during use.

Still furthermore, only the operation state of the first p-type MOS transistor (Qp1) 302 may be set to the same operation state as the second p-type MOS transistor (Qp2) 303 described above during use.

The constructions of the other parts of this embodiment than the above-described constructions are the same as the first embodiment. These same parts are represented by the same reference numerals, and the description thereof is omitted.

Accordingly, the liquid crystal display device having the above difference is represented by 10-3, and the pixel circuit is represented by 20-3.

Next, the operation of this embodiment will be described with reference to FIG. 15. The operation of this embodiment is the same as the driving method of the liquid crystal display device of the second embodiment described with reference to FIG. 5.

That is, the pixel voltage Vpix and the light transmittance of liquid crystal when high-response liquid crystal such as ferroelectric or antiferroelectric liquid crystal having polarization, OCB mode liquid crystal responding within one-field period or the like is driven by the pixel circuit 20-3 are the same as shown in FIG. 7, and the pixel voltage Vpix and the light transmittance of liquid crystal when TN liquid crystal is driven by the pixel circuit 20-3 are the same as shown in FIG. 14.

As described above, according to the construction of this embodiment, the analog amplifier circuit 104-3 is constructed as the active load type analog amplifier circuit, so that the dependence of Ids on Vds is greatly reduced and the variation of the gate-source voltage Vgs is slight.

Accordingly, linearity is achieved in the relationship between the gate input voltage and the pixel voltage of the analog amplifier circuit 104-3, and the pixel voltage Vpix is substantially proportional to the data signal voltage Vd, and no reduction appears in the gain of the pixel electrode 107.

Accordingly, in the image display operation, Vds is varied not only when the electrostatic capacity of the liquid crystal 109 is varied under application of the pixel voltage Vpix corresponding to the data signal voltage Vd, but also when the data signal voltage Vd is changed every field or at the time when the period of several fields has elapsed to drive the liquid crystal and the electrostatic capacity of the liquid crystal 109 is varied. However, even in these cases, Ids is substantially fixed, and thus the variation of the pixel voltage Vpix can be more reduced as compared with the patent document described above.

As a result, as indicated by the pixel voltage Vpix of FIG. 7, the pixel voltage Vpix (FIG. 9) under which the linearity of the gate input voltage-pixel voltage characteristic over one-field period can be more enhanced as compared with the patent document described above can be applied to the liquid crystal, and as indicated by the light transmittance of liquid crystal shown in FIG. 11, more excellent gradation can be achieved every field.

Furthermore, by using the p-type MOS transistor having the double gate structure, a p-type MOS transistor having a short channel length can be used, so that the aperture ratio can be increased.

The liquid crystal display device of this embodiment is designed with keeping the above effect so that the scan voltage is used as the power supply source and reset power supply source of the first p-type MOS transistor (Qp1) 302 operating as the amplifier circuit portion of the analog amplifier 104-3, and the reset of the analog amplifier circuit 104-2 is carried out by the first p-type MOS transistor (Qp1) 302 itself. Therefore, wires and circuits such as power supply source wires, reset power supply source lines, reset switch, etc. are not needed, so that the analog amplifier can be constructed in a small area:

Fourth Embodiment

Figure 16:
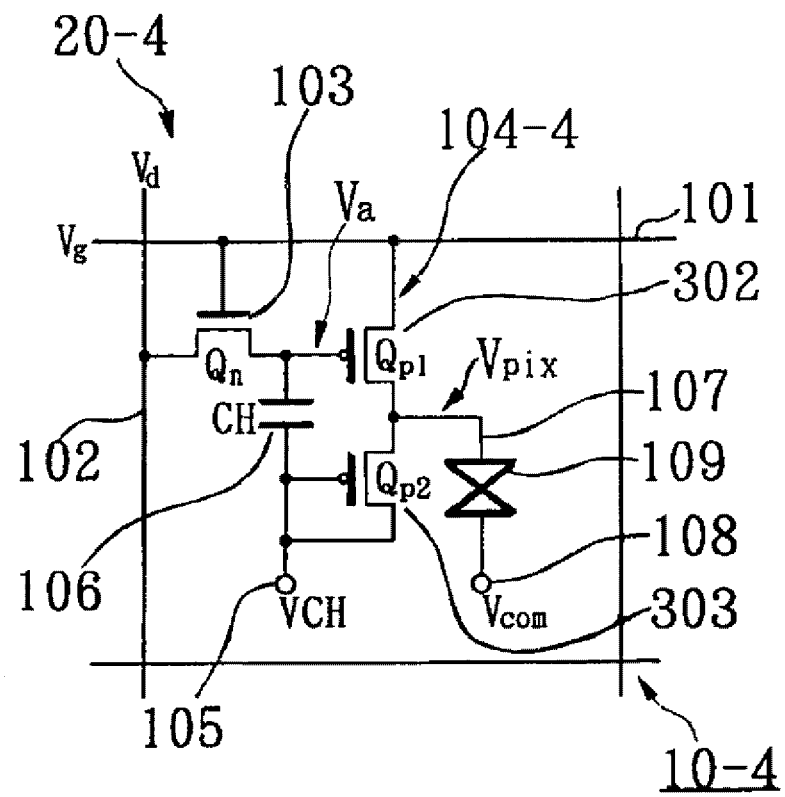
FIG. 16 is a diagram showing a pixel circuit constituting a liquid crystal display device according to a fourth embodiment of the present invention.
Figure 17:
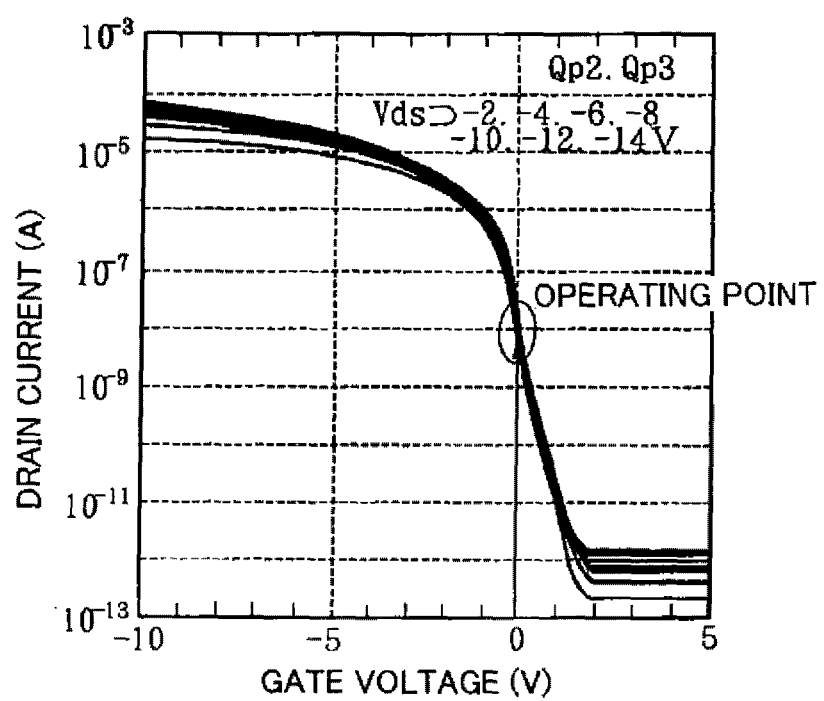
FIG. 17 is a diagram showing a drain current-gate input voltage characteristic curved line of a p-type MOS transistor having a double gate structure used in the liquid crystal display device of the fourth embodiment.

FIG. 16 is a diagram showing a pixel circuit constituting a liquid crystal display device according to a fourth embodiment of the present invention. FIG. 17 is a diagram showing the drain current-gate input voltage (in FIG. 17, the gate input voltage represents a gate-source voltage) characteristic of the p-type MOS transistor of the pixel circuit constituting the liquid crystal display device of this embodiment.

The great difference of the construction of this embodiment from that of the first embodiment resides in that the load element in the analog amplifier circuit of the pixel circuit constituting the liquid crystal display device is constructed by an active element, that is, the analog amplifier circuit is constructed as an active load type analog amplifier circuit.

The difference resides in that the p-type MOS transistor of the analog amplifier circuit 104-4 of the first embodiment is set as the first p-type MOS transistor (Qp1) 302 and the load element is set as the second MOS transistor (Qp2) 303 as in the case of the second and third embodiments.

That is, the gate electrode of the first p-type MOS transistor (Qp1) 302 is connected to any one of the source and drain electrodes of the n-type MOS transistor (Qn) 103, any one of the source and drain electrodes of the first p-type MOS transistor (Qp1) 302 is connected to the scan line 101, the gate and source electrodes of the second p-type MOS transistor (Qp2) 303 are connected to the voltage holding capacitance electrode 105, and the drain electrode is connected to the pixel electrode 107.

The first p-type MOS transistor (Qp1) 302 and the second p-type MOS transistor (Qp2) 303 operate as a source follower type analog amplifier circuit 104-4.

Both the gate and source electrodes of the second p-type MOS transistor (Qp2) 303 are connected to the voltage holding capacitance electrode 105, so that the gate-source voltage Vgsp of the second p-type MOS transistor (Qp2) is equal to 0V Under this bias condition, the threshold voltage of the second p-type MOS transistor (Qp2) 303 is controlled to be shifted to the positive side by channel dose so that the value Rdsp of the source-drain resistance of the second p-type MOS transistor (Qp2) 303 satisfies the equation (1).

FIG. 17 shows the drain current-gate input voltage characteristic and the operating point. In FIG. 17, eight curved lines are drawn in conformity with the variation of Vds from −2 V to −14 V, and the relationship of the respective curved lines is the same as those of FIGS. 3 and 4.

As shown in FIG. 17, when the gate-source voltage is equal to 0 V, the threshold voltage is controlled to be shifted to the positive side by the channel dose so that the drain current is equal to about 1E-8 (A). As a result, the drain current of the second p-type MOS transistor (Qp2) 303 is equal to about IE-8 (A), and the value Rdsp of the source-drain resistance is equal to 1 GΩ when the source-drain voltage Vdsp is equal to −10 V.

As described above, the value Rr of the resistor R1, the value Rsp of the resistor R in the equivalent of the liquid crystal and the value Rdsp of the source-drain resistance are set so as to satisfy the equation (1), whereby at least one of the first p-type MOS transistor (Qp1) 302 and the second p-type MOS transistor (Qp2) 303 each of which is constructed by an MOS transistor having the multi-gate structure is operated in the operation area as described in the first embodiment, that is, each single TFT equivalent to the MOS type transistor having the multi-gate structure is operated in the voltage area where the dependence of Ids on Vds is slight.

For example, the second p-type MOS transistor (Qp2) 303 is operated in the weak inversion area, and the drain current is kept substantially constant even when the source-drain voltage Vdsp is varied from −2 V to −14 V. The second p-type MOS transistor (Qp2) 303 operates as a bias current source when the first p-type MOS transistor (Qp1) 302 is operated as the amplifier circuit portion of the analog amplifier circuit 104-4.

Like the operation state of the second p-type MOS transistor (Qp2) 303, the operation state of the first p-type MOS transistor (Qp1) 302 may be set to the same operation state as the second p-type MOS transistor (Qp2) 303 during use.

Furthermore, only the operation state of the first p-type MOS transistor (Qp1) 302 may be set to the same operation state as the second p-type MOS transistor (Qp2) 303 described above during use.

According to this embodiment, the bias power supply source 304 needed in the second embodiment and the source power supply source 305 needed in the third embodiment are not needed, however, a channel dose step is further needed.

The constructions of the respective parts other than the above-described constructions are the same as the first embodiment. Therefore, the same parts are represented by the same reference numerals as the first embodiment, and the description thereof is omitted.

Accordingly, the liquid crystal display device having the above difference is represented by 10-4, and the pixel circuit is represented by 20-4.

Next, the operation of this embodiment will be described with reference to FIGS. 16 and 17.

The operation of this embodiment is the same as the driving method of the liquid crystal display devices according to the second embodiment and the third embodiment.

That is, the pixel voltage Vpix and the light transmittance of the liquid crystal when high-response liquid crystal such as ferroelectric or antiferroelectric liquid crystal having polarization, OCB mode liquid crystal responding within one field period or the like is driven by the pixel circuit 20-4, they are similar to the pixel voltage Vpix when the TN liquid crystal is driven by the pixel circuit 20-4 and the light transmittance of liquid crystal shown in FIG. 14, respectively.

As described above, according to this embodiment, the analog amplifier circuit 104-4 is constructed by an active load type analog amplifier circuit, so that the dependence of ids on Vd is greatly reduced, and the variation of the gate-source voltage Vgs is slight.

Accordingly, linearity is achieved in the relationship of the gate input voltage-pixel voltage of the analog amplifier circuit 104-4, the pixel voltage Vpix is substantially proportional to the data signal voltage Vd, and reduction in the gain of the pixel electrode 107 does not appear.

As described above, the linearity is achieved in the relationship between the gate input voltage and the pixel voltage of the analog amplifier circuit 104-4, and the liquid crystal 109 is driven by the pixel voltage Vpix during the field period concerned after the horizontal scan period is finished, that is, the pixel voltage Vpix output from the analog amplifier circuit 104-4 is applied to the pixel electrode 107 to drive the liquid crystal 109. Therefore, in the image display operation, even when the electrostatic capacitance of the liquid crystal 109 is varied under application of the pixel voltage Vpix corresponding to the data signal voltage Vd or the data signal voltage Vd is changed every field period or after lapse of the period of several fields to drive the liquid crystal and thus the electrostatic capacitance of the liquid crystal 109 is varied, so that Vds is varied within a permissible range, Ids is substantially kept constant and thus the variation of the pixel voltage Vpix can be more remarkably suppressed as compared with the patent document described above.

As a result, the pixel voltage Vpix can be applied to liquid crystal while the pixel voltage Vpix shown in FIG. 7, that is, the pixel voltage Vpix output from the analog amplifier circuit 104-4 is further enhanced in the linearity of the pixel voltage to the gate input voltage as compared with the patent document described above as shown in FIG. 9, so that more excellent gradation can be achieved every field as shown by the light transmittance of liquid crystal of FIG. 11.

Furthermore, use of the p-type MOS transistor having the double structure enables use of a p-type MOS transistor having a short channel length, so that the aperture ratio can be enhanced.

The liquid crystal display device of this embodiment is designed with keeping the above effect so that the scan voltage is used as the power supply source and reset power supply source of the first p-type MOS transistor (Qp1) 302 operating as the amplifier circuit portion of the analog amplifier 104-4, and the reset of the analog amplifier circuit 104-4 is carried out by the first p-type MOS transistor (Qp1) 302 itself. Therefore, wires and circuits such as power supply source wires, reset power supply source lines, reset switch, etc. are not needed, so that the analog amplifier circuit can be constructed in a small area.

Fifth Embodiment

Figure 18:
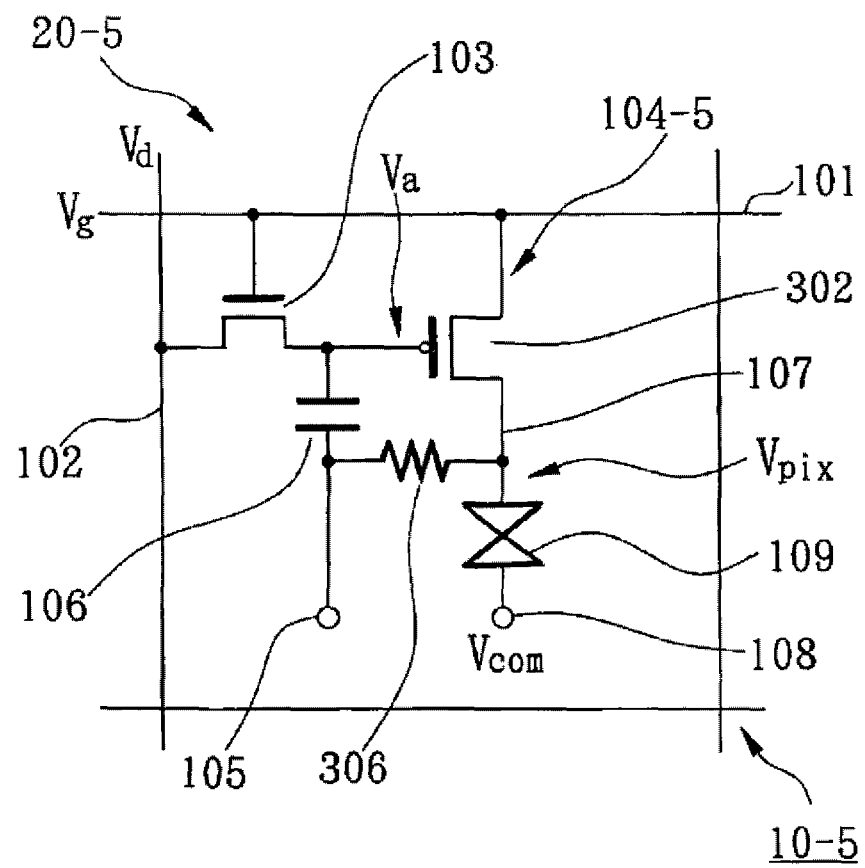
FIG. 18 is a diagram showing a pixel circuit constituting a liquid crystal display device according to a fifth embodiment of the present invention.
Figure 19:
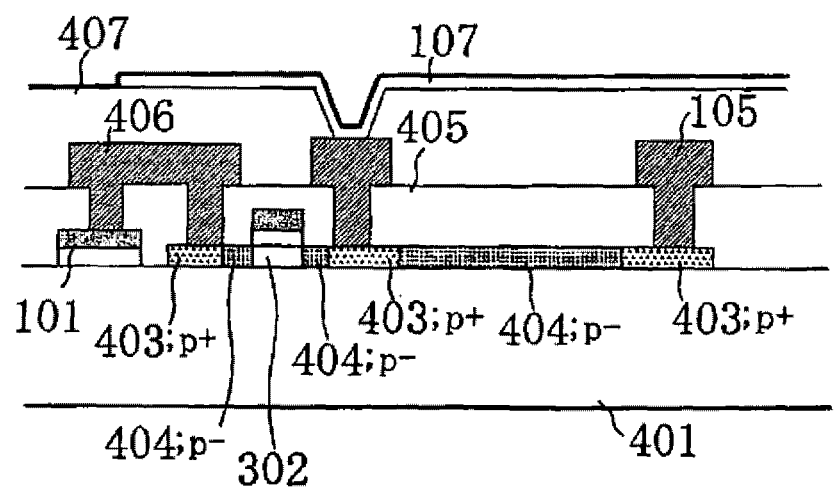
FIG. 19 is a diagram showing a first structure of a resistor constituting the pixel circuit of the liquid crystal display device of the fifth embodiment.
Figure 20:
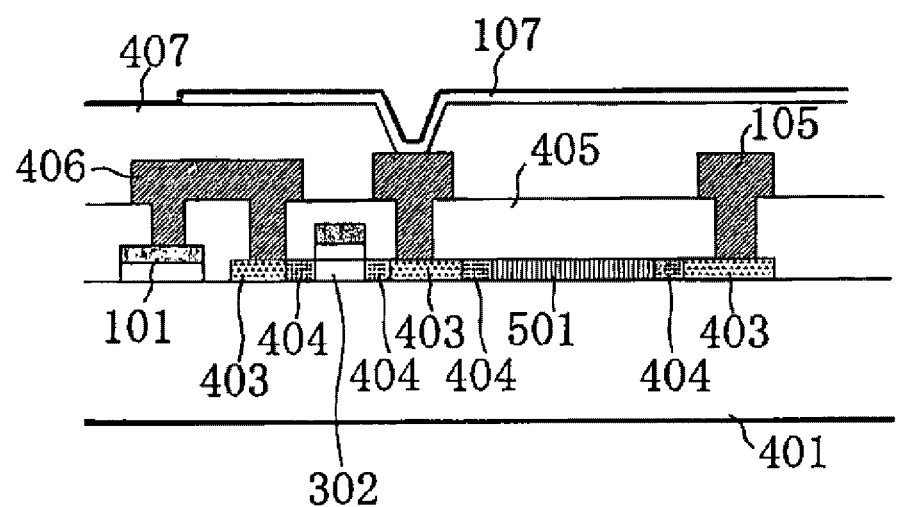
FIG. 20 is a diagram showing a second structure of a resistor constituting the pixel circuit of the liquid crystal display device of the fifth embodiment.
Figure 21:
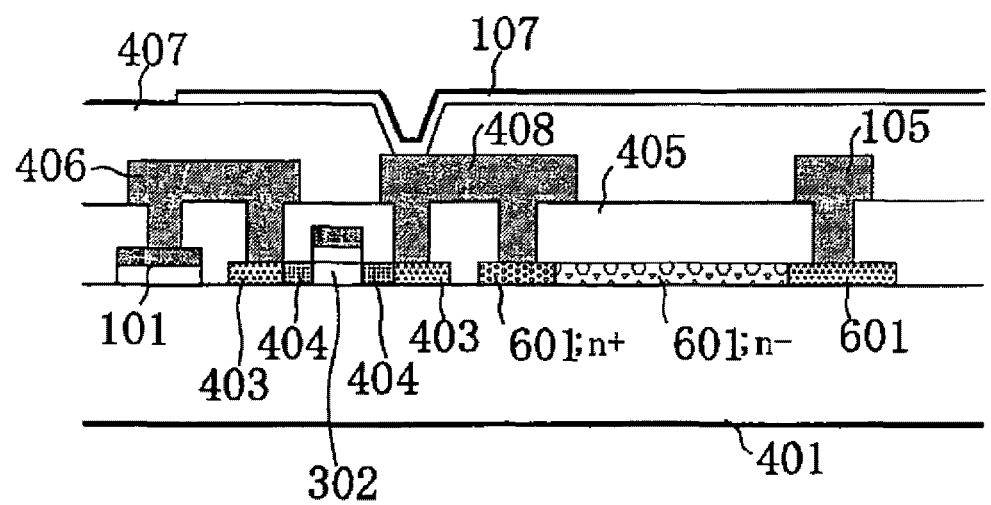
FIG. 21 is a diagram showing a third structure of a resistor constituting the pixel circuit of the liquid crystal display device of the fifth embodiment.
Figure 22:
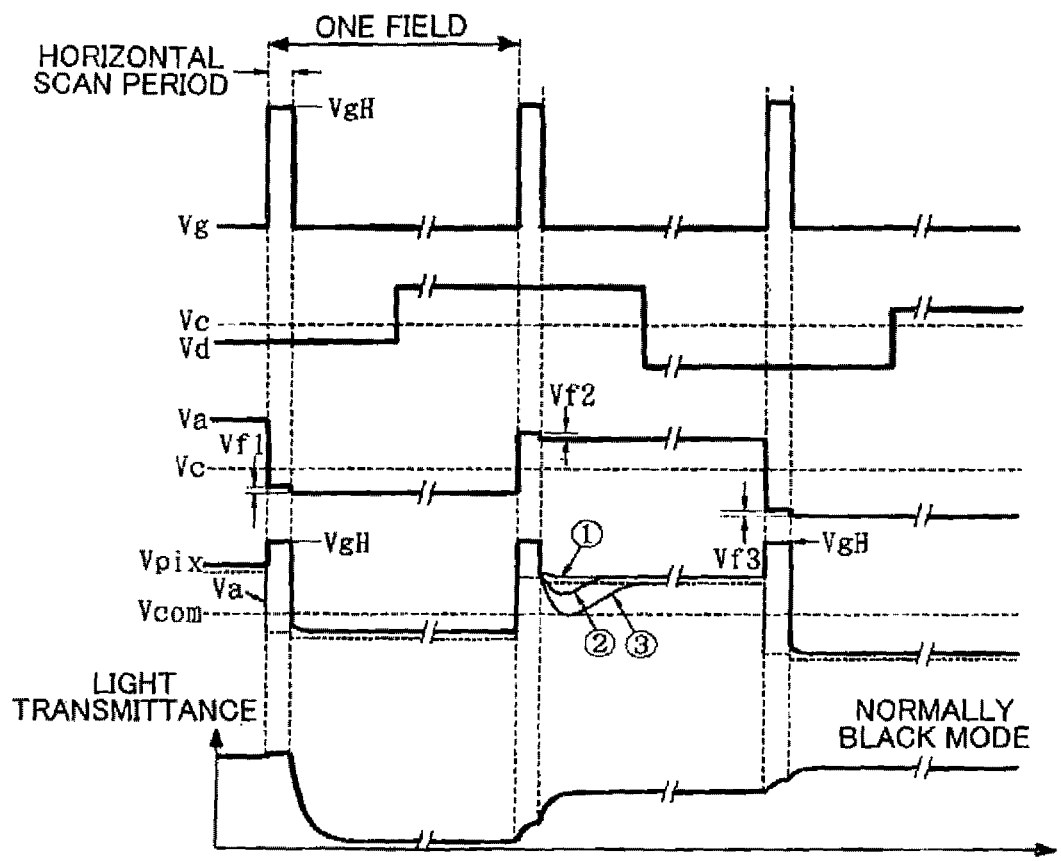
FIG. 22 is a timing chart for driving the liquid crystal display device of the fifth embodiment.

FIG. 18 is a diagram showing a pixel circuit constituting a liquid crystal display device according to a fifth embodiment of the present invention, FIG. 19 is a diagram showing a first structure of a resistor used in the pixel circuit of the liquid crystal display device of the fifth embodiment, FIG. 20 is a diagram showing a second structure of the resistor used in the pixel circuit of the liquid crystal display device of the fifth embodiment, FIG. 21 is a diagram showing a third structure of the resistor used in the pixel circuit of the liquid crystal display device of the fifth embodiment, and FIG. 22 is a timing chart showing the gate scan voltage Vg, the data signal voltage Vd, the amplifier input voltage Va and the pixel voltage Vpix and also shows the variation of the light transmittance of the liquid crystal when the value of the resistor of the pixel circuit constituting the liquid crystal display device of the fifth embodiment is varied.

The great difference of the construction of this embodiment from that of the first embodiment resides in that the load element in any analog amplifier circuit constituting the liquid crystal display device is constructed by a resistor, that is, the analog amplifier circuit is constructed as a passive load type analog amplifier circuit.

The difference resides in that the p-type MOS transistor of the analog amplifier circuit 104-1 is set as the p-type MOS transistor 302 and the load element is constructed by a resistor 306.

Accordingly, the analog amplifier circuit 104-4 comprising the p-type MOS transistor (Qp) 302 and the resistor 306 constitutes a source follower type analog amplifier circuit.

The p-type MOS transistor (Qp) 302 comprises an MOS type transistor having a multi-gate structure, and the n-type MOS transistor (Qn) 103 and the p-type MOS transistor (Qp) 302 are constructed by p-Si TFT.

That is, the gate electrode of the p-type MOS transistor 302 is connected to any one of the source and drain electrodes of the n-type MOS transistor (Qn) 103, any one of the source and drain electrodes of the p-type MOS transistor 302 is connected to the scan line 101, and one end of the resistor 306 is connected to the voltage holding capacitance electrode 105 while the other end of the resistor 306 is connected to the pixel electrode 107.

The value RL of the resistor 306 is set to be not more than the value of the resistance component which determines the response time constant of the liquid crystal. That is, the value Rr of the resistor R1 in the equivalent circuit of the liquid crystal shown in FIG. 73, the value Rsp of the resistor R2 in the equivalent circuit of the liquid crystal shown in FIG. 75 and the value RL of the resistor 306 are required to satisfy the following equation (2):

$$RL \leq Rr, RL \leq Rsp \quad (2)$$

For example, when the value Rsp of the resistor R2 is equal to about 5 GΩ, the value RL of the resistor 306 is set to about 1 GΩ. Large resistance of 1 GΩ which is not usable in normal semiconductor integrated circuits is formed by semiconductor thin film or semiconductor thin film doped with impurities.

FIG. 19 is a diagram showing a structure when lightly-doped p-type semiconductor thin film (p−). FIG. 19 also shows the structure of the p-type MOS transistor (p-type p-Si TFT) 302. As shown in FIG. 19, any one of the source and drain electrodes of the p-type p-SiTFT 302 is connected to the scan line 101, and the other electrode is connected to the pixel electrode 107. Here, the impurity doping amount, length and width at the p− layer 404 portion forming the resistor 303 are set so as to satisfy the condition represented by the equation (2). Furthermore, p-type p-SiTFT 302 has a lightly doped drain (hereinafter referred to as LDD) structure to increase the withstanding voltage, and a step of forming LDD of p-SiTFT 402 and a step of forming the resistor 306 (p−) are carried out at the same time in order to simplify the process. Reference numeral 403 in FIG. 19 represents a p+ region, and areas represented by 403, 404, 404, 403 attached from the left side to the right side in FIG. 19 constitute the p-type MOS transistor 303. 401 represents a glass substrate.

Next, FIG. 20 shows an example in which the resistor 303 is formed of semiconductor thin film (i-layer) 501 which is not doped with impurities. Here the length and width of the i-layer 501 forming the resistor 306 are set to satisfy the equation (2). Furthermore, when the i-layer 501 is used as the resistor 306, a lightly-doped p-type p−-layer 404 is formed between one of the source and drain electrodes (p+) 403 of the p-type MOS transistor 302 at one side thereof which is connected to the pixel electrode 107 and the i-layer 501 serving as the resistor 306. This is because when the p+-layer and the i-layer are brought into contact with each other, an extremely high Schottky resistor is formed and thus it is difficult to form a resistor satisfying the equation (2) in a small area. Likewise, the p−-layer 404 is formed between the p+-electrode 403 connected to the voltage holding capacitance electrode 105 and the i-layer 501. The other reference numerals are the same as FIG. 19.

Next, FIG. 21 shows a case where the resistor 306 is formed of lightly doped n-type semiconductor thin film (n−). Here, the impurity doping amount, length and width at the portion of the n− layer 602 constituting the resistor 306 are set so as to satisfy the equation (2). When any one of the source and drain electrodes P+ layer) 403 of the p-type p-SiTFT 302 and the n− layer 602 are connected to each other, the p+-layer 403 and the n+-layer 601 are connected to each other through a metal layer 408 as shown in FIG. 21, and the n+-layer 601 is brought into contact with the n—layer 602. The other reference numerals are the same as FIG. 19.

In the foregoing description, the resistor 306 shown in FIG. 18 is formed of semiconductor thin film or semiconductor thin film doped with impurities. However, any material can be applied insofar as it provides resistance satisfying the equation (2).

The constructions of the other parts than the above parts in this embodiment are the same as the first embodiment. The same parts are represented by the same reference numerals, and the description thereof is omitted.

Accordingly, the liquid crystal display device having the above difference is represented by 10-5, and the pixel circuit is represented by 20-5.

Next, the operation of this embodiment will be described with reference to FIGS. 18 to 22.

The method of driving the liquid crystal display device according to this embodiment is as follows.

The driving method for the liquid crystal display method of this embodiment is the same as the second embodiment, the third embodiment and the fourth embodiment. The same description made with reference to FIG. 7 is satisfied for the time charge of the gate scan voltage Vg, the data signal voltage Vd, the gate input voltage Va of the first p-type MOS transistor (Qp1) 302 and the pixel voltage Vpix and the variation of the light transmittance of liquid crystal when high-response liquid crystal such as ferroelectric or antiferroelectric having polarization, OCB mode liquid crystal responding within one-field period or the like is driven by the pixel circuit 20-5. Here, in the following example, the liquid crystal is assumed to be operated in the normally black mode in which it is kept under dark state under no voltage application.

The same description made with reference to FIG. 14 is also applied to the timing chart showing the gate scan voltage Vg, the data signal voltage Vd, the gate input voltage Va of the first p-type MOS transistor (Qp1) and the pixel voltage Vpix and the variation of the light transmittance of liquid crystal, when NT liquid crystal is driven by the pixel circuit 20-5.

Like the second to fourth embodiments, in this embodiment, the gate input voltage Va held in the voltage holding capacitor 106 during the present field period is applied to the liquid crystal 109 by the first p-type MOS transistor (Qp1) 302 of the analog amplifier 104-5. The application of the gate input voltage Va is continued until the gate scan voltage is set to VgH and reset is carried out in the next field, and the analog gradation voltage corresponding to the gate input voltage Va thus held can be output. The output voltage is varied in accordance with the transconductance gmp of the p-type MOS transistor and the value of the resistor 306, and approximately represented by the following equation.

$$V\text{pix} \approx Va - Vtp \quad (3)$$

Here, Vtp is normally a negative value, and thus Vpix is larger than Va by the absolute value of the threshold voltage of the first p-type MOS transistor (Qp1) 302.

Next, there will be described a case where TN liquid crystal is drive while the resistor 306 of the pixel circuit 20-5 constituting the liquid crystal display device 10-5 of this embodiment is varied. This example will be described with reference to FIG. 22.

FIG. 22 is a timing chart showing the gate scan voltage Vg, the data signal voltage Vd, the gate input voltage Va of the first p-type MOS transistor (Qp1) 302 and the pixel voltage Vpix and shows variation of the light transmittance of liquid crystal. NT liquid is assumed to be operated in the normally white mode in which it is kept to light state under no voltage application. In the following example, a signal voltage is applied as the data signal voltage Vd to keep the light state over several fields.

The same driving method as described with reference to FIG. 7 is used. TN liquid crystal has a response time ranging from about several tens msec to 100 msec, and thus the display state thereof transits to a light display state while taking the time corresponding to several fields. During this time period, the molecules of the TN liquid crystal are switched to induce variation of the liquid crystal capacitance. In the conventional liquid crystal display device, the pixel voltage Vpix is varied as shown in FIG. 74, and thus the original light transmittance of the liquid crystal cannot be achieved. On the other hand, in the liquid crystal display device 10-5 of this embodiment, the first p-type MOS transistor (Qp1) 302 operates as the amplifier circuit portion of the analog amplifier circuit 104-5, and a fixed voltage can be continued to be applied to the liquid crystal 109 without being effected by the variation of the capacitance of the TN liquid crystal. Therefore, the original light transmittance can be achieved, and accurate gradation display can be performed.

Next, there will be described variation of the pixel voltage Vpix when the value of the resistor 306 is varied in the liquid crystal display device according to this embodiment shown in FIG. 18.

FIG. 22 shows the variation of the pixel voltage Vpix when the value RL of the resistor 306 in FIG. 18 is varied with respect to the value Rsp of the resistor R2 of the liquid crystal of FIG. 75 like (1) Rsp/4, (2) Rsp and (3) 2×Rsp.

As shown in FIG. 22, when the value of the resistor 306 is larger than the resistance value Rsp of the RL liquid ((3)), the pixel voltage Vpix exhibits great variation in fields in which positive-polarity signals are written. On the other hand, when the value RL of the resistor 306 is not more than the liquid crystal resistance Rsp ((1), (2)), the pixel voltage Vpix varies little. When the value of the resistor 306 is equal to the value Rsp of the resistor R2 of the liquid crystal 109 ((2)), slight variation is observed. However, the variation period is extremely shorter than the one-field period and it has no effect on the gradation display control.

For the reason described above, the value RL of the resistor 303 in the liquid crystal display device 10-5 of this embodiment is set so as to satisfy the equation (2) described above. Actually, the value RL of the resistor 306 is settled in consideration of the variation of the pixel voltage Vpix and the power consumption. In order to reduce the power consumption, it is favorable that the value RL of the resistor 306 is set to be as large as possible to the extent that the variation of the pixel voltage Vpix does not affect the light transmittance.

As described above, like the second embodiment, according to the construction of this embodiment, the first p-type MOS transistor (Qp1) 302 having the double structure is used for the amplifier circuit portion of the analog amplifier circuit 104-5, so that the dependence of Ids on Vds is greatly reduced and there occurs no variation in the source-gate voltage Vgs.

Accordingly, linearity is achieved in the relationship between the gate input voltage and the pixel voltage of the analog amplifier circuit 104-5, and irrespective of the changing style of the data signal voltage Vd on the signal line 102 (every field or change at the time when the period of plural fields has elapsed) and even when the pixel voltage Vpix is applied from the analog amplifier circuit 104-5 through the pixel electrode 107 to the liquid crystal 109 and thus the electrostatic capacitance of the liquid crystal 109 is varied, the pixel voltage Vpix applied to the liquid crystal 109 is substantially proportional to the data signal voltage Vd data on the signal line 102, and no reduction appears in the gain of the pixel voltage applied to the pixel electrode 107.

The linearity is achieved in the gate input voltage-pixel voltage characteristic of the analog amplifier circuit 104-5. Therefore, in the case where the pixel voltage Vpix output from the analog amplifier circuit 104 is applied to the pixel electrode 107 to drive the liquid crystal 109 during the field period after the horizontal scan period, and the same driving operation is carried out on each pixel circuit to display an image, even if the data signal voltage Vd is changed or Vds is changed within a permissible range due to response of the liquid crystal 109 under the state that the data signal voltage Vd is changed, Ids is substantially kept constant, so that the variation of the pixel voltage Vpix can be further reduced as compared with the patent document described above. The light transmittance of the liquid crystal 109 and the gradation every field are also further enhanced as compared with the patent document described above.

As a result, like the waveform of the pixel voltage Vpix of FIGS. 7 and 14 in the second embodiment, the pixel voltage for which the linearity of the gate input voltage-pixel voltage characteristic is more enhanced over the one-field period as compared with the patent document described above can be applied to the liquid crystal, and more excellent gradation can be achieved every field as indicated by the light transmittance of the liquid crystal 109 as shown in FIG. 11.

Furthermore, by using the MOS transistor having the double gate structure, an MOS transistor having a short channel length can be used. Therefore, the aperture ratio can be enhanced.

The liquid crystal display device of this embodiment is designed with keeping the above effect so that the scan voltage is used as the power supply source and reset power supply source of the first p-type MOS transistor (Qp1) 302 operating as the amplifier circuit portion of the analog amplifier 104-5, and the reset of the analog amplifier circuit 104-5 is carried out by the first p-type MOS transistor (Qp1) 302 itself. Therefore, wires and circuits such as power supply source wires, reset power supply source lines, reset switch, etc. are not needed, so that the analog amplifier circuit 104-5 can be constructed in a small area and there can be achieved a remarkable effect to enhance the high aperture ratio.

Sixth Embodiment

Figure 23:
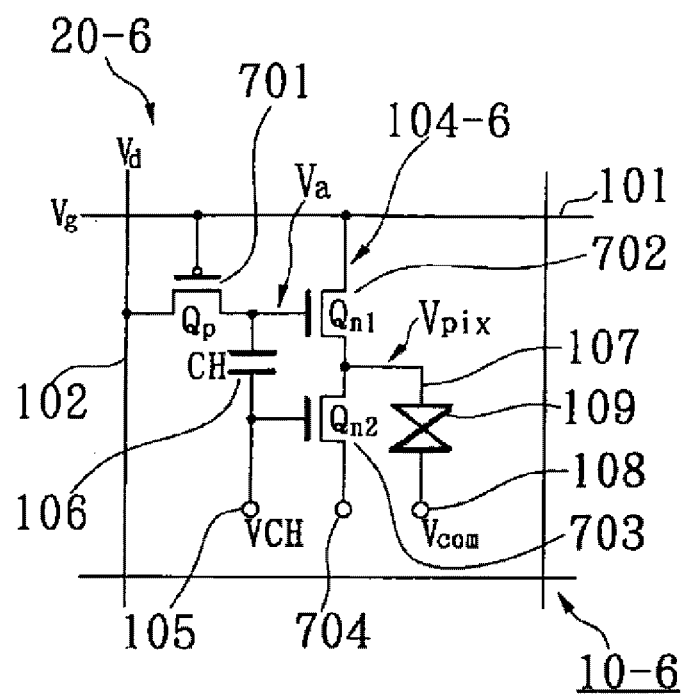
FIG. 23 is a diagram showing a pixel circuit constituting a liquid crystal display device according to a sixth embodiment of the present invention.
Figure 24:
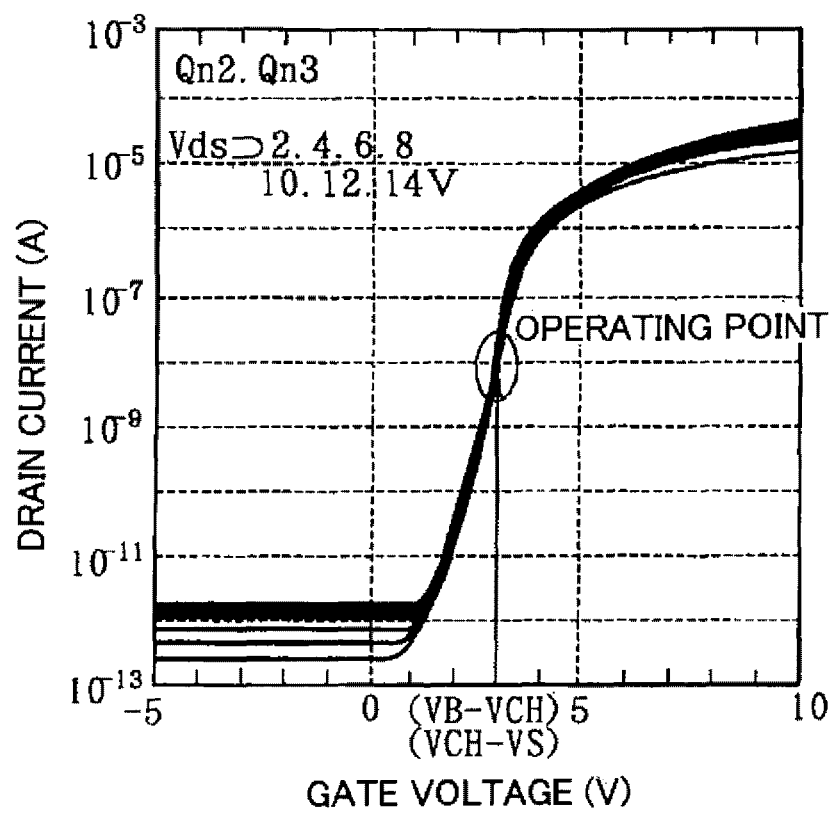
FIG. 24 is a diagram showing a drain current-gate input voltage characteristic curved line of an n-type MOS transistor having a double gate structure used in the liquid crystal display device of the sixth embodiment.
Figure 25:
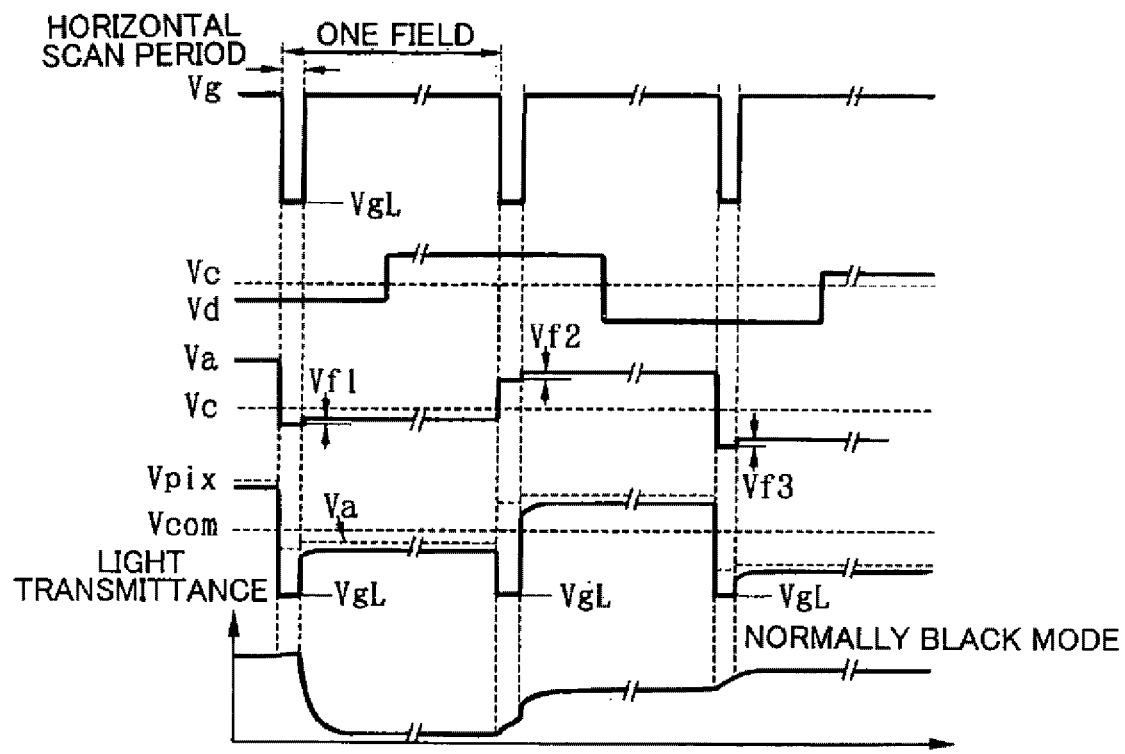
FIG. 25 is a timing chart when high-response liquid crystal is driven in the liquid crystal display device of the sixth embodiment.
Figure 26:
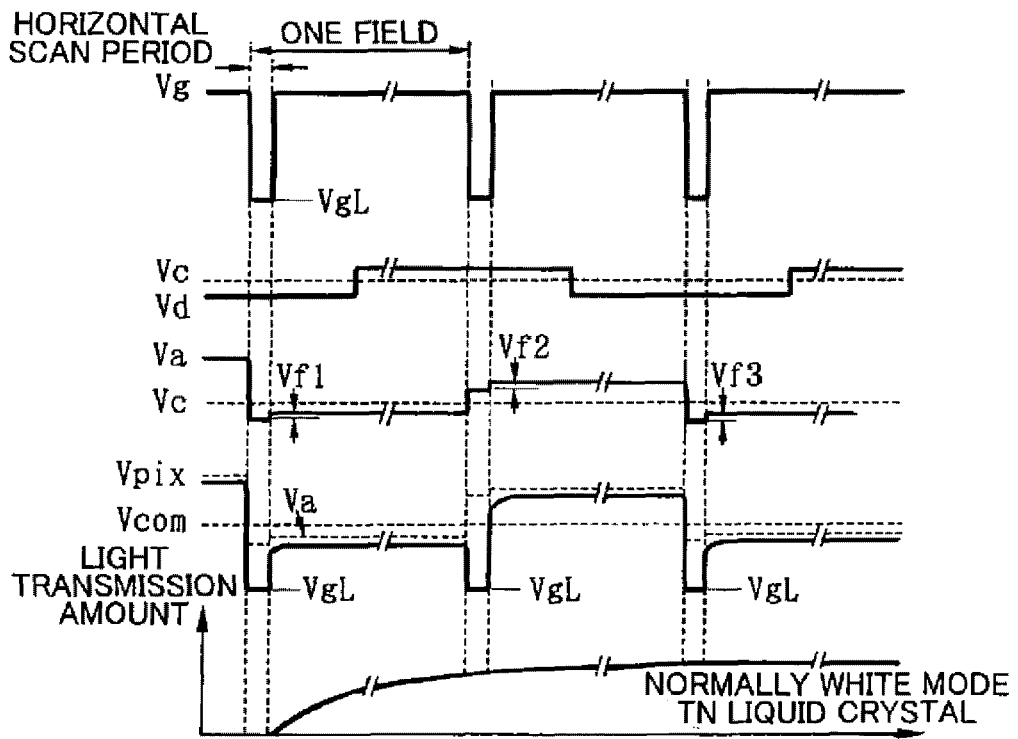
FIG. 26 is a timing chart when TN liquid crystal is driven in the liquid crystal display device of the sixth embodiment.

FIG. 23 is a diagram showing a pixel circuit constituting a liquid crystal display device according to a sixth embodiment of the present invention, FIG. 24 is a diagram showing a drain current-gate input voltage characteristic of a second p-type MOS transistor (Qp2) 703 of the pixel circuit constructed by the liquid crystal display device of FIG. 23 (the gate input voltage represents the gate-source voltage in FIG. 24), FIG. 25 is a timing chart showing the gate scan voltage Vg, the data signal voltage Vd, the gate input voltage Va and the pixel voltage Vpix and shows the variation of the light transmittance of liquid crystal when high-response liquid crystal is driven in the pixel circuit constituting the liquid crystal display device, and FIG. 26 is a timing chart showing the gate scan voltage Vg, the data signal voltage Vd, the gate input voltage Va and the pixel voltage Vpix and also shows the variation of the light transmittance of liquid crystal when NT liquid is driven in the pixel circuit constituting the liquid crystal display device.

The, construction of this embodiment is greatly different from that of the second embodiment in that the n-type MOS transistor 103 of the second embodiment is set as a p-type MOS transistor (Qp) 701, the first p-type MOS transistor (Qp1) 302 is set as a first n-type MOS transistor 702 and the second p-type MOS transistor 303 is set as a second n-type MOS transistor (Qn2) 703. This relationship is applied to seventh and eighth embodiments described later.

That is, the difference resides in that the gate electrode of the p-type MOS transistor (Qp) 701 is connected to the scan line 101, any one of the source and drain electrodes thereof is connected to the signal line 102, the gate electrode of the first n-type MOS transistor (Qn1) 702 is connected to the other of the source and drain electrodes of the p-type MOS transistor (Qp) 701, any one of the source and drain electrodes of the first n-type MOS transistor (Qn1) 702 is connected to the scan line 101, the other of the source and drain electrodes is connected to the pixel electrode 107, the gate electrode of the second n-type MOS transistor (Qn2) 703 is connected to the voltage holding capacitance electrode 105, the drain electrode thereof is connected to the pixel electrode 107, and the source electrode thereof is connected to the source electrode 704.

At least one of the first n-type MOS transistor (Qn1) 702 and the second n-type MOS transistor (Qn2) 703 is an n-type MOS transistor having a multi-gate structure, and the p-type MOS transistor (Qp) 701, the first n-type MOS transistor (Qn1) 702 and the second n-type MOS transistor (Qn2) 703 are constructed by p-Si TFT.

Furthermore, the source power supply source 704 supplies the source electrode of the second n-type MOS transistor (Qn2) 703 with a source voltage under which the value Rdsn of the source-drain resistance of the second n-type MOS transistor (Qn2) is not more than the value of the resistance component which determines the response time constant of the liquid crystal. That is, the value Rr of the resistor R1 in the equivalent circuit of the liquid crystal shown in FIG. 73, the value Rsp of the resistor R2 in the equivalent circuit of the liquid crystal shown in FIG. 75 and the value Rdsn of the source-drain resistor satisfy the relationship represented by the equation (4).

$$Rdsn \approx Rr, Rdsn \approx Rsp \qquad (4)$$

The voltage satisfying the above equation is supplied from the source power supply source 704 to the source electrode of the second p-type MOS transistor (Qp2) 703.

For example, when the value Rsp of the resistor R2 is equal to 5 GΩ, a source voltage VS under which the value Rdsn of the source-drain resistor does not exceed 1 GΩ is supplied form the source power supply source 704. The operating point of the second n-type MOS transistor (Qn2) 703 is the same as shown in FIG. 24. FIG. 24 is a diagram showing ideal curved lines. In FIG. 24, eight curved lines achieved by varying Vds from −2 V to −14 V are drawn. The positional relationship among the respective curved lines in FIG. 24 is the same as those of FIGS. 3 and 4.

That is, in this embodiment, the gate-source voltage (VCH-VS) of the second n-type MOS transistor (Qn2) 703 is set to about 3 V. For example, the voltage holding capacitance voltage VCH is set to 3 V, and VS is set to 0 V As a result, the drain current of the second n-type MOS transistor (Qn2) 703 is equal to about IE-8 (A), and the value Rdsn of the source-drain resistance is equal to 1 GΩ when the source-drain voltage Vdsn is equal to 10 V.

The second n-type MOS transistor (Qn2) 703 is an n-type MOS transistor having a multi-gate structure, and operated in the weak inversion area. That is, current Ids flowing in the second n-type MOS transistor (Qn2) 703 is little dependent on the source-drain voltage Vdsn applied to the n-type MOS transistor (Qn2) 703 (FIG. 24), so that the drain current is substantially fixed even when the source-drain voltage Vdsn is varied between 2 and 14 V. The second n-type MOS transistor (Qn2) 703 operates as a bias current source when the first n-type MOS transistor (Qn1) 702 is operated as an amplifier circuit portion of the analog amplifier circuit 104-6.

Both the first n-type MOS transistor (Qn1) 702 and the second n-type MOS transistor (Qn2) 703 may be formed of MOS transistors having the double gate structure. Furthermore, only the second n-type MOS transistor (Qn2) 703 may be formed of the MOS transistor having the double gate structure.

The constructions of the other parts than the above parts in this embodiment are the same as the second embodiment. Therefore, the same parts as the second embodiment are represented by the same reference numerals as the second embodiment, and the description thereof is omitted.

Accordingly, the liquid crystal display device having the above difference is represented by 10-6, and the pixel circuit is represented by 20-6.

Next, the operation of this embodiment will be described with reference to FIGS. 23 to 26.

FIG. 25 is a timing chart showing the gate scan voltage Vg, the data signal voltage Vd, the gate input voltage Va of the first n-type MOS transistor (Qn1) 702 and the pixel voltage Vpix and also shows the variation of the light transmittance of liquid crystal when high-response liquid crystal such as ferroelectric or antiferroelectric liquid crystal having polarization, OCB mode liquid crystal responding within the one-field period or the like is driven by the pixel circuit 20-6. Here, it is assumed that the display mode of the liquid crystal is set to the normally black mode in which the display thereof is kept dark under no voltage application.

As shown in FIG. 25, the gate scan voltage Vg is set to low level VgL during the horizontal scan period, whereby the p-type MOS transistor (Qp) 701 is kept to ON state and the data signal voltage Vd input to the signal line 102 is transferred through the p-type MOS transistor (Qp) 701 to the gate electrode of the first n-type MOS transistor (Qn1) 702. Furthermore, during the horizontal scan period, the gate scan voltage VgL is transferred through the first n-type MOS transistor (Qn1) 702 to the pixel electrode 107, whereby the pixel electrode 107 is shifted to the reset state.

That is, the pixel voltage Vpix is set to VgL during the horizontal scan period, whereby the reset of the first n-type MOS transistor (Qn1) 702, that is, the display switching to the normal black state can be simultaneously performed. The first n-type MOS transistor (Qn1) 702 operates as the amplifier circuit portion of the source follower type analog amplifier circuit 104-6 after the horizontal scan period is finished. This will be described as follows.

When the horizontal scan period is finished and the gate scan voltage Vg is set to high level, the p-type MOS transistor (Qp) 701 is set to OFF state, and the data signal voltage transferred to the gate electrode of the first n-type MOS transistor (Qn1) 702 is held in the voltage holding capacitor 106. At this time, the gate input voltage Va of the first n-type MOS transistor (Qn1) undergoes a voltage shift called as a field through voltage via the gate-source capacitance of the p-type MOS transistor (Qp) 701 at the time when the p-type MOS transistor (Qp) 701 is set to OFF state. This voltage shift is represented by Vf1, Vf2, Vf3 in FIG. 25, and the amount of the voltage shift Vf1 to Vf3 can be reduced by setting the value of the voltage holding capacitance 106 to a large value.

The gate input voltage Va of the first n-type MOS transistor (Qn1) 702 is held until the gate scan voltage Vg is set to low level again in the next field period and the p-type MOS transistor (Qp) 701 is selected.

On the other hand, the first n-type MOS transistor (Qn1) 702 has been already reset during the horizontal scan period, and it operates as the amplifier circuit portion of the source follower type analog amplifier circuit 104-6 with the pixel electrode 107 as a source electrode. In order to induce this operation, the voltage holding capacitance electrode 105 is supplied with a voltage lower than at least (Vdmin-Vtn) as a voltage at which the first n-type MOS transistor (Qn1) 702 is operated as the amplifier circuit portion of the analog amplifier circuit 104-6. Vdmin represents the minimum value of the data signal voltage Vd, and Vtn represents a threshold voltage of the first n-type MOS transistor (Qn1) 702.

The first n-type MOS transistor (Qn1) 702 can output the analog gradation voltage (pixel voltage) corresponding to the gate input voltage Va thus held until the gate scan voltage is set to VgL in the next field and it is reset.

The active load type analog amplifier circuit 104 which outputs the output voltage described above operates in the same manner as the described in detail with reference to FIGS. 8 to 11. Therefore, linearity is achieved between the gate input voltage Va and the analog gradation voltage (pixel voltage), the voltage range thereof is broad and also linearity is achieved between the data signal voltage Vd and the light transmittance.

Next, the driving method when TN liquid crystal 109 is used as the liquid crystal of the pixel circuit 20-6 of the liquid crystal display device will be described.

FIG. 26 is a timing chart showing the gate scan voltage Vg, the data signal voltage Vd, the gate input voltage Va of the first n-type MOS transistor (Qn1) 702 and the pixel voltage Vpix and also shows the variation of the light transmittance of liquid crystal at this time. Here, in this example, the liquid crystal 109 is operated in the normally white mode in which it is kept in bright state under no voltage application. Furthermore, in this example, a signal voltage under which the light display state is kept over several fields is applied as the data signal voltage Vd. The same driving method as FIG. 25 is used.

Since TN liquid crystal has a response time from several tens msec to about one hundred msec, it transmits to the light display state while taking the time corresponding to several fields as shown in FIG. 26. During this period, the molecules of TN liquid are switched to vary the liquid crystal capacitance. Therefore, in the conventional liquid crystal display device, the pixel electrode Vpix is varied as shown in FIG. 74, and thus the original light transmittance T0 of the liquid crystal cannot be achieved.

On the other hand, the liquid crystal display device 10-6 of this embodiment is designed so that the first n-type MOS transistor (Qn1) 702 operates as the amplifier circuit portion of the analog amplifier circuit 104-6, and the second n-type MOS transistor (Qn2) 702 is operated in a voltage area where Ids has substantially no dependence on Vds, that is, in the weak inversion area. Therefore, even when the TN liquid crystal is driven and the capacitance thereof is varied, the pixel voltage Vpix which is substantially proportional to the data signal voltage Vd can be applied to the liquid crystal 109 every field without being affected by the variation of the capacitance of the TN liquid, so that the original light transmittance can be achieved and images can be displayed with accurate gradation.

As described above, according to the construction of this embodiment, the first p-type MOS transistor (Qp1) 302 and the second p-type MOS transistor (Qp2) 303 of the second embodiment are altered to the first n-type MOS transistor (Qn1) 702 and the second n-type MOS transistor (Qn2) 703 to construct the analog amplifier circuit 104-6, and in connection with this alteration, the polarities of the voltages needed to operate the first and second n-type MOS transistors 702, 703 are changed, whereby there can be achieved the same effects as the second embodiment, that is, the effect that the pixel voltage Vpix substantially proportional to the data signal voltage Vd can be applied to the liquid crystal 109, and thus the effect that more excellent gradation can be achieved and the aperture ratio can be more enhanced as compared with the patent document.

The liquid crystal display device of this embodiment is designed with keeping the above effect so that the scan voltage is used as the power supply source and reset power supply source of the first n-type MOS transistor (Qn1) 702 operating as the amplifier circuit portion of the analog amplifier 104-6, and the reset of the analog amplifier circuit 104-6 is carried out by the first p-type MOS transistor (Qn1) 702 itself. Therefore, wires and circuits such as power supply source wires, reset power supply source lines, reset switch, etc. are not needed, so that the analog amplifier circuit 104-6 can be constructed in a small area and there can be achieved a remarkable effect to enhance the high aperture ratio as the second embodiment.

Seventh Embodiment

Figure 27:
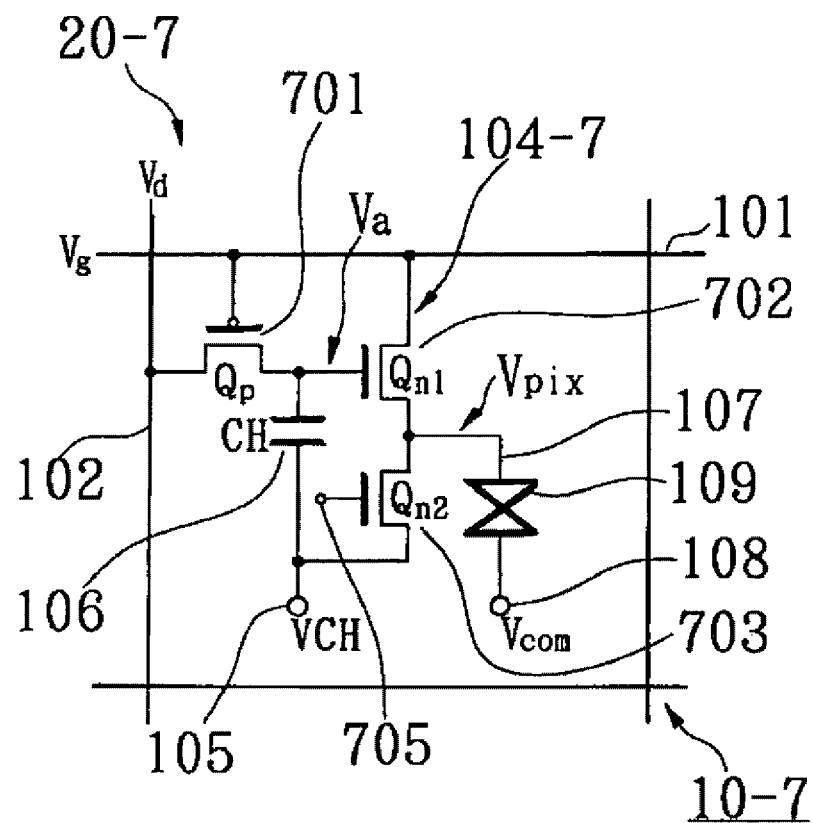
FIG. 27 is a diagram showing a pixel circuit constituting a liquid crystal display device according to a seventh embodiment of the present invention.

FIG. 27 is a diagram showing a pixel circuit constructed by a liquid crystal display device according to a seventh embodiment of the present invention.

The construction of this embodiment is greatly different from the construction of the third embodiment in that the n-type MOS transistor (Qn) 103 of the third embodiment is set as the p-type MOS transistor (Qp) 701 and the first p-type MOS transistor (Qp1) 302 is set as the first n-type MOS transistor (Qn1) 702 and the second p-type transistor (Qp2) 303 is set as the second n-type MOS transistor (Qn2) 703.

That is, the difference resides in that the gate electrode of the p-type MOS transistor (Qp) 701 is connected to the scan line 101, any one of the source and drain electrodes thereof is connected to the signal line 102, the gate electrode of the first n-type MOS transistor (Qn1) is connected to the other of the source and drain electrodes of the p-type MOS transistor (Qp) 701, any one of the source and drain electrodes of the first n-type MOS transistor (Qn1) 702 is connected to the scan line 101, the other of the source and drain electrodes is connected to the pixel electrode 107, the gate electrode of the second n-type MOS transistor (Qn2) 703 is connected to the bias power supply source 705, the drain electrode of the second n-type MOS transistor (Qn2) 703 is connected to the pixel electrode 107, and the source electrode of the second n-type MOS transistor (Qn2) 703 is connected to the voltage holding capacitance electrode 105.

At least one of the first n-type MOS transistor (Qn1) 702 and the second n-type MOS transistor (Qn2) 703 is an n-type MOS transistor having a multi-gate structure, and the p-type MOS transistor (Qp) 701, the first n-type MOS transistor (Qn1) 702 and the second n-type MOS transistor (Qn2) 703 are constructed by p-Si TFT.

The bias power supply source 705 to be supplied to the gate electrode of the second n-type MOS transistor (Qn2) 703 is set so that the source-drain resistance Rdsn of the second n-type MOS transistor (Qn2) 703 is not more than the value of the resistance component which determines the response time constant of the liquid crystal. That is, the value Rr in the equivalent circuit of the liquid crystal shown in FIG. 73, the value Rsp of the resistor R2 in the equivalent circuit of the liquid crystal shown in FIG. 75 and the value Rdsn of the source-drain resistance satisfy the relationship represented by the following equation (5).

$$Rdsn \approx Rr, Rdsn \approx Rsp \qquad (5)$$

For example, when the value Rsp of the resistor R2 is equal to 5 GΩ, a bias voltage VB under which the value Rdsn of the source-drain resistance does not exceed 1 GΩ is supplied from the bias power supply source 705 to the gate electrode of the second n-type MOS transistor (Qn2) 703. FIG. 24 shows the operating point of the drain current-gate input voltage characteristic of the second n-type MOS transistor (Qn2) 703. In the example of FIG. 24, the gate-source voltage (VB-VCH) of the second n-type MOS transistor (Qn2) 703 is set to about 3 V.

For example, the voltage holding capacitance voltage VCH is set to 0V, and the voltage VB of the gate electrode is set to 3V. As a result, the drain current of the second n-type MOS transistor (Qn2) 703 is equal to about IE-8 (A), and the value Rdsn of the source-drain resistance is equal to 1 GΩ when the source-drain voltage Vdsn is equal to 10V. The second n-type MOS transistor (Qn2) 703 operates in the weak inversion area.

That is, since the current Ids flowing in the second n-type MOS transistor (Qn2) 703 has substantially no dependence on the source-drain voltage Vdsn applied to the n-type MOS transistor (Qn2) 703 (FIG. 24), the drain current is substantially fixed even when the source-drain voltage Vdsn is varied from 2 to 14 V. The second n-type MOS transistor (Qn2) 703 operates as a bias current source when the first n-type MOS transistor (Qn1) 702 is operated as the amplifier circuit portion of the analog amplifier circuit.

The constructions of the parts other than the above parts in this embodiment are the same as the third embodiment. Therefore, the same parts are represented by the same reference numerals as the third embodiment, and the description thereof is omitted.

Accordingly, the liquid crystal display device having the above difference is represented by 10-7, and the pixel circuit is represented by 20-7.

Next, the operation of this embodiment will be described with reference to FIG. 27.

The driving method of this embodiment is the same as the seventh embodiment. That is, the pixel voltage Vpix and the light transmittance of liquid crystal when high-response liquid crystal such as ferroelectric or antiferroelectric liquid crystal having polarization, OCB mode liquid crystal responding within the one-field period or the like is driven by the pixel circuit 20-7 are the same as shown in FIG. 25, and the pixel voltage Vpix and the light transmittance of the liquid crystal are the same as shown in FIG. 26.

As described above, according to the construction of this embodiment, the first p-type MOS transistor (Qp1) 302 and the second p-type MOS transistor (Qp2) 303 of the third embodiment are altered to first n-type MOS transistor (Qn1) 702 and the second n-type MOS transistor (Qn2) 703 to construct the analog amplifier circuit 104-7, and in connection with this alteration, the polarities of the voltages needed to operate the first and second n-type MOS transistors 702, 703 are changed to achieve the same effects as the third embodiment, that is, the effect that the pixel voltage Vpix which is substantially-proportional to the data signal voltage Vd can be applied to the liquid crystal 109, so that more excellent gradation can be achieved every field as compared with the patent document and the effect that the aperture ratio can be more enhanced.

The liquid crystal display device of this embodiment is designed with keeping the above effect so that the scan voltage is used as the power supply source and reset power supply source of the first p-type MOS transistor (Qp1) 702 operating as the amplifier circuit portion of the analog amplifier 104-7, and the reset of the analog amplifier circuit 104-7 is carried out by the first n-type MOS transistor (Qp1) 702 itself. Therefore, wires and circuits such as power supply source wires, reset power supply source lines, reset switch, etc. are not needed.

Furthermore, the analog amplifier circuit 104-7 can be constructed in a small area, and there can be achieved the same level of high aperture ratio as the third embodiment.

Eighth Embodiment

Figure 28:
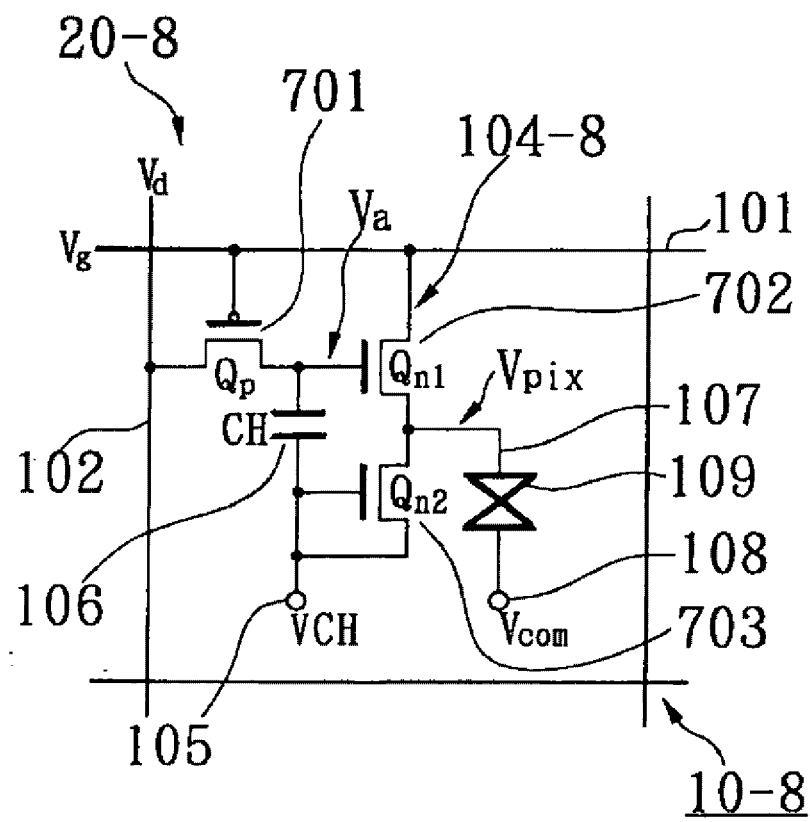
FIG. 28 is a diagram showing a pixel circuit constituting a liquid crystal display device according to an eighth embodiment of the present invention.
Figure 29:
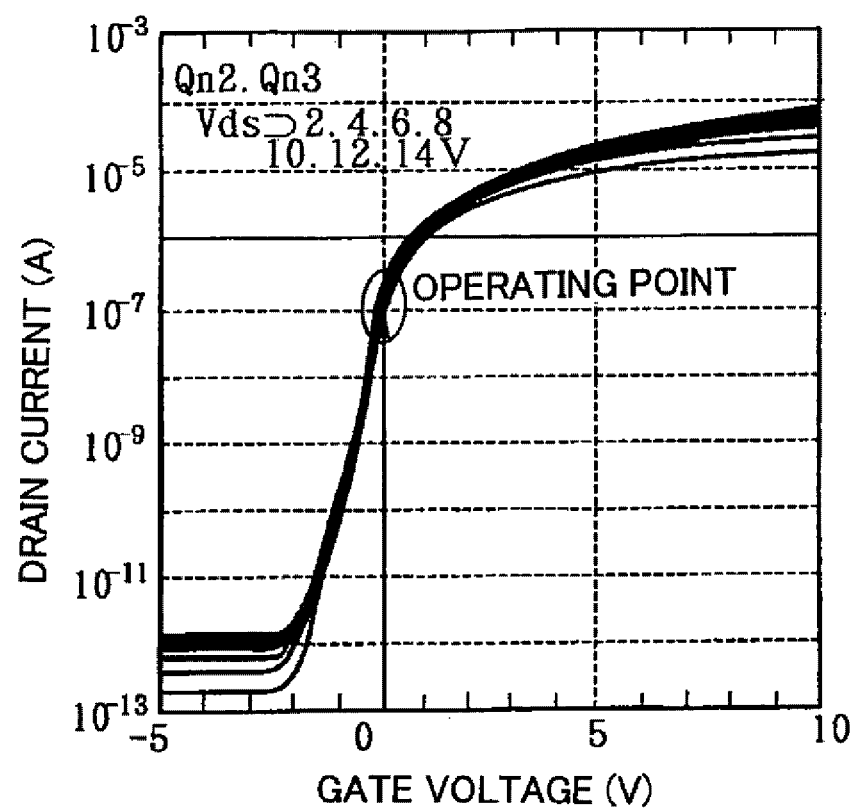
FIG. 29 is a drain current-gate input voltage characteristic curved line of an n-type MOS transistor having a double gate structure used in the liquid crystal display device of the eighth embodiment.

FIG. 28 is a diagram showing a pixel circuit constituting a liquid crystal display device according to an eighth embodiment of the present invention, and FIG. 29 is a diagram showing a drain current-gate input voltage (in FIG. 29, the gate input voltage represents a gate-source voltage) characteristic of the second n-type MOS transistor (Qn2) 703 of the pixel circuit constituting the liquid crystal display device of this embodiment.

The construction of this embodiment is greatly different from that of the fourth embodiment in that the n-type MOS transistor (Qn) 103 of the fourth embodiment is set as a p-type MOS transistor (Qp) 701, the first p-type MOS transistor (Qp1) 302 is set as a first n-type MOS transistor (Qn1) 702, the second p-type MOS transistor (Qp2) 303 is set as a second n-type MOS transistor (Qn2) 703.

That is, the difference resides in that the gate electrode of the p-type MOS transistor (Qp) 701 is connected to the scan line 101, any one of the source and drain electrodes is connected to the signal line 102, the gate electrode of the first n-type MOS transistor (Qn1) 702 is connected to the other of the source and drain electrodes of the p-type MOS transistor (Qp) 701, any one of the source and drain electrodes of the first n-type MOS transistor (Qn1) 702 is connected to the scan line 101, and the other of the source and drain electrodes thereof is connected to the pixel electrode 107, the drain electrode of the second n-type MOS transistor (Qn2) 703 is connected to the pixel electrode 107, and the gate electrode and the source electrode are connected to the voltage holding capacitance electrode 105.

At least one of the first n-type MOS transistor (Qn1) 702 and the second n-type MOS transistor (Qn2) 703 comprises an n-type MOS transistor having a multi-gate structure, and the p-type MOS transistor (Qp) 701, the first n-type MOS transistor (Qn1) 702 and the second n-type MOS transistor (Qn2) 703 are constructed by p-Si TFT.

Furthermore, both the gate electrode and the source electrode of the second n-type MOS transistor (Qn2) 703 are connected to the voltage holding capacitance electrode 105, so that the gate-source voltage Vgsn of the second n-type MOS transistor (Qn2) 703 is equal to 0V.

Under this bias condition, the threshold voltage of the second n-type MOS transistor (Qn2) 703 is controlled to be shifted to the negative side by channel dose so that the value Rdsn of the source-drain resistance of the second n-type MOS transistor (Qn2) 703 satisfies the equation (4). FIG. 29 shows the drain current-gate input voltage characteristic and operating point of the second n-type MOS transistor (Qn2) 703. FIG. 29 is a diagram showing ideally drawn curves. In FIG. 29, eight curved lines achieved by varying Vds from −2 V to −14 V are drawn, and the positional relationship of the respective curved lines in FIG. 29 is the same as FIGS. 3 and 4.

As shown in FIG. 29, the threshold voltage is controlled to be shifted to the negative side by channel dose so that the drain current is equal to about 1E-8(A) when the gate-source voltage is equal to 0V As a result, the drain current of the second n-type MOS transistor (Qn2) 703 is equal to about 1E-8 (A), and the value Rdsn of the source-drain resistance is equal to 1 GΩ.

The second n-type MOS transistor (Qn2) 703 operates in the weak inversion area.

That is, the current Ids flow in the second n-type MOS transistor (Qn2) 703 has substantially no dependence on the source-drain voltage Vdsn applied to the n-type MOS transistor (Qn2) 703 (FIG. 29). Therefore, even when the source-drain voltage Vdsn is varied between 2 and 14 V, the drain current is substantially fixed. The second n-type MOS transistor (Qn2) 703 operates as a bias current source when the first n-type MOS transistor (Qn1) 702 is operated as the amplifier circuit portion of the analog amplifier circuit 1104-8.

The bias power supply source 704 needed in the sixth embodiment and the source power supply source 705 needed in the seventh embodiment are not required in the eight embodiment, however, a channel dose step is additionally needed.

The constructions as the parts other than the above parts in this embodiment are the same as the fourth embodiment. The same parts are represented by the same reference numerals as the fourth embodiment, and the description thereof is omitted.

Accordingly, the liquid crystal display device having the above difference is represented by 10-8, and the pixel circuit is represented by 20-8.

Next, the operation of this embodiment will be described with reference to FIGS. 28 and 29.

The driving method for the liquid crystal display device of this embodiment is the same as the sixth embodiment and the seventh embodiment.

The pixel voltage Vpix and the light transmittance of liquid crystal when high-response liquid crystal such as ferroelectric or antiferroelectric liquid crystal having polarization, OCB mode liquid crystal responding within the one-field period or the like is driven by the pixel circuit 20-8 are the same as shown in FIG. 25, and the pixel voltage Vpix and the light transmittance of liquid crystal when NT liquid crystal is driven by the pixel circuit 20-8 are the same as shown in FIG. 26.

As described above, according to the construction of this embodiment, the first p-type MOS transistor (Qp1) 3Q2 and the second p-type MOS transistor (Qp2) 303 are altered to the first n-type MOS transistor (Qn1) 702 and the second n-type MOS transistor 703 to construct an analog amplifier circuit 104-8, and in connection with the alteration, the polarities of voltages needed to operate the first n-type MOS transistor (Qn1) 702 and the second n-type MOS transistor (Qn2) 703 are changed to achieve the same effect as the fourth embodiment, that is, the effect that the pixel voltage Vpix which is substantially proportional to the data signal voltage Vd can be applied to the liquid crystal 109, whereby more excellent gradation can be achieved every field as compared with the patent document described above and also the effect that the aperture ratio can be more enhanced.

The liquid crystal display device of this embodiment is designed with keeping the above effect so that the scan voltage is used as the power supply source and reset power supply source of the first n-type MOS transistor (Qn1) 702 operating as the amplifier circuit portion of the analog amplifier 104-8, and the reset of the analog amplifier circuit 104-8 is carried out by the first n-type MOS transistor (Qn1) 702 itself. Therefore, wires and circuits such as power supply source wires, reset power supply source lines, reset switch, etc. are not needed, so that the analog amplifier circuit 104-8 can be constructed in a small area and the same level of high aperture ratio as the fourth embodiment can be achieved.

Ninth Embodiment

Figure 30:
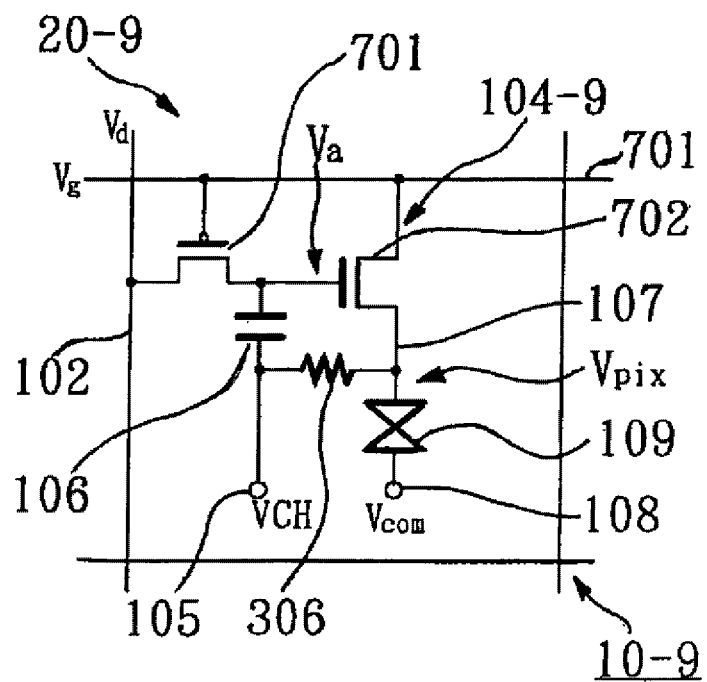
FIG. 30 is a diagram showing a pixel circuit constituting a liquid crystal display device according to a ninth embodiment of the present invention.
Figure 31:
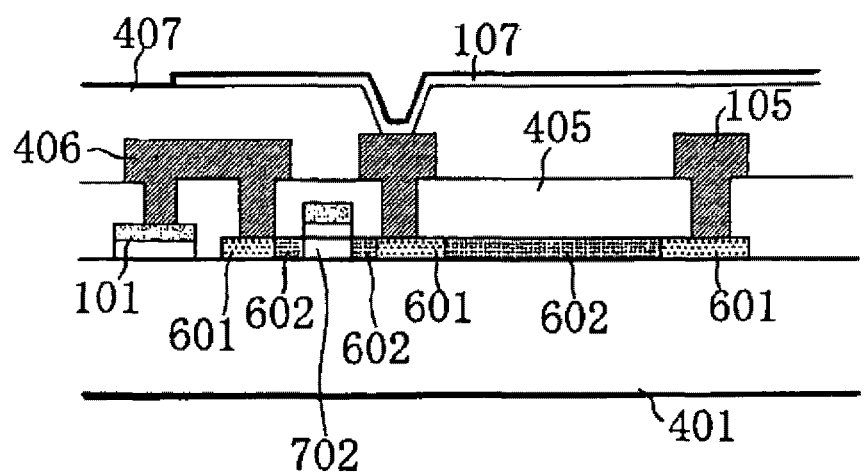
FIG. 31 is a diagram showing a first structure of a resistor constituting the pixel circuit of the liquid crystal display device of the ninth embodiment.
Figure 32:
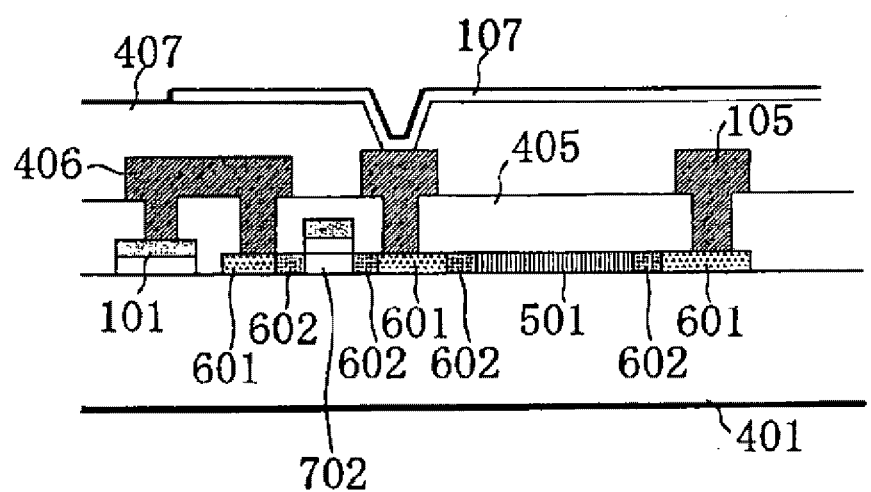
FIG. 32 is a diagram showing a second structure of the resistor constituting the pixel circuit of the liquid crystal display device of the ninth embodiment.
Figure 33:
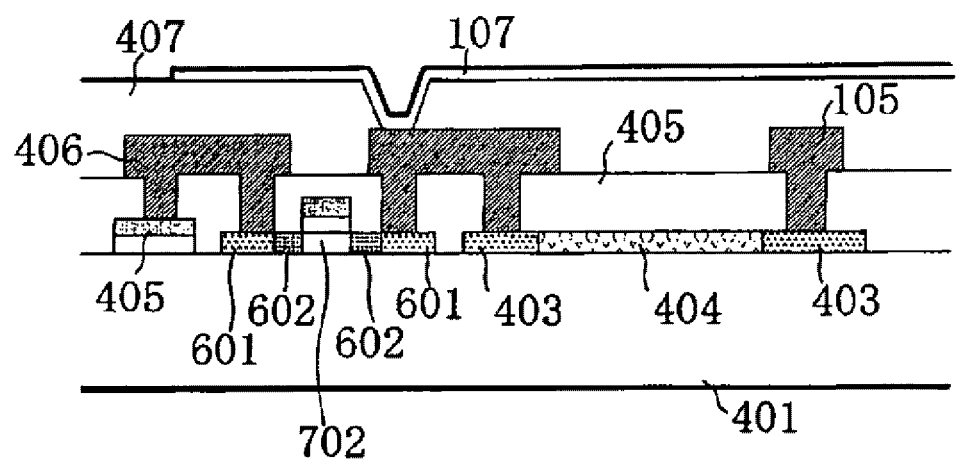
FIG. 33 is a diagram showing a third structure of the resistor constituting the pixel circuit of the liquid crystal display device of the ninth embodiment.
Figure 34:
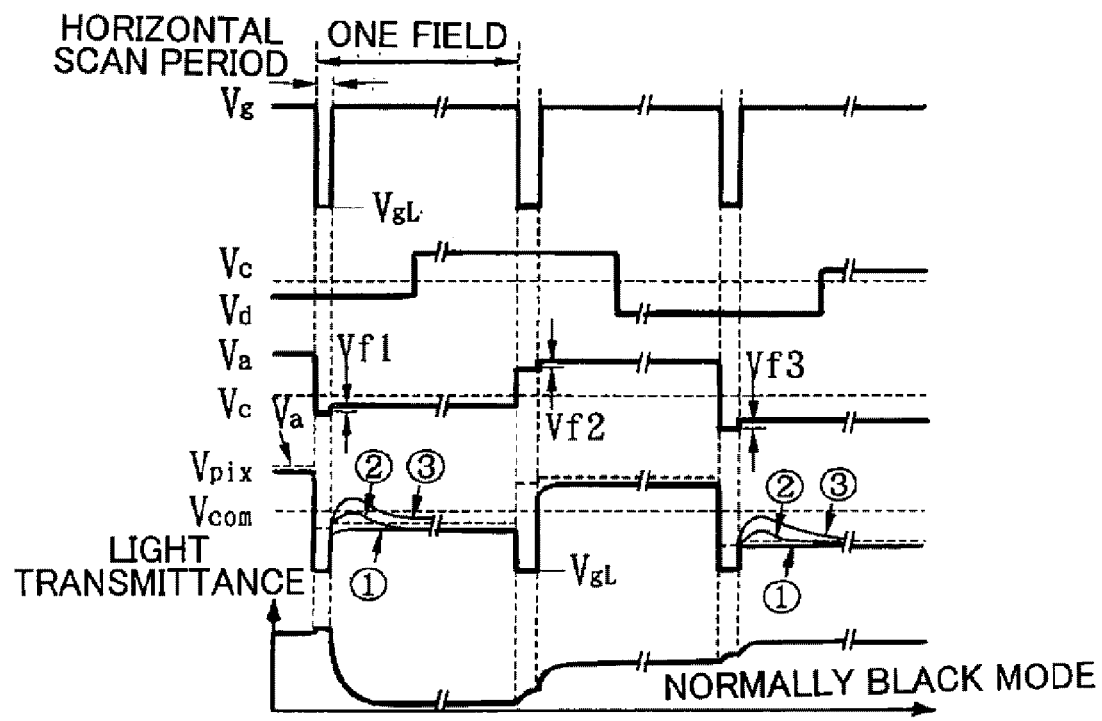
FIG. 34 is a timing chart when liquid crystal is driven while varying the resistance value in the liquid crystal display device of the ninth embodiment.

FIG. 30 is a diagram showing a pixel circuit constituting a liquid crystal display device according to a ninth embodiment of the present invention, FIG. 31 is a diagram showing a first structure of a resistor used in the pixel circuit of the liquid crystal display device of the ninth embodiment, FIG. 32 is a diagram showing a second structure of the resistor used in the pixel circuit of the liquid crystal display device of the ninth embodiment, FIG. 33 is a diagram showing a third structure of the resistor used in the pixel circuit of the liquid crystal display device of the ninth embodiment, and FIG. 34 is a timing chart showing the gate scan voltage Vg, the data signal voltage Vd, the amplifier input voltage and the pixel voltage Vpix and also shows the variation of the light transmittance of liquid crystal when high-response liquid crystal is driven in the pixel circuit constituting the liquid crystal display device of the ninth embodiment while varying the value of the resistor.

The construction of this embodiment is greatly different from that of the fifth embodiment in that the p-type MOS transistor (Qp) 1-3 of the pixel circuit 10-5 of the fifth embodiment is set as the p-type MOS transistor (Qp) 701 and the first p-type MOS transistor (Qp1) 302 is set as the n-type MOS transistor (Qn) 702.

The n-th MOS transistor (Qn) 702 comprises an MOS transistor having a multi-gate structure, and the p-type MOS transistor (Qp) 701 and the n-type MOS transistor (Qn1) 702 are constructed by p-Si TFT.

That is, the gate electrode of the n-type MOS transistor 702 is connected to any one of the source and drain electrodes of the p-type MOS transistor (Qn) 701, any one of the source and drain electrodes of the n-type MOS type transistor 702 is connected to the scan line 101 while the other of the source and drain electrodes of the n-type MOS type transistor 702 is connected to the resistor 306, and one end of the resistor 306 is connected to the voltage holding capacitance electrode 105 while the other end of the resistor 306 is connected to the pixel electrode 107.

Figure 72:
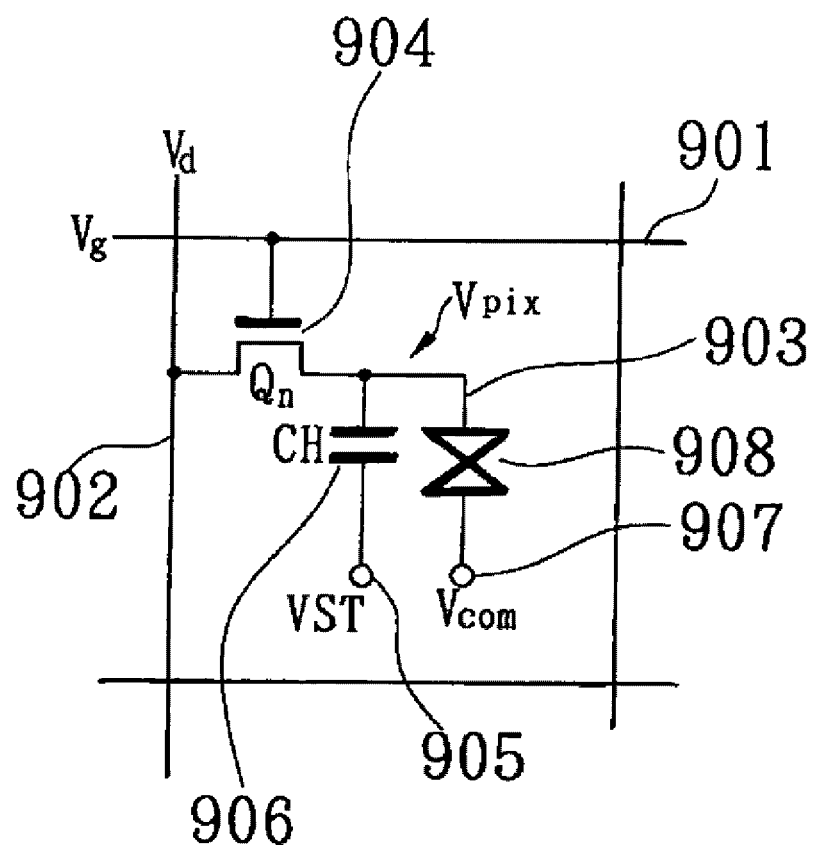
FIG. 72 is a diagram showing a first example of a pixel circuit constituting a conventional liquid crystal display device.

Furthermore, the value RL of the resistor 306 is set to equal to or less than the value of the resistance component which determines the response time constant of the liquid crystal. That is, the value Rr of the resistor R1 in the liquid crystal equivalent circuit shown in FIG. 72, the value Rsp of the resistor R2 in the liquid crystal equivalent circuit shown in FIG. 74 and the value RL of the resistor 306 satisfy the relationship represented by the equation (4).

For example, when the value Rsp of the resistor R2 is equal to 5 GΩ, the value RL of the resistor 306 is set to about 1 GΩ. A large resistance value of 1 GΩ which is not used in normal semiconductor integrated circuits is achieved by semiconductor thin film or semiconductor thin film doped with impurities.

FIG. 31 shows a structure of the resistor 306 when the resistor 306 is formed of Lightly doped n-type semiconductor thin film (n–). FIG. 31 also shows the structure of the n-type p-Si TFT1 (n-type MOS transistor) 702.

As shown in FIG. 31, any one of the source and drain electrodes of the n-type p-Si TFT 702 (n+-layer portion 601 at the left side) is connected to the scan line 101 through metal 406, and the other electrode (n+-layer portion at the right side) is connected to the pixel electrode 107. Here, the n--layer portion 602 forming the resistor 306 (the n--layer portion between the n+-layer portion 601 connected to the voltage holding electrode 105 and the n+-layer portion 601 connected to the pixel electrode 107) is designed in impurity doping amount, length and width so as to satisfy the condition represented by the equation (4). The n-type p-Si TFT 702 is designed to have a lightly doped drain (hereinafter referred to as "LDD") structure to increase the withstanding voltage, and a step of forming LDD of P-Si TFT and a step of forming resistor RL (n–) are carried out at the same time to simplify the process.

A first n-type MOS transistor (Qn2) 702 is formed between the n+-layer portion 601 connected to the pixel electrode 107 and the n+-layer portion 601 connected to the scan line 101. Reference numeral 602 in the layer portion in which the first n-type MOS transistor (Qn2) is formed represents the n+-layer portion. 401 represents a glass substrate.

Next, FIG. 32 shows an example in which the resistor 306 is formed of semiconductor thin film (i-layer) 501 doped with no impurity. Here, the length and width of the i-layer 501 forming the resistor 306 are set so as to satisfy the equation (4). Furthermore, when the i-layer 501 is used as the resistor 306, as shown in FIG. 32, a lightly-doped n-type (n-layer 602) is formed in advance between any one electrode (n+) 601 of the source and drain electrodes at one side of the n-type p-Si TFT 702 which is connected to the pixel electrode 107 and the resistor 306 (i-layer 501). This is because if the n+-layer is brought into contact with the i-layer, Schottky resistor having extremely high resistance is formed, so that it is difficult to form the resistor satisfying the equation (4) in a small area.

Likewise, the n--layer 602 is formed between the n+-electrode connected to the voltage holding capacitance electrode 105 and the i-layer 501. The other reference numerals are the same as FIG. 31.

Next, FIG. 33 shows an example when the resistor 306 is formed of lightly-doped p-type semiconductor thin film (p–). In FIG. 33, the impurity doping amount, length and width at the portion of the p--layer 404 forming the resistor 306 are set so as to satisfy the condition represented by the equation (4). When the source-drain electrode (n+-layer) 601 of the n-type p-Si TFT 1601 is connected to the p--layer 404, the n+-layer 601 and the p+-layer 403 are connected to each other through a metal layer 408, and the p+-layer 403 is brought into contact with the p--layer 404. The other reference numerals are the same as FIG. 31.

In the foregoing description, the resistor 306 is formed of semiconductor thin film or semiconductor thin film doped with impurities. However, any other materials may be used if they have resistance satisfying the equation (4).

Next, the variation of the pixel voltage Vpix when the value RL of the resistor 306 is varied in the liquid crystal display device 10-9 according to the present invention shown in FIG. 30 will be described. FIG. 34 shows the variation of the pixel voltage Vpix when the value RL of the resistor 306 in FIG. 30 is varied to (1) Rsp/4, (2) Rsp and (3) 2×Rsp with respect to the resistance value Rsp of the liquid crystal 109 in FIG. 75. When the value RL of the resistor 306 is larger than the resistance value Rsp of the liquid crystal 109 (3) as shown in FIG. 34, the pixel voltage Vpix has a great variation in fields in which negative-polarity signals are written. On the other hand, when the value RL of the resistor 306 is not more than the resistance value Rsp of the liquid crystal 109 ((1), (2)), there is little variation of the pixel voltage Vpix. When the value RL of the resistor 306 is equal to the resistance value Rsp of the liquid crystal 109 ((2)), a slight variation is observed, however, the variation period is extremely shorter as compared with the one-field period, so that there is no effect on the gradation display control.

For the reason described above, in the liquid crystal display device shown in FIG. 30, the value RL of the resistor 306 is set so as to satisfy the condition represented by the equation (4). Actually, the value RL of the resistor 306 is determined in consideration of the variation of the pixel voltage Vpix and the power consumption. In order to reduce the power consumption, the value RL of the resistor 306 is preferably set to be as large as possible to the extent that the variation of the pixel voltage Vpix has no effect on the light transmittance of liquid crystal.

The constructions of the other parts than the above parts in this embodiment are the same as the fifth embodiment. Therefore, these same parts are represented by the same reference numerals as the fifth embodiment, and the description thereof is omitted.

The liquid crystal display device having the above difference is represented by 10-9, and the pixel circuit is represented by 20-9.

Next, the operation of this embodiment will be described with reference to FIGS. 30 and 34.

The driving method of the liquid crystal display device according to this embodiment is the same as the liquid crystal display device according to the sixth to eighth embodiments.

That is, the pixel voltage Vpix and the light transmittance of liquid crystal when high-response liquid crystal such as ferroelectric or antiferroelectric liquid crystal having polarization, OCB mode liquid crystal responding within one-field period or the like is driven by the pixel circuit 20-9 are the same as shown in FIG. 25, and the pixel voltage Vpix and the light transmittance of liquid crystal when NT liquid crystal is driven by the pixel circuit 20-9 are the same as shown in FIG. 26.

As described above, according to the construction of this embodiment, the p-type MOS transistor 302 of the fifth embodiment is altered to the n-type MOS transistor 702 to construct the analog amplifier circuit 104-9, and the polarity of the voltage needed to operate the n-type MOS transistor 702 is changed in connection with this alteration, thereby achieving the same effect as the fifth embodiment, that is, the effect that the pixel voltage Vpix substantially proportional to the data signal voltage Vd can be applied to the liquid crystal 109, and thus the effect that more excellent gradation can be achieved and the aperture ration can be more enhanced every field as compared with the patent document.

The liquid crystal display device of this embodiment is designed with keeping the above effect so that the scan voltage is used as the power supply source and reset power supply source of the first n-type MOS transistor (Qn1) 702 operating as the amplifier circuit portion of the analog amplifier 104-8, and the reset of the analog amplifier circuit 104-8 is carried out by the first n-type MOS transistor (Qn1) 702 itself. Therefore, wires and circuits such as power supply source wires, reset power supply source lines, reset switch, etc. are not needed, so that the analog amplifier circuit 104-9 can be constructed in a small area and the same level of high aperture ratio as the fifth embodiment can be achieved.

Tenth Embodiment

Figure 35:
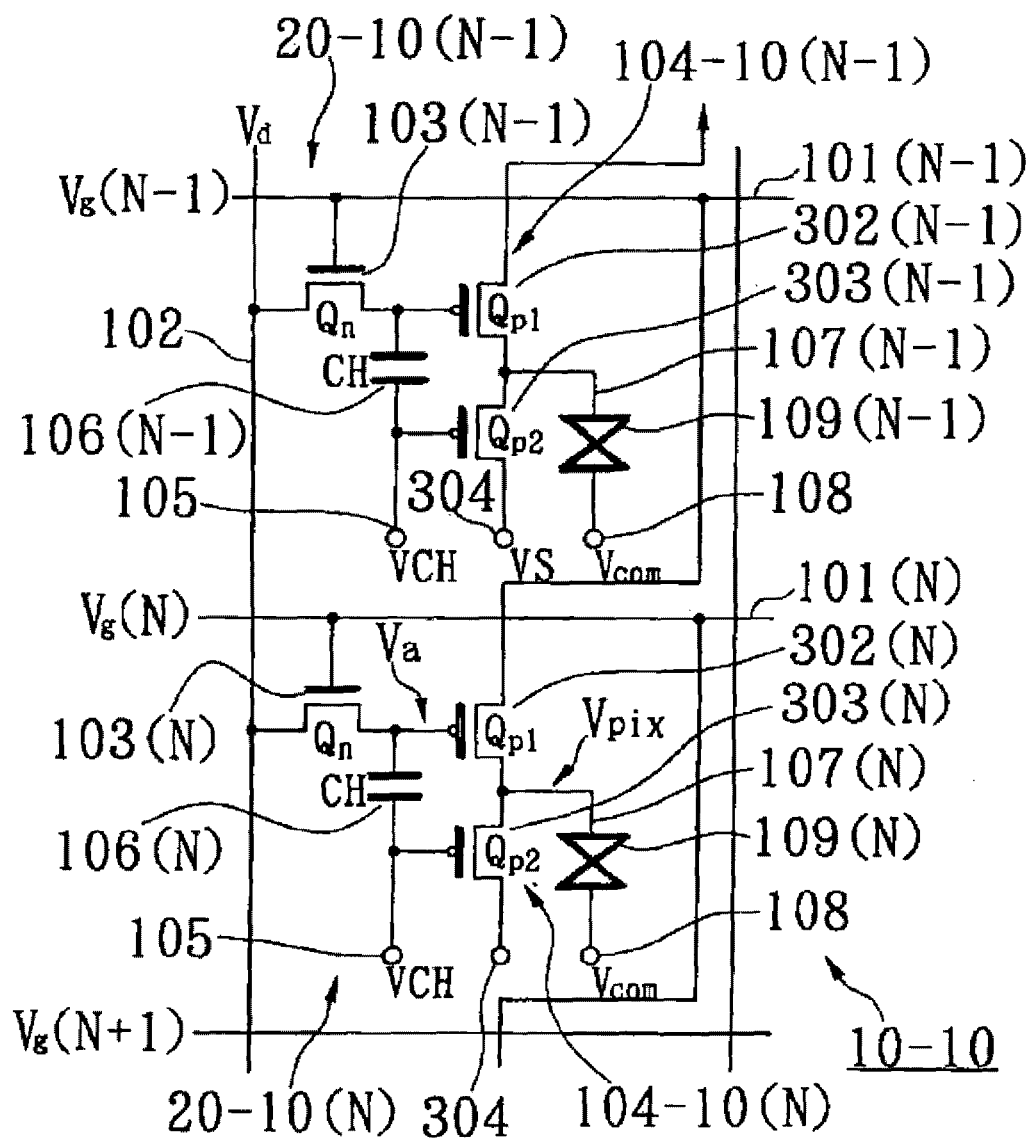
FIG. 35 is a diagram showing two pixel circuits constituting a liquid crystal display device according to a tenth embodiment of the present invention.
Figure 36:
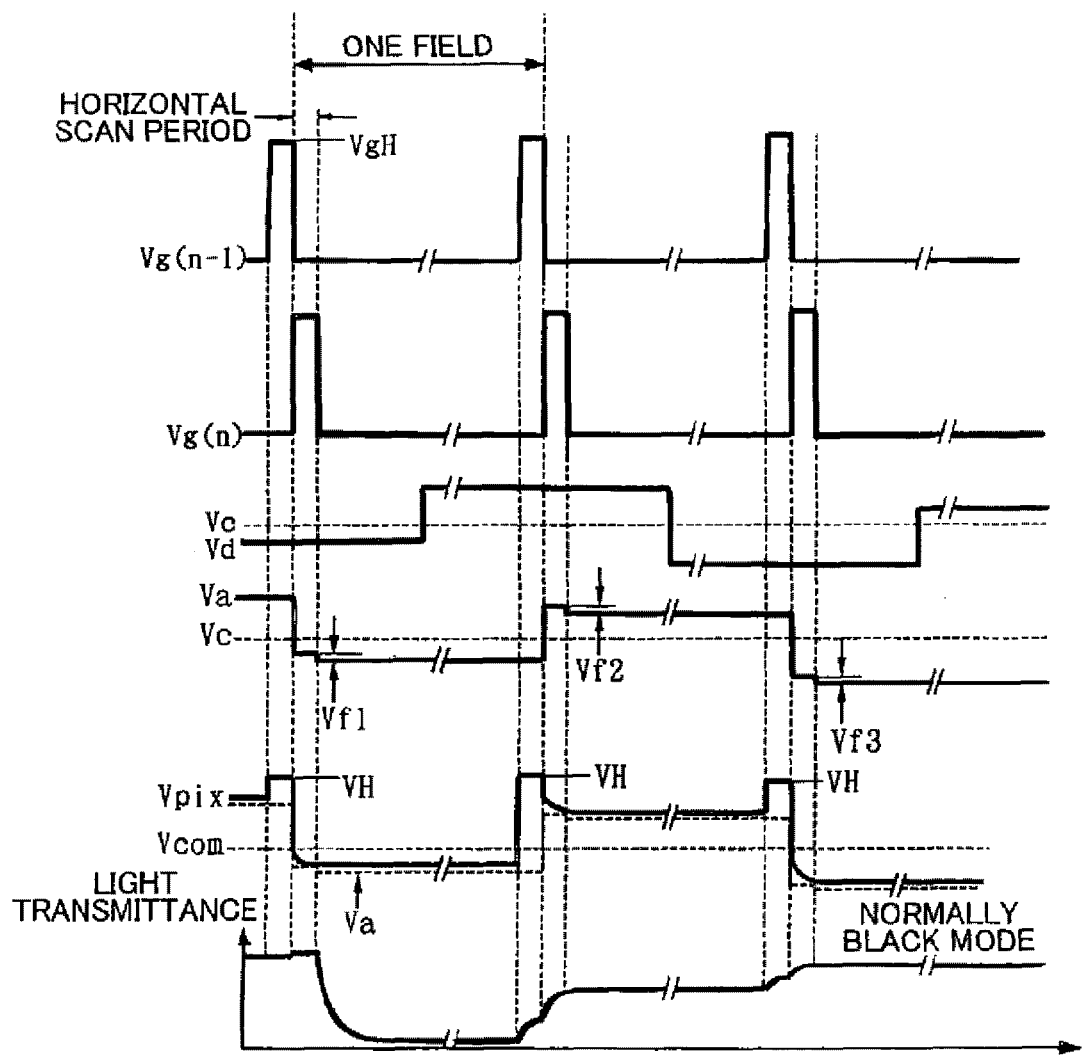
FIG. 36 is a timing chart when liquid crystal is driven in the liquid crystal display device of the tenth embodiment.

FIG. 35 is a diagram showing a pixel circuit constructed by a liquid crystal display device according to a tenth embodiment of the present invention, and FIG. 36 is a timing chart showing the gate scan voltage Vg, the data signal voltage Vd, the gate input voltage Va of the first p-type MOS transistor*Qp1) 302 and the pixel voltage Vpix and also shows the variation of the light transmittance of liquid crystal when high-response liquid crystal such as ferroelectric or antiferroelectric liquid crystal having polarization, OCB mode liquid crystal responding within one-field period or the like is driven by the pixel circuit.

The construction of this embodiment is greatly different from that of the second embodiment in that any one of the source and drain electrodes of the p-type MOS transistor constituting the amplifier circuit portion in each pixel circuit constituting the liquid crystal display device is driven by the just preceding scan line.

That is, the difference resides in that the gate electrode of the n-type MOS transistor (Qn) 103 (N) is connected to an N-th scan line 101 (N), any one of the source and drain electrodes thereof is connected to the signal line 102, the gate electrode of the first p-type MOS transistor (Qp1) 302 (N) is connected to the other of the source and drain electrodes of the n-type MOS transistor (Qn) 103 (N), any one of the source and drain electrodes of the first p-type MOS transistor (Qp1) 302 (N) is connected to an (N−1)-th scan line 101 (N−1), and the other of the source and drain electrodes of the first p-type MOS transistor (Qp1) 302 (N) is connected to the pixel electrode 107 (N).

The constructions of the other parts than the above parts in this embodiment are the same as the second embodiment. These same parts are represented by the same reference numerals as the second embodiment, and the description thereof is omitted.

Accordingly, the liquid crystal display device 10-10 having the above difference is represented by 10-10, and the pixel circuit is represented by 20-10 (N−1), 20-10 (N).

Next, the operation of this embodiment will be described with reference to FIGS. 35 and 36.

The driving method for the liquid crystal display device 10-10 of this embodiment is substantially identical to the driving method for the liquid crystal display device 10-2 of the second embodiment except that the first p-type MOS transistor (Qp1) 302 (N) of the analog amplifier circuit 104-10 (N) is driven by the scan line 101 (N−1), and the driving method is as follows.

As in the case of FIG. 7, FIG. 36 is a timing chart showing the gate scan voltage Vg, the data signal voltage Vd, the gate input voltage Va of the first p-type MOS transistor (Qp1) 302 and the pixel voltage Vpix and also shows the variation of the light transmittance of liquid crystal when high-response liquid crystal is driven in the normally black mode in which the display thereof is kept dark under no voltage application.

As shown in FIG. 36, during a period for which an (N−1)-th gate scan voltage Vg(N−1) is set to high level VgH, the pixel electrode 107(N) is set to reset state when the gate scan voltage VgH is transferred through the first p-type MOS transistor (Qp1) 302(N). The pixel voltage Vpix is set to VgH during this selection period of the (N−1)-th scan line, whereby the reset of the first p-type MOS transistor (Qp1) 302(N) is carried out, and the first p-type MOS transistor (Qp1) 302(N) operates as a source follower type analog amplifier circuit 104-10(N) after the selection period of the (N−1)-th scan line 101(N−1) is finished. This will be described below.

During the period for which the N-th gate scan voltage Vg(N) is set to high level VgH, the n-type MOS transistor (Qn) 103(N) is under ON state, and the data signal voltage Vd input to the signal line 102 is transferred to the gate electrode of the first p-type MOS transistor (Qp1) 302(N) through the n-type MOS transistor (Qn) 103(N). When the horizontal scan period is finished and the gate scan voltage Vg is set to low level, the n-type MOS transistor (Qn) 103(N) is set to OFF state, and the data signal voltage Vd transferred to the gate electrode of the first p-type MOS transistor (Qp1) 302(N) is held in the voltage holding capacitor 106(N).

At this time, the gate input voltage Va of the first p-type MOS transistor (Qp1) 302(N) is suffers a voltage shift called as a field through voltage via the gate-source capacitor of the n-type MOS transistor (Qn) 103(N) at the time when the n-type MOS transistor (Qn) 103(N) is set to OFF state. This voltage shift is represented by Vf1, Vf2, Vf3 in FIG. 36, and the amount of the voltage shift Vf1 to Vf3 can be reduced by setting the value of the voltage holding capacitor 106(N) to a large value. The gate input voltage Va of the first p-type MOS transistor (Qp1) 302(N) is held until the N-th gate scan voltage Vg is set to high level and the n-type MOS transistor (Qn) 103(N) is selected in the next field period.

On the other hand, the reset of the first p-type MOS transistor (Qp1) 302(N) has been completed during the (N−1)-th horizontal scan period, and it operates as the amplifier circuit portion of the source follower type analog amplifier 104-10 (N) using the pixel electrode 107(N) as a source electrode after the N-th horizontal scan period. At this time, in order to make the first p-type OS transistor (Qp1) 302(N) as the analog amplifier circuit 104-10(N), the voltage holding capacitance electrode 105(N) is supplied with a voltage higher than at least (Vdmax-Vtp). Here, Vdmax represents the maximum value of the data signal voltage Vd, and Vtp represents the threshold voltage of the first p-type MOS transistor (Qp1) 302(N). The first p-type MOS transistor (Qp1) 302(N) can output the analog gradation voltage corresponding to the gate input voltage Va thus held until the (N−1)-th gate scan voltage is set to VgH to reset the first p-type MOS transistor (Qp1) 302(N).

It is needless to say that TN liquid crystal can be driven by the pixel circuit 20-10 of this embodiment. In the conventional liquid crystal display device, the molecules of the TN liquid are switched, so that the liquid crystal capacitance is varied. Therefore, as described above with reference to FIG. 74, the pixel voltage Vpix is varied, and thus the original light transmittance T0 of the liquid crystal cannot be achieved.

On the other hand, in the liquid crystal display device according to this embodiment, the first p-type MOS transistor (Qp1) 302(N) operates as the amplifier circuit portion of the analog amplifier circuit 104-10(N), and a fixed voltage can be continued to be applied to the liquid crystal 109(N) without being affected by the capacitance variation of the TN liquid crystal, so that the original light transmittance can be achieved and the accurate gradation display can be performed.

As described above, according to the construction of this embodiment, substantially the same effect as the second embodiment can be achieved except that the driving of the first p-type MOS transistor (Qp1) 302(N) is carried out by the gate scan voltage Vg(N−1) applied to the scan line 101(N−1).

That is, there can be achieved the effect that the pixel voltage which is substantially proportional to the data signal voltage Vd can be applied to the liquid crystal 109(N) and thus the effect that more excellent gradation can be achieved every field and the aperture ratio can be more enhanced as compared with the patent document described above.

The liquid crystal display device of this embodiment is designed with keeping the above effect so that the scan voltage of the (N−1) scan line is used as the power supply source and reset power supply source of the first p-type MOS transistor (Qp1) 302(N) operating as the amplifier circuit portion of the analog amplifier circuit 104-10(N), and the reset of the analog amplifier circuit 104-10(N) is carried out by the first p-type MOS transistor (Qp1) 302(N) itself. Therefore, wires and circuits such as power supply source wires, reset power supply source lines, reset switch, etc. are not needed, so that the analog amplifier circuit 104-10(N) can be constructed in a small area and the same level of high aperture ratio as the second embodiment can be achieved.

Eleventh Embodiment

Figure 37:
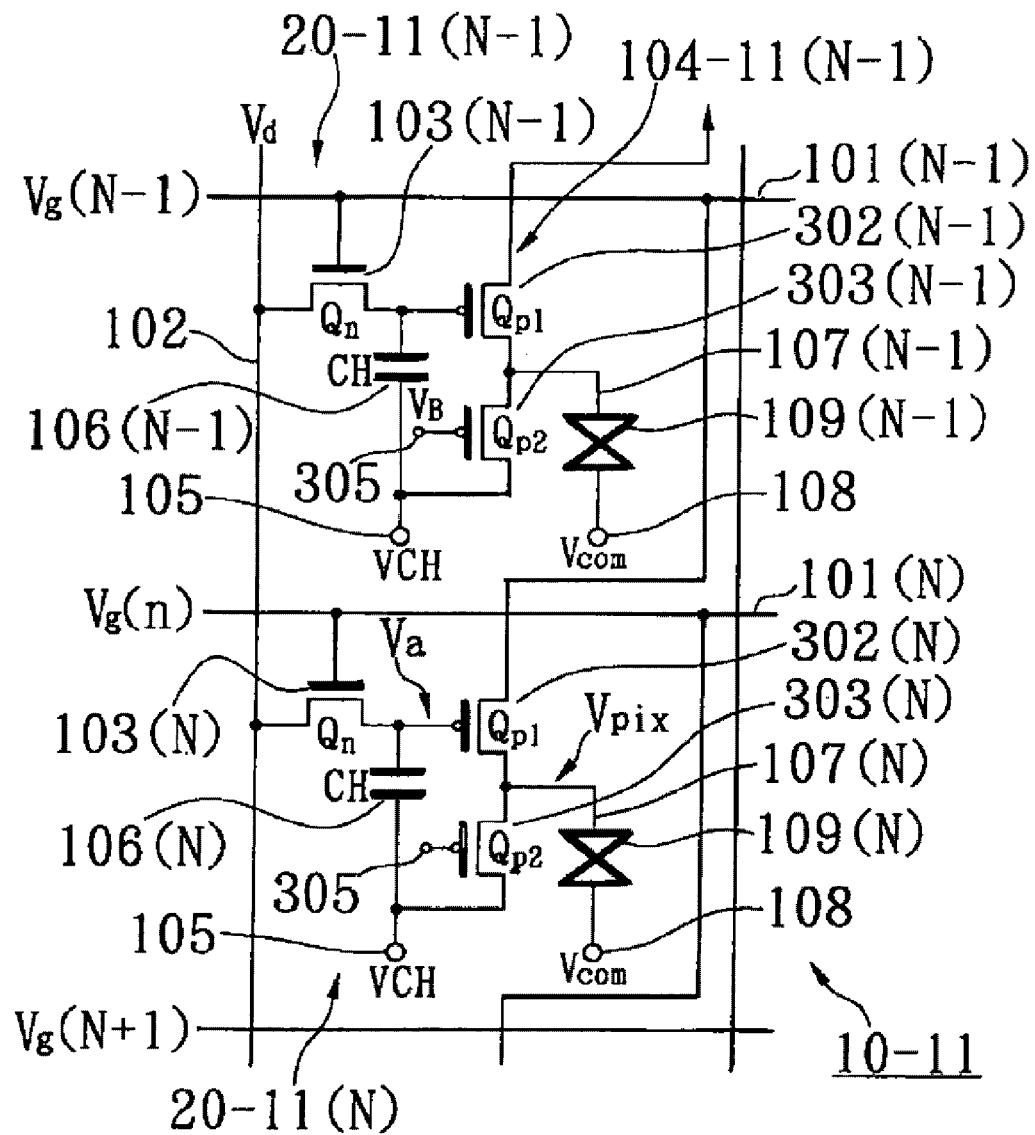
FIG. 37 is a diagram showing two pixel circuits constituting a liquid crystal display device according to an eleventh embodiment of the present invention.

FIG. 37 is a diagram showing a pixel circuit constituting a liquid crystal display device according to an eleventh embodiment of the present invention.

The construction of this embodiment is greatly different from that of the third embodiment in that any one of the source and drain electrodes of the p-type MOS transistor constituting the amplifier circuit portion in each pixel circuit constituting the liquid crystal display device 10-11 is driven by the just preceding scan line.

That is, the difference resides in that the gate electrode of the n-type MOS transistor (Qn) 103(N) is connected to the N-th scan line 101(N), any one of the source and drain electrodes thereof is connected to the signal line 102, the gate electrode of the first p-type MOS transistor (Qp1) 302(N) is connected to the other of the source and drain electrodes of the n-type MOS transistor (Qn) 103(N), and any one of the source and drain electrodes of the first p-type MOS transistor (Qp1) 302(N) is connected to the (N−1)-th scan line 101(N−1), and the other of the source and drain electrodes thereof is connected to the pixel electrode 107(N).

The constructions of the parts other than the above-described parts in this embodiment are the same as the third embodiment. These same parts are represented by the same reference numerals as the third embodiment, and the description thereof is omitted.

Accordingly, the liquid crystal display device having the difference described above is represented by 10-11, and the pixel circuit is represented by 20-11(N−1), 20-11(N).

Next, the operation of this embodiment will be described with reference to FIG. 37.

The driving method for the liquid crystal display device 10-11 of this embodiment is substantially identical to the driving method for the liquid crystal display device according to the third embodiment except that the first p-type MOS transistor (Qp1) 302(N) of the analog amplifier circuit 104-11(N) is driven by the gate scan voltage applied to the scan line 101(N−1).

The understanding can be made more clearly by referring to the description of the tenth embodiment, and it is merely indicated hereunder that the first p-type MOS transistor (Qp1) 302(N) of the analog amplifier circuit 104-11(N) is driven by the scan line 101(N−1), and the repetitive detailed description on the operation is omitted from the following description.

As described above, according to the construction of this embodiment, there can be achieved substantially the same effect as the third embodiment except that the driving of the first p-type MOS transistor (Qp1) 302(N) is carried out with the gate scan line voltage Vg(N−1) applied to the scan line 101(N−1).

That is, there can be achieved the effect that the pixel voltage Vpix substantially proportional to the data signal voltage Vd can be applied to the liquid crystal 109(N), and thus the effect that the more excellent gradation can be achieved every field and the aperture ratio can be more enhanced as compared with the patent document described above.

The liquid crystal display device of this embodiment is designed with keeping the above effect so that the scan voltage of the scan voltage of the (N−1) scan line is used as the power supply source and reset power supply source of the first p-type MOS transistor (Qp1) 302(N) operating as the amplifier circuit portion of the analog amplifier circuit 104-11(N), and the reset of the analog amplifier circuit 104-11(N) is carried out by the first p-type MOS transistor (Qp1) 302(N) itself. Therefore, wires and circuits such as power supply source wires, reset power supply source lines, reset switch, etc. are not needed, so that the analog amplifier circuit 104-11(N) can be constructed in a small area and the same level of high aperture ratio as the third embodiment can be achieved.

Twelfth Embodiment

Figure 38:
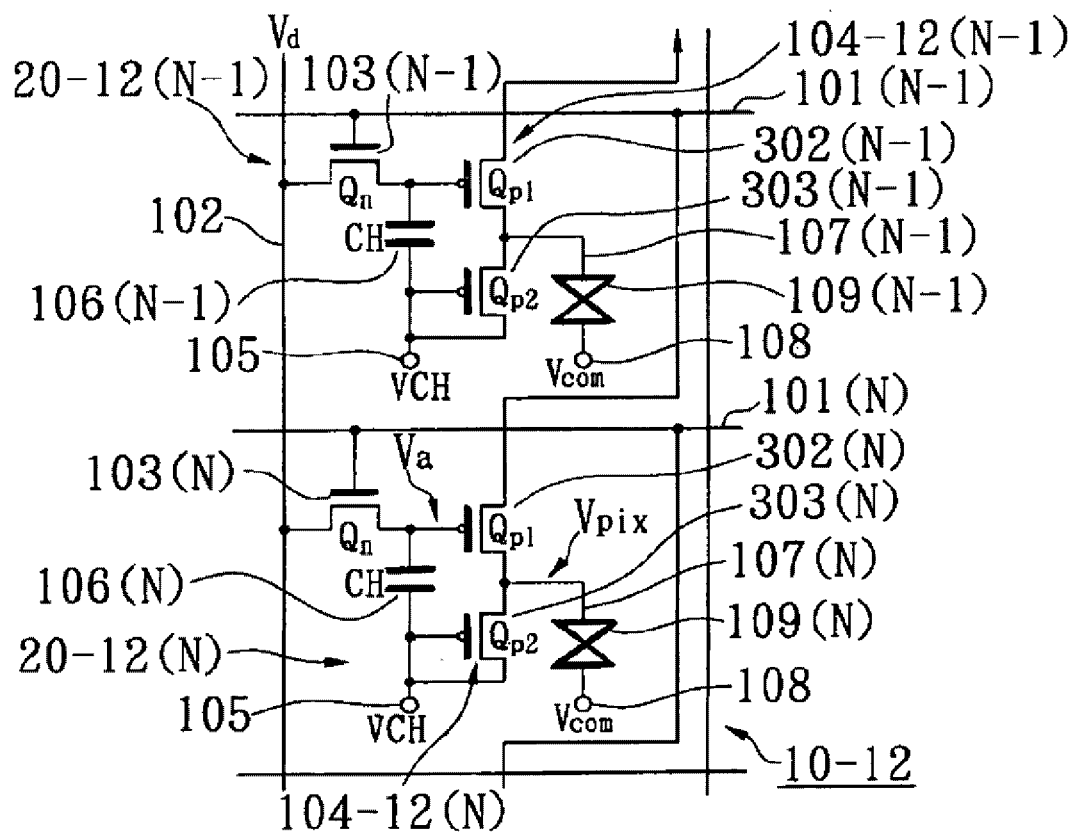
FIG. 38 is a diagram showing two pixel circuits constituting a liquid crystal display device according to a twelfth embodiment according to the present invention.

FIG. 38 is a diagram showing a pixel circuit constituting a liquid crystal display device according to a twelfth embodiment of the present invention.

The construction of this embodiment is greatly different from that of the fourth embodiment in that any one of the source and drain electrodes of the p-type MOS transistor constituting the amplifier circuit portion in each pixel circuit constituting the liquid crystal display device is driven by the just preceding scan line.

That is, the difference resides in that the gate electrode of the n-type MOS transistor (Qn) 103(N) is connected to the N-th scan line 101(N), any one of the source and drain electrodes thereof is connected to a signal line 102, the gate electrode of the first p-type MOS transistor (Qp1) 302(N) is connected to the other of the source and drain electrodes of the n-type MOS transistor (Qn) 103(N), and one of the source and drain electrodes of the first p-type MOS transistor (Qp1) 302(N) is connected to the (N−1)-th scan line 101(N−1), and the other of the source and drain electrodes of the first p-type MOS transistor (Qp1) 302(N) is connected to the pixel electrode 107(N).

The constructions of the other parts than the above parts in this embodiment are the same as the fourth embodiment. Therefore, these same parts are represented by the same reference numerals as the fourth embodiment, and the description thereof is omitted. Accordingly, the liquid crystal display device having the above difference is represented by 10-12, and the pixel circuit is represented by 20-12.

Next, the operation of this embodiment will be described with reference to FIG. 38.

The driving method of the liquid crystal display device 10-12 of this embodiment is similar to the driving method of the liquid crystal display device according to the fourth embodiment except that the first p-type MOS transistor (Qp1) 302(N) of the analog amplifier circuit 104-12(N) id driven with the gate scan voltage Vg(N−1) applied to the scan line 101(N−1).

The understanding can be made more clearly by referring to the description of the tenth embodiment, and it is merely indicated hereunder that the first p-type MOS transistor (Qp1) 302(N) of the analog amplifier circuit 104-11(N) is driven by the scan line 101(N−1), and the repetitive detailed description of the operation is omitted from the following description.

As described above, according to the construction of this embodiment, there can be achieved substantially the same effect as the fourth embodiment except that the driving of the first p-type MOS transistor (Qp1) 302(N) is carried out with the gate scan line voltage Vg(N−1) applied to the scan line 101(N−1).

That is, there can be achieved the effect that the pixel voltage Vpix substantially proportional to the data signal voltage Vd can be applied to the liquid crystal 109(N), and thus the effect that the more excellent gradation can be achieved every field and the aperture ratio can be more enhanced as compared with the patent document described above.

The liquid crystal display device of this embodiment is designed with keeping the above effect so that the scan voltage of the scan voltage of the (N−1) scan line is used as the power supply source and reset power supply source of the first p-type MOS transistor (Qp1) 302(N) operating as the amplifier circuit portion of the analog amplifier circuit 104-1	 2, and the reset of the analog amplifier circuit 104-12 is carried out by the first p-type MOS transistor (Qp1) 302(N) itself. Therefore, wires and circuits such as power supply source wires, reset power supply source lines, reset switch, etc. are not needed, so that the analog amplifier circuit 104-12 can be constructed in a small area and the same level of high aperture ratio as the fourth embodiment can be achieved.

Thirteenth Embodiment

Figure 39:
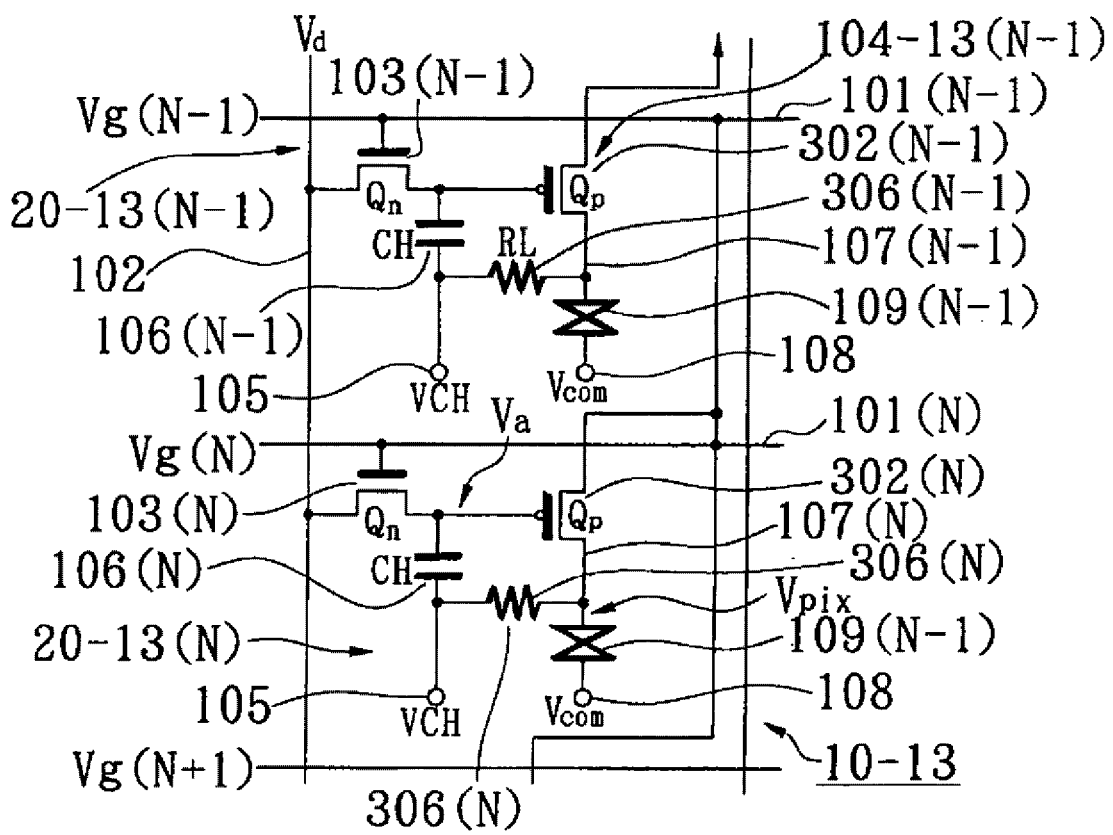
FIG. 39 is a diagram showing two pixel circuits constituting a liquid crystal display device according to a thirteenth embodiment of the present invention.

FIG. 39 is a diagram showing a pixel circuit constructed by a liquid crystal display device according to a thirteenth embodiment of the present invention.

The construction of this embodiment is greatly different from that of the fifth embodiment in that any one of the source and drain electrodes of the p-type MOS transistor constituting the amplifier circuit portion in each pixel circuit constituting the liquid crystal display device is driven by the just preceding scan line.

That is, the difference resides in that the gate electrode of the n-type MOS transistor (Qn) 103(N) is connected to the N-th scan line 101(N), any one of the source and drain electrodes thereof is connected to the signal line 102, the gate electrode of the first p-type MOS transistor (Qp1) 302(N) is connected to the other of the source and drain electrodes of the n-type MOS transistor (Qn) 103(N), and any one of the source and drain electrodes of the first p-type MOS transistor (Qp1) 302(N) is connected to the (N−1)-th scan line 101(N−1), and the other of the source and drain electrodes thereof is connected to the pixel electrode 107(N).

The constructions of the parts other than the above-described parts in this embodiment are the same as the fifth embodiment. These same parts are represented by the same reference numerals as the third embodiment, and the description thereof is omitted.

Accordingly, the liquid crystal display device having the difference described above is represented by 10-13, and the pixel circuit is represented by 20-13.

Next, the operation of this embodiment will be described with reference to FIG. 39.

The driving method for the liquid crystal display device 10-11 of this embodiment is substantially identical to the driving method for the liquid crystal display device according to the fifth embodiment except that the first p-type MOS transistor (Qp1) 302(N) of the analog amplifier circuit 104-13(N) is driven by the gate scan voltage applied to the scan line 101(N−1).

The understanding can be made more clearly by referring to the description of the tenth embodiment, and it is merely indicated hereunder that the first p-type MOS transistor (Qp1) 302(N) of the analog amplifier circuit 104-13(N) is driven by the scan line 101(N−1), and the repetitive detailed description of the operation is omitted from the following description.

As described above, according to the construction of this embodiment, there can be achieved substantially the same effect as the fifth embodiment except that the driving of the p-type MOS transistor (Qp1) 302(N) is carried out with the gate scan line voltage Vg(N−1) applied to the scan line 101 (N−1).

That is, there can be achieved the effect that the pixel voltage Vpix substantially proportional to the data signal voltage Vd can be applied to the liquid crystal 109, and thus the effect that the more excellent gradation can be achieved every field and the aperture ratio can be more enhanced as compared with the patent document described above.

The liquid crystal display device of this embodiment is designed with keeping the above effect so that the scan voltage of the scan voltage of the (N−1) scan line is used as the power supply source and reset power supply source of the first p-type MOS transistor (Qp1) 302(N) operating as the amplifier circuit portion of the analog amplifier circuit 104-1	 3, and the reset of the analog amplifier circuit 104-13 is carried out by the first p-type MOS transistor (Qp1) 302(N) itself. Therefore, wires and circuits such as power supply source wires, reset power supply source lines, reset switch, etc. are not needed, so that the analog amplifier circuit 104-11(N) can be constructed in a small area and the same level of high aperture ratio as the fifth embodiment can be achieved.

Fourteenth Embodiment

Figure 40:
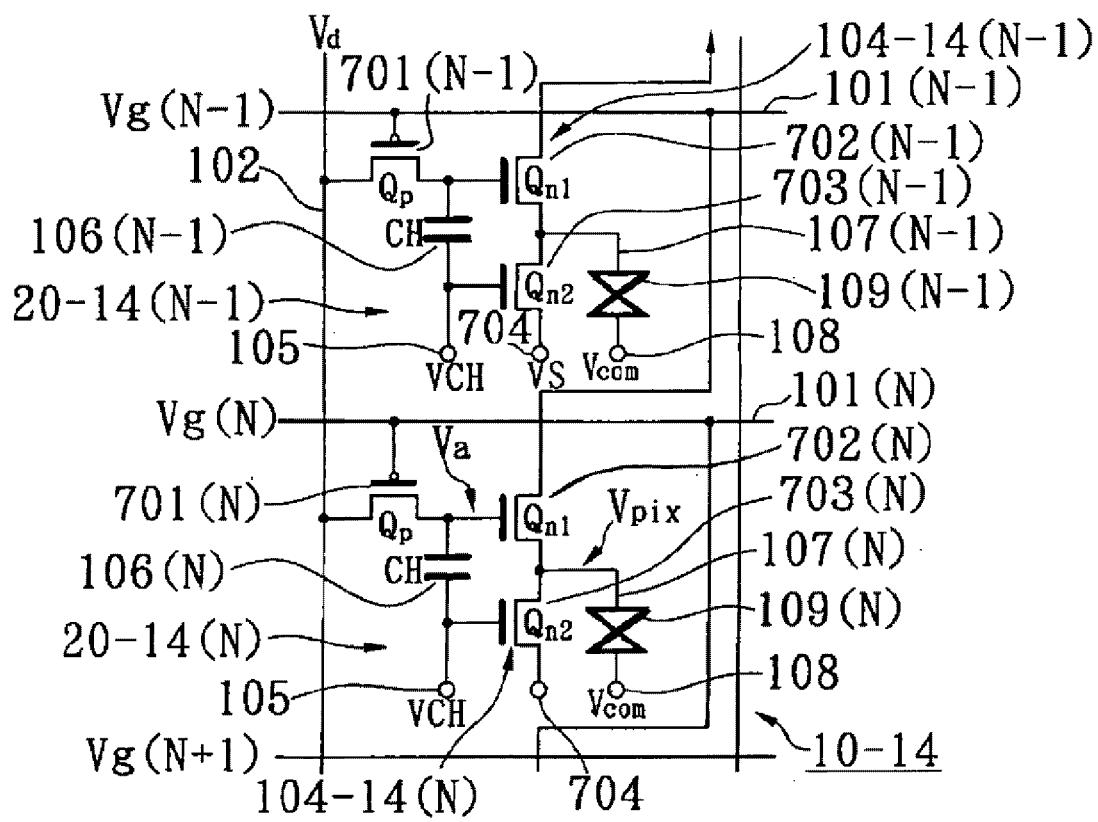
FIG. 40 is a diagram showing two pixel circuits constituting a liquid crystal display device according to a fourteenth embodiment of the present invention.
Figure 41:
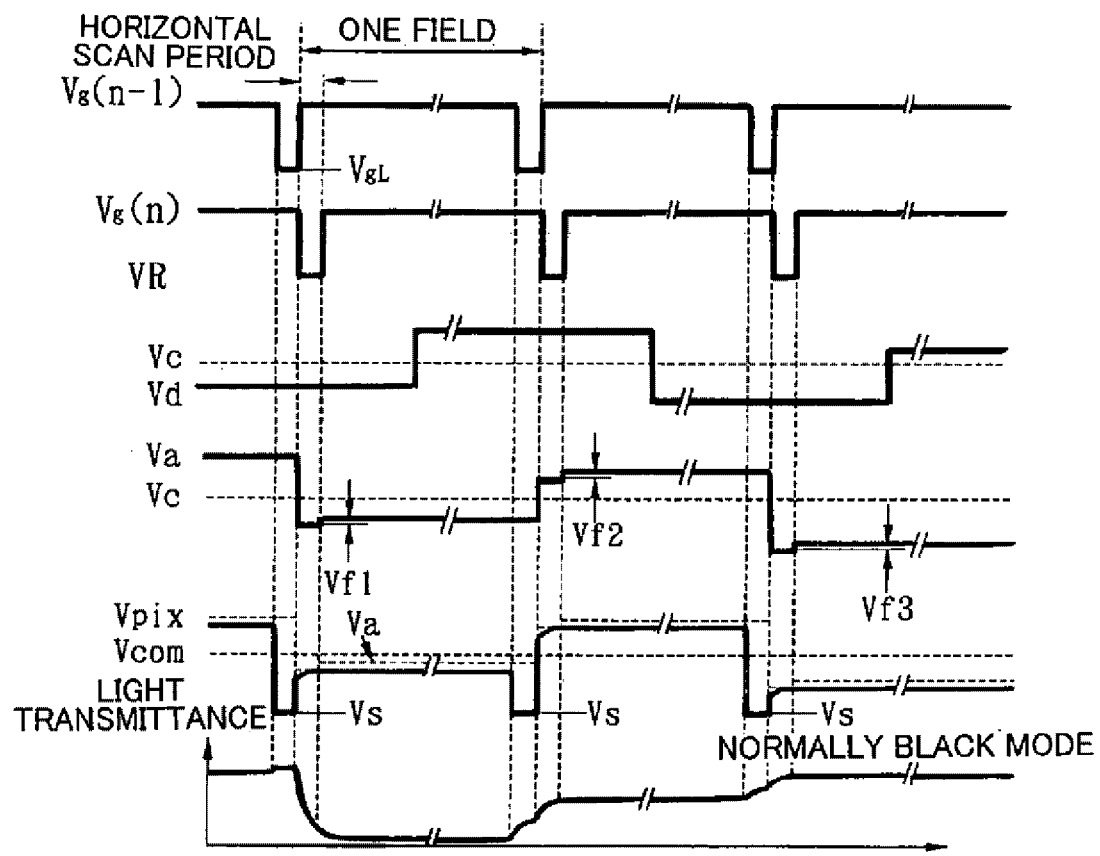
FIG. 41 is a timing chart when liquid crystal is driven in the liquid crystal display device of the fourteenth embodiment.
Figure 42:
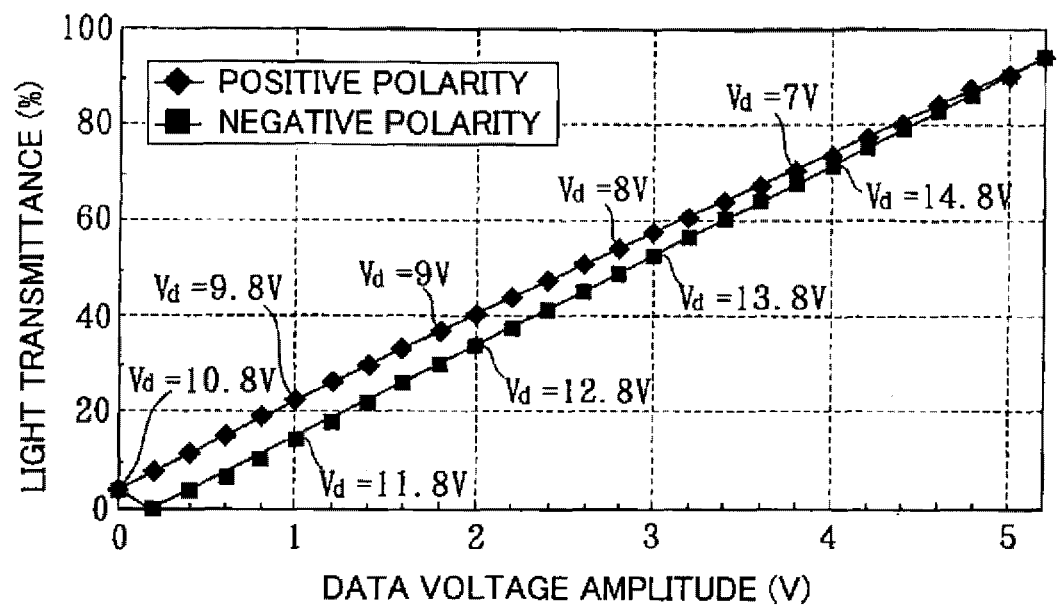
FIG. 42 is a diagram showing a data voltage amplitude-transmittance characteristic curved line of a pixel circuit constructed by an MOS transistor having a single gate structure to describe the liquid crystal display device of the fourteenth embodiment.
Figure 43:
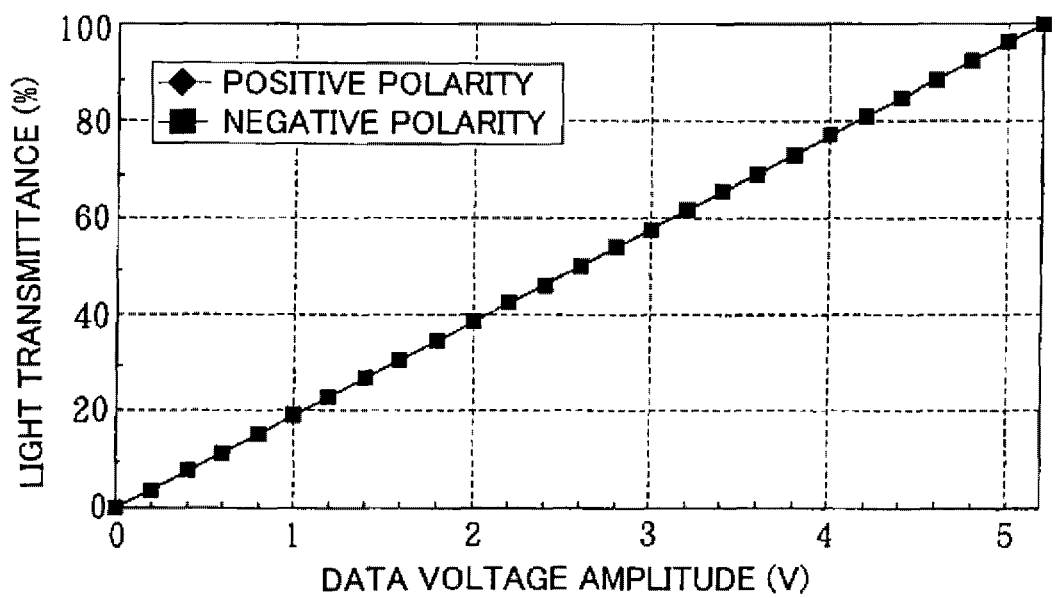
FIG. 43 is a diagram showing a data voltage amplitude-transmittance characteristic curved line of a pixel circuit constructed by an MOS transistor having a double gate structure in the liquid crystal display device of the fourteenth embodiment.

FIG. 40 is a diagram showing a pixel circuit constituting a liquid crystal display device according to a fourteenth embodiment of the present invention, FIG. 41 is a timing chart showing the gate scan voltage Vg, the data signal voltage Vd, the gate input voltage Va of a first n-type MOS transistor (Qn1) 702 and the pixel voltage Vpix and also shows the variation of the light transmittance of liquid crystal when high-response liquid crystal such as ferroelectric or antiferroelectric liquid crystal having polarization, OCB mode liquid crystal responding within the one-field period or the like is driven by the pixel circuit, FIG. 42 is a diagram showing the data signal voltage-light transmittance of the MOS transistor having the single gate structure, and FIG. 43 is a diagram showing the data signal voltage-light transmittance of the MOS transistor having the double gate structure.

The great difference of the construction of this embodiment from that of the sixth embodiment resides in that any one of the source and drain electrodes of the n-type MOS transistor constituting the amplifier circuit portion in each pixel circuit constituting the liquid crystal display device is driven by the just preceding scan line.

That is, the difference resides in that the gate electrode of a p-type MOS transistor (Qp) 701(N) is connected to the N-th scan line 101(N), any one of the source and drain electrodes of the p-type MOS transistor (Qp) 701(N) is connected to the signal line 102, the gate electrode of a first n-type MOS transistor (Qn1) 702(N) is connected to the other of the source and drain electrodes of the p-type MOS transistor (Qp) 701 (N), any one of the source and drain electrodes of the first n-type MOS transistor (Qn1) 702(N) is connected to the scan line 101(N−1), and the other of the source and drain electrodes of the first n-type MOS transistor (Gn1) 702(N) is connected to the pixel electrode 107.

The constructions of the other parts than the above-described parts are the same as the sixth embodiment. Therefore, these same parts are represented by the same reference numerals as the sixth embodiment, and the description thereof is omitted.

Accordingly, the liquid crystal display device having the above difference is represented by 10-14, and the pixel circuit is represented by 20-14.

Next, the operation of this embodiment will be described with reference to FIGS. 40 to 43.

The driving method for the liquid crystal display device 10-14 of this embodiment is substantially similar to the driving method for the liquid crystal display device according to the sixth embodiment except that the first n-type MOS transistor (Qn1) 702(N) of the analog amplifier circuit 20-14(N) is driven by the scan line 101(N−1), and the driving method will be described hereunder.

Like FIG. 25, FIG. 41 is a timing charge showing the gate scan voltage Vg, the data signal voltage Vd, the gate input voltage Va of the first n-type MOS transistor (Qn1) 702 and the pixel voltage Vpix and also shows the variation of the light transmittance of liquid crystal when high-response liquid crystal is driven in the normally black mode in which it is kept in dark state under no voltage application.

As shown in FIG. 41, during the period when the (N−1)-th gate scan voltage Vg(N−1) is set to high level VgH, the pixel electrode 107(N) transits to the reset state by transferring the scan voltage VgH through the first n-type MOS transistor (Qn1) 702(N). The pixel voltage Vpix is set to VgH during this selection period of the (N−1)-th scan line 101(N−1), whereby the first n-type MOS transistor (Qn1) 702(N) is also reset. After the selection period of the (N−1)-th scan line 101(N−1) is finished, the first n-type MOS transistor (Qn1) 702(N) operates as the amplifier circuit portion of the source follower type analog amplifier circuit 104(N). This will be described hereunder.

Next, during the period when the N-th gate scan voltage Vg(N) is set to high level VgH, the p-type MOS transistor (Qp) 701(N) is set to ON state, and the data signal voltage Vd input to the signal line 102 is transferred through the p-type MOS transistor (Qp) 701(N) to the gate electrode of the first n-type MOS transistor (Qn1) 702(N). When the horizontal scan period is finished and the gate scan voltage Vg is set to low level, the p-type MOS transistor (Qp) 701(N) is set to OFF state, and the data signal voltage Vd transferred to the gate electrode of the first n-type MOS transistor (Qn1) 702(N) is held by the voltage holding capacitor 106.

At this time, the gate input voltage of the first n-type MOS transistor (Qn1) 702(N) suffers a voltage shift called as a field through voltage via the gate-source capacitance of the p-type MOS transistor (Qp) 701(N) at the time when the p-type MOS transistor (Qp) 701(N) is set to OFF state. This voltage shift is represented by Vf1, Vf2, Vf3 in FIG. 41, and the amount of the voltage shift Vf1 to Vf3 can be reduced by setting the voltage holding capacitor 106 to a large value. The gate input voltage Va of the first n-type MOS transistor (Qn1) 702(N) is held until the N-th gate scan voltage Vg is set to high level again and the p-type MOS transistor (Qp) 701(N) is selected in the next field period.

On the other hand, the first n-type MOS transistor (Qn1) 702(N) has been already reset during the (N−1)-th horizontal scan period, and it operates as a source follower type analog amplifier circuit 104-14(N) using the pixel electrode 107(N) as the source electrode. At this time, the voltage holding capacitance electrode 105 is supplied with a voltage higher than at least (Vdmax-Vtp) in advance in order to make the first n-type MOS transistor (Qn1) 702(N) as the analog amplifier circuit 104-14(N). Here, Vdmax represents the maximum value of the data signal voltage Vd, and Vtp represents the threshold voltage of the first n-type MOS transistor (Qn1) 702(N). The first n-type MOS transistor (Qn1) 702(N) can output the analog gradation voltage corresponding to the gate input voltage thus held until the (N−1)-th gate scan voltage is set to VgH to reset the first n-type MOS transistor (Qn1) 702(N) again.

In FIG. 41, the relationship between data signal voltage Vd which is difficult to read and the light transmittance will be described with reference to FIGS. 42 and 43. Each of FIGS. 42 and 43 shows the light transmittance when the data signal voltage Vd is set to a voltage ranging from 5.6V to 16V.

In FIGS. 42 and 43, the ordinate axis represents the light transmittance (%), and the abscissa axis represents the absolute value of the difference between the data signal voltage Vd and the intermediate voltage (Vc=10.8 V) of the data input voltage, that is, the amplitude (|Vd−Vc|) (represented as the amplitude of the data voltage in FIGS. 42 and 43). When the data signal voltage Vd is larger than the intermediate voltage Vc, it is represented as positive polarity, and when the data signal voltage Vd is smaller than the intermediate voltage Vc, it is represented as negative polarity. The light transmittance represents a value under the state that the light transmittance is stabilized in each field with respect to time lapse in FIG. 41.

FIG. 42 shows a case where the MOS transistor having the single gate structure is used, and FIG. 43 shows a case where the MOS transistor having the double gate structure is used.

In the case of the single gate structure, the gain of the analog amplifier circuit is low and the maximum light transmittance is less than 94%. To make matters worse, the input/output characteristic of the analog amplifier circuit is bad, so that the light transmittance is greatly different between positive polarity and negative polarity and the difference is equal to 9% at maximum.

In the double gate structure, the gain of the analog amplifier circuit 104-14 is high, and the maximum light transmittance is equal to 100%. Furthermore, the linearity of the input/output characteristic of the analog amplifier circuit 104-14 is high, and there is little difference in light transmittance between positive polarity and negative polarity. The difference does not reach even 0.1%.

Furthermore, it is needless to say that TN liquid crystal is driven by the pixel circuit 20-14 according to this embodiment. In the conventional liquid crystal display device, the molecules of TN liquid crystal are switched to vary the liquid crystal capacitance, so that the pixel voltage Vpix is varied as shown in FIG. 74 and the original light transmittance T0 of the liquid crystal cannot be achieved.

On the other hand, in the liquid crystal display device according to this embodiment, the first n-type MOS transistor (Qn1) 702 operates as the amplifier circuit portion of the analog amplifier circuit 104-14, and a fixed voltage can be continued to be applied to the liquid crystal 109(N) without being affected by the capacitance variation of the TN liquid crystal. Therefore, original light transmittance can be achieved and accurate gradation display can be performed.

As described above, according to the construction of this embodiment, there can be substantially the same effect as the sixth embodiment except that the driving of the first n-type MOS transistor (Qn1) 702(N) is carried out with the gate scan voltage Vg(N−1) applied to the scan line 101 (N−1).

That is, there can be achieved the effect that the pixel voltage Vpix substantially proportional to the data signal voltage Vd can be applied to the liquid crystal 109(N), and thus the effect that more excellent gradation can be achieved every field and the aperture ratio can be more enhanced as compared with the patent document described above.

The liquid crystal display device of this embodiment is designed with keeping the above effect so that the scan voltage of the scan line (N−1) is used as the power supply source and reset power supply source of the first n-type MOS transistor (Qn1) 302(N) operating as the amplifier circuit portion of the analog amplifier 104-14(N), and the reset of the analog amplifier circuit 104-14(N) is carried out by the first n-type MOS transistor (Qn1) 302(N) itself. Therefore, wires and circuits such as power supply source wires, reset power supply source lines, reset switch, etc. are not needed, so that the analog amplifier circuit 104-14(N) can be constructed in a small area, and the high aperture ratio of the same level as the sixth embodiment can be achieved.

Fifteenth Embodiment

Figure 44:
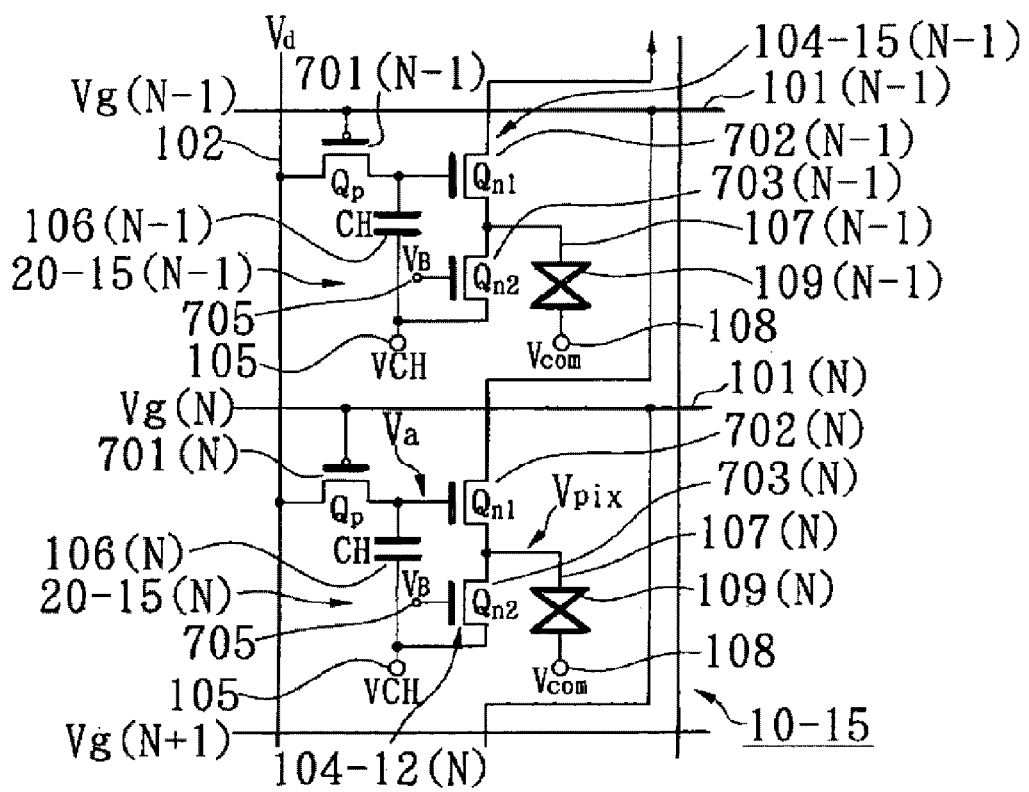
FIG. 44 is a diagram showing two pixel circuits constituting a liquid crystal display device according to a fifteenth embodiment of the present invention.

FIG. 44 is a diagram showing a pixel circuit constituting a liquid crystal display device according to a fifteenth embodiment of the present invention.

The great difference of the construction of this embodiment from that of the seventh embodiment resides in that any one of the source and drain electrodes of the n-type MOS transistor constituting the amplifier circuit portion in each pixel circuit constituting the liquid crystal display device is driven by the just preceding scan line.

That is, the difference resides in that the gate electrode of the p-type MOS transistor (Qp) 701(N) is connected to the N-th scan line 101(N), any one of the source and drain electrodes is connected to the signal line 102, the gate electrode of the first n-type MOS transistor (Qn1) 702(N) is connected to the other electrodes of the source and drain electrodes of the p-type MOS transistor (Qp) 701(N), any one of the source and drain electrodes of the first n-type MOS transistor (Qn1) 702(N) is connected to the (N−1)-th scan line 101(N−1), and the other of the source and drain electrodes is connected to the pixel electrode 107(N).

The constructions of the other parts than the above-described parts in this embodiment are identical to those of the seventh embodiment. Therefore, these same parts are represented by the same reference numerals as the seventh embodiment, and the description thereof is omitted.

Accordingly, the liquid crystal display device having the above difference is represented by 10-15, and the pixel circuit is represented by 20-15.

Next, the operation of this embodiment will be described with reference to FIG. 44.

the driving method for the liquid crystal display device according to this embodiment is substantially identical to the driving method for the liquid crystal display device according to the seventh embodiment except that the first n-type MOS transistor (Qn1) 302(N) of the analog amplifier circuit 104-15(N) is driven with the gate scan voltage Vg(N−1) applied to the scan line 101(N−1).

If the description made with reference to the fourteenth embodiment is referred to, the understanding is made clearer. Therefore, it is merely indicated hereunder that the first n-type MOS transistor (Qn1) 302(N) of the analog amplifier circuit 104-15(N) is driven by the scan line 101(N−1), and the repetitive detailed description of the operation is omitted from the following description.

As described above, according to the construction of this embodiment, there can be achieved substantially the same effect as the seventh embodiment except that the driving of the first n-type MOS transistor (Qn1) 702(N) is carried out by the gate scan voltage Vg(N−1) applied to the scan line 101 (N−1).

That is, there can be achieved the effect that the pixel voltage Vpix substantially proportional to the data signal voltage Vd can be applied to the liquid crystal 109 and thus the effect that more excellent gradation can be achieved every field and the aperture ratio can be more enhanced as compared with the patent document described above.

The liquid crystal display device of this embodiment is designed with keeping the above effect so that the scan voltage of the scan line (N−1) is used as the power supply source and reset power supply source of the first n-type MOS transistor (Qn1) 302(N) operating as the amplifier circuit portion of the analog amplifier 104-14(N), and the reset of the analog amplifier circuit 104-15 is carried out by the first n-type MOS transistor (Qp1) 702(N) itself. Therefore, wires and circuits such as power supply source wires, reset power supply source lines, reset switch, etc. are not needed, so that the analog amplifier circuit 104-15(N) can be constructed in a small area, and the high aperture ratio of the same level as the sixth embodiment can be achieved.

Sixteenth Embodiment

Figure 45:
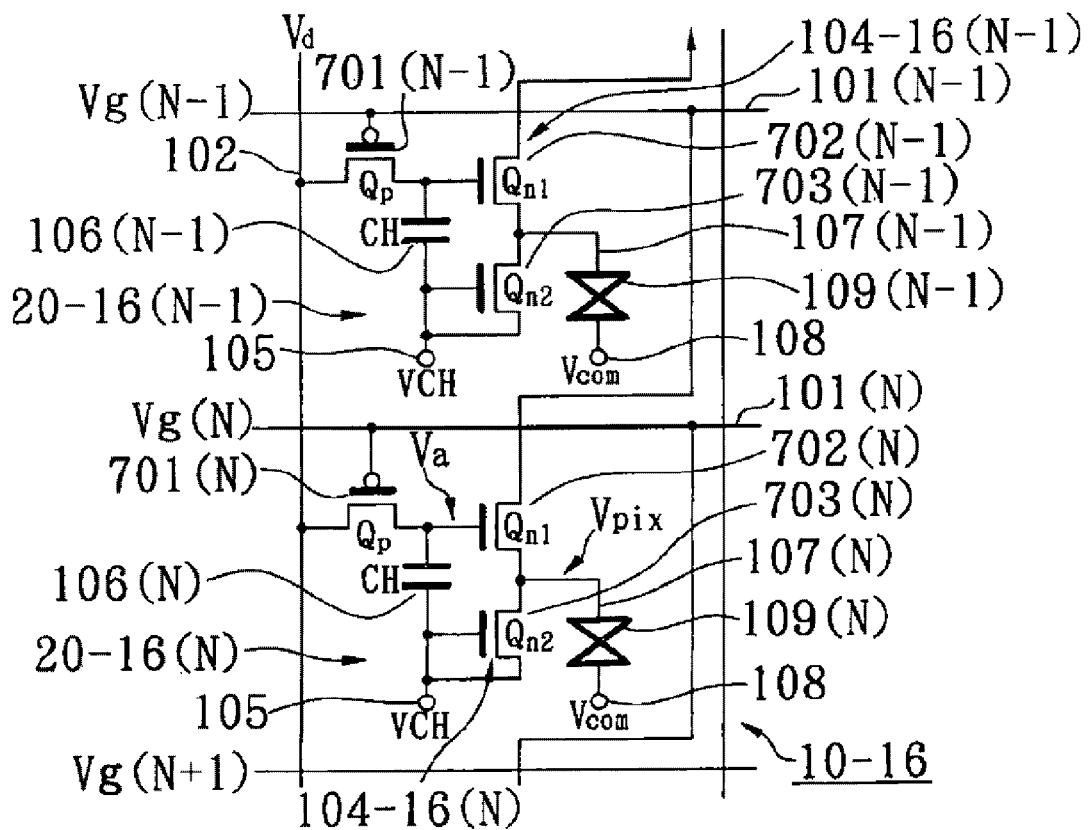
FIG. 45 is a diagram showing two pixel circuits constituting a liquid crystal display device according to a sixteenth embodiment of the present invention.

FIG. 45 is a diagram showing a pixel circuit constituting a liquid crystal display device according to a sixteenth embodiment of the present invention.

The great difference of the construction of this embodiment from that of the eighth embodiment resides in that any one of the source and drain electrodes of the n-type MOS transistor constituting the amplifier circuit portion in each pixel circuit constituting the liquid crystal display device is driven by the just preceding scan line.

That is, the difference resides in that the gate electrode of the p-type MOS transistor (Qp) 701(N) is connected to the N-th scan line 101(N), any one of the source and drain electrodes is connected to the signal line 102, the gate electrode of the first n-type MOS transistor (Qn1) 702(N) is connected to the other of the source and drain electrodes of the p-type MOS transistor (Qp) 701(N), any one of the source and drain electrodes of the n-type MOS transistor (Qn1) 702(N) is connected to the (N−1)-th scan line 101(N−1), and the other of the source and drain electrodes of the n-type MOS transistor (Qn1) 702(N) is connected to the pixel electrode 107.

The constructions of the other parts than the above-described parts in this embodiment are identical to those of the eighth embodiment. Therefore, these same parts are represented by the same reference numerals as the eighth embodiment, and the description thereof is omitted.

Accordingly, the liquid crystal display device having the above difference is represented by 10-16, and the pixel circuit is represented by 20-16.

Next, the operation of this embodiment will be described with reference to FIG. 45.

The driving method for the liquid crystal display device 10-16 according to this embodiment is substantially identical to the driving method for the liquid crystal display device of the eighth embodiment except that the first n-type MOS transistor (Qn1) 702(N) of the analog amplifier circuit 104-16(N) is driven by the gate scan voltage Vg(N−1) applied to the scan line 101(N−1).

The understanding would be more clarified by referring to the description made for the fourteenth embodiment, and it is merely indicated hereunder that the first n-type MOS transistor (Qn1) 702(N) of the analog amplifier circuit 104-16(N) is driven by the scan line 101(N−1), and the repetitive detailed description of the operation is omitted from the following description.

As described above, according to the construction of this embodiment, there can be achieved substantially the same effect as the eighth embodiment except that the driving of the first n-type MOS transistor (Qn1) 702(N) is carried out with the gate scan line voltage Vg(N−1) applied to the scan line 101(N−1).

That is, there can be achieved the effect that the pixel voltage Vpix substantially proportional to the data signal voltage Vd can be applied to the liquid crystal 109(N), and thus the effect that the more excellent gradation can be achieved every field and the aperture ratio can be more enhanced as compared with the patent document described above.

The liquid crystal display device of this embodiment is designed with keeping the above effect so that the scan voltage of the scan voltage of the (N−1) scan line is used as the power supply source and reset power supply source of the first n-type MOS transistor (Qn1) 702(N) operating as the amplifier circuit portion of the analog amplifier circuit 104-16(N), and the reset of the analog amplifier circuit 104-16 is carried out by the first n-type MOS transistor (Qn1) 702(N) itself. Therefore, wires and circuits such as power supply source wires, reset power supply source lines, reset switch, etc. are not needed, so that the analog amplifier circuit 104-16 can be constructed in a small area and the same level of high aperture ratio as the eighth embodiment can be achieved.

Seventeenth Embodiment

Figure 46:
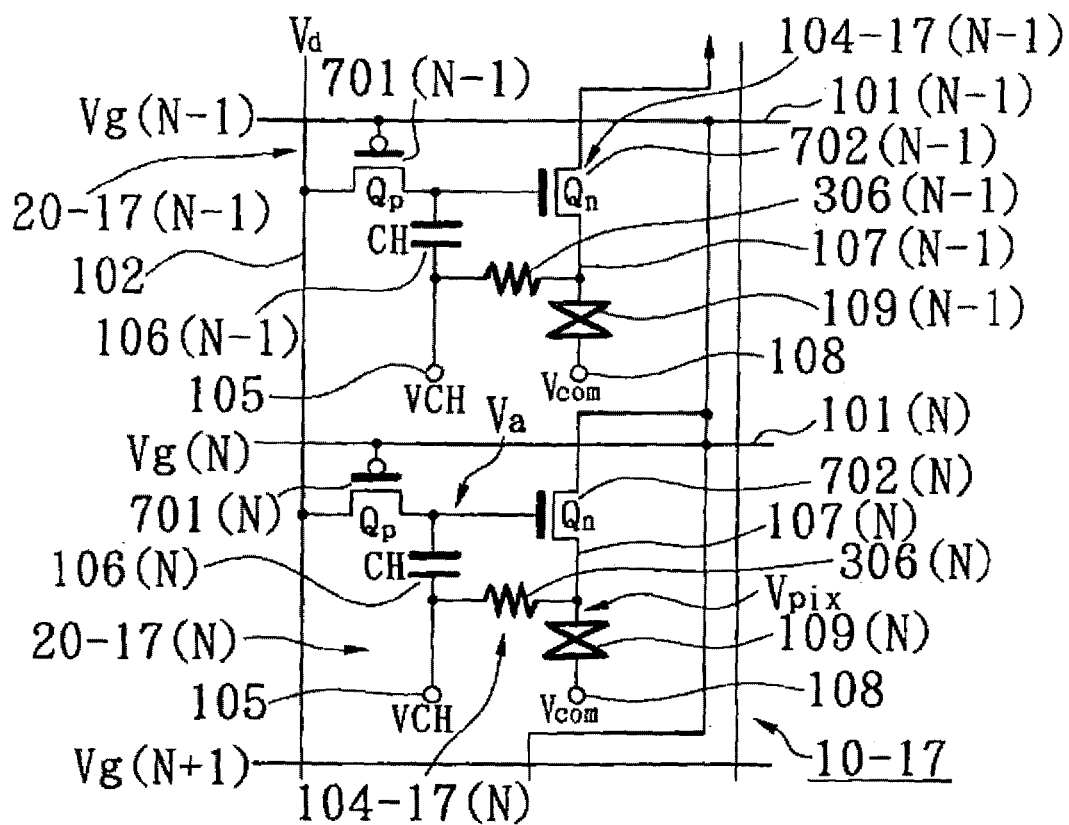
FIG. 46 is a diagram showing two pixel circuits constituting a liquid crystal display device according to a seventeenth embodiment of the present invention.

FIG. 46 is a diagram showing a pixel circuit constituting a liquid crystal display device according to a seventh embodiment of the present invention.

The great difference of the construction of this embodiment from that of the ninth embodiment resides in that any one of the source and drain electrodes of the first n-type MOS transistor constituting the amplifier circuit portion of each pixel circuit constituting the liquid crystal display device is driven by the just preceding scan line.

That is, the difference resides in that the gate electrode of the p-type MOS transistor (Qp) 701(N) is connected to the N-th scan line 101(N), any one of the source and drain electrodes thereof is connected to the signal line 102, the gate electrode of the first n-type MOS transistor (Qn1) 702(N) is connected to the other of the source and drain electrodes of the p-type MOS transistor (Qp) 701(N), any one of the source and drain electrodes of the first n-type MOS transistor (Qn1) 702(N) is connected to the (N−1)-th scan line 101(N−1), and the other of the source and drain electrodes of the first n-type MOS transistor (Qn1) 702(N) is connected to the pixel electrode 107(N).

The constructions of the other parts than the above-described parts in this embodiment are identical to those of the ninth embodiment. That is, these same parts are represented by the same reference numerals as the ninth embodiment, and the description thereof is omitted.

Accordingly, the liquid crystal display device having the above difference is represented by 10-17, and the pixel circuit is represented by 20-17.

Next, the operation of this embodiment will be described with reference to FIG. 46.

The driving method for the liquid crystal display device according to this embodiment is substantially identical to the driving method for the liquid crystal display device according to the ninth embodiment except that the first n-type MOS transistor (Qn1) 702(N) of the analog amplifier circuit 104-17(N) is driven by the gate scan voltage Vg(N−1) applied to the scan line 101(N−1).

Since the understanding is clearer by referring to the description on the fourteenth embodiment, it is merely indicated that the first n-type MOS transistor (Qn1) 702(N) of the analog amplifier circuit 104-17(N) is driven by the scan line 101(N−1), and the repetitive detailed description on the operations is omitted.

As described above, according to the construction of this embodiment, there can be achieved substantially the same effect as the ninth embodiment except that the driving of the first n-type MOS transistor (Qn1) 702(N) is carried out by the gate scan line voltage Vg(N−1) applied to the scan line 101 (N−1).

That is, there can be achieved the effect that the pixel voltage Vpix which is substantially proportional to the data signal voltage Vd can be applied, and also the effect that more excellent gradation can be achieved every field and the aperture ratio can be more enhanced as compared with the patent document described above.

The liquid crystal display device of this embodiment is designed with keeping the above effect so that the scan voltage of the scan voltage of the (N−1) scan line is used as the power supply source and reset power supply source of the first n-type MOS transistor (Qn1) 702(N) operating as the amplifier circuit portion of the analog amplifier circuit 104-17(N), and the reset of the analog amplifier circuit 104-17(N) is carried out by the first n-type MOS transistor (Qn1) 702(N) itself. Therefore, wires and circuits such as power supply source wires, reset power supply source lines, reset switch, etc. are not needed, so that the analog amplifier circuit 104-17(N) can be constructed in a small area and the same level of high aperture ratio as the ninth embodiment can be achieved.

Eighteenth Embodiment

Figure 47:
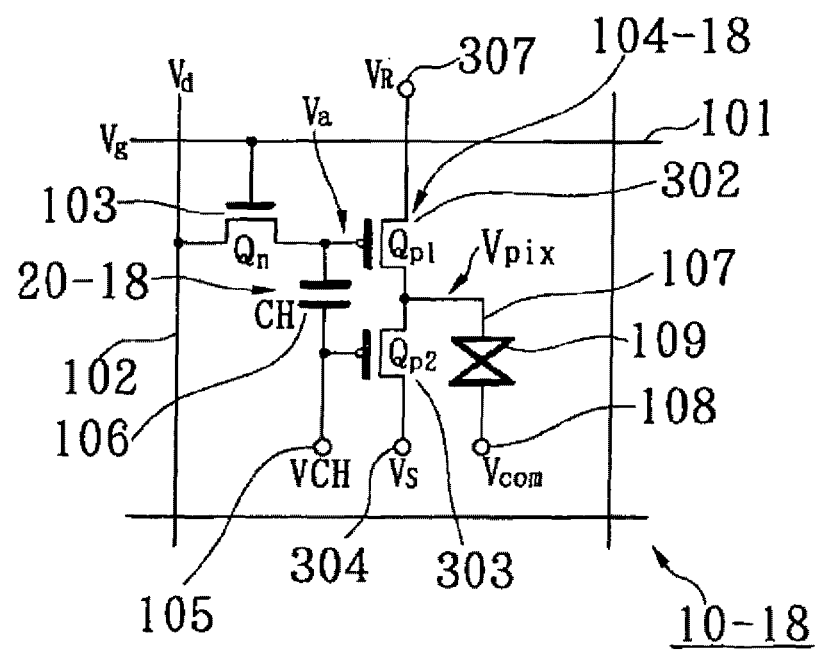
FIG. 47 is a diagram showing a pixel circuit constituting a liquid crystal display device according to an eighteenth embodiment of the present invention.
Figure 48:
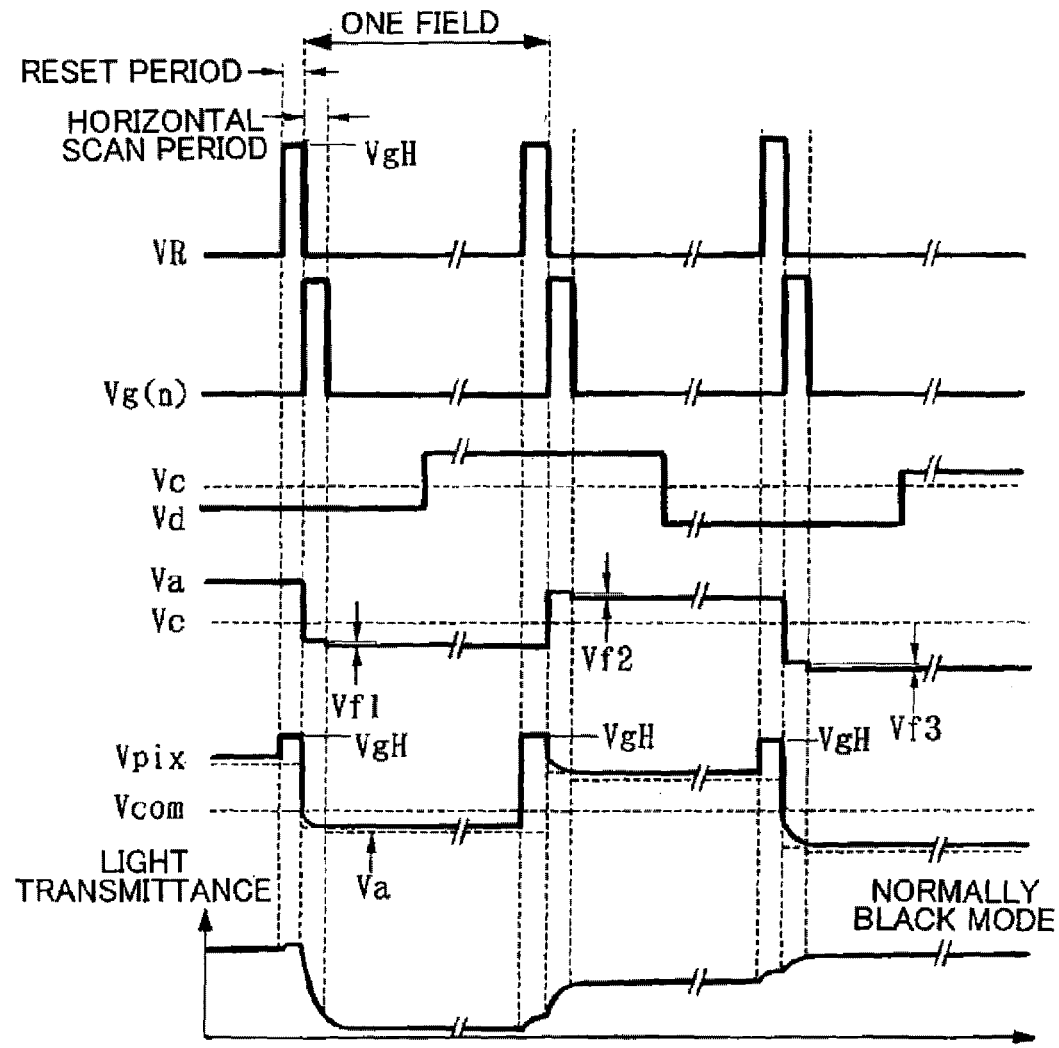
FIG. 48 is a timing chart when liquid crystal is driven in the liquid crystal display device of the eighteenth embodiment.

FIG. 47 is a diagram showing a pixel circuit constituting a liquid crystal display device according to an eighteenth embodiment of the present invention, and FIG. 48 is a timing chart showing the gate scan voltage Vg, the data signal voltage Vd, the gate input voltage Va of the first p-type MOS transistor (Qp1) 302 and the pixel voltage Vpix and also shows the variation of the light transmittance of liquid crystal when high-response liquid crystal such as ferroelectric or antiferroelectric liquid crystal having polarization, OCB more liquid crystal responding within the one-field period or the like is drive by the pixel circuit.

The great difference of the construction of this embodiment from the second embodiment resides in that any one of the source and drain electrodes of the p-type MOS transistor constituting the amplifier circuit portion in each pixel circuit constituting the liquid crystal display device is driven by a reset pulse power supply source.

That is, the difference resides in that any one of the source and drain electrodes of the first p-type MOS transistor (Qp1) 302 is connected to a reset pulse power supply source 307, and the other of the source and drain electrodes is connected to the pixel electrode 107.

The constructions of the other parts than the above-described parts in this embodiment are identical to those of the second embodiment. Therefore, these same parts are represented by the same reference numerals, and the description thereof is omitted.

Accordingly, the liquid crystal display device having the above difference is represented by 10-18, and the pixel circuit is represented by 20-18.

Next, the operation of this embodiment will be described with reference to FIGS. 47 and 48.

The driving method for the liquid crystal display device 10-18 according to this embodiment is substantially identical to the driving method for the liquid crystal display device 10-2 according to the second embodiment except that the first p-type MOS transistor (Qp1) 302 of the analog amplifier circuit 20-18 is driven by the reset pulse power supply source 307, and the driving method will be described hereunder.

FIG. 48 is a timing chart showing the reset pulse voltage VR, the gate scan voltage Vg, the data signal voltage, the gate input voltage Va of the first p-type MOS transistor (Qp1) 302 and the pixel voltage Vpix and also shows the variation of the light transmittance of liquid crystal when high-response liquid crystal such as ferroelectric or antiferroelectric liquid crystal having polarization, OCB mode liquid crystal responding within the one-field period or the like is driven in the pixel circuit in the normally black mode in which it is kept in dark state under no voltage application.

As shown in FIG. 48, during a period when the reset pulse voltage VR is set to high level VgH, the gate scan voltage VgH is transferred via the first p-type MOS transistor (Qp1) 302 to thereby reset the pixel electrode 107.

During the period when the reset pulse voltage VR is set to high level, the pixel voltage Vpix is set to VgH so that the first p-type MOS transistor (Qp1) 302 is reset, and the first p-type MOS transistor (Qp1) 302 operates as a source follower type analog amplifier circuit 104-18 after the reset pulse VR is set to low level. This will be described hereunder.

Subsequently to the reset period when the reset pulse voltage VR is set to high level VgH, in a period when the gate scan voltage Vg is set to high level VgH, the n-type MOS transistor (Qn) 103 is set to ON state, and the data signal voltage Vd input to the signal line 102 is transferred through the n-type MOS transistor (Qn) 103 to the gate electrode of the first p-type MOS transistor (Qp1) 302. When the horizontal scan period is finished and the gate scan voltage Vg is set to low level, the n-type MOS transistor (Qn) 103 is set to OFF state and the data signal voltage transferred to the gate electrode of the first p-type MOS transistor (Qp1) 302 is held in the voltage holding capacitor 106.

At this time, the gate input voltage Va of the first p-type MOS transistor (Qp1) 302 suffers a voltage shift called as a field through voltage via the gate-source capacitance of the n-type MOS transistor (Qn), 103 at the time when the n-type MOS transistor (Qn) 103 is set to OFF state. This voltage shift is represented by Vf1, Vf2, Vf3 in FIG. 48, and the amount of the voltage shift can be reduced by setting the voltage holding capacitance 106 to a large value. The gate input voltage Va of the first p-type MOS transistor (Qp1) 302 is held until the gate scan voltage Vg is set to high level again in the next field period to select the n-type MOS transistor (Qn) 103. On the other hand, the first p-type MOS transistor (Qp1) 302 has been already reset during the reset period when the reset pulse voltage VR is set to high level VgH, and subsequently to the horizontal scan period, it operates as the source follower type analog amplifier circuit 104-18 using the pixel electrode 107 as a source electrode subsequently to the horizontal scan period.

At this time, the voltage holding capacitance electrode 105 is supplied with a voltage higher than at least (Vdmax-Vtp) in advance in order to make the first p-type MOS transistor (Qp1) 302 as the analog amplifier 104-18. Here, Vdmax represents the maximum value to the data signal voltage, and Vtp represents a threshold voltage of the first p-type MOS transistor (Qp1) 302. The first p-type MOS transistor (Qp1) can output the analog gradation voltage corresponding to the gate input voltage Va thus held until the reset pulse voltage is set to VgH in the next field to reset the first p-type MOS transistor (Qp1) 302.

Furthermore, in the driving method described above, the horizontal scan period comes after the reset period. However, the driving may be carried out so that the reset period and the horizontal scan period are set to the same timing.

In this case, the selection of the pixel circuit 20-18 and the reset of the first p-type MOS transistor (Qn1) 302 are simultaneously performed.

As described above, according to the construction of this embodiment, there can be achieved substantially the same effect as the second embodiment except that the driving of the first p-type MOS transistor (Qp1) 302 (N) is carried out by the reset pulse voltage VR supplied from the reset pulse power supply source 307.

That is, there can be achieved the effect that the pixel voltage which is substantially proportional to the data signal voltage Vd can be applied to the liquid crystal 109, and thus the effect that more excellent gradation can be achieved and the aperture ratio can be more enhanced as compared with the patent document described above.

The liquid crystal display device of this embodiment is designed with keeping the above effect so that the scan voltage of the scan voltage of the scan line 101 is used as the power supply source and reset power supply source of the first p-type MOS transistor (Qp1) 302 operating as the amplifier circuit portion of the analog amplifier circuit 104-18, and the reset of the analog amplifier circuit 104-18 is carried out by the first p-type MOS transistor (Qp1) 302 itself. Therefore, wires and circuits such as power supply source wires, reset power supply source lines, reset switch, etc. are not needed, so that the analog amplifier circuit 104-18 can be constructed in a small area and the same level of high aperture ratio as the second embodiment can be achieved.

Furthermore, the reset pulse power supply source VR is separately equipped, and thus as compared with the liquid crystal display devices described in the second embodiment and the tenth embodiment, the delay of the scan pulse signal used to reset the analog amplifier can be nullified.

Nineteenth Embodiment

Figure 49:
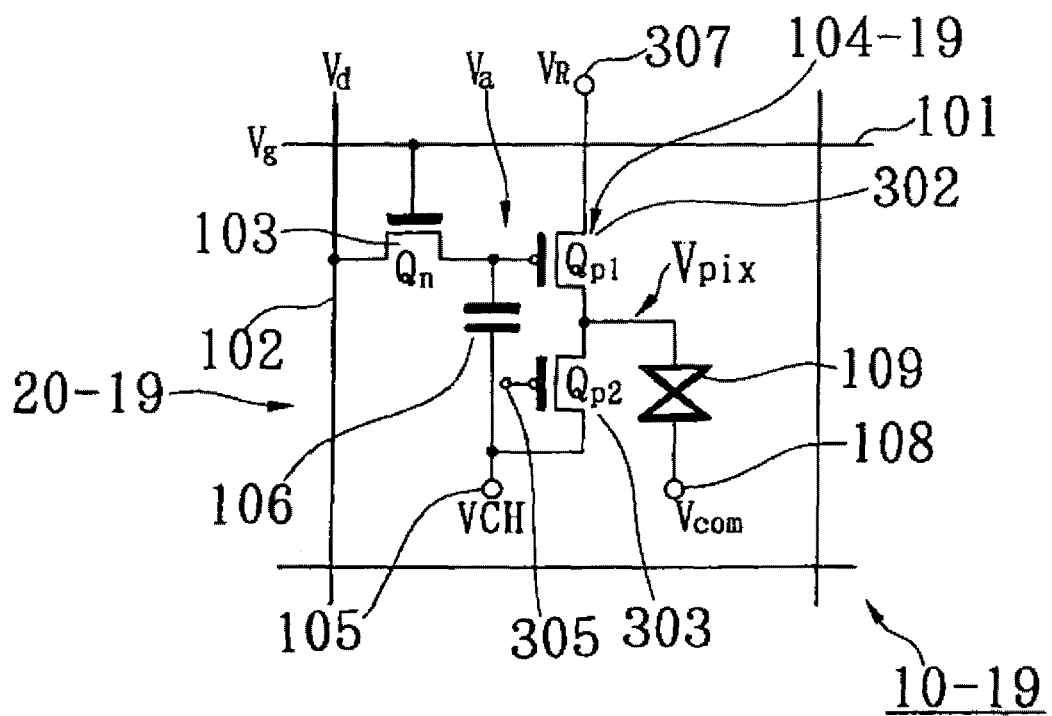
FIG. 49 is a diagram showing a pixel circuit constituting a liquid crystal display device according to a nineteenth embodiment of the present invention.

FIG. 49 is a diagram showing a pixel circuit constituting a liquid crystal display device according to a nineteenth embodiment of the present invention.

The great difference of the construction of this embodiment from that of the third embodiment resides in that any one of the source and drain electrodes of the p-type MOS transistor constituting the amplifier circuit portion of the analog amplifier circuit in each pixel circuit constituting the liquid crystal display device is driven by the reset pulse power supply source.

That is, the difference resides in that any one of the source and drain electrodes of the first p-type MOS transistor (Qp1) 302(N) is connected to the reset pulse power supply source 307, and the other of the source and drain electrodes is connected to the pixel electrode 107.

The constructions of the other parts than the above-described parts in this embodiment are identical to those of the third embodiment. Therefore, these same parts are represented by the same reference parts as the third embodiment, and the description thereof is omitted.

Accordingly, the liquid crystal display device having the above difference is represented by 10-19, and the pixel circuit is represented by 20-19.

The operation of this embodiment will be described with reference to FIG. 49.

The driving method for the liquid crystal display device 10-19 of this embodiment is substantially identical to the driving method of the liquid crystal display device according to the third embodiment except that the first p-type MOS transistor (Qp1) 302 of the analog amplifier circuit 104-19 is driven by the reset pulse voltage VR supplied from the reset pulse power supply source 307.

If the description on the eighteenth embodiment is referred to, the understanding would be made clearer, and thus it is merely indicated that the first p-type MOS transistor (Qp1) 302 of the analog amplifier circuit 20-19 is driven by the reset pulse voltage VR supplied from the reset pulse power supply source 307.

In the driving method of this embodiment, the horizontal scan period comes subsequently to the reset period. However, the driving may be carried out so that the reset period and the horizontal period are set to the same timing.

In this case, the selection of the pixel circuit 20-19 and the reset of the first p-type MOS transistor (Qp1) 302 are simultaneously carried out.

As described above, according to the construction of this embodiment, there can be achieved substantially the same effect as the third embodiment except that the driving of the first p-type MOS transistor (Qp1) 302 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved and the aperture ratio can be more enhanced as compared with the patent document described above.

The liquid crystal display device of this embodiment is designed with keeping the above effect so that the reset pulse power supply source is commonly used for the power supply source and reset power supply source of the first p-type MOS transistor (Qp1) 302 operating as the amplifier circuit portion of the analog amplifier circuit 104-19, and the reset of the analog amplifier circuit 104-19 is carried out by the first p-type MOS transistor (Qn1) 302 itself. Therefore, wires and circuits such as power supply source wires, reset power supply source lines, reset switch, etc. are not needed, so that the analog amplifier circuit 104-19 can be constructed in a small area and the same level of high aperture ratio as the third embodiment can be achieved.

Furthermore, the reset pulse power supply source VR is separately equipped, and thus as compared with the liquid crystal display devices described in the third embodiment and the eleventh embodiment, the delay of the scan pulse signal used to reset the analog amplifier circuit 104-19 can be nullified.

Twentieth Embodiment

Figure 50:
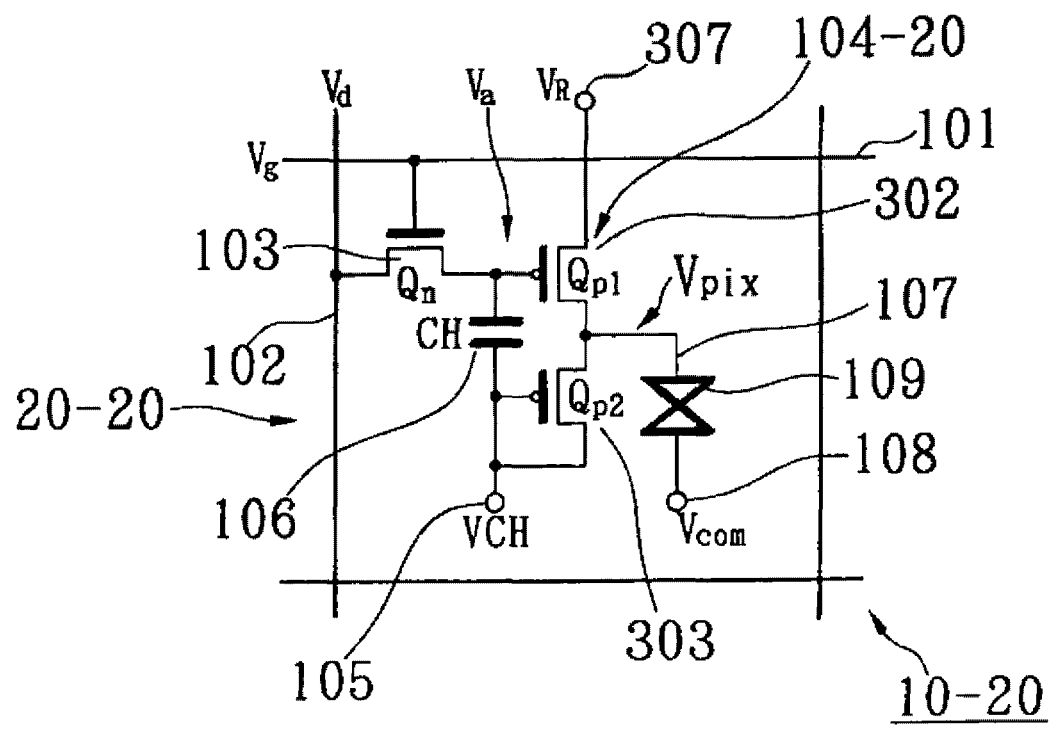
FIG. 50 is a diagram showing a pixel circuit constituting a liquid crystal display device according to a twentieth embodiment of the present invention.

FIG. 50 is a diagram showing a pixel circuit constituting a liquid crystal display device according to a twelfth embodiment of the present invention.

The great difference of the construction of this embodiment from that of the fourth embodiment resides in that any one of the source and drain electrodes of the p-type MOS transistor constituting the amplifier circuit portion of the analog amplifier circuit in each pixel circuit constituting the liquid crystal display device is driven by the reset pulse power supply source.

That is, the difference resides in that any one of the source and drain electrodes of the first p-type MOS transistor (Qp1) 302 is connected to the reset pulse power supply source 307, the other of the source and drain electrodes is connected to the pixel electrode 107.

The constructions of the other parts than the above-described parts in this embodiment are identical to those of the fourth embodiment.

Therefore, these same parts are represented by the same reference numerals, and the description thereof is omitted.

Accordingly, the liquid crystal display device having the above difference is represented by 10-20, and the pixel circuit is represented by 20-20.

Next, the operation of this embodiment will be described with reference to FIG. 50.

The driving method for the liquid crystal display device 10-20 according to this embodiment is substantially identical to the driving method for the liquid crystal display device of the fourth embodiment except that the first p-type MOS transistor (Qp1) 302 of the analog amplifier circuit 104-20 is driven by the reset pulse voltage VR supplied from the reset pulse power supply source 307.

If the description on the eighteenth embodiment is referred to, the understanding would be made clearer. Therefore, it is merely indicated that the first p-type MOS transistor (Qp1) 302 of the analog amplifier circuit 104-20 is driven by the reset pulse power supply source 307, and the repetitive detailed description on the operation is omitted from the following description.

In the driving method of this embodiment, the horizontal scan period comes subsequently to the reset period. However, the driving may be carried out so that the reset period and the horizontal period are set to the same timing.

In this case, the selection of the pixel circuit 20-20 and the reset of the first n-type MOS transistor (Qn1) 302 are simultaneously carried out.

As described above, according to the construction of this embodiment, there can be achieved substantially the same effect as the fourth embodiment except that the driving of the first p-type MOS transistor (Qp1) 302 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved and the aperture ratio can be more enhanced as compared with the patent document described above.

The liquid crystal display device of this embodiment is designed with keeping the above effect so that the reset pulse power supply source 307 is commonly used for the power supply source and reset power supply source of the first p-type MOS transistor (Qp1) 302 operating as the amplifier circuit portion of the analog amplifier circuit 104-20, and the reset of the analog amplifier circuit 104-20 is carried out by the first p-type MOS transistor (Qn1) 302 itself. Therefore, wires and circuits such as power supply source wires, reset power supply source lines, reset switch, etc. are not needed.

Furthermore, the analog amplifier circuit 104-20 can be constructed in a small area and the same level of high aperture ratio as the fourth embodiment can be achieved.

Still furthermore, the reset pulse power supply source VR is separately equipped, and thus as compared with the liquid crystal display devices described in the fourth embodiment and the twelfth embodiment, the delay of the scan pulse signal used to reset the analog amplifier can be nullified.

Twenty First Embodiment

Figure 51:
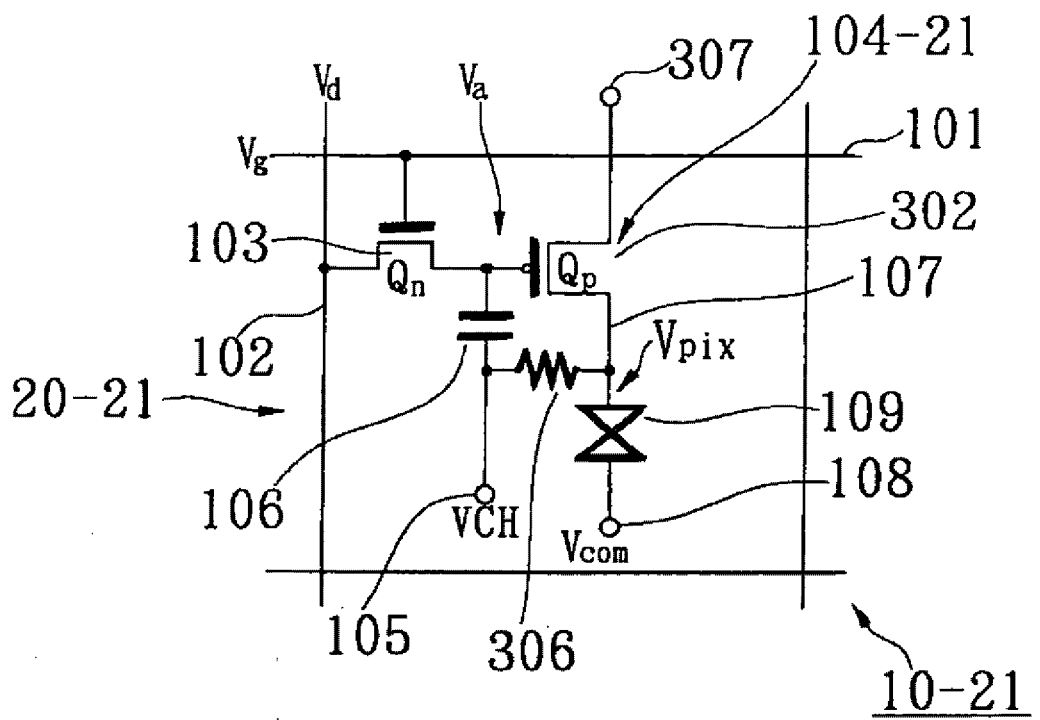
FIG. 51 is a diagram showing a pixel circuit constituting a liquid crystal display device according to a twenty first embodiment of the present invention.

FIG. 51 is a diagram showing a pixel circuit constituting a liquid crystal display device according to a twentieth embodiment of the present invention.

The great difference of the construction of this embodiment from that of the fifth embodiment resides in that any one of the source and drain electrodes of the p-type MOS transistor constituting the amplifier circuit portion in each pixel circuit constituting the liquid crystal display device is driven by the reset pulse power supply source.

That is, the difference resides in that any one of the source and drain electrodes of the p-type MOS transistor (Qp) 302 is connected to the reset pulse power supply source 307 and the other of the source and drain electrodes thereof is connected to the pixel electrode 107.

The constructions of the other parts than the above-described parts in this embodiment are identical to those of the fifth embodiment. Therefore, these same parts are represented by the same reference numerals, and the description thereof is omitted.

Accordingly, the liquid crystal display device having the above difference is represented by 10-21, and the pixel circuit is represented by 20-21.

Next, the operation of this embodiment will be described with reference to FIG. 51.

The driving method for the liquid crystal display device according to this embodiment is substantially identical to the driving method for the liquid crystal display device according to the fifth embodiment except that the p-type MOS transistor (Qp) 302 of the analog amplifier circuit 104-21 is drive by the reset pulse voltage VR supplied from the reset pulse power supply source 307.

If the description on the eighteenth embodiment is referred to, the understanding could be made clearer, and thus it is merely indicated here that the p-type MOS transistor (Qp) 302 of the analog amplifier circuit 104-21 is driven by the reset pulse voltage VR supplied from the reset pulse power supply source 307, and the repetitive detailed description on the operation is omitted from the following description.

Furthermore, in the driving method of this embodiment, the horizontal scan period comes subsequently to the reset period. However, the reset period and the horizontal scan period may be set to the same timing.

In this case, the selection of the pixel circuit 20-21 and the reset of the n-type MOS transistor (Qn) 302 are simultaneously carried out.

As described above, according to the construction of this embodiment, there can be achieved substantially the same effect as the fifth embodiment except that the driving of the p-type MOS transistor (Qp) 302 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 307 is commonly used for the power supply source and reset power supply source of the p-type MOS transistor (Qp) 302 operating as the amplifier circuit portion of the analog amplifier circuit 104-21, and the reset of the analog amplifier circuit 104-21 is carried out by the p-type MOS transistor (Qp) 302 itself. Therefore, wires and circuits such as power supply source wires, reset power supply source lines, reset switch, etc. are not needed.

Furthermore, the analog amplifier circuit 104-21 can be constructed in a small area and the same level of high aperture ratio as the fifth embodiment can be achieved.

Still furthermore, the reset pulse power supply source VR is separately equipped, and thus as compared with the liquid crystal display devices described in the fifth embodiment and the thirteenth embodiment, the delay of the scan pulse signal used to reset the analog amplifier circuit can be nullified.

Twenty Second Embodiment

Figure 52:
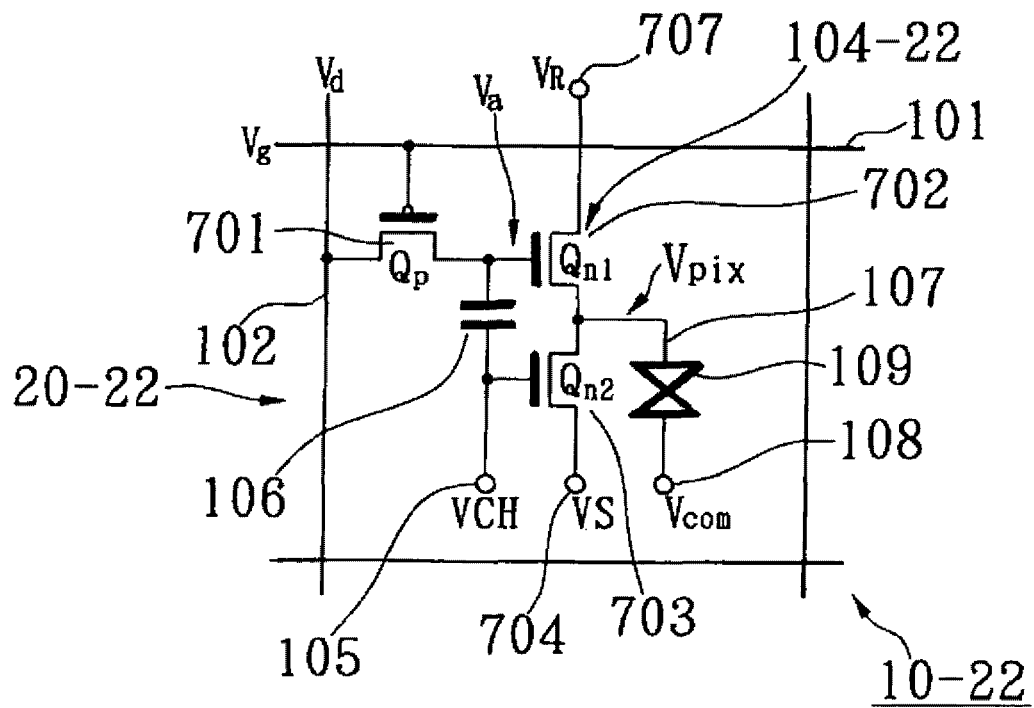
FIG. 52 is a diagram showing a pixel circuit constituting a liquid crystal display device according to a twenty second embodiment of the present invention.
Figure 53:
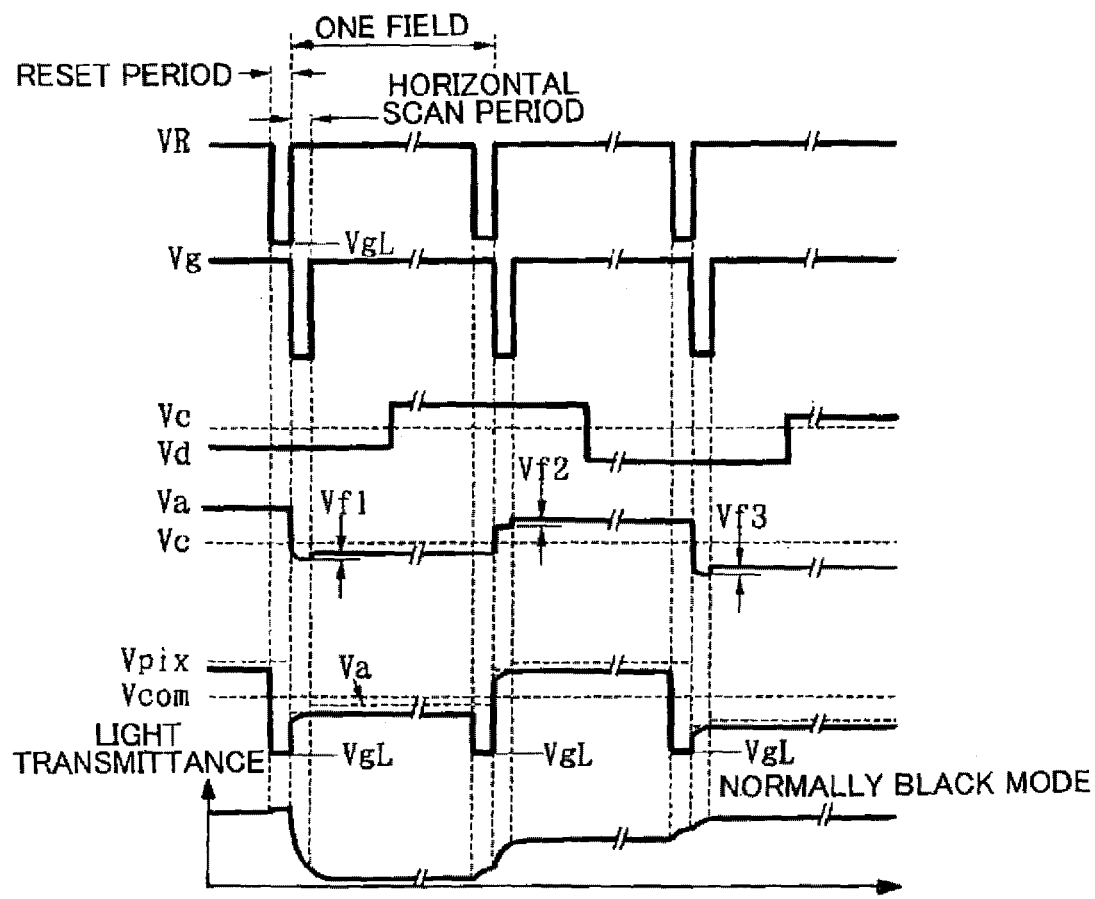
FIG. 53 is a timing chart when liquid crystal is driven in the liquid crystal display device of the twenty second embodiment.

FIG. 52 is a diagram showing a pixel circuit constituting a liquid crystal display device according to a twenty second embodiment of the present invention, and FIG. 53 is a timing chart showing the gate scan voltage Vg, the data signal voltage Vd, the gate input voltage Va of the n-type MOS transistor (Qn) 702 and the pixel voltage Vpix and also shows the variation of the light transmittance of liquid crystal when high-response liquid crystal such as ferroelectric or antiferroelectric liquid crystal having polarization, OCB mode liquid crystal responding within the one-field period or the like is driven in the pixel circuit.

The great difference of the construction of this embodiment from that of the sixth embodiment resides in that any one of the source and drain electrodes of the n-type MOS transistor of the analog amplifier in each pixel circuit constituting the liquid crystal display device is driven by the reset pulse power supply source.

That is, the difference resides in that the gate electrode of the first n-type MOS transistor (Qn1) 702 is connected to any one of the source and drain electrodes of the p-type MOS transistor (Qp) 701, any one of the source and drain electrodes of the first n-type MOS transistor (Qn1) 702 is connected to the reset pulse power supply source 707, and the other of the source and drain electrodes of the first n-type MOS transistor (Qn1) 702 is connected to the pixel electrode 107.

The constructions of the other parts than the above-described parts in this embodiment are identical to those of the sixth embodiment. Therefore, these same parts are represented by the same reference numerals as the sixth embodiment, and the description thereof is omitted.

The liquid crystal display device having the above difference is represented by 10-22, and the pixel circuit is represented by 20-22.

Next, the operation of this embodiment will be described with reference to FIGS. 52 and 53.

The driving method for the liquid crystal display device 10-22 according to this embodiment is substantially identical to the driving method for the liquid crystal display device according to the sixth embodiment except that the first n-type MOS transistor (Qn1) 702 of the analog amplifier circuit 104-22 is driven by the reset pulse power supply source 307, and the driving method will be hereunder described.

FIG. 53 is a timing chart showing the gate scan voltage Vg, the data signal voltage Vd, the gate input voltage Va of the first n-type MOS transistor (Qn1) 702 and the pixel voltage Vpix and also shows the variation of the light transmittance of liquid crystal when high-response liquid crystal is driven in the normally black mode in which it is kept in dark state under no voltage application as in the case of FIG. 25.

As shown in FIG. 53, during the period when the reset pulse voltage VR is set to low level VgL, the gate scan voltage VgL is transferred through the first n-type MOS transistor (Qn1) 702 to reset the pixel electrode 107. That is, during the period when the reset pulse voltage VR is set to low level, the pixel voltage Vpix is set to VgL, so that the first n-type MOS transistor (Qn1) 702 is reset. The first n-type MOS transistor (Qn1) 702 operates as the amplifier circuit portion of the source follower type analog amplifier circuit 104-22 after the reset pulse voltage VR is set to high level. This will be described hereunder.

Sequentially to the reset period when the reset pulse voltage VR is set to low level VgL, in the period when the gate scan voltage Vg is set to low level VgL, the p-type MOS transistor (Qp) 701 is set to ON state, and the data signal voltage Vd input to the signal line 102 is transferred to the gate electrode of the first n-type MOS transistor (Qn1) 702 through the p-type MOS transistor (Qp) 701. when the horizontal scan period is finished and the gate scan voltage Vg is set to high level, the p-type MOS transistor (Qp) 701 is set to OFF state, and the data signal voltage transferred to the gate electrode of the first n-type MOS transistor (qn1) 702 is held in the voltage holding capacitor 106.

The gate input voltage Va of the first n-type MOS transistor (Qn1) 702 thus held suffers a voltage shift called as a field through voltage via the gate-source capacitance of the p-type MOS transistor (Qn) 701 at the time when the p-type MOS transistor (Qp) 701 is set to OFF state. This voltage shift is represented by Vf1, Vf2, Vf3 in FIG. 53, and the amount of the voltage shift Vf1 to Vf3 can be reduced by setting the voltage holding capacitance 106 to a large value.

The gate input voltage Va of the first n-type MOS transistor (Qn1) 702 is held until the gate scan voltage Vg is set to low level in the next field to select the p-type MOS transistor (Qp) 701. The first n-type MOS transistor (Qn1) 702 has been already reset during the period when the reset pulse voltage VR is set to low level VgL, and subsequently to the horizontal scan period, the first n-type MOS transistor (Qn1) 702 operates as a source follower type analog amplifier circuit 104-22 using the pixel electrode 107 as the source electrode.

At this time, in order to make the first n-type MOS transistor (Qn1) 702 operate as the amplifier circuit portion of the analog amplifier circuit 104-22, the voltage holding capacitance electrode 105 is supplied with a voltage lower than at least (Vdmin-Vtn). Vdmin represents the minimum value of the data signal voltage Vd, and Vtn represents the threshold voltage of the first n-type MOS transistor (Qn1) 702. The first n-type MOS transistor (Qn1) 702 can output the analog gradation voltage corresponding to the gate input voltage Va thus held until the reset pulse voltage VR is set to VgL again to reset the first n-type MOS transistor (Qn1) 702.

In the driving method of this embodiment, the horizontal scan period comes subsequently to the reset period. However, the driving may be carried out so that the reset period and the horizontal scan period are set to the same timing.

In this case, the selection of the pixel circuit 20-22 and the reset of the first n-type MOS transistor (Qn1) 702 are simultaneously carried out.

As described above, according to the construction of this embodiment, there can be achieved substantially the same effect as the sixth embodiment except that the driving of the first n-type MOS transistor (Qn1) 702 is carried out by the reset pulse voltage VR supplied from the reset pulse power supply source 707.

That is, there can be achieved the effect that the pixel voltage Vpix which is substantially proportional to the data signal voltage Vd can be applied to the liquid crystal 109 and thus the effect that more excellent gradation can be achieved every field and the aperture ration can be more enhanced as compared with the patent document described above.

The liquid crystal display device of this embodiment is designed with keeping the above effect so that the reset pulse power supply source 707 is commonly used for the power supply source and reset power supply source of the first n-type MOS transistor (Qn1) 702 operating as the amplifier circuit portion of the analog amplifier circuit 104-22, and the reset of the analog amplifier circuit 104-22 is carried out by the first n-type MOS transistor (Qn1) 702 itself. Therefore, wires and circuits such as power supply source wires, reset power supply source lines, reset switch, etc. are not needed.

Furthermore, the analog amplifier circuit 104-22 can be constructed in a small area and the same level of high aperture ratio as the sixth embodiment can be achieved.

Still furthermore, the reset pulse power supply source VR is separately equipped, and thus as compared with the liquid crystal display devices described in the sixth embodiment and the fourteenth embodiment, the delay of the scan pulse signal used to reset the analog amplifier can be nullified.

Twenty Third Embodiment

Figure 54:
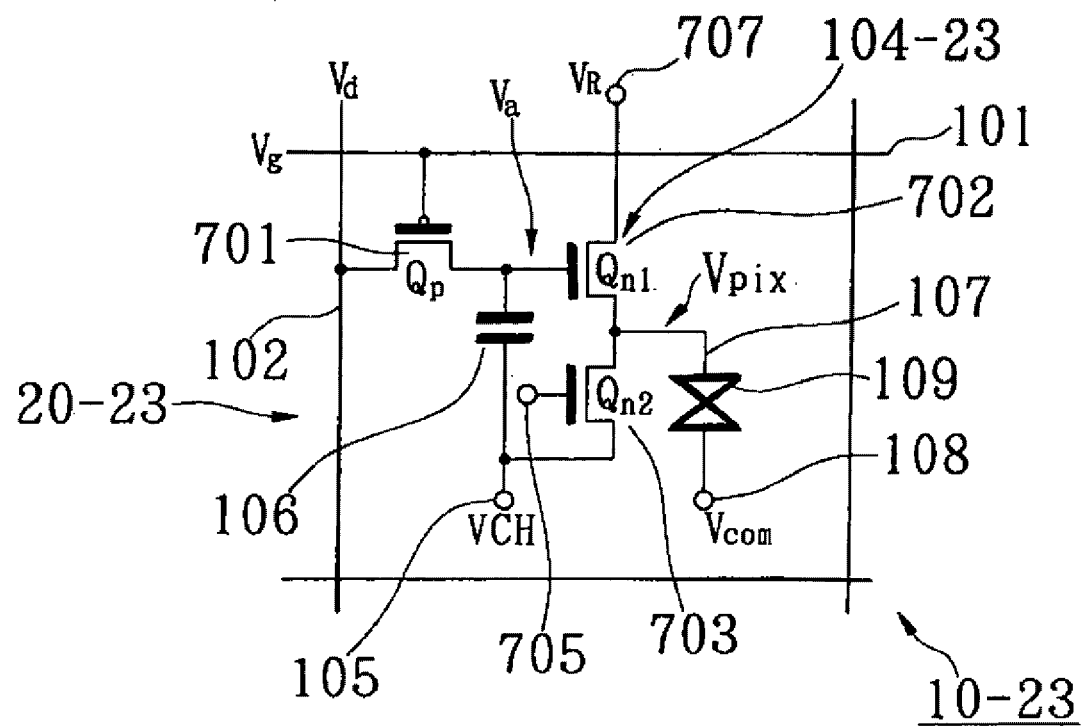
FIG. 54 is a diagram showing a pixel circuit constituting a liquid crystal display device according to a twenty third embodiment of the present invention.

FIG. 54 is a diagram showing a pixel circuit constituting a liquid crystal display device according to a twenty third embodiment of the present invention.

The construction of this embodiment is different from that of the seventh embodiment in that any one of source and drain electrodes of the n-type MOS transistor of the analog amplifier circuit in each pixel circuit constituting the liquid crystal display device is driven by the reset pulse power supply source.

That is, the difference resides in that any one of the source and drain electrodes of the first n-type MOS transistor (Qn1) 702 is connected to the reset pulse power supply source 707 and the other of the source and drain electrodes thereof is connected to the pixel electrode 107.

The constructions of the other parts than the above-described parts in this embodiment are identical to those of the seventh embodiment. Therefore, these same parts re represented by the same reference numerals as the seventh embodiment, and the description thereof is omitted.

Accordingly, the liquid crystal display device having the above difference is represented by 10-23, and the pixel circuit is represented by 20-23.

Next, the operation of this embodiment will be described with reference to FIG. 54.

The driving method of the liquid crystal display device 10-23 of this embodiment is substantially identical to the driving method of the liquid crystal display device according to the seventh embodiment except that the first n-type MOS transistor (Qn1) 702 of the analog amplifier circuit 104-23 is driven by the reset pulse voltage VR supplied from the reset pulse power supply source 707.

If the description on the twenty second embodiment is referred to, the understanding could be made clearer, and thus it is merely indicated here that the first n-type MOS transistor (Qn1) 702 of the analog amplifier circuit 104-23 is driven by the reset pulse voltage VR supplied from the reset pulse power supply source, and the repetitive detailed description on the operation is omitted.

Furthermore, in the driving method of this embodiment, the horizontal scan period comes subsequently to the reset period. However, the reset period and the horizontal scan period may be set to the same timing.

In this case, the selection of the pixel circuit 20-23 and the reset of the FIRST n-type MOS transistor (Qn1) 302 are simultaneously carried out.

As described above, according to the construction of this embodiment, there can be achieved substantially the same effect as the seventh embodiment except that the driving of the first n-type MOS transistor (Qn1) 702 is carried out by the reset pulse voltage supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the first n-type MOS transistor (Qn1) 702 operating as the amplifier circuit portion of the analog amplifier circuit 104-23, and the reset of the analog amplifier circuit 104-23 is carried out by the first n-type MOS transistor (Qn1) 702 itself. Therefore, wires and circuits such as power supply source wires, reset power supply source lines, reset switch, etc. are not needed.

Furthermore, the analog amplifier circuit 104-23 can be constructed in a small area and the same level of high aperture ratio as the seventh embodiment can be achieved.

Still furthermore, the reset pulse power supply source VR is separately equipped, and thus as compared with the liquid crystal display devices described in the seventh embodiment and the fifteenth embodiment, the delay of the scan pulse signal used to reset the analog amplifier circuit 104-23 can be nullified.

Twenty Fourth Embodiment

Figure 55:
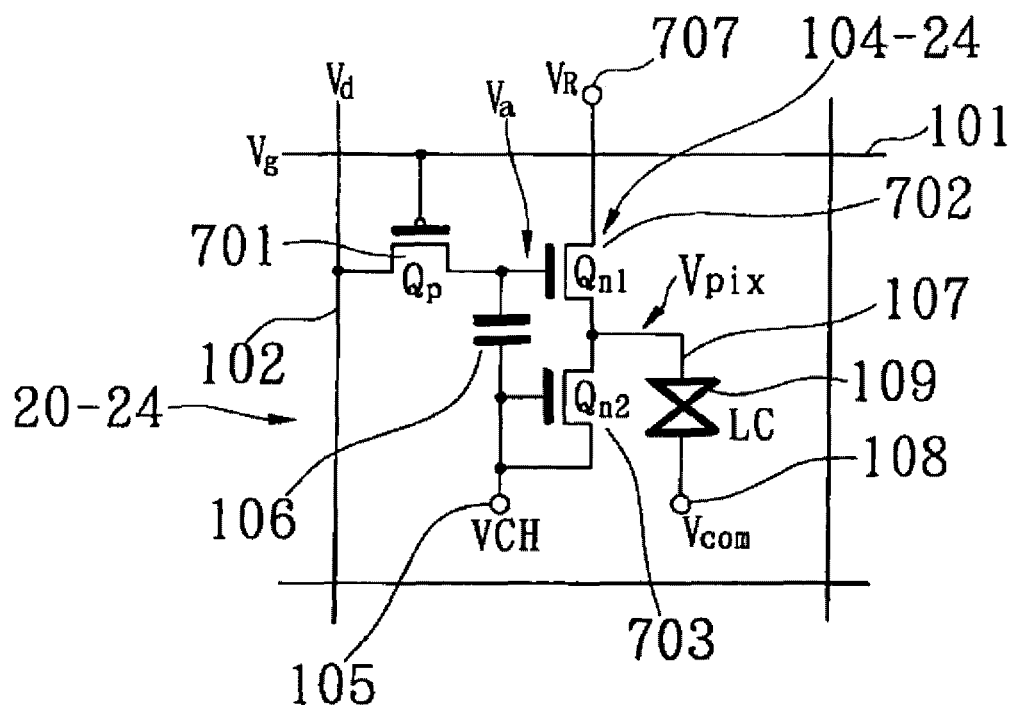
FIG. 55 is a diagram showing a pixel circuit constituting a liquid crystal display device according to a twenty fourth embodiment of the present invention.

FIG. 55 is a diagram showing a pixel circuit constituting a liquid crystal display device according to a twenty fourth embodiment of the present invention.

The construction of this embodiment is greatly different from that of the eighth embodiment in that any one of the source and drain electrodes of the n-type MOS transistor of the analog amplifier circuit in each pixel circuit constituting the liquid crystal display device is driven by the reset pulse power supply source.

That is, the difference resides in that one of the source and drain electrodes of the first n-type MOS transistor (Qn1) 702 is connected to the reset pulse power supply source 707 and the other of the source and drain electrodes thereof is connected to the pixel electrode 107.

The constructions of the other parts than the above-described parts in this embodiment are identical to those of the eighth embodiment. Therefore, these same parts are represented by the same reference numerals as the eighth embodiment, and the description thereof is omitted.

Accordingly, the liquid crystal display device having the above difference is represented by 10-24, and the pixel circuit is represented by 20-24.

Next, the operation of this embodiment will be described with reference to FIG. 55.

The driving method of the liquid crystal display device 10-24 according to this embodiment is substantially identical to the driving method of the liquid crystal display device according to the eighth embodiment except that the first n-type MOS transistor (Qn1) 702 of the analog amplifier circuit 104-24 is driven by the reset pulse voltage VR supplied from the reset pulse power supply source 707.

If the description on the twenty second embodiment is referred to, the understanding could be made clearer, and thus it is merely indicated here that the first n-type MOS transistor (Qn1) 702 of the analog amplifier circuit 104-24 is driven by the reset pulse voltage VR supplied from the reset pulse power supply source, and the repetitive detailed description on the operation is omitted.

Furthermore, in the driving method of this embodiment, the horizontal scan period comes subsequently to the reset period. However, the reset period and the horizontal scan period may be set to the same timing.

In this case, the selection of the pixel circuit 20-24 and the reset of the first n-type MOS transistor (Qn1) 702 are simultaneously carried out.

As described above, according to the construction of this embodiment, there can be achieved substantially the same effect as the eighth embodiment except that the driving of the first n-type MOS transistor (Qn1) 702 is carried out by the reset pulse voltage supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the first n-type MOS transistor (Qn1) 702 operating as the amplifier circuit portion of the analog amplifier circuit 104-24, and the reset of the analog amplifier circuit 104-24 is carried out by the first n-type MOS transistor (Qn1) 702 itself. Therefore, wires and circuits such as power supply source wires, reset power supply source lines, reset switch, etc. are not needed.

Furthermore, the analog amplifier circuit 104-24 can be constructed in a small area and the same level of high aperture ratio as the eighth embodiment can be achieved.

Still furthermore, the reset pulse power supply source VR is separately equipped, and thus as compared with the liquid crystal display devices described in the eighth embodiment and the sixteenth embodiment, the delay of the scan pulse signal used to reset the analog amplifier circuit 104-24 can be nullified.

Twenty Fifth Embodiment

Figure 56:
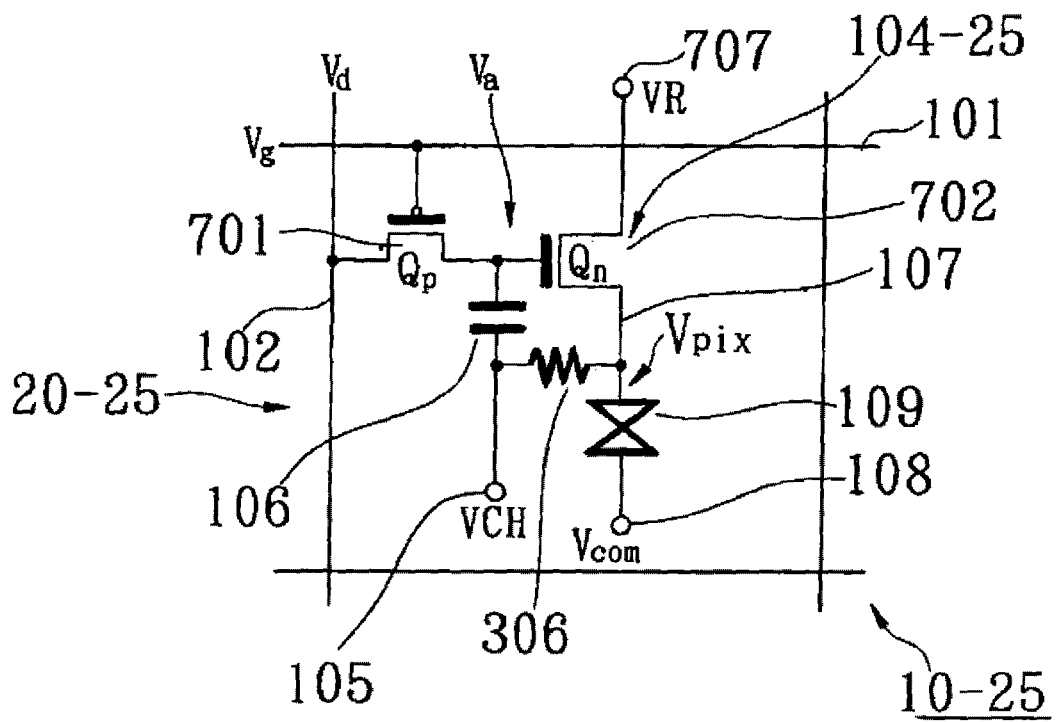
FIG. 56 is a diagram showing a pixel circuit constituting a liquid crystal display device according to a twenty fifth embodiment of the present invention.

FIG. 56 is a diagram showing a pixel circuit constituting a liquid crystal display device according to a twenty fifth embodiment of this invention.

The construction of this embodiment is greatly different from that of the ninth embodiment in that any one of the source and drain electrodes of the n-type MOS transistor of the analog amplifier circuit in each pixel circuit constituting the liquid crystal display device is driven by the reset pulse power supply source.

That is, the difference resides in that any one of the source and drain electrodes of the n-type MOS transistor (Qn) 702 is connected to the reset pulse power supply source 707 and the other of the source and drain electrodes is connected to the pixel electrode 107.

The constructions of the other parts than the above-described parts in this embodiment are identical to those of the ninth embodiment. Therefore, these same parts are represented by the same reference numerals as the ninth embodiment, and the description thereof is omitted.

Accordingly, the liquid crystal display device having the above difference is represented by 10-25, and the pixel circuit is represented by 20-25.

Next, the operation of this embodiment will be described with reference to FIG. 56.

The driving method for the liquid crystal display device 10-25 according to this embodiment is substantially identical to the driving method for the liquid crystal display device according to the ninth embodiment except that the n-type MOS transistor (Qn) 702 of the analog amplifier circuit 104-25 is driven by the reset pulse voltage VR supplied from the reset pulse power supply source 707.

If the description on the twenty second embodiment is referred to, the understanding could be made clearer, and thus it is merely indicated here that the n-type MOS transistor (Qn) 702 of the analog amplifier circuit 104-25 is driven by the reset pulse voltage VR supplied from the reset pulse power supply source, and the repetitive detailed description on the operation is omitted.

Furthermore, in the driving method of this embodiment, the horizontal scan period comes subsequently to the reset period. However, the reset period and the horizontal scan period may be set to the same timing.

In this case, the selection of the pixel circuit 20-25 and the reset of the FIRST n-type MOS transistor (Qn) 702 are simultaneously carried out.

As described above, according to the construction of this embodiment, there can be achieved substantially the same effect as the ninth embodiment except that the driving of the n-type MOS transistor (Qn) 702 is carried out by the reset pulse voltage supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the n-type MOS transistor (Qn) 702 operating as the amplifier circuit portion of the analog amplifier circuit 104-25, and the reset of the analog amplifier circuit 104-25 is carried out by the n-type MOS transistor (Qn) 702 itself. Therefore, wires and circuits such as power supply source wires, reset power supply source lines, reset switch, etc. are not needed.

Furthermore, the analog amplifier circuit 104-25 can be constructed in a small area and the same level of high aperture ratio as the ninth embodiment can be achieved.

Still furthermore, the reset pulse power supply source VR is separately equipped, and thus as compared with the liquid crystal display devices described in the ninth embodiment and the seventh embodiment, the delay of the scan pulse signal used to reset the analog amplifier circuit can be nullified.

Figure 57:
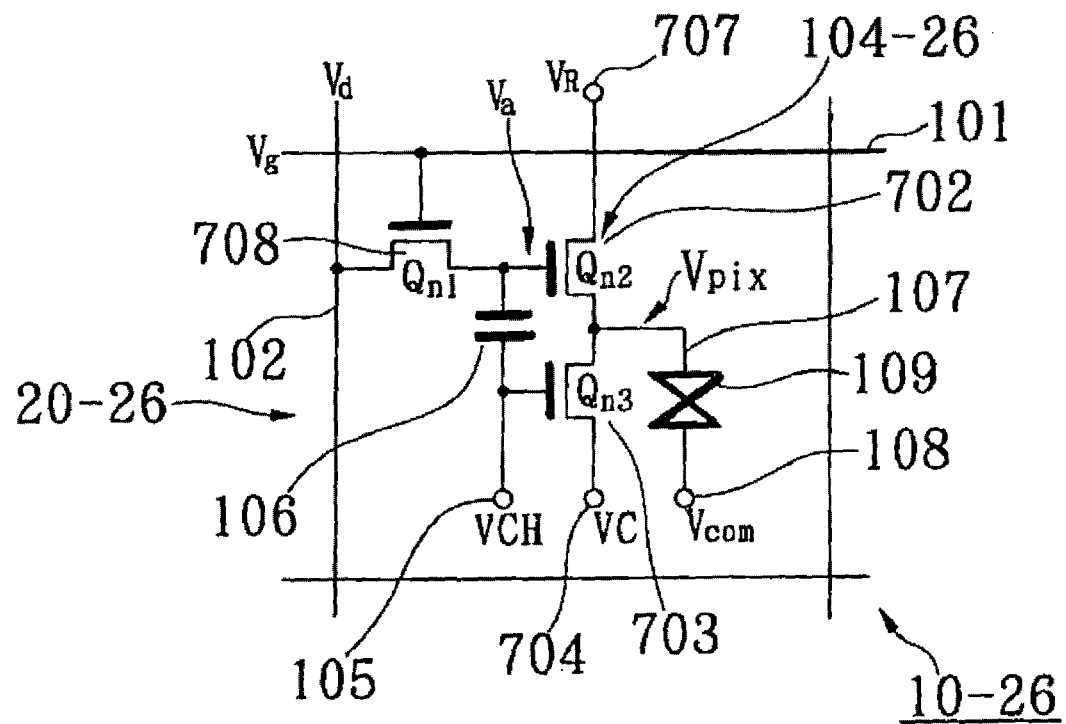
FIG. 57 is a diagram showing a pixel circuit constituting a liquid crystal display device according to a twenty sixth embodiment of the present invention.
Figure 58:
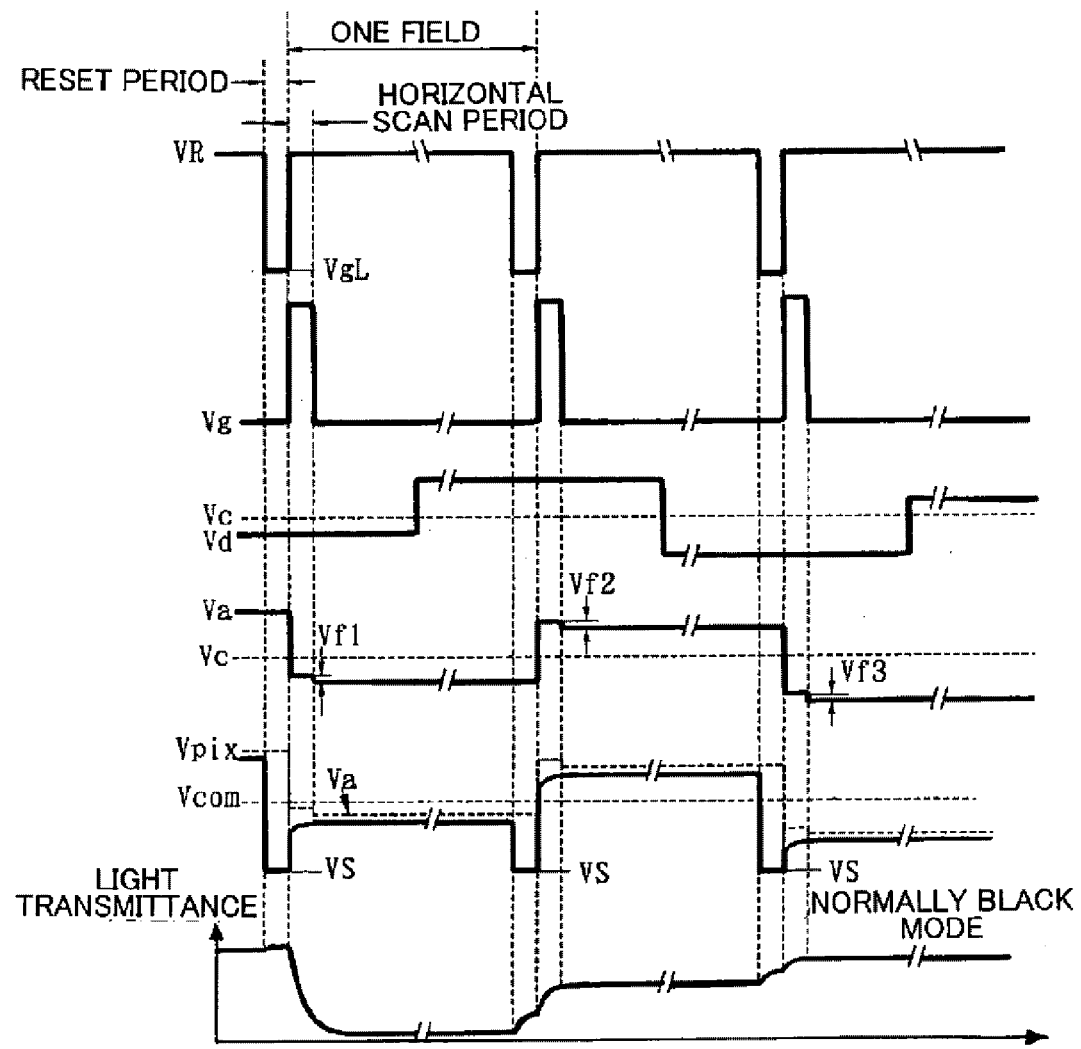
FIG. 58 is a timing chart when liquid crystal is driven in the liquid crystal display device of the twenty sixth embodiment.
Figure 59:
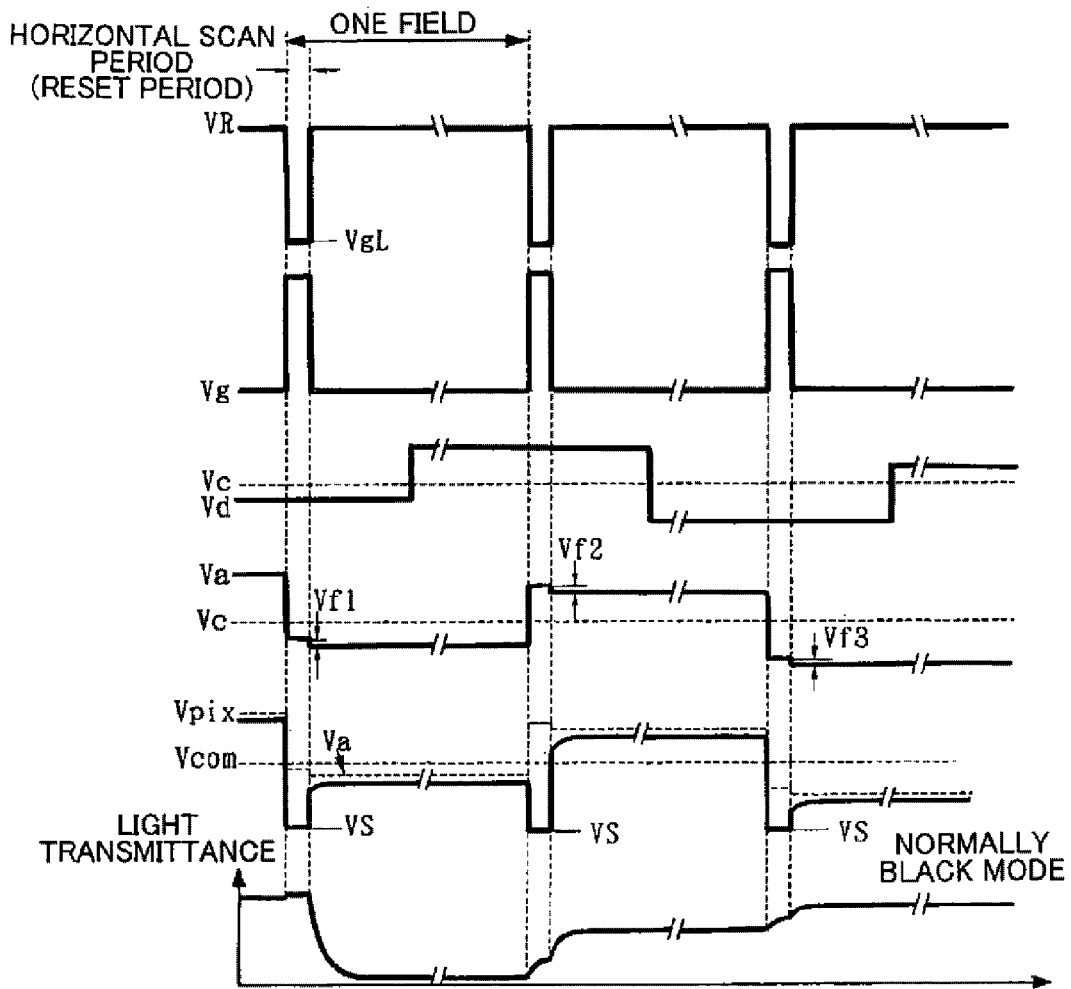
FIG. 59 is a timing chart when a horizontal scan period and a reset period are set to the same period in case that liquid crystal is driven in the liquid crystal display device of the twenty sixth embodiment.

FIG. 57 is a diagram showing a pixel circuit constituting a liquid crystal display device according to a twenty sixth embodiment of the present invention, FIG. 58 is a timing chart showing the gate scan voltage Vg, the data signal voltage Vd, the gate input voltage Va of the n-type MOS transistor (Qn) 702 and the pixel voltage Vpix and also shows the variation of the light transmittance of liquid crystal when the pixel circuit is designed so that the horizontal scan period comes when the reset period elapses and high-response liquid is driven in the normally black mode, and FIG. 59 is a timing chart showing the gate scan voltage Vg, the data signal voltage Vd, the gate input voltage Va of a second n-type MOS transistor (Qn2) 702 and the pixel voltage Vpix and also shows the variation of the light transmittance of liquid when the reset period and the horizontal scan period are set to the same timing in the pixel circuit 20-26 and the high-response liquid crystal is driven in the normally black mode. The high-response liquid is ferroelectric or antiferroelectric liquid crystal having polarization, OCB mode liquid crystal responding within the one-field period or the like.

The difference of the construction of this embodiment from that of the sixth embodiment resides in that the p-type MOS transistor (Qn) 701 of the sixth embodiment is changed to a first n-type MOS transistor (Qn1) 708, the first n-type MOS transistor (Qn1) 702 is changed to a second n-type MOS transistor (Qn2) 702 and the second n-type MOS transistor (Qn2) 703 is changed to a third n-type MOS transistor (Qn2) 703, and also any one of the source and drain electrodes of the second n-type MOS transistor (Qn2) 702 constituting the analog amplifier circuit in the pixel circuit is driven by the reset pulse power supply source.

That is, the difference resides in that the gate electrode of the first n-type MOS transistor (Qn1) 708 is connected to the scan line 101, any one of the source and drain electrodes thereof is connected to the signal line 102, the other electrodes of the source and drain electrodes of the n-type MOS transistor (Qn) 708 is connected to the gate electrode of the second n-type MOS transistor (Qn2) 702, any one of the source and drain electrodes of the second n-type MOS transistor (Qn2) 702 is connected to the reset pulse power supply source 707, and the other of the source and drain electrodes of the second n-type MOS transistor (Qn2) 702 is connected to the pixel electrode 107.

The constructions of the other parts than the above-described parts in this embodiment are identical to those of the sixth embodiment. Therefore, these same parts are represented by the same reference numerals as the sixth embodiment, and the description thereof is omitted.

Accordingly, the liquid crystal display device having the above difference is represented by 10-26, and the pixel circuit is represented by 20-26.

Next, the operation of this embodiment will be described with reference to FIGS. 57 and 58.

The driving method for the liquid crystal display device 10-26 according to this embodiment is substantially identical to the driving method for the liquid crystal display device according to the sixth embodiment except that the second n-type MOS transistor (Qn2) 702 of the analog amplifier circuit 20-26 is driven by the reset pulse power supply source 707.

As shown in FIG. 57, during the period when the reset pulse voltage VR is set to high level VgH, the pixel electrode 107 is set to reset state when the gate scan voltage VgH is transferred through the second n-type MOS transistor (Qn2) 702.

During the period when the reset pulse voltage VR is set to high level, the pixel voltage Vpix is set to VgH, so that the second n-type MOS transistor (Qn2) 702 is reset and the second n-type MOS transistor (Qn2) 702 operates as a source follower type analog amplifier circuit 104-26 after the reset pulse VR is set to low level. This will be described hereunder.

Subsequently to the reset period, in the period when the gate scan voltage Vg is set to high level VgH, the first n-type MOS transistor (Qn1) 708 is set to ON state, and the data signal voltage Vd input to the signal line 102 is transferred to the gate electrode of the second n-type MOS transistor (Qn2) 702 through the first n-type MOS transistor (Qn1) 708.

When the horizontal scan period is finished and the gate scan voltage Vg is set to low level, the first n-type MOS transistor (Qn1) 708 is set to OFF state, and the data signal voltage transferred to the gate electrode of the second n-type MOS transistor (Qn2) 702 is held in the voltage holding capacitor 106.

At this time, the gate input voltage Va of the second n-type MOS transistor (Qn2) 702 suffers a voltage shift called as a field through voltage via the gate-source capacitor of the first n-type MOS transistor (Qn1) 708 at the time when the first n-type MOS transistor (Qn1) 708 is set to OFF state. This voltage shift is represented by Vf1, Vf2, Vf3 in FIG. 58, and the amount of the voltage shift Vf1 to Vf3 can be reduced by setting the voltage holding capacitance 106 to a large value. The gate input voltage Va of the second n-type MOS transistor (Qn2) 702 is held until the gate scan voltage Vg is set to high level again to select the first n-type MOS transistor (Qn) 708 in the next field period. On the other hand, the second n-type MOS transistor (Qn2) 702 has been already reset during the reset period when the reset pulse voltage VR is set to high level VgH, and subsequently to the horizontal scan period, it operates as a source follower type analog amplifier circuit 104-26 using the pixel electrode 107 as the source electrode.

At this time, the voltage holding capacitance electrode 105 is supplied with a voltage higher than at least (Vdmax-Vtp) in order to make the second n-type MOS transistor (Qn2) 702 operate as the amplifier circuit portion of the analog amplifier circuit 104-26. Here, Vdmax represents the maximum amount of the data signal voltage Vd, and Vtp represents the threshold value of the second n-type MOS transistor (Qn2) 702. The second n-type MOS transistor (Qn2) 702 can output the analog gradation voltage corresponding to the gate input voltage Va thus held until the reset pulse voltage VR is set to VgH in the next field to reset the second n-type MOS transistor (Qn2) 702.

In the driving method described above, the horizontal scan period comes after the reset period, however, the reset period and the horizontal scan period may be set to the same timing.

In this case, the selection of the pixel circuit 20-26 and the reset of the second n-type MOS transistor (Qn2) 702 are carried out at the same time. The timing chart at this time is shown in FIG. 59.

As described above, according to the construction of this embodiment, there can be achieved substantially the same effect as the sixth embodiment except that the driving of the second n-type MOS transistor (Qn2) 702(N) is carried out by the reset pulse voltage VR supplied from the reset pulse power supply source 707.

That is, there can be achieved the effect that the pixel voltage which is substantially proportional to the data signal voltage Vd can be applied to the liquid crystal 109 and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the second n-type MOS transistor (Qn2) 702 operating as the amplifier circuit portion of the analog amplifier circuit 104-26, and the reset of the analog amplifier circuit 104-26 is carried out by the second n-type MOS transistor (Qn2) 702 itself. Therefore, wires and circuits such as power supply source wires, reset power supply source lines, reset switch, etc. are not needed.

Furthermore, the analog amplifier circuit 104-26 can be constructed in a small area and the same level of high aperture ratio as the sixth embodiment can be achieved.

Still furthermore, the reset pulse power supply source VR is separately equipped, and thus as compared with the liquid crystal display devices described in the sixth embodiment and the fourteenth embodiment, the delay of the scan pulse signal used to reset the analog amplifier circuit 104-26 can be nullified.

Still furthermore, according to this embodiment, the pixel circuit 20-26 is constructed by only the n-type MOS transistor, so that there is an advantage that the manufacturing process can be simplified.

Twenty Seventh Embodiment

Figure 60:
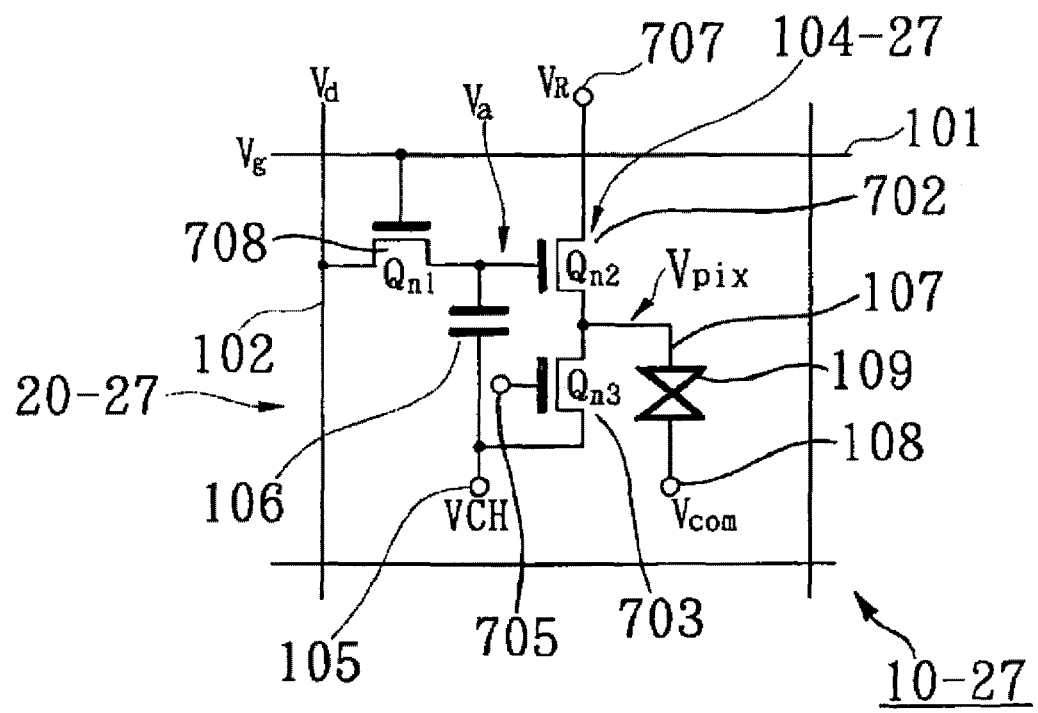
FIG. 60 is a diagram showing a pixel circuit constituting a liquid crystal display device according to a twenty seventh embodiment of the present invention.

FIG. 60 is a diagram showing a pixel circuit constituting a liquid crystal display device according to a twenty seventh embodiment of this invention.

The construction of this embodiment is greatly different from that of the seventh embodiment in that all the MOS transistors constituting the pixel circuit are constructed by n-type MOS transistors, and the reset of the n-type MOS transistor of the amplifier circuit portion of the analog amplifier is carried out by the reset pulse power supply source.

That is, the difference resides in that the p-type MOS transistor (Qn) 701 of the seventh embodiment is changed to a first n-type MOS transistor (Qn1) 708, the first n-type MOS transistor (Qn1) 702 is changed to a second n-type MOS transistor (Qn2) 702, the second n-type MOS transistor (Qn2) 703 is charged to a third n-type MOS transistor (Qn2) 703, the gate electrode of the first n-type MOS transistor (Qn1) 708 is connected to the scan line 101, any one of the source and drain electrodes of the first n-type MOS transistor (Qn1) 708 is connected to the signal line 102, the other of the source and drain electrodes of the first n-type MOS transistor (Qn1) 708 is connected to the gate electrode of the second n-type MOS transistor (Qn2) 702, any one of the source and drain electrodes of the second n-type MOS transistor (Qn2) 702 is connected to the reset pulse power supply source 707, and the other of the source and drain electrodes of the second n-type MOS transistor (Qn2) 702 is connected to the pixel electrode 107.

The constructions of the other parts than the above-described parts in this embodiment are identical to those of the seventh embodiment. Therefore, these same parts are represented by the same reference numerals as the seventh embodiment, and the description thereof is omitted.

Accordingly, the liquid crystal display device having the above difference is represented by 10-27, and the pixel circuit is represented by 20-27.

Next, the operation of this embodiment will be described with reference to FIG. 60.

The driving method for the liquid crystal display device 10-27 of this embodiment is substantially identical to the driving method for the liquid crystal display device of the seventh embodiment except that the second n-type MOS transistor (qn2) 702 of the analog amplifier circuit 104-27 is driven by the reset pulse voltage VR supplied from the reset pulse power supply source 707.

If the description on the twenty sixth embodiment is referred to, the understanding could be made clearer, and thus it is merely indicated here that the second n-type MOS transistor (Qn2) 702 of the analog amplifier circuit 20-27 is driven by the reset pulse voltage VR supplied from the reset pulse power supply source 707, and Furthermore, in the driving method of this embodiment, the horizontal scan period comes subsequently to the reset period. However, the reset period and the horizontal scan period may be set to the same timing.

In this case, the selection of the pixel circuit 20-27 and the reset of the second n-type MOS transistor (Qn2) 702 are simultaneously carried out.

As described above, according to the construction of this embodiment, there can be achieved substantially the same effect as the seventh embodiment except that the driving of the second n-type MOS transistor (Qn2) 702 is carried out by the reset pulse voltage VR supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the second n-type MOS transistor (Qn2) 702 operating as the amplifier circuit portion of the analog amplifier circuit 104-27, and the reset of the analog amplifier circuit 104-27 is carried out by the second n-type MOS transistor (Qn2) 702 itself. Therefore, wires and circuits such as power supply source wires, reset power supply source lines, reset switch, etc. are not needed.

Furthermore, the analog amplifier circuit 104-27 can be constructed in a small area and the same level of high aperture ratio as the seventh embodiment can be achieved.

Still furthermore, the reset pulse power supply source VR is separately equipped, and thus as compared with the liquid crystal display devices described in the seventh embodiment and the fifteenth embodiment, the delay of the scan pulse signal used to reset the analog amplifier circuit 104-27 can be nullified.

Still furthermore, the pixel circuit 104-27 is constructed by only the n-type MOS transistors, and thus there is an advantage that the manufacturing process can be simplified.

Twenty Eighth Embodiment

Figure 61:
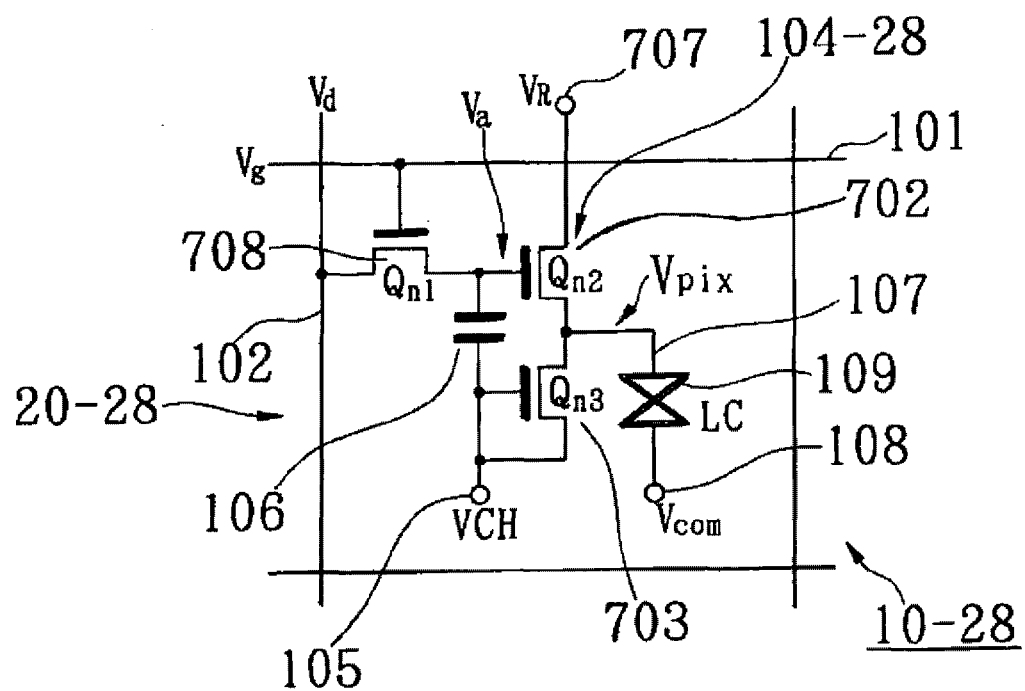
FIG. 61 is a diagram showing a pixel circuit constituting a liquid crystal display device according to a twenty eighth embodiment of the present invention.

FIG. 61 is a diagram showing a pixel circuit constituting a liquid crystal display device according to a twenty eighth embodiment of the present invention.

The construction of this embodiment is greatly different from that of the eighth embodiment in that all the MOS transistors are constructed by n-type MOS transistors and any one of the source and drain electrodes of the n-type MOS transistor constituting the analog amplifier circuit in the pixel circuit.

That is, the difference resides in that the p-type MOS transistor (Qn) 701 of the eighth embodiment is changed to a first n-type MOS transistor (Qn1) 708, the first n-type MOS transistor (Qn1) 702 is changed to a second n-type MOS transistor (Qn2) 702, the second n-type MOS transistor (Qn2) 703 is changed to a third n-type MOS transistor (Qn2) 703, the gate electrode of the first n-type MOS transistor (Qn) 708 is connected to the scan line 101, any one of the source and drain electrodes of the first n-type MOS transistor (Qn) 708 is connected to the signal line 102, the gate electrode of the second n-type MOS transistor (Qn2) 702 is connected to the other of the source and drain electrodes of the first n-type MOS transistor (Q) 708, any one of the source and drain electrodes of the second n-type MOS transistor (Qn2) 702 is connected to the reset pulse power supply source 707, and the other of the source and drain electrodes of the second n-type MOS transistor (Qn2) 702 is connected to the pixel electrode 107.

The constructions of the other parts than the above-described parts in this embodiment are identical to those of the eighth embodiment. Therefore, these same parts are represented by the same reference numerals as the eighth embodiment, and the description thereof is omitted.

Accordingly, the liquid crystal display device having the above difference is represented by 10-28, and the pixel circuit is represented by 20-28.

Next, the operation of this embodiment will be described with reference to FIG. 61.

The driving method for the liquid crystal display device 10-28 according to this embodiment is substantially identical to the driving method for the liquid display device according to the eighth embodiment except that the second n-type MOS transistor (Qn2) 702 of the analog amplifier circuit 104-28 is driven by the reset pulse voltage Vr supplied from the reset pulse power supply source 707.

If the description on the twenty sixth embodiment is referred to, the understanding could be made clearer, and thus it is merely indicated here that the second n-type MOS transistor (Qn2) 702 of the analog amplifier circuit 104-28 is driven by the reset pulse voltage VR supplied from the reset pulse power supply source, and the repetitive detailed description on the operation is omitted.

As described above, according to the construction of this embodiment, there can be achieved substantially the same effect as the eighth embodiment except that the driving of the second n-type MOS transistor (Qn2) 702 is carried out by the reset pulse voltage VR supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the second n-type MOS transistor (Qn2) 702 operating as the amplifier circuit portion of the analog amplifier circuit 104-28, and the reset of the analog amplifier circuit 104-28 is carried out by the second n-type MOS transistor (Qn2) 702 itself. Therefore, wires and circuits such as power supply source wires, reset power supply source lines, reset switch, etc. are not needed.

Furthermore, the analog amplifier circuit 104-28 can be constructed in a small area and the same level of high aperture ratio as the eighth embodiment can be achieved.

Still furthermore, the reset pulse power supply source VR is separately equipped, and thus as compared with the liquid crystal display devices described in the eighth embodiment and the sixteenth embodiment, the delay of the scan pulse signal used to reset the analog amplifier circuit 20-28 can be nullified.

Furthermore, according to this embodiment, the pixel circuit 20-28 is constructed by only the n-type MOS transistors, and thus there is an advantage that the manufacturing process can be simplified.

Twenty Ninth Embodiment

Figure 62:
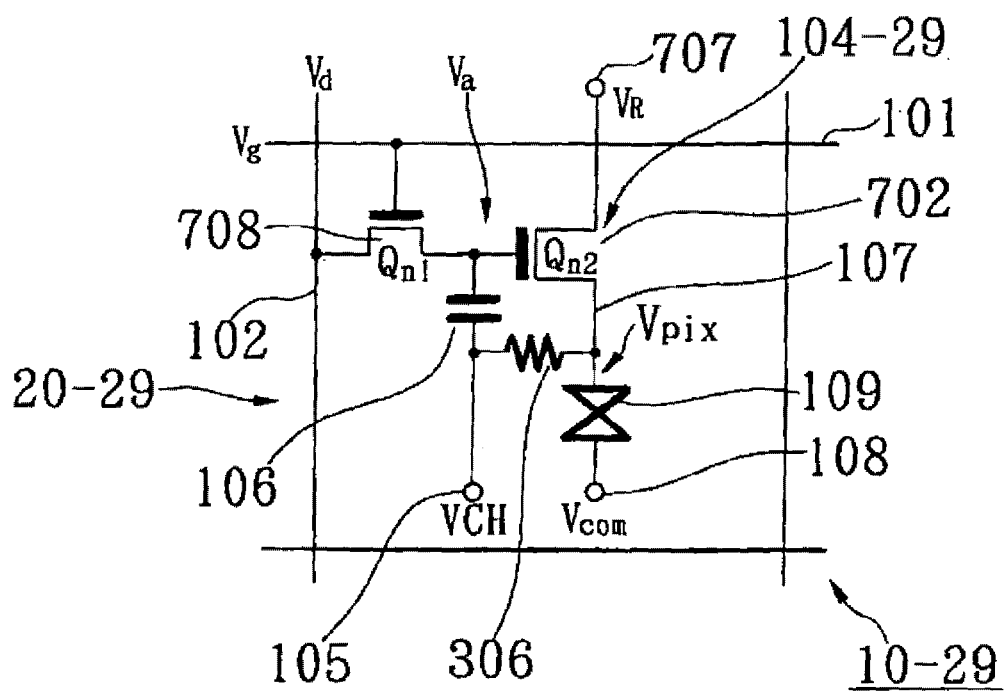
FIG. 62 is a diagram showing a pixel circuit constituting a liquid crystal display device according to a twenty ninth embodiment of the present invention.

FIG. 62 is a diagram showing a pixel circuit constituting a liquid crystal display device according to a twenty ninth embodiment of the present invention.

The construction of this embodiment is different from the fifth embodiment in that all the MOS transistors constituting the pixel circuit 28-29 are constructed by n-type MOS transistors.

The difference resides in that the p-type MOS transistor (Qn) 701 of the ninth embodiment is changed to a first n-type MOS transistor (Qn1) 708, the first n-type MOS transistor (Qn1) 702 is changed to a second n-type MOS transistor (Qn2) 702, the second n-type MOS transistor (Qn2) 707 is changed to a third n-type MOS transistor (Qn2) 703, the gate electrode of the first n-type MOS transistor (Qn1) 708 is changed to the scan line 101, any one of the source and drain electrodes of the first n-type MOS transistor (Qn1) 708 is changed to the signal line 102, the other of the source and drain electrodes of the first n-type MOS transistor (Qn1) 708 is connected to the gate electrode of the second n-type MOS transistor (Qn2) 702, any one of the source and drain electrodes of the second n-type MOS transistor (Qn2) 702 is connected to the reset pulse power supply source 707, and the other of the source and drain electrodes of the second n-type MOS transistor (Qn2) 702 is connected to the pixel electrode 107.

The constructions of the other parts than the above-described parts are identical to those of the fifth embodiment. Therefore, these same parts are represented by the same reference numerals as the fifth embodiment, and the description thereof is omitted.

Accordingly, the liquid crystal display device having the above difference is represented by 10-29, and the pixel circuit is represented by 20-29.

Next, the operation of this embodiment will be described with reference to FIG. 62.

The driving method for the liquid crystal display device 10-29 according to this embodiment is substantially identical to the driving method for the liquid crystal display device according to the fifth embodiment except that the second n-type MOS transistor (Qn2) 702 of the analog amplifier circuit 104-29 is driven by the reset pulse voltage VR supplied from the reset pulse power supply source 707.

If the description on the twenty sixth embodiment is referred to, the understanding could be made clearer, and thus it is merely indicated here that the second n-type MOS transistor (Qn2) 702 of the analog amplifier circuit 104-29 is driven by the reset pulse voltage VR supplied from the reset pulse power supply source.

As described above, according to the construction of this embodiment, there can be achieved substantially the same effect as the ninth embodiment except that the driving of the second n-type MOS transistor (Qn2) 702 is carried out by the reset pulse voltage VR supplied from the reset pulse power supply source 707. That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 707 is commonly used for the power supply source and reset power supply source of the second n-type MOS transistor (Qn2) 702 operating as the amplifier circuit portion of the analog amplifier circuit 104-29, and the reset of the analog amplifier circuit 104-29 is carried out by the second n-type MOS transistor (Qn2) 702 itself. Therefore, wires and circuits such as power supply source wires, reset power supply source lines, reset switch, etc. are not needed.

Furthermore, the analog amplifier circuit 104-29 can be constructed in a small area and the same level of high aperture ratio as the fifth embodiment can be achieved.

Still furthermore, the reset pulse power supply source VR is separately equipped, and thus as compared with the liquid crystal display devices described in the ninth embodiment and the seventeenth embodiment, the delay of the scan pulse signal used to reset the analog amplifier circuit 104-29 can be nullified.

Furthermore, according to this embodiment, the pixel circuit 20-29 is constructed by only the n-type MOS transistors, and thus there is an advantage that the manufacturing process can be simplified.

Thirtieth Embodiment

Figure 63:
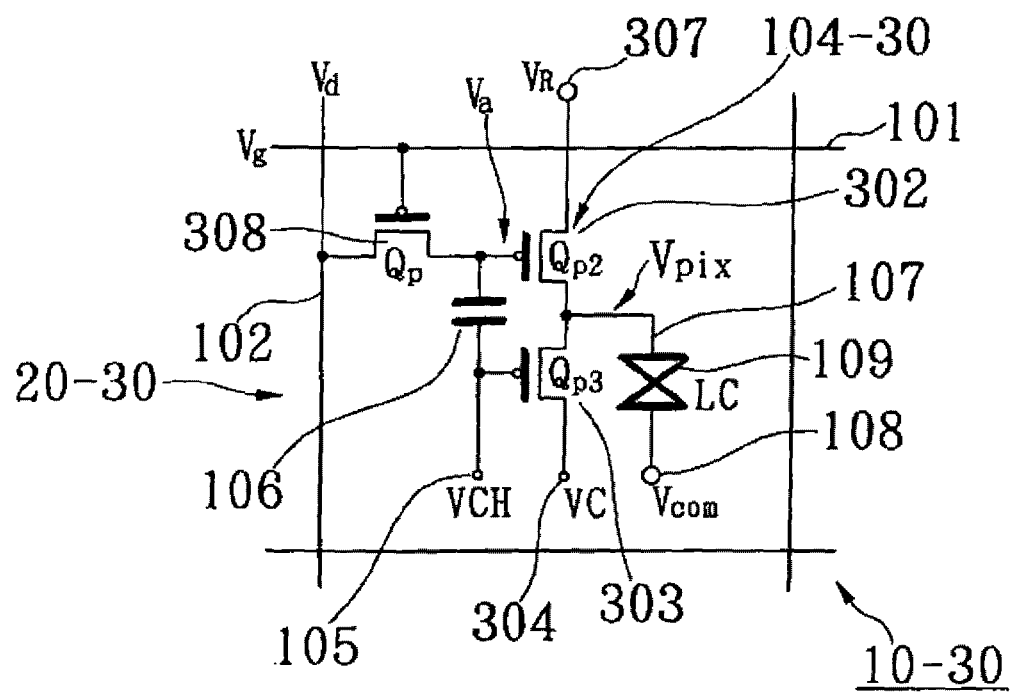
FIG. 63 is a diagram showing a pixel circuit constituting a liquid crystal display device according to a thirtieth embodiment of the present invention.
Figure 64:
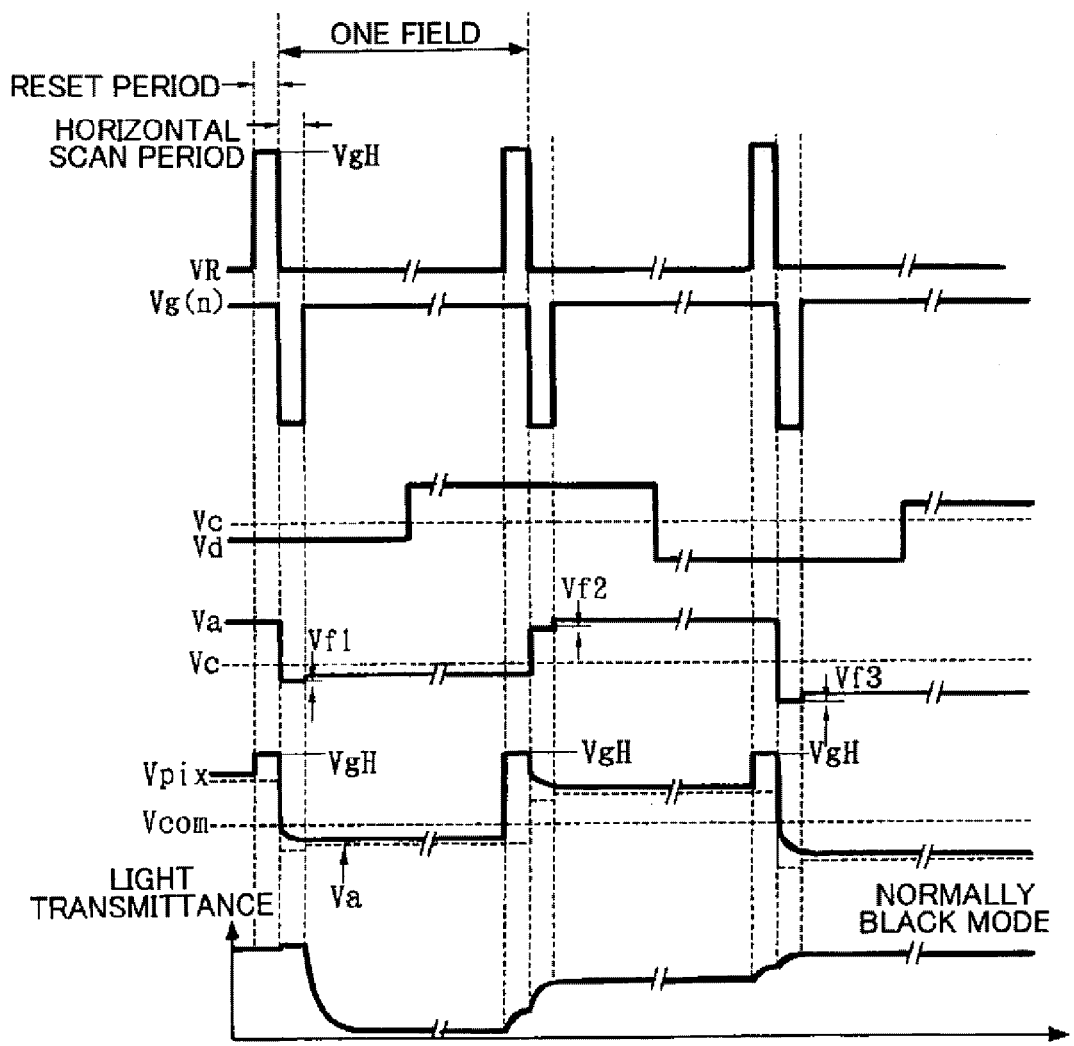
FIG. 64 is a timing chart when liquid crystal is driven in the liquid crystal display device of the thirtieth embodiment.
Figure 65:
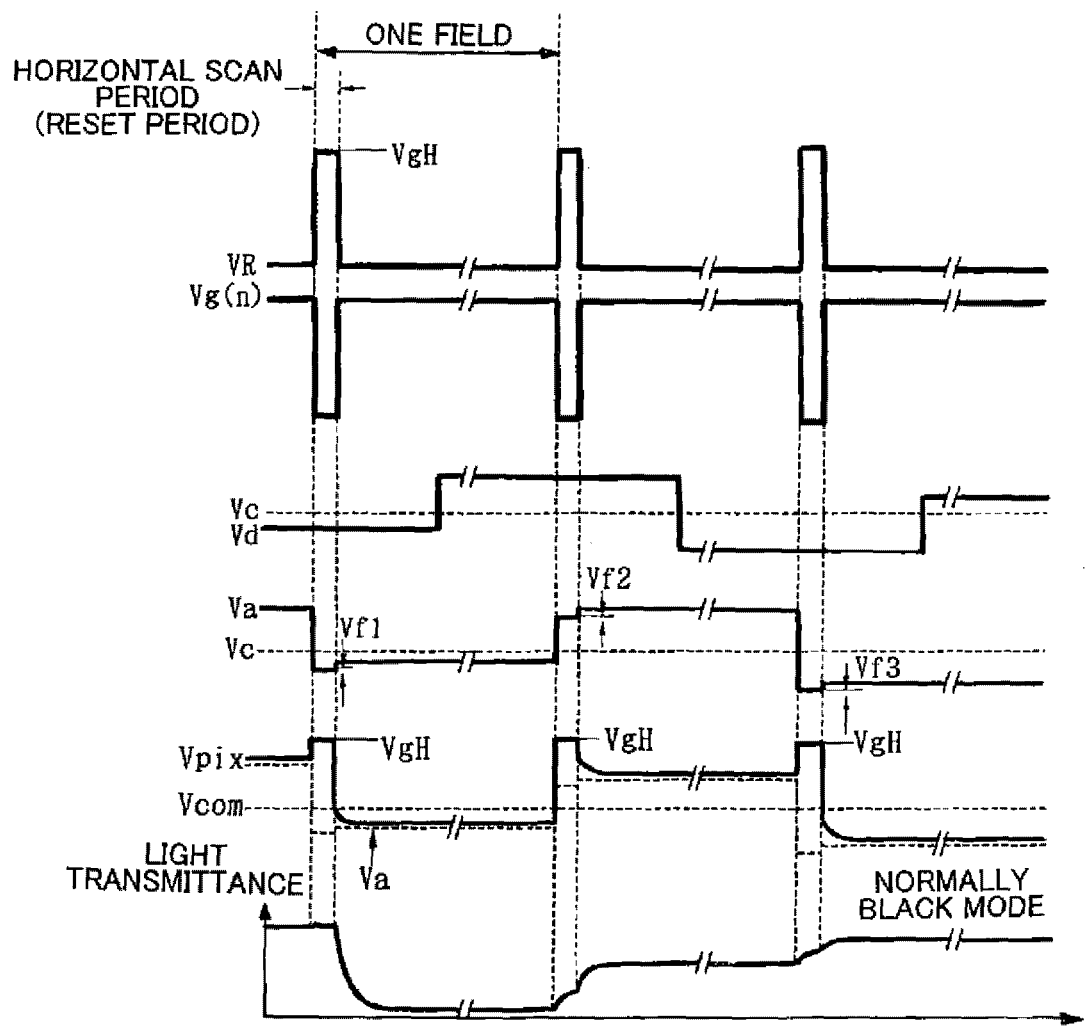
FIG. 65 is a timing chart when the horizontal scan period and the reset period are set to the same period in case that liquid crystal is driven in the liquid crystal display device of the thirtieth embodiment.

FIG. 63 is as diagram showing a pixel circuit constituting a liquid crystal display device according to a thirtieth embodiment of the present invention, FIG. 64 is a timing chart showing the gate scan voltage Vg, the data signal voltage Vd, the gate input voltage Va of the second p-type MOS transistor (Qp2) 702 and the pixel voltage Vpix and also shows the variation of the light transmittance of liquid crystal when the horizontal scan period is set to come in the pixel circuit at the time when the reset pulse elapses and high-response liquid is driven in the normally black mode, and FIG. 65 is a timing chart showing the gate scan voltage Vg, the data signal voltage Vd, the gate input voltage Va of the second p-type MOS transistor (Qp2) 302 and the pixel voltage Vpix and also shows the variation of the light transmittance of liquid crystal when the reset period and the horizontal scan period are set to the same timing in the pixel circuit and the high-response liquid crystal is driven in the normally black mode. The high-response liquid crystal is ferroelectric or antiferroelectric liquid crystal having polarization, OCB mode liquid crystal responding within one-field period or the like.

The construction of this embodiment is greatly different from that of the second embodiment in that all the MOS transistors constituting the pixel circuit are constructed by p-type MOS transistors and also any one of the source and drain electrodes of the second p-type MOS transistor (Qp2) 302 constituting the analog amplifier circuit in the pixel circuit is driven by the reset pulse power supply source.

That is, the difference resides in that the n-type MOS transistor (Qn) 103 of the second embodiment is set to a first p-type MOS transistor (Qp1) 308, the gate electrode of the first p-type MOS transistor (Qp1) 308 is connected to the scan line 101, and any one of the source and drain electrodes of the first p-type MOS transistor (Qp1) 308 is connected to the signal line 102. In addition, the first p-type MOS transistor (Qp1) 302 of the second embodiment is set to a second p-type MOS transistor (Qp2) 302, the other of the source and drain electrodes of the p-type MOS transistor (Qp) 308 is connected to the gate electrode of the second p-type MOS transistor (Qp2) 302, any one of the source and drain electrodes of the second p-type MOS transistor (Qp2) 302 is connected to the reset pulse power supply source 707, and the other of the source and drain electrodes of the second p-type MOS transistor (Qp2) 302 is connected to the pixel electrode 107.

Furthermore, the second p-type MOS transistor (Qp2) 303 of the second embodiment is set to a third p-type MOS transistor (Qp3) 303.

The constructions of the other parts than the above-described parts in this embodiment are identical to those of the second embodiment, and these same parts are represented by the same reference numerals as the second embodiment, and the description thereof is omitted.

Accordingly, the liquid crystal display device having the difference is represented by 10-30, and the pixel circuit is represented by 20-30.

Next, the operation of this embodiment will be described with reference to FIGS. 62 to 64.

The driving method for the liquid crystal display device 10-30 according to this embodiment is substantially identical to the driving method for the liquid crystal display device 10-2 according to the second embodiment except that the second p-type MOS transistor (Qp2) 302 of the analog amplifier circuit 104-30 is driven by the reset pulse power supply source 307, and this driving method will be described hereunder.

As shown in FIG. 63, during the period when the reset pulse voltage VR is set to high level VgH, the pixel electrode 107 transits to the reset state through the transfer of the gate scan voltage VgH via the second p-type MOS transistor (Qp2) 302 thereto. The pixel voltage pixel Vpix is set to VgH during the period when the reset pulse voltage VR is set to high level, whereby the second p-type MOS transistor (Qp2) is reset, and after the reset pulse VR is set to low level, the second p-type MOS transistor (Qp2) 302 operates as an amplifier circuit portion of a source follower type analog amplifier circuit 104-30. This operation will be described hereunder. Subsequently to the reset period when the reset pulse voltage VR is set to high level VgH, in the period when the gate scan voltage Vg is set to high level VgH, the first p-type MOS transistor (Qp1) 308 is set to ON state, and the data signal voltage Vd input to the signal line 102 is transferred through the first p-type MOS transistor (Qp1) 308 to the gate electrode of the second p-type MOS transistor (Qp2) 302.

When the horizontal scan period is finished and the gate scan voltage is set to low level, the first p-type MOS transistor (Qp1) 308 is set to OFF state, and the data signal voltage transferred to the gate electrode of the second p-type MOS transistor (Qp2) 302 is held in the voltage holding capacitor 106.

At this time, the gate input voltage Va of the second p-type MOS transistor (Qp2) 302 is suffers a voltage shift called as a field through voltage via the gate-source capacitance of the first p-type MOS transistor (Qp1) 308 at the time when the first p-type MOS transistor (Qp1) 308 is set to OFF state. This voltage shift is represented by Vf1, Vf2, Vf3 in FIG. 64, and the amount of the voltage shift Vf1 to Vf3 can be reduced by setting the voltage holding capacitance 106 to a large value. The gate input voltage Va of the second p-type MOS transistor (Qp2) 302 is held until the gate scan voltage Vg is set to high level again to select the first p-type MOS transistor (Qp1) 308 in the next field period.

On the other hand, the second p-type MOS transistor (Qp2) 302 has been already reset during the reset period when the reset pulse voltage VR is set to high level VgH, and subsequently to the horizontal scan period, it operates as the amplifier circuit portion of the source follower type analog amplifier circuit 104-30 using the pixel electrode 107 as the source electrode.

At this time, in order to make the second p-type MOS transistor (Qp2) 302 operate as the amplifier circuit portion of the analog amplifier circuit 104-30, the voltage holding capacitance electrode 105 is supplied with a voltage higher than at least (Vdmax-Vtp) in advance. Here, Vdmax represents the maximum value of the data signal voltage Vd, and Vtp represents the threshold voltage of the second p-type MOS transistor (Qp2) 302. The second p-type MOS transistor (Qp2) 302 can output the analog gradation voltage corresponding to the gate input voltage Va thus held until the reset pulse voltage VR is set to VgH and thus the second p-type MOS transistor (Qp2) 302 is reset.

In the driving method described above, the horizontal scan period comes subsequently to the reset period. However, the driving may be performed so that the reset period and the horizontal scan period may be set to the same timing.

In this case, the selection of the pixel circuit 20-30 and the reset of the second p-type MOS transistor (Qp2) 302 are carried out at the same time. The timing chart at this time is shown in FIG. 65.

As described above, according to the construction of this embodiment, there can be substantially the same effect as the second embodiment except that the driving of the second p-type MOS transistor (Qp2) 302 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 307 is commonly used for the power supply source and reset power supply source of the second p-type MOS transistor (Qp2) 302 operating as the amplifier circuit portion of the analog amplifier circuit 104-30, and the reset of the analog amplifier circuit 104-30 is carried out by the second p-type MOS transistor (Qp2) 302 itself. Therefore, wires and circuits such as power supply source wires, reset power supply source lines, reset switch, etc. are not needed.

Furthermore, the analog amplifier circuit 104-30 can be constructed in a small area and the same level of high aperture ratio as the second embodiment can be achieved.

Still furthermore, the reset pulse power supply source VR is separately equipped, and thus as compared with the liquid crystal display devices described in the second embodiment and the tenth embodiment, the delay of the scan pulse signal used to reset the analog amplifier circuit 104-40 can be nullified.

Furthermore, the pixel circuit 20-30 is constructed by only the p-type MOS transistors, and thus there is an advantage that the manufacturing process can be simplified.

Thirty-First Embodiment

Figure 66:
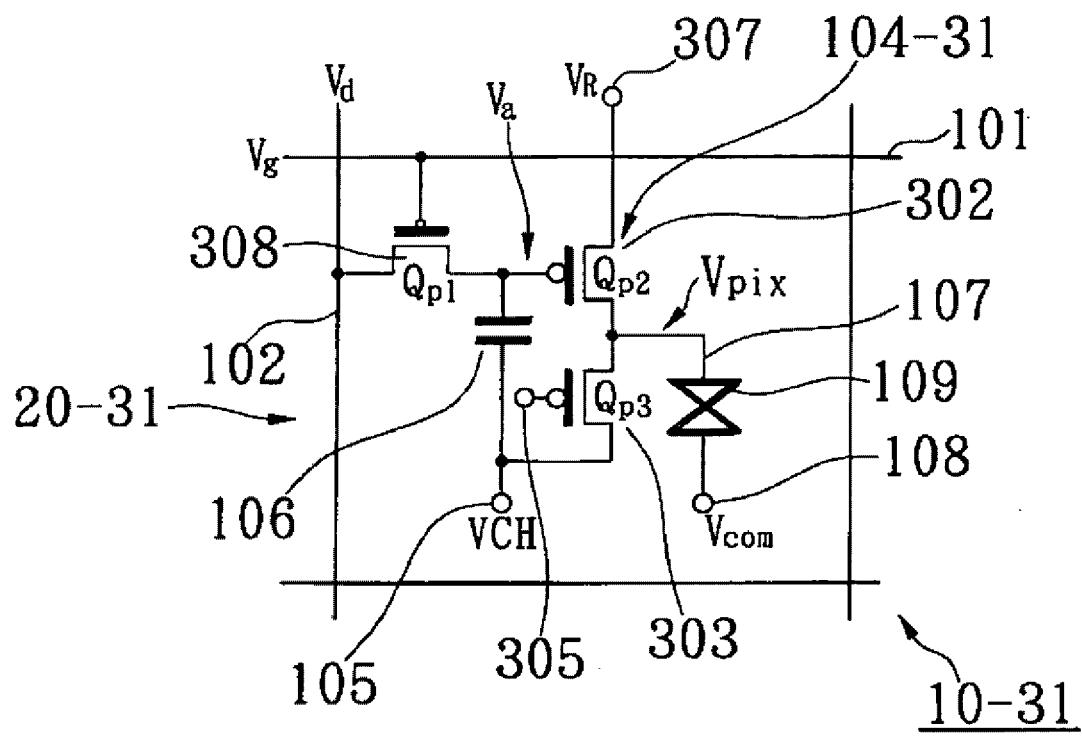
FIG. 66 is a diagram showing a pixel circuit constituting a liquid crystal display device according to a thirtieth first embodiment.

FIG. 66 is a diagram showing a pixel circuit constituting a liquid crystal display device according to a thirty first embodiment of the present invention.

The construction of this embodiment is greatly different from that of the third embodiment in that all the MOS transistors constituting the pixel circuit are constructed by p-type MOS transistors, and the reset of the p-type MOS transistor constituting the amplifier circuit portion of the analog amplifier circuit is carried out by the reset pulse power supply source.

That is, the difference resides in that the p-type MOS transistor (Qp) 701 of the third embodiment is set to a p-type MOS transistor (Qp1) 308, the gate electrode of the first p-type MOS transistor (Qp1) 308 is connected to the scan line 101, and any one of the source and drain electrodes of the first p-type MOS transistor (Qp1) 308 is connected to the signal line 102. In addition, the first p-type MOS transistor (Qp1) 302 of the second embodiment is set to a second p-type MOS transistor (Qp2) 302, the gate electrode of the second p-type MOS transistor (Qp2) 302 is connected to the other of the source and drain electrodes of the first p-type MOS transistor (Qp1) 308, any one of the source and drain electrodes of the second p-type MOS transistor (Qp2) 302 is connected to the reset pulse power supply source 307, and the other of the source and drain electrodes of the second p-type MOS transistor (Qp2) 302 is connected to the pixel electrode 107.

Furthermore, the second p-type MOS transistor (Qp2) 303 of the second embodiment is set to a third p-type MOS transistor (Qp3) 303.

The constructions of the other parts than the above-described parts in this embodiment are identical to those of the third embodiment. These same parts are represented by the same reference numerals as the third embodiment, and the description thereof is omitted.

Accordingly, the liquid crystal display device having the above difference is represented by 10-31, and the pixel circuit is represented by 20-31.

The operation of this embodiment will be described with reference to FIG. 66.

The driving method for the liquid crystal display device 10-31 according to this embodiment is substantially identical to the driving method for the liquid crystal display device according to the third embodiment except that the second p-type MOS transistor (Qp2) 302 of the analog amplifier circuit 104-31 is driven by the reset pulse voltage VR supplied from the reset pulse power supply source 307.

If the description on the thirtieth embodiment is referred to, the understanding could be made clearer, and thus it is merely indicated here that the second p-type MOS transistor (Qp2) 302 of the analog amplifier circuit 20-31 is driven by the reset pulse voltage VR supplied from the reset pulse power supply source 307, and the repetitive detailed description on the operation is omitted.

Furthermore, in the above-described driving method, the horizontal scan period comes subsequently to the reset period. However, the reset period and the horizontal scan period may be set to the same timing.

In this case, the selection of the pixel circuit 20-31 and the reset of the second p-type MOS transistor (Qp2) are carried out at the same time.

As described above, according to the construction of this embodiment, there can be achieved substantially the same effect as the third embodiment except that the driving of the second p-type MOS transistor (Qp2) 702 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 307 is commonly used for the power supply source and reset power supply source of the second p-type MOS transistor (Qp2) 302 operating as the amplifier circuit portion of the analog amplifier circuit 104-31, and the reset of the analog amplifier circuit 104-31 is carried out by the second p-type MOS transistor (Qp2) 302 itself. Therefore, wires and circuits such as power supply source wires, reset power supply source lines, reset switch, etc. are not needed.

Furthermore, the analog amplifier circuit 104-31 can be constructed in a small area and the same level of high aperture ratio as the third embodiment can be achieved.

Still furthermore, the reset pulse power supply source VR is separately equipped, and thus as compared with the liquid crystal display devices described in the third embodiment and the eleventh embodiment, the delay of the scan pulse signal due to the reset of the analog amplifier circuit 104-31 can be nullified.

Furthermore, according to this embodiment, the pixel circuit 20-31 is constructed by only the p-type MOS transistors, and thus there is an advantage that the manufacturing process can be simplified.

Thirty Second Embodiment

Figure 67:
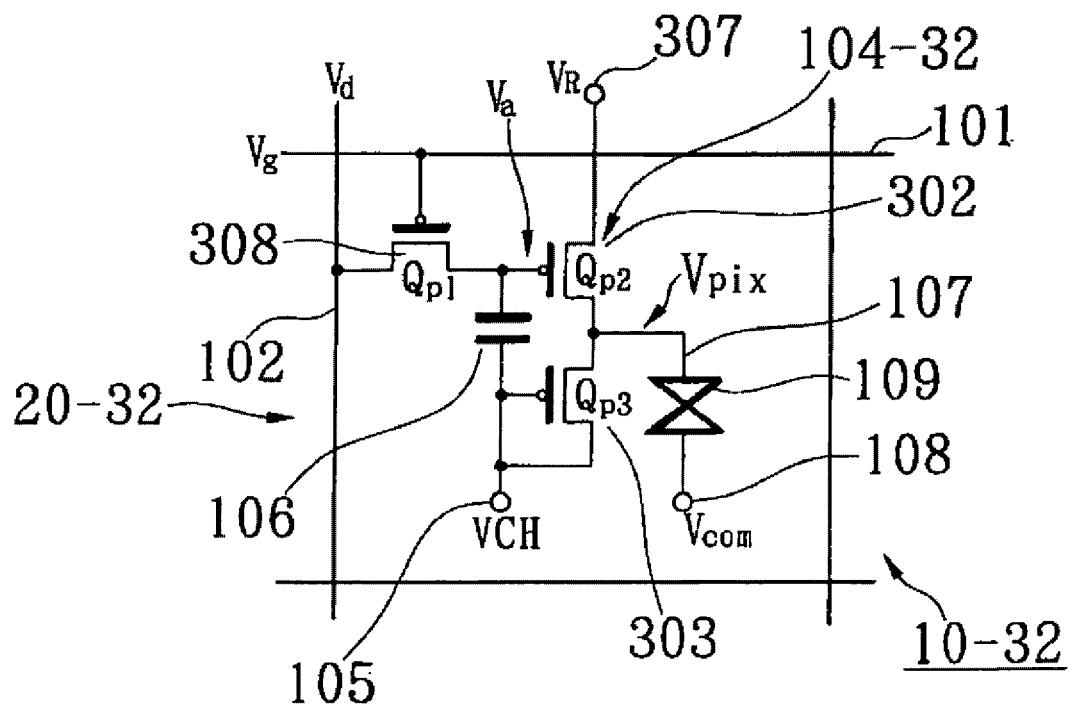
FIG. 67 is a diagram showing a pixel circuit constituting a liquid crystal display device according to a thirty second embodiment of the present invention.

FIG. 67 is a diagram showing a pixel circuit constituting a liquid crystal display device according to a thirty second embodiment of the present invention.

The construction of this embodiment is different from that of the fourth embodiment in that all the MOS transistors are constructed by p-type MOS transistors and any one of the source and drain electrodes of the p-type MOS transistor constituting the analog amplifier circuit in the pixel circuit is driven by the reset pulse power supply source.

That is, the difference resides in that the p-type MOS transistor (Qp) 103 of the fourth embodiment is set to a first p-type MOS transistor (Qp1) 308, the gate electrode of the first p-type MOS transistor (Qp1) 308 is connected to the scan line 101, and any one of the source and drain electrodes of the first p-type MOS transistor (Qp1) 308 is connected to the signal line 102. In addition, the first p-type MOS transistor (Qp1) 302 of the second embodiment is set to a second p-type MOS transistor (Qp2) 302, the gate electrode of the second p-type MOS transistor (Qp2) 302 is connected to the other of the source and drain electrodes of the first p-type MOS transistor (Qp1) 308, any one of the source and drain electrodes of the second p-type MOS transistor (Qp2) 302 is connected to the reset pulse power supply source 707, and the other of the source and drain electrodes of the second p-type MOS transistor (Qp2) 302 is connected to the pixel electrode 107.

The second p-type MOS transistor (Qp2) 303 of the fourth embodiment is set to a third p-type MOS transistor (Qp3).

The constructions of the other parts than the above-described parts in this embodiment are identical to those of the fourth embodiment. Therefore, these same parts are represented by the same reference numerals as the fourth embodiment, and the description thereof is omitted. Accordingly, the liquid crystal display device having the above difference is represented by 10-32, and the pixel circuit is represented by 20-32.

Next, the operation of this embodiment will be described with reference to FIG. 67.

The driving method for the liquid crystal display device 10-32 according to this embodiment is substantially identical to the driving method for the liquid crystal display device according to the fourth embodiment except that the second p-type MOS transistor (Qp2) 302 of the analog amplifier circuit 104-32 is driven by the reset pulse voltage VR supplied from the reset pulse power supply source 307.

If the description on the thirtieth embodiment is referred to, the understanding could be made clearer, and thus it is merely indicated here that the second p-type MOS transistor (Qp2) 302 of the analog amplifier circuit 104-32 is driven by the reset pulse voltage VR supplied from the reset pulse power supply source 307, and the repetitive detailed description on the operation is omitted from the following description.

In the above-described driving method, the horizontal scan period comes subsequently to the reset period. However, the driving may be performed so that the reset period and the horizontal scan period are set to the same timing.

In this case, the selection of the pixel circuit 20-32 and the reset of the second p-type MOS transistor (Qp2) 302 are simultaneously carried out.

As described above, according to the construction of this embodiment, there can be achieved substantially the same effect as the eighth embodiment except that the driving of the second p-type MOS transistor (Qp2) 302 is carried out by the reset pulse voltage VR supplied from the reset pulse power supply source 707.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source 307 is commonly used for the power supply source and reset power supply source of the second p-type MOS transistor (Qp2) 302 operating as the amplifier circuit portion of the analog amplifier circuit 104-28, and the reset of the analog amplifier circuit 104-28 is carried out by the second n-type MOS transistor (Qn2) 702 itself. Therefore, wires and circuits such as power supply source wires, reset power supply source lines, reset switch, etc. are not needed.

Furthermore, the analog amplifier circuit 104-28 can be constructed in a small area and the same level of high aperture ratio as the fourth embodiment can be achieved.

Still furthermore, the reset pulse power supply source VR is separately equipped, and thus as compared with the liquid crystal display devices described in the fourth embodiment and the twelfth embodiment, the delay of the scan pulse signal used to reset the analog amplifier circuit 20-28 can be nullified.

Furthermore, according to this embodiment, the pixel circuit 20-28 is constructed by only the p-type MOS transistors, and thus there is an advantage that the manufacturing process can be simplified.

Thirty Third Embodiment

Figure 68:
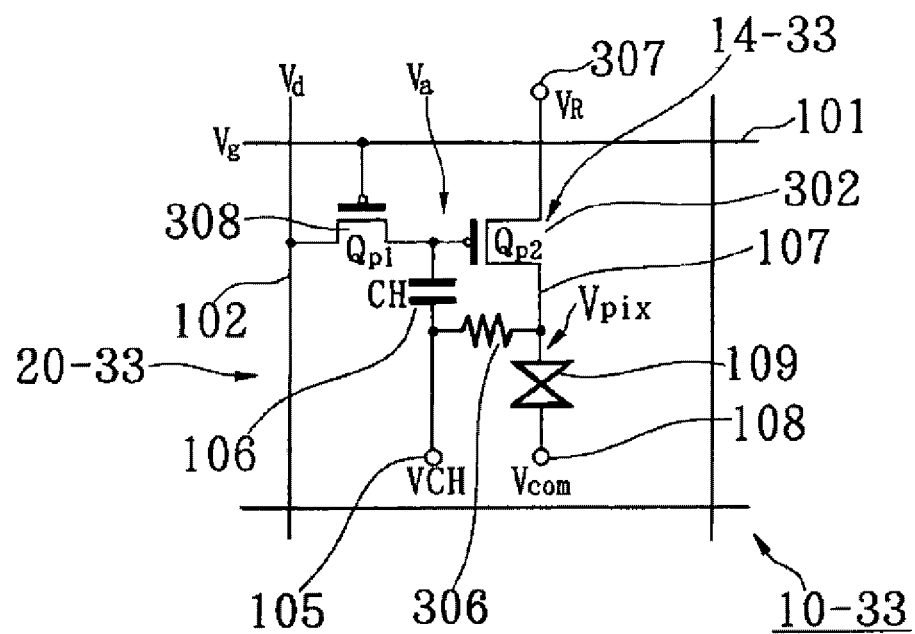
FIG. 68 is a diagram showing a pixel circuit constituting a liquid crystal display device according to a thirty third embodiment.

FIG. 68 is a diagram showing a pixel circuit constituting a liquid crystal display device according to a thirty third embodiment of the present invention.

The construction of this embodiment is different from that of the fifth embodiment in that all the MOS transistors constituting the pixel circuit are constructed by p-type MOS transistors.

That is, the difference resides in that the p-type MOS transistor (Qp) 103 of the fifth embodiment is set to a first p-type MOS transistor (Qp1) 308, the gate electrode of the first p-type MOS transistor (Qp1) 308 is connected to the scan line 101, and any one of the source and drain electrodes of the first p-type MOS transistor (Qp1) 308 is connected to the signal line 102. In addition, the other electrodes of the source and drain electrodes of the first p-type MOS transistor (Qp1) 308 is connected to the gate electrode of the second p-type MOS transistor (Qp2) 302, any one of the source and drain electrodes of the second p-type MOS transistor (Qp2) 302 is connected to the reset pulse power supply source 307, and the other of the source and drain electrodes of the second p-type MOS transistor (Qp2) 302 is connected to the pixel electrode 107.

The constructions of the other parts than the above-described parts in this embodiment are identical to those of the fifth embodiment, and the description thereof is omitted. Accordingly, the liquid crystal display device having the above difference is represented by 10-33, and the pixel circuit is represented by 20-33.

The constructions of the other parts than the above-described parts in this embodiment are identical to those of the first to thirty fourth embodiments. Therefore, these same parts are represented by the same reference numerals as the first to thirty fourth embodiments and the description thereof is omitted. Accordingly, the liquid crystal display having the above difference is represented by 10-35, and the pixel circuit is represented by 20-35.

Next, the operation of this embodiment will be described with reference to FIG. 67.

The driving method for the liquid crystal display device 10-33 according to this embodiment is substantially identical to the driving method for the liquid crystal display device 10-5 according to the fifth embodiment except that the second p-type MOS transistor (Qp2) 302 of the analog amplifier circuit 104-33 is driven by the reset pulse voltage VR supplied from the reset pulse power supply source 307.

If the description on the thirtieth embodiment is referred to, the understanding could be made clearer, and thus it is merely indicated here that the second p-type MOS transistor (Qp2) 302 of the analog amplifier circuit 104-32 is driven by the reset pulse voltage VR supplied from the reset pulse power supply source 307, and the repetitive detailed description on the operation is omitted.

As described above, according to the construction of this embodiment, there can be achieved substantially the same effect as the fifth embodiment except that the driving of the second p-type MOS transistor (Qp2) 302 is carried out by the reset pulse voltage VR supplied from the reset pulse power supply source 307.

That is, there can be achieved the effect that the pixel voltage Vpix which is substantially proportional to the data signal voltage Vd can be applied to the liquid crystal 109, and thus the effect that more excellent gradation can be achieved every field and the aperture ratio can be more enhanced as compared with the patent document described above.

The liquid crystal display device of this embodiment is designed with keeping the above effect so that the reset pulse power supply source is commonly used for the power supply source and reset power supply source of the second p-type MOS transistor (Qp2) 302 operating as the amplifier circuit portion of the analog amplifier circuit 104-32, and the reset of the analog amplifier circuit 104-32 is carried out by the second n-type MOS transistor (Qn2) 302 itself. Therefore, wires and circuits such as power supply source wires, reset power supply source lines, reset switch, etc. are not needed.

Furthermore, the analog amplifier circuit 104-32 can be constructed in a small area and the same level of high aperture ratio as the fifth embodiment can be achieved.

Still furthermore, the reset pulse power supply source VR is separately equipped, and thus as compared with the liquid crystal display devices described in the fifth embodiment and the thirteenth embodiment, the delay of the scan pulse signal used to reset the analog amplifier circuit 104-33 can be nullified.

Furthermore, according to this embodiment, the pixel circuit 20-33 is constructed by only the p-type MOS transistors, and thus there is an advantage that the manufacturing process can be simplified.

Thirty Fourth Embodiment

The construction of this embodiment is greatly different from those of the first to thirty third embodiments in that the driving method of the first to thirty third embodiment is modified so that color display can be performed by switching the color of light incident during one-field (one-frame) period.

That is, the liquid crystal display device and the driving method thereof according to the first to thirty third embodiments are applied to a liquid crystal display base based on a time-divisional driving system in which color display is carried out by switching the color of light incident during one-field (one-frame) period.

The constructions of the other parts than the above-described parts in this embodiment are identical to those of the first to thirty third embodiments, and these same parts are represented by the same reference numerals. Accordingly, the liquid crystal display device having the above difference is represented by 10-34.

Next, the operation of this embodiment will be described. In the liquid crystal display 10-34, as in the case where high-response liquid crystal such as ferroelectric or antiferroelectric liquid crystal having polarization, OCB mode liquid responding within the one-field (one-frame) period or the like is driven by each of the pixel circuits 20-1 to 20-33 of the first to thirty third embodiments, the liquid crystal can be driven under the state that there is little dependence of Ids on Vds. In this case, thresholdless antiferroelectric liquid crystal is used as the liquid crystal material.

As described above, according to the construction of this embodiment, the dependence of Ids on Vds is substantially perfectly eliminated, and the linearity between the gate input voltage and the pixel voltage in the analog amplifier circuit can be substantially achieved. Therefore, even when the electrostatic capacitance of the liquid crystal is varied under application of the pixel voltage to the liquid crystal and Vds of the MOS transistor constituting the amplifier circuit portion of the analog amplifier circuit is varied, Vgs of the MOS transistor is substantially fixed. Therefore, there is achieved an effect that no variation occurs in the pixel voltage applied to the liquid crystal and a desired gradation display can be performed every one-field (one-frame) period.

Thirty Fifth Embodiment

Figure 69:
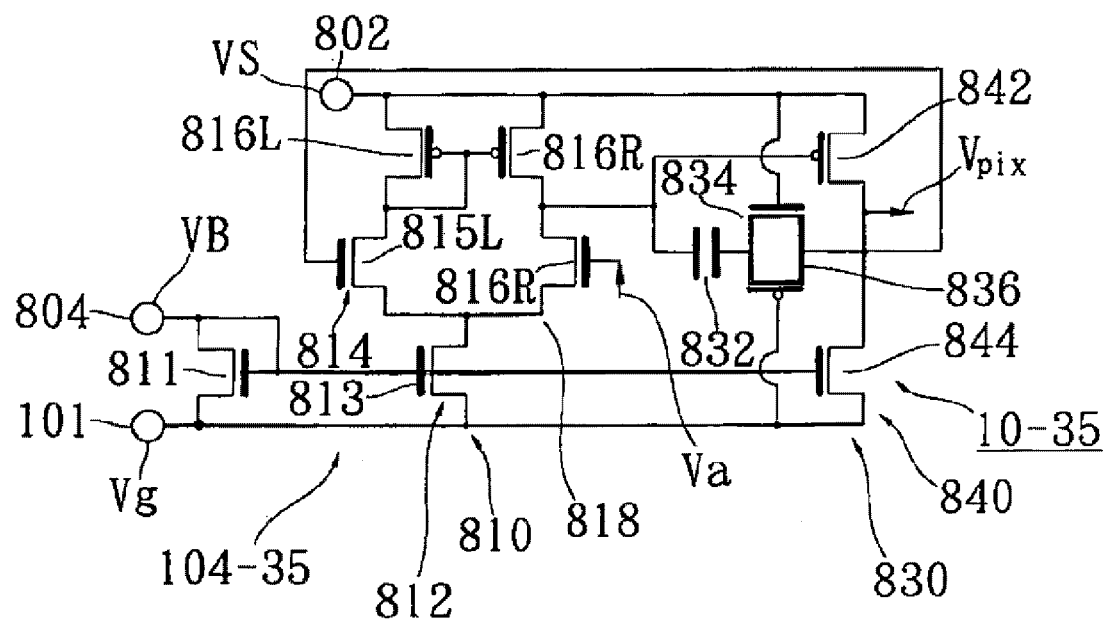
FIG. 69 is a diagram showing an operation amplifying circuit in a pixel circuit constituting a liquid crystal display device according to a thirty fifth embodiment of the present invention.

FIG. 69 is a diagram showing only an analog amplifier circuit in a pixel circuit constituting a liquid crystal display device according to a thirty fifth embodiment.

The construction of this embodiment is greatly different from those of the first to thirty third embodiments in that an operating amplifier circuit is used in place of the source follower type analog amplifier circuit.

That is, an operating amplifier circuit 104-35 comprises a differential amplification circuit 810, a phase-compensating circuit 830 and an output buffer 840.

Under feedback of the pixel voltage Vpix output from the output terminal of the output buffer 840 described later, the differential amplification circuit 810 outputs from the output terminal thereof a voltage substantially-proportional to an amplification input voltage input thereto after the output voltage of the differential amplification circuit 810 reaches the substantially-proportional voltage concerned.

The phase-compensating circuit 830 compensates for the phase lag of the voltage output from the differential amplification circuit 810. The phase compensation means the compensation for the phase lag of the voltage output from the differential amplification circuit 810 which occurs due to variation of the voltage of a bias power supply source 802 and/or the voltage supplied to the scan line 101.

The output buffer 840 sets the phase-compensated voltage to the pixel voltage Vpix having sufficiently power feeding capability and outputs the pixel voltage Vpix.

The differential amplification circuit 810 comprises a constant current supply source 812 and differential amplification branches 814, 818. The constant current supply source 812 comprises an n-type MOS transistor 813. The n-type MOS transistor 813 is formed of an MOS transistor having the double-gate structure. The gate electrode of the n-type MOS transistor 813 is connected to the bias electrode 804 and the drain electrode of an n-type MOS transistor 811. The source electrode of the n-type MOS transistor 811 is connected to the scan line 101. The voltage of the bias power supply source 804 is represented by VB, and the voltage supplied to the scan line 101 is represented by Vg. The n-type MOS transistor 811 is a protecting transistor.

When an excessively large voltage is supplied due to voltage variation of the voltage of the bias power supply source 804 and/or the voltage of the scan line 101, the protecting transistor suppresses the supply of the excessively large voltage.

The differential amplification branch 814 contains two MOS transistors which are connected to each other in series between a source power supply source 80 and the drain electrode of the n-type MOS transistor 813. One of the two MOS transistors is a p-type MOS transistor 815L, and the other is a p-type MOS transistor 816L. The source electrode of the p-type MOS transistor 815L is connected to the source power supply source 802, and the source electrode of the n-type MOS transistor 815L is connected to the drain electrode of the n-type MOS transistor 816L.

The differential amplification branch 818 includes two MOS transistors which are connected to each other in series between the source power supply source 802 and the drain electrode of the n-type MOS transistor 813 *n*. One of the two MOS transistors is a p-type MOS transistor 815R, and the other is a p-type MOS transistor 816R. The source electrode of the p-type MOS transistor 815R is connected to the source power supply source 802, and the drain electrode of the n-type MOS transistor 815R is connected to the drain electrode of the p-type MOS transistor 816R.

One differential input voltage (described later) is applied to the gate electrode of the n-type MOS transistor 816, and the other different input voltage which is applied to the gate electrode of the n-type MOS transistor 816R corresponds to the gate input voltage Va described in the first to thirty third embodiments.

The phase compensating circuit 830 comprises a capacitor 832, an n-type MOS transistor 834 having the gate electrode connected to the source power supply source 802, and a p-type MOS transistor 836 having the gate electrode connected to the scan line 101. The drain electrode of the p-type MOS transistor 842 and the source electrode of the n-type MOS transistor 844 are connected to each other.

One electrode of the capacitor 832 is connected to the connection point between the drain electrode of the p-type MOS transistor 815R and the drain electrode of the n-type MOS transistor 816R and also connected to the gate electrode of the p-type MOS transistor 842. The other electrode of the capacitor 832 is connected to any one of the source and drain electrodes of the n-type MOS transistor 834 and also anyone of the source and drain electrodes of the p-type MOS transistor 836, and also it is connected to the connection point between the drain electrode of the p-type MOS transistor 842 and the drain electrode of the n-type MOS transistor 84$n$, thereby forming the phase-compensating circuit 830 as a whole.

The two channel terminal electrodes of each MOS transistor may function as a source electrode or drain electrode in accordance with the voltage applied to each of both the channel terminal electrodes. Therefore, in this embodiment, they are represented as any one of the source and drain electrodes or the other of the source and drain electrodes.

The output buffer 840 comprises the p-type MOS transistor 842 and the n-type MOS transistor 844 described above. The n-type MOS transistor 844 is formed of an MOS transistor having the double gate structure. The gate electrode of the n-type MOS transistor 844 is connected to the bias power supply source 804 described above.

The source electrode of the n-type MOS transistor 844$n$ is connected to the scan line 101. The n-type MOS transistor 844 forms a current supply source.

The output terminal of the output buffer 840, that is, the output of the operating amplification circuit 104-35 corresponds to the connection point between the source electrode of the p-type MOS transistor 842 and the source electrode of the n-type MOS transistor 844, and is connected to the pixel electrode 107 of the liquid crystal 109.

The output voltage of the output buffer 840, that is, the image data Vpix described above is supplied to the gate electrode of the n-type MOS transistor 816L constituting the differential amplification branch 814 of the differential amplification circuit as one differential input voltage described above. By supplying the above pixel voltage Vpix, the operating amplification circuit 810 constitutes a voltage follower as a whole.

The constructions of the other parts than the above-described parts in this embodiment are identical to the first to thirty third embodiment. Therefore, in the following description, these same parts are represented by the same reference numerals as the first to thirty third embodiments and the description thereof is omitted. Accordingly, the liquid crystal display device having the above difference is represented by 10-35, and the pixel circuit is represented by 20-35.

Next, the operation of this embodiment will be described with reference to FIG. 69.

For the sake of simplification of the description on the operation of the liquid crystal display device 10-35 according to this embodiment, the description will be made on a case where an analog amplifier circuit 104-35 according to this embodiment is used as the analog amplifier circuit of the second embodiment in the pixel circuit 20-35 of this embodiment.

The amplifier input voltage Va output from the n-type MOS transistor 103 (FIG. 5) is applied to the gate electrode of the n-type MOS transistor 816R of the differential amplification circuit 810. Furthermore, the pixel voltage Vpix is applied to the gate electrode of the n-type MOS transistor 816L.

Accordingly, if a changed amplifier input voltage Va is input when the operation enters a new field period, with respect to the output voltage of the differential amplification circuit 810 (the output voltage of the differential amplification branch 818 at the right side, that is, the voltage appearing at the drain electrode of the n-type MOS transistor 816R), a convergence action under which the difference between the amplifier input voltage Va and the pixel voltage Vpix is approached to zero appears in a feedback system formed in the differential amplification circuit 810, the phase-compensating circuit 830 and the output buffer 840.

As a result, the output voltage of the differential amplification circuit 810 is set to a voltage settled so as to have a substantially fixed relationship with the amplifier input voltage Va, that is, a voltage having a constant relationship between the output voltage and the amplifier input voltage (linearity between both the voltages) by the action of the n-type MOS transistor 813 having the double gate structure constituting the constant current supply source 812.

This voltage is supplied to the phase-compensating circuit 830. The phase-compensating circuit 830 compensates for the phase lag of the voltage output from the differential amplification circuit 810, which occurs due to the voltage variation of the voltage of the bias power supply source 802 and/or the voltage supplied to the scan line 101. In the phase compensation, the voltage of the bias power supply source 802 and/or the voltage supplied to the scan line 101 is used as a control signal for the phase compensation in the phase compensating circuit 830.

The signal output from the phase compensating circuit 830 is set to the pixel voltage Vpix having a sufficient capability of feeding power to the liquid crystal 109 in the output buffer 840, and then fed to the liquid crystal 109. Since the MOS transistor having the double gate structure is used as the current supply source in the output buffer gate 840, the linearity of the pixel voltage Vpix to the amplifier input voltage is enhanced, and thus the gradation is also more enhanced from the viewpoint of the image display on the liquid crystal 109 in the output buffer 840.

As described above, according to the construction of this embodiment, in both the differential amplification circuit 810 and the output buffer 840, the MOS transistor having the double gate structure is used and also the operating area of the MOS transistor is set to the operating point at which the dependence of Ids on Vds is substantially nullified or to an operating point in the neighborhood of the above non-dependence operating point within a permissible range as in the case of the second embodiment. Therefore, as described above, the pixel voltage Vpix output from the operating amplification circuit 104-35 as the analog amplification circuit is set to a voltage which is substantially proportional to the amplifier input voltage Va, or a voltage represented by a deviation from the voltage concerned within a permissible range.

Accordingly, more excellent gradation can be achieved every field as compared with the patent document described above.

With keeping this effect, this embodiment has resistance to variation of a power source voltage (strong resistance to voltage variation) which is a feature inherent to the operating amplification circuit having the above construction.

Thirty Sixth Embodiment

Figure 70:
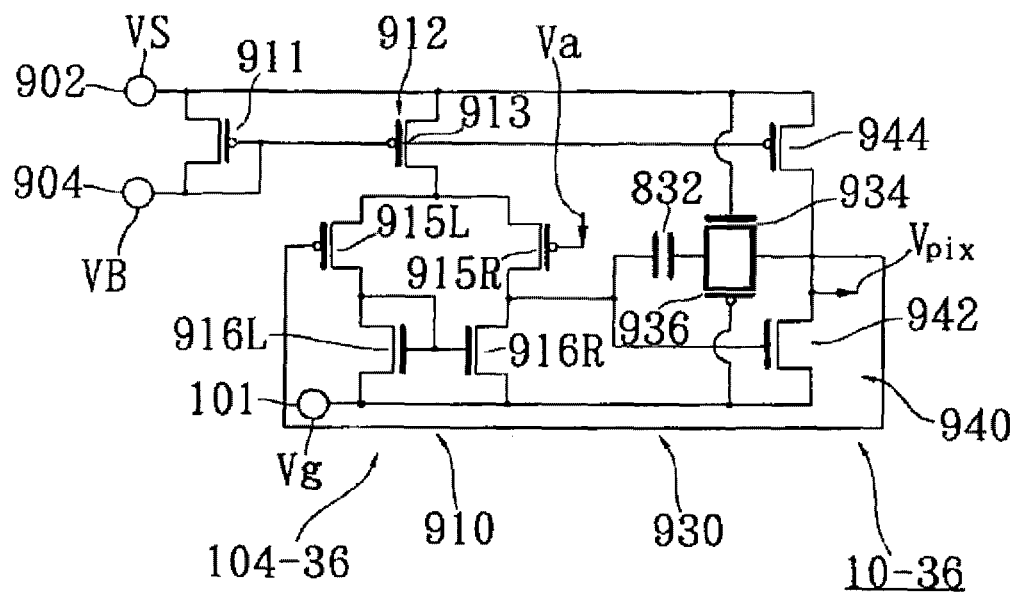
FIG. 70 is a diagram showing an operation amplifying circuit in a pixel circuit constituting a liquid crystal display device according to a thirty sixth embodiment of the present invention.

FIG. 70 is a diagram showing only an analog amplifier circuit in a pixel circuit constituting a liquid crystal display device according to a thirty sixth embodiment of the present invention.

The construction of this embodiment is greatly different from that of the thirty fifth embodiment in that the n-type MOS transistor constituting the operating amplification circuit of the thirty fifth embodiment is replaced by a p-type MOS transistor.

That is, it is the same as the thirty fifth embodiment in that the operating amplification circuit 104-36 comprises a differential amplification circuit 910, a phase-compensating circuit 930 and an output buffer 940.

All the n-type MOS transistors used in the differential amplification circuit 910, the phase-compensating circuit 930 and the output buffer 940 are replaced by p-type MOS transistors, and all the p-type MOS transistors are replaced by n-type MOS transistors.

In connection with the replacement between the MOS transistor types, the constant current supply source 912 and the current supply source 944 are disposed at the high potential side.

Accordingly, the respective MOS transistors are represented by reference numerals of 900s in place of 800s, and the description of each transistor is omitted.

Next, the operation of this embodiment will be described with reference to FIG. 70.

The operation of this embodiment is substantially similar to that of the thirty fifth embodiment except that the types of the MOS transistors of the thirty fifth embodiment are changed like n-type is replaced by p-type while p-type is replaced by n-type and the voltage polarity is inverted. Accordingly, the operation would be naturally clarified if the description on the operation of the thirty fifth embodiment is referred to, and thus the detailed description thereof is omitted.

As described above, according to this embodiment, the n-type MOS transistors used in the thirty fifth embodiment are merely replaced by p-type MOS transistors, the p-type MOS transistors are merely replaced by n-type MOS transistors and also the voltage polarity is merely inverted, so that the same effect as the thirty fifth embodiment can be achieved.

Thirty Seventh Embodiment

Figure 71:
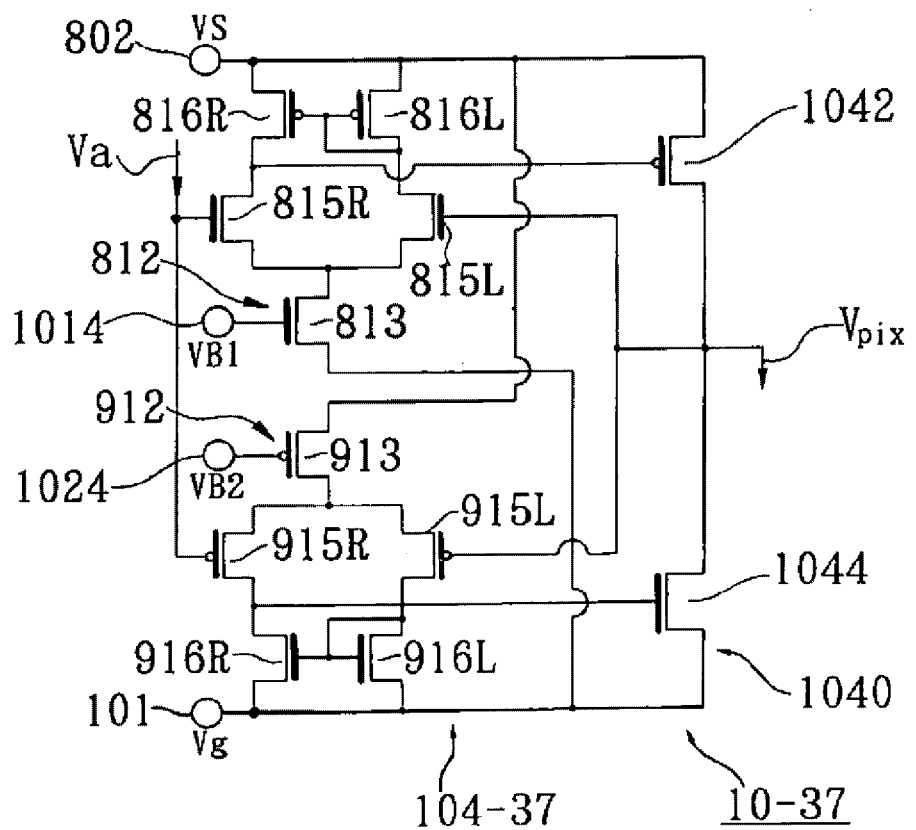
FIG. 71 is a diagram showing an operation amplifying circuit in a pixel circuit constituting a liquid crystal display device according to a thirty seventh embodiment of the present invention.

FIG. 71 is a diagram showing only an analog amplifier circuit in a pixel circuit constituting a liquid crystal display device according to a thirty seventh embodiment of the present invention.

The construction of this embodiment is greatly different from those of the thirty fifth embodiment and the thirty sixth embodiment in that the operating amplification circuit 104-35 of the thirty fifth embodiment and the operating amplification circuit 104-36 of the thirty sixth embodiment are used in combination.

That is, the operating amplification circuit 104-37 uses the gate electrode of the MOS transistor 815L of the differential amplification circuit 810 and the gate electrode of the MOS transistor 915L of the differential amplification circuit 910 as input terminals for the amplifier input voltage Va.

The drain electrode of the MOS transistor 816R of the differential amplification circuit 810 is connected to the gate electrode of the p-type MOS transistor 1042 of the output buffer 1040, and the drain electrode of the MOS transistor 916R of the differential amplification circuit 910 is connected to the gate electrode of the n-type MOS transistor 1044 of the output buffer 1040.

The MOS transistor 816L of the differential amplification circuit 810 and the MOS transistor 916L of the differential amplification circuit 910 are connected to the output of the output buffer 1040, that is, the drain electrode of the p-type MOS transistor 1042 and the drain electrode of the n-type MOS transistor 1044.

The source electrode of the n-type MOS transistor 813 of the differential amplification circuit 810 is connected to the scan line 101, and the source electrode of the n-type MOS transistor 913 of the differential amplification circuit 910 is connected to the source electrode 802.

A bias power supply source 1014 is connected to the gate electrode of the n-type MOS transistor 813, and a bias power supply source 1024 is connected to the gate electrode of the n-type MOS transistor 913. The voltage VB1 of the bias power supply source 1014 is higher than the voltage VB2 of the bias power supply source 1024 by a predetermined value.

A phase compensating circuit 1030 is constructed by an n-type MOS transistor 813 having the source electrode connected to the scan line 101, a p-type MOS transistor 913 having the source electrode connected to the source power supply source 802, MOS transistor 816L and MOS transistor 916L whose gate electrodes are connected to the output terminals of the output buffer 1040, an n-type MOS transistor 816R having the drain electrode connected to the gate electrode of the p-type MOS transistor 1044, and a p-type MOS transistor 916R having the drain electrode connected to the gate electrode of the n-type MOS transistor 1044.

Next, the operation of this embodiment will be described with reference to FIG. 70.

As described above, the construction of this embodiment is achieved by combining the construction of the thirty fifth embodiment and the construction of the thirty sixth embodiment.

Accordingly, if the descriptions on both the embodiments are referred to, the operation would be naturally clarified, and thus the detailed description thereof is omitted.

As described above, this embodiment is constructed by combining the construction of the thirty fifth embodiment and the construction of the thirty sixth embodiment, so that the same effect as the thirty fifth embodiment and the thirty sixth embodiment can be achieved.

The embodiments of the present invention have been described in detail with reference to the drawings. However, the present invention is not limited to these embodiments, and even if these embodiments are modified in design or the like without departing from the subject matter of the present invention, these modifications are contained in the present invention.

For example, the feature of the present invention which is intrinsic in each embodiment, that is, the feature that the dependence of Ids on Vds can be substantially eliminated is applied to devices other than the liquid crystal display device, and the present invention can be implemented by these devices.

Accordingly, it is needless to say that the amplifier input voltage of each embodiment may be set to other signals to be amplified, and these signals may be modulation and demodulation signals in modulation and demodulation circuits, etc.

Furthermore, the present invention may be applied to compensate for not only the amplitude of a signal, but also the displacement in phase, frequency, etc.

In each of the above embodiments, the MOS transistor having the multi-gate structure may be used for not only the MOS transistor constituting the analog amplifier circuit, but also the MOS transistor for switching the data signal voltage to the analog amplifier circuit. In this case, all the MOS transistors may be designed to have the multi-gate structure under some conditions.

In each of the above embodiments, the n-type MOS transistor 103, the n-type MOS transistor 701, the first p-type MOS transistor 302, the second p-type MOS transistor 303, the first n-type MOS transistor 702 and the second n-type MOS transistor 703 are formed of p-SiTFT. However, they may be formed of a-SiTFT, CdSeTFT or other thin film transistors, or monocrystal silicon transistors.

Furthermore, each of the circuits described above may be constructed by not only the insulated gate type transistor such as MOS transistor, but also a junction field effect transistor contained in the unipolar transistor.

The present invention is not limited to the above-described embodiments, and each embodiment may be suitably modified within the technical idea of the present invention.

INDUSTRIAL APPLICABILITY

As described above, according to the construction of the present invention, the unipolar transistor is operated in the operating area where Ids of the unipolar transistor having the multi-gate structure on Vds can be substantially eliminated, so that the voltage for driving liquid crystal or the like can be prevented from being varied due to response of the liquid crystal or the like and at the same time the withstanding voltage of the transistors being used can be extremely enhanced.

As a result, the above function makes it possible to drive the circuit with a signal having a broad input/output voltage range. For example, there can be implemented an analog amplifier circuit having a broad dynamic range in which the gain thereof is substantially fixed over a broad input voltage range.

Furthermore, by increasing the withstanding voltage of the unipolar transistor described above, the area needed for each sub unipolar transistor can be reduced, so that a high aperture ratio can be implemented.

Accordingly, for example, in the liquid crystal display device actively using the effect described above, more accurate gradation display can be performed as compared with the prior art. Particularly, even in the case of high-response liquid crystal such as ferroelectric or antiferroelectric liquid crystal having polarization, OCB mode liquid crystal responding within one-field period, etc., the high-response liquid crystal can be driven without inducing variation in the pixel voltage. As a result, more accurate gradation display can be performed every field (frame).

When the liquid crystal display device is driven in the time-divisional driving system by applying the above characteristic, the color reproduction in the liquid crystal display device is better, and high-gradation display can be performed.

Furthermore, according to the liquid crystal display device of the present invention, the scan voltage is used as the power supply source and the reset power supply source for the unipolar transistor operating as, and also the reset of the analog amplifier circuit is carried out by the unipolar transistor itself. Therefore, there can be achieved such a remarkable effect that with keeping the above effect, the wires and the circuits such as the power supply source wires, the reset power supply source wires, the reset switches, etc. are never needed, the analog amplifier circuit can be constructed in a small area and the high aperture ration can be achieved.

The pixel circuit can be constructed by all unipolar transistors having the same type, so that the manufacturing process can be simplified.

The load resistance of the source follower type analog amplifier or the resistance of the active load transistor in the liquid crystal display device of the present invention is equal to a high value, for example, 1 GΩ, and thus constantly flowing consumption current can be suppressed with keeping the above effect, so that the power consumption can be saved.

The above feature can provide a projector device, a notebook-sized PC, a monitor liquid crystal display, etc. which are compact and light in size and weight, high in aperture ratio, response, visual field and gradation and low in power consumption and price.

What is claimed is:

1. A method for setting the operating point of a unipolar first transistor, wherein the unipolar first transistor having a multi-gate structure is equivalently achieved by commonly connecting respective gates of plural unipolar second transistors each having a single gate structure and connecting the plural unipolar second transistors to one another in series, an operating point of each single unipolar second transistor having the single gate structure is set at an operating point that the dependence of source-drain current on source-drain voltage is within a permissible range.

2. The method according to claim 1, wherein said unipolar first transistor having the multi-gate structure is an insulated gate type transistor having a multi-gate structure or a junction type transistor having a multi-gate structure.

3. The method according to claim 1, wherein the operating point is set at any one of an optimum operating point within the permissible range and an operating point other than the optimum operating point within the permissible range.

4. The method according to claim 1, wherein said unipolar first transistor having the multi-gate structure alters the signal component value of a signal, the signal being any one of an amplified signal, a modulated signal and a demodulated signal.

5. The method according to claim 1, wherein said unipolar first transistor is connected to a load element and the load element is a unipolar third transistor.

6. The method according to claim 5, wherein a gate of the unipolar third transistor is configured for receiving a first voltage, a drain of the third transistor is connected to drain of the unipolar first transistor, and a source of the unipolar third transistor is configured for receiving a second voltage.

7. The method according to claim 5, wherein a gate of the unipolar third transistor is configured for receiving a third voltage, a drain of the third transistor is connected to drain of the unipolar first transistor, and a source of the unipolar third transistor is configured for receiving a fourth voltage.

8. A method for changing a signal component value of an input signal by using a unipolar first transistor, wherein a unipolar first transistor having a multi-gate structure is equivalently achieved by commonly connecting respective gates of plural unipolar second transistors each having a single gate structure and connecting the plural unipolar second transistors to one another in series, an operating point of each single unipolar first transistor having the single gate structure is set at an operating point that the dependence of source-drain current on source-drain voltage is within a permissible range, and said unipolar first transistor having the multi-gate structure is operated at the operating point and set to change the signal component value of the input signal.

9. The method according to claim 8, wherein the number of said unipolar first transistor having the multi-gate structure for which the operating point is set is a singular number or a plural number.

10. The method according to claim 8, wherein said unipolar first transistor having the multi-gate structure is selected from a group consisting of an insulated gate type transistor having a multi-gate structure and a junction type transistor having a multi-gate structure.

11. The method according to claim 8, wherein the operating point is set at any one of an optimum operating point within the permissible range and an operating point other than the optimum operating point within the permissible range.

12. The method according to claim 8, wherein the signal is any one of an amplified signal, a modulated signal and a demodulated signal.

13. The method according to claim 8, wherein the signal component of the signal is any one of the amplitude, phase and frequency of the signal.

14. The method according to claim 8, wherein said unipolar first transistor is connected to a load element, and the load element is a unipolar third transistor.

15. The method according to claim 8, wherein a gate of the unipolar third transistor is configured for receiving a first voltage, a drain of the third transistor is connected to drain of the unipolar first transistor, and a source of the unipolar third transistor is configured for receiving a second voltage.

16. The method according to claim 8, wherein a gate of the unipolar third transistor is configured for receiving a third voltage, a drain of the third transistor is connected to drain of the unipolar first transistor, and a source of the unipolar third transistor is configured for receiving a fourth voltage.

17. A circuit for setting the operating point of a unipolar transistor, wherein a unipolar transistor having a multi-gate structure is equivalently achieved by commonly connecting respective gates of plural unipolar transistors each having a single gate structure and connecting the plural unipolar transistors to one another in series, an operating point of each single unipolar transistor having the single gate structure is set at an operating point that the dependence of source-drain current on source-drain voltage is within a permissible range.

18. The circuit according to claim 17, wherein the unipolar transistor having the multi-gate structure is an insulated gate type transistor having a multi-gate structure or a junction type transistor having a multi-gate structure.

19. The circuit according to claim 17, wherein the operating point is set at any one of an optimum operating point within the permissible range and an operating point other than the optimum operating point within the permissible range.

* * * * *